US008743030B2

(12) United States Patent
Shishido

(10) Patent No.: US 8,743,030 B2
(45) Date of Patent: Jun. 3, 2014

(54) DISPLAY DEVICE AND DRIVING METHOD OF DISPLAY DEVICE

(75) Inventor: Hideaki Shishido, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 53 days.

(21) Appl. No.: 12/813,885

(22) Filed: Jun. 11, 2010

(65) Prior Publication Data

US 2010/0245219 A1 Sep. 30, 2010

Related U.S. Application Data

(63) Continuation of application No. 11/530,654, filed on Sep. 11, 2006, now Pat. No. 7,737,923.

(30) Foreign Application Priority Data

Sep. 16, 2005 (JP) ................................. 2005-269654

(51) Int. Cl.
G09G 3/30 (2006.01)

(52) U.S. Cl.
USPC ............................................. 345/80; 345/76

(58) Field of Classification Search
USPC .................. 345/87–104, 204–215, 690–699; 315/169.1–169.4
See application file for complete search history.

(56) References Cited

U.S. PATENT DOCUMENTS

| | | | | |
|---|---|---|---|---|
| 5,592,199 | A | * | 1/1997 | Kawaguchi et al. .......... 345/206 |
| 5,737,272 | A | * | 4/1998 | Uchiyama et al. ............ 345/206 |
| 5,870,075 | A | * | 2/1999 | Yamazaki et al. ............. 345/92 |
| 6,229,506 | B1 | | 5/2001 | Dawson et al. |
| 6,373,454 | B1 | | 4/2002 | Knapp et al. |
| 6,501,466 | B1 | | 12/2002 | Yamagishi et al. |

(Continued)

FOREIGN PATENT DOCUMENTS

| | | |
|---|---|---|
| EP | 1 134 811 A1 | 9/2001 |
| EP | 1 441 325 A2 | 7/2004 |

(Continued)

OTHER PUBLICATIONS

Jackson, W.B., High-performance Flexible Zinc Tin OXide Field—Effect Transistors, Nov. 2005, Applied Physics Letters 87, 193503.*

(Continued)

Primary Examiner — Alexander Eisen
Assistant Examiner — Patrick F Marinelli
(74) Attorney, Agent, or Firm — Fish & Richardson P.C.

(57) ABSTRACT

One feature of the present invention includes first to third steps of holding a voltage, corresponding to a difference between a voltage applied to a first power supply line and a threshold voltage of a first transistor, between both electrodes of first and second storage capacitors; holding a voltage, corresponding to a difference between a voltage applied to the first power supply line and a gate-source voltage of the first transistor, which is necessary to supply a light-emitting element with a current equivalent to a video signal current inputted into a signal line, between both the electrodes of the second storage capacitor; and applying a voltage based on the voltage held in the first and second storage capacitors in the first and second steps to a gate electrode of the first transistor; therefore, a current is supplied to the light-emitting element through the first transistor.

12 Claims, 87 Drawing Sheets

(56) References Cited

U.S. PATENT DOCUMENTS

| | | | |
|---|---|---|---|
| 6,542,138 B1* | 4/2003 | Shannon et al. | 345/76 |
| 6,788,108 B2 | 9/2004 | Miyake | |
| 6,919,871 B2* | 7/2005 | Kwon | 345/92 |
| 7,057,588 B2 | 6/2006 | Asano et al. | |
| 7,061,014 B2 | 6/2006 | Hosono et al. | |
| 7,064,346 B2 | 6/2006 | Kawasaki et al. | |
| 7,091,749 B2 | 8/2006 | Miyake | |
| 7,109,952 B2 | 9/2006 | Kwon | |
| 7,187,351 B2 | 3/2007 | Kwon | |
| 7,242,376 B2 | 7/2007 | Yamashita et al. | |
| 7,277,071 B2 | 10/2007 | Oh | |
| 7,282,782 B2 | 10/2007 | Hoffman et al. | |
| 7,323,356 B2 | 1/2008 | Hosono et al. | |
| 7,324,075 B2 | 1/2008 | Sano | |
| 7,362,139 B2 | 4/2008 | Miyake | |
| 7,414,599 B2 | 8/2008 | Chung et al. | |
| 7,518,580 B2 | 4/2009 | Kwon | |
| 7,573,441 B2 | 8/2009 | Kwon | |
| RE41,215 E | 4/2010 | Miyake | |
| 7,800,564 B2 | 9/2010 | Numao | |
| 7,876,294 B2 | 1/2011 | Sasaki | |
| RE43,401 E | 5/2012 | Miyake | |
| 8,217,863 B2 | 7/2012 | Kwon | |
| 8,289,240 B2 | 10/2012 | Kwon | |
| 8,519,918 B2 | 8/2013 | Sasaki | |
| 2002/0047581 A1 | 4/2002 | Koyama | |
| 2002/0060661 A1* | 5/2002 | Nah et al. | 345/99 |
| 2002/0135312 A1 | 9/2002 | Koyama | |
| 2002/0140654 A1* | 10/2002 | Kim et al. | 345/87 |
| 2002/0180369 A1 | 12/2002 | Koyama | |
| 2003/0117352 A1 | 6/2003 | Kimura | |
| 2003/0132900 A1* | 7/2003 | Yamauchi et al. | 345/76 |
| 2004/0070557 A1 | 4/2004 | Asano et al. | |
| 2004/0080474 A1 | 4/2004 | Kimura | |
| 2004/0095340 A1 | 5/2004 | Nakamura | |
| 2004/0145547 A1 | 7/2004 | Oh | |
| 2004/0196224 A1 | 10/2004 | Kwon | |
| 2004/0196239 A1* | 10/2004 | Kwon | 345/92 |
| 2005/0052366 A1 | 3/2005 | Kim | |
| 2005/0057459 A1 | 3/2005 | Miyazawa | |
| 2005/0083270 A1 | 4/2005 | Miyazawa | |
| 2005/0122283 A1 | 6/2005 | Kimura et al. | |
| 2005/0190175 A1* | 9/2005 | Kim et al. | 345/204 |
| 2005/0206593 A1 | 9/2005 | Kwon | |
| 2005/0275038 A1* | 12/2005 | Shih et al. | 257/382 |
| 2005/0285825 A1 | 12/2005 | Eom et al. | |
| 2006/0113551 A1 | 6/2006 | Kwak | |
| 2006/0244107 A1 | 11/2006 | Sugihara et al. | |
| 2007/0001954 A1 | 1/2007 | Shishido et al. | |
| 2007/0085112 A1 | 4/2007 | Yamazaki et al. | |
| 2007/0194379 A1 | 8/2007 | Hosono et al. | |
| 2009/0262105 A1 | 10/2009 | Kwon | |
| 2009/0267935 A1 | 10/2009 | Kwon | |
| 2009/0267936 A1 | 10/2009 | Kwon | |
| 2010/0277402 A1 | 11/2010 | Miyazawa | |
| 2010/0328294 A1 | 12/2010 | Sasaki | |
| 2011/0018855 A1 | 1/2011 | Miyazawa | |

FOREIGN PATENT DOCUMENTS

| | | | |
|---|---|---|---|
| EP | 1 465 141 A1 | 10/2004 | |
| EP | 1 465 143 A2 | 10/2004 | |
| EP | 1 496 495 A2 | 1/2005 | |
| EP | 1 517 290 A2 | 3/2005 | |
| EP | 1 610 291 A1 | 12/2005 | |
| GB | PCT/IB04/00869 | * | 10/2004 |
| JP | 05-251705 A | 9/1993 | |
| JP | 2000-044236 A | 2/2000 | |
| JP | 2000-150900 A | 5/2000 | |
| JP | 2001147659 A | 5/2001 | |
| JP | 2002-076356 A | 3/2002 | |
| JP | 2002-517806 A | 6/2002 | |
| JP | 2002-289859 A | 10/2002 | |
| JP | 2003-179479 A | 6/2003 | |
| JP | 2003-271095 A | 9/2003 | |
| JP | 2004-029791 A | 1/2004 | |
| JP | 2004-133240 A | 4/2004 | |
| JP | 2004163673 A | 6/2004 | |
| JP | 2004-226960 A | 8/2004 | |
| JP | 2004-310006 A | 11/2004 | |
| JP | 2004-310014 A | 11/2004 | |
| JP | 2004-333594 A | 11/2004 | |
| JP | 2005-031630 A | 2/2005 | |
| JP | 2005-033172 A | 2/2005 | |
| JP | 2005-062794 A | 3/2005 | |
| JP | 2005-099772 A | 4/2005 | |
| JP | 2005-157261 A | 6/2005 | |
| JP | 2005-234242 A | 9/2005 | |
| KR | 2004-0085653 A | 10/2004 | |
| WO | 99/65011 A2 | 12/1999 | |
| WO | 03/040441 A1 | 5/2003 | |

OTHER PUBLICATIONS

Kamiya, T et al., "1a-F-5 Room Temperature Fabrication and Carrier Transport of Amorphous Semiconductor Exhibiting Large Electron Hall Mobilities > 10 cm2/Vs," (The 65th Augumn Meeting, 2004) The Japan Society of Applied Physics, Sep. 1, 2004, No. 2, p. 791 (with English translation).

Kimizuka, N. et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—ZnO System," Journal of Solid State Chemistry, Apr. 1, 1995, vol. 116, No. 1, pp. 170-178.

Li, C et al., "Modulated Structures of Homologous Compounds $InMO_3(ZnO)m$ (M=In,Ga; m=Integer) Described by Four-Dimensional Superspace Group," Journal of Solid State Chemistry, 1998, vol. 139, pp. 347-355.

Nomura, K et al., "Carrier Transport in Transparent Oxide Semiconductor with Intrinsic Structural Randomness.Probed Using Single-Crystalline $InGaO_3(ZnO)_5$ Films," Appl. Phys. Lett. (Applied Physics Letters) , Sep. 13, 2004, vol. 85, No. 11, pp. 1993-1995.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "31a-ZA-6 Carrier Transport in Transparent Amorphous Oxide Semiconductor InGaZnO4," (The 51st Spring Meeting, 2004); The Japan Society of Applied Physics and Related Societies, Mar. 28, 2004, No. 2, p. 669 (with English translation).

Search Report (European Patent Application No. 06018355.5) dated Feb. 13, 2012.

* cited by examiner

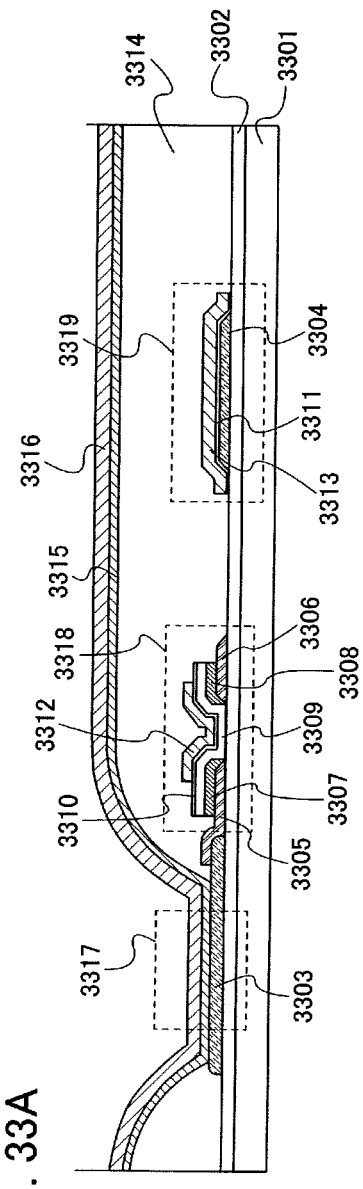
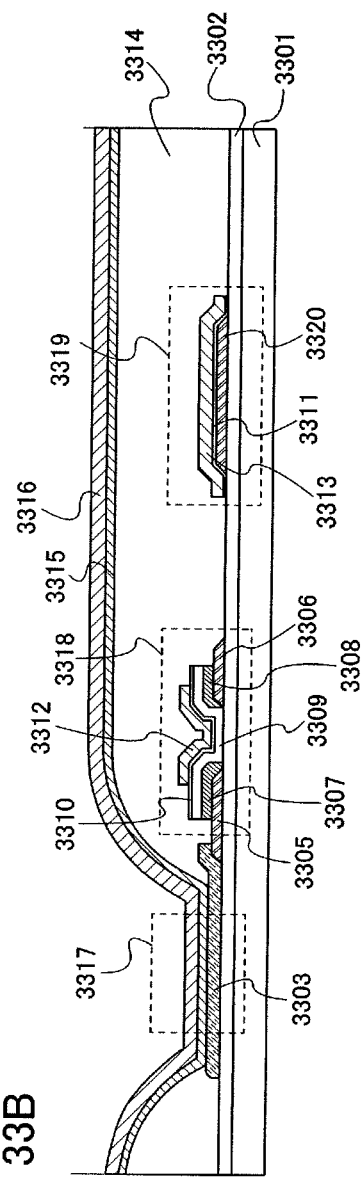
FIG. 33A
FIG. 33B

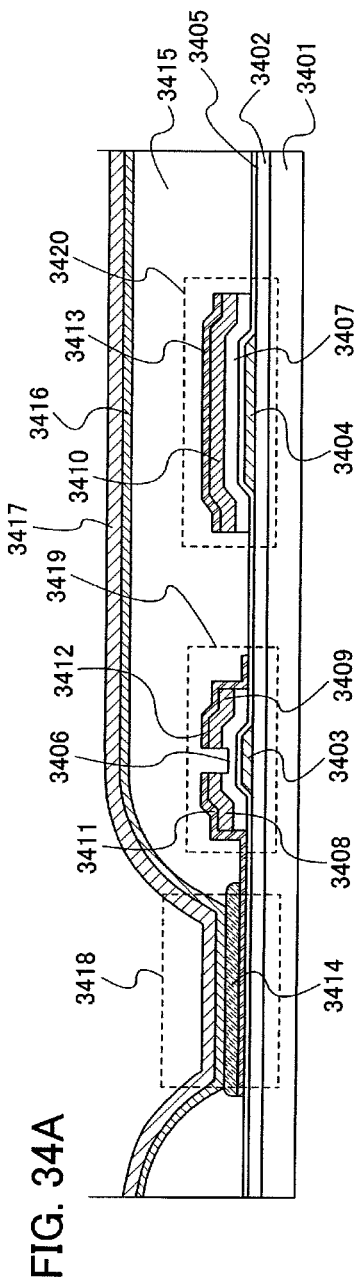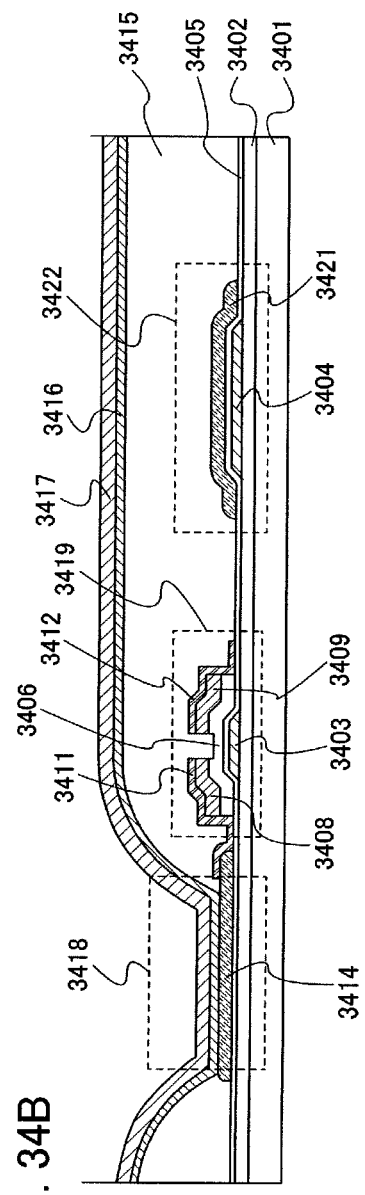
FIG. 34A
FIG. 34B

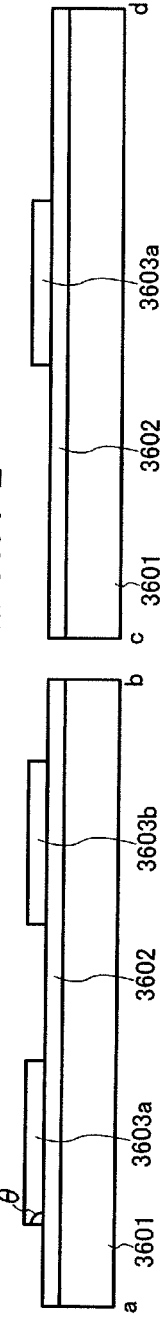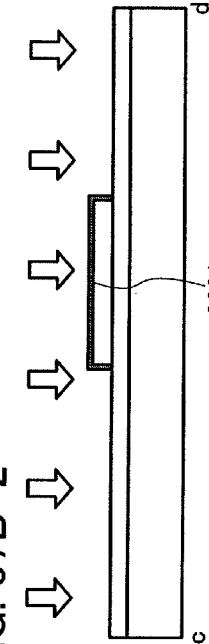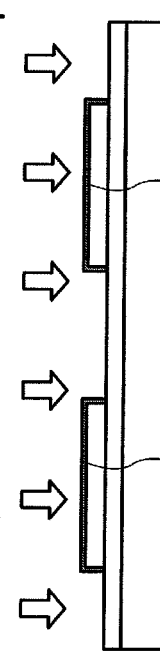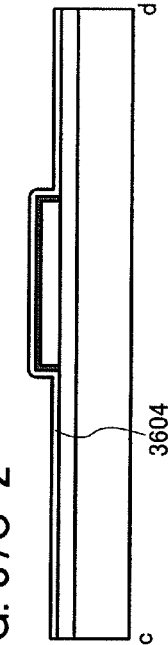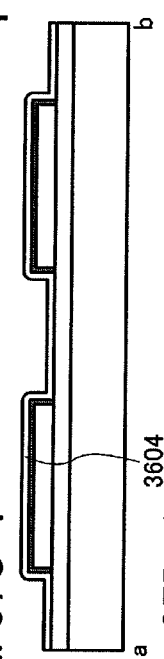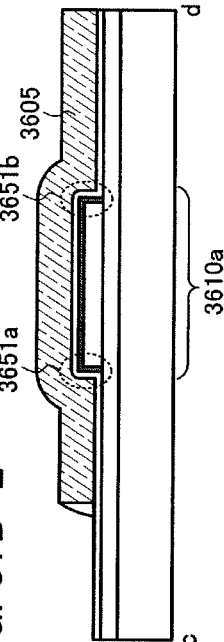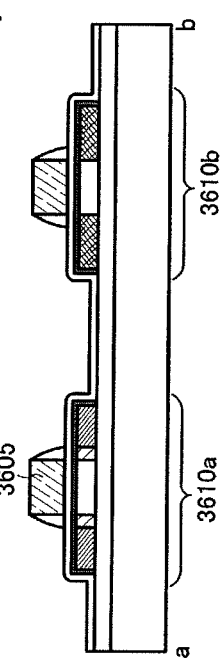

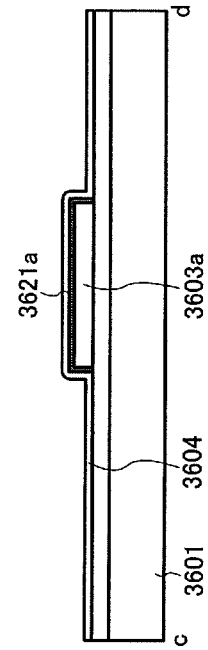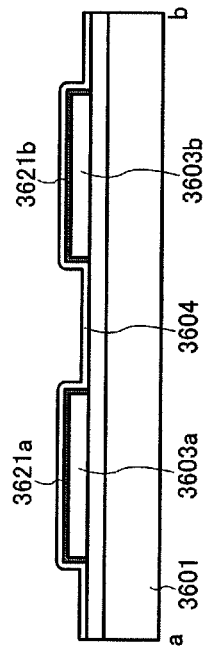
FIG. 38A-1   FIG. 38A-2
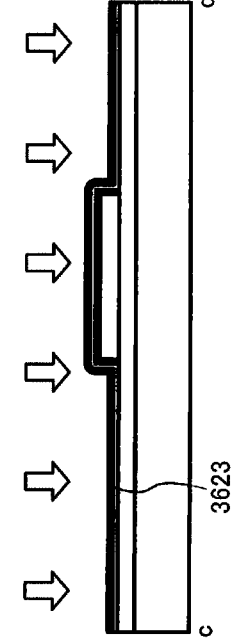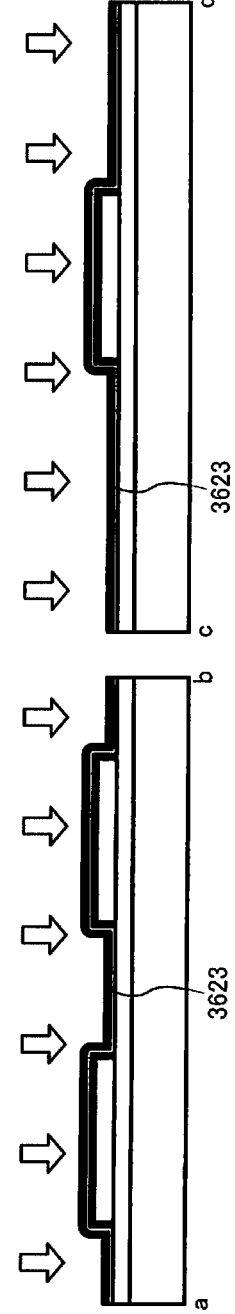
FIG. 38B-1   FIG. 38B-2
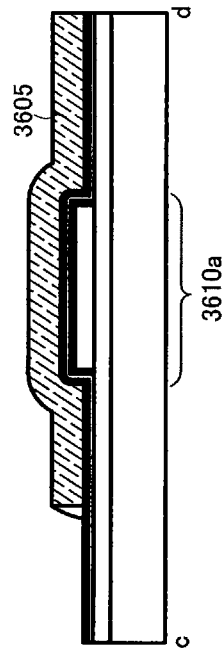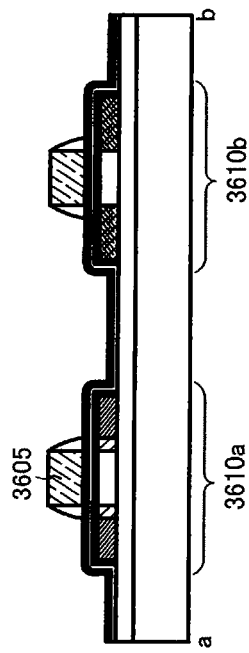
FIG. 38C-1   FIG. 38C-2

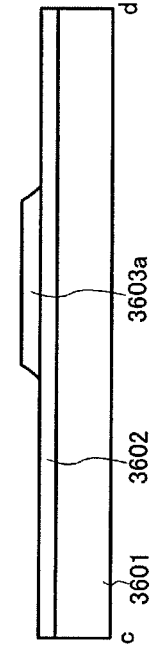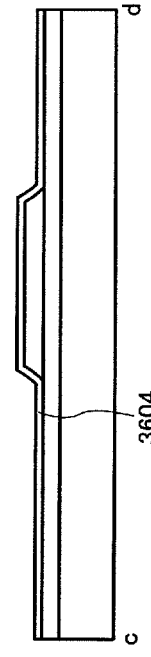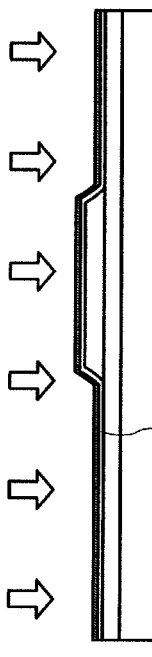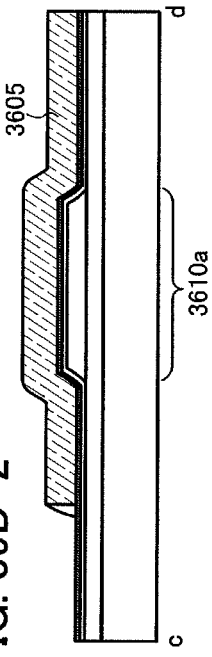
FIG. 39A-2  FIG. 39B-2  FIG. 39C-2  FIG. 39D-2
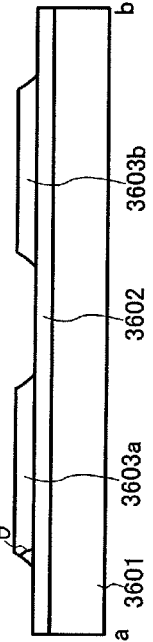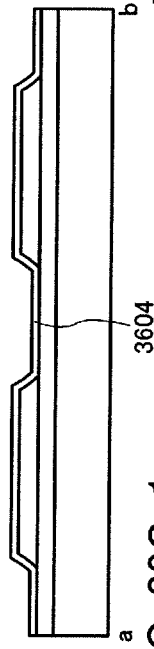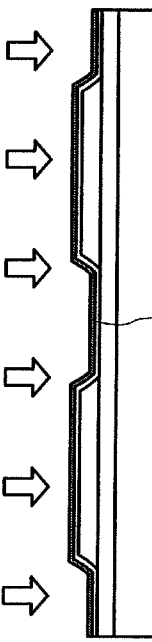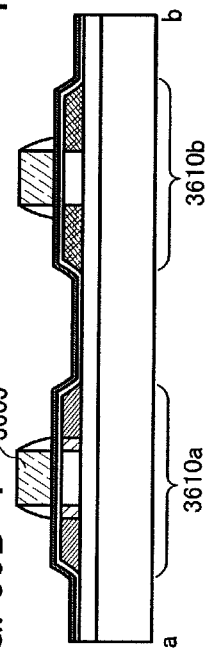
FIG. 39A-1  FIG. 39B-1  FIG. 39C-1  FIG. 39D-1

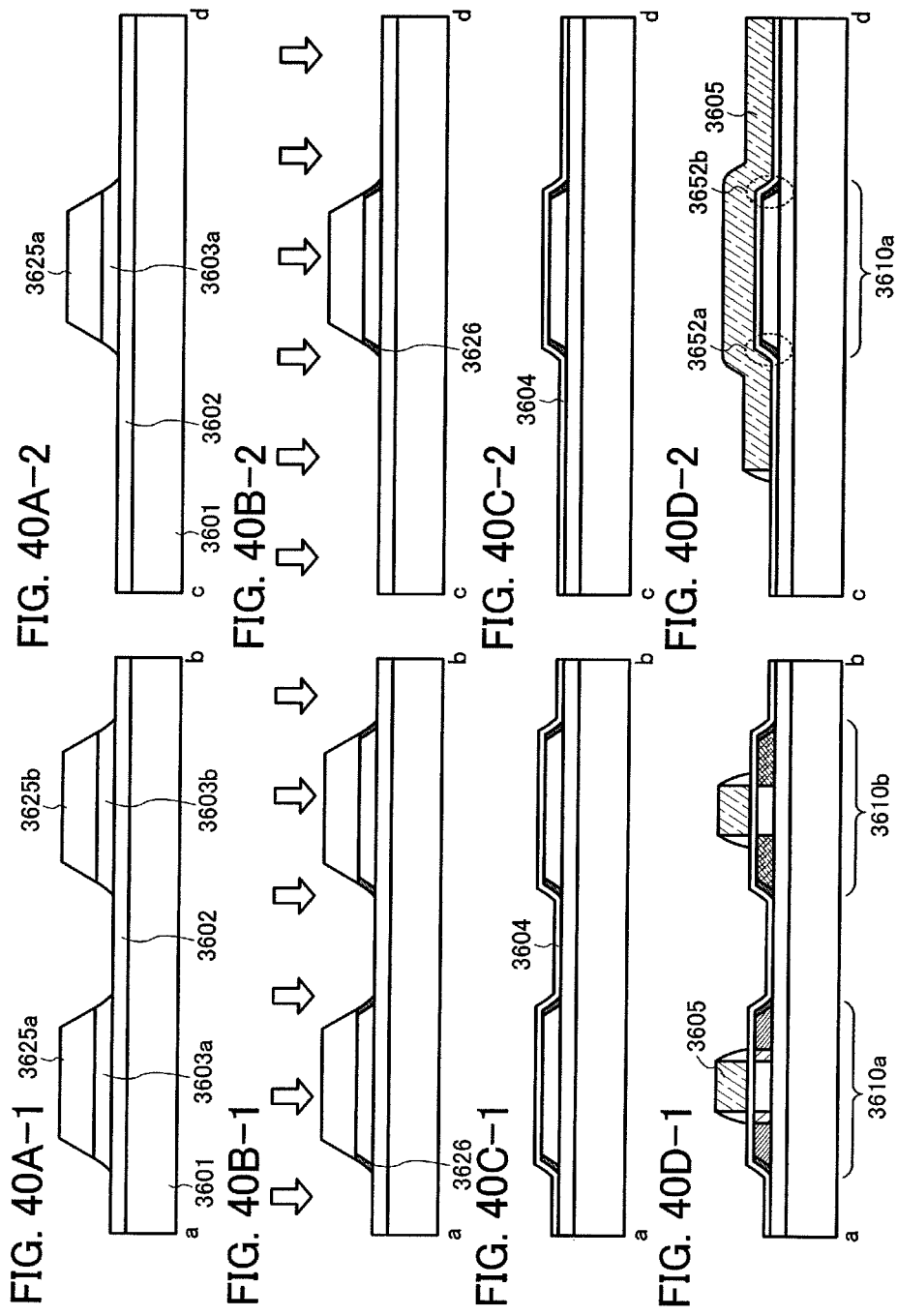

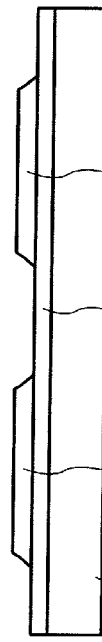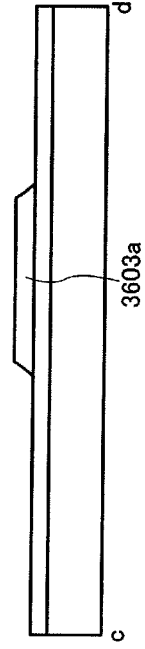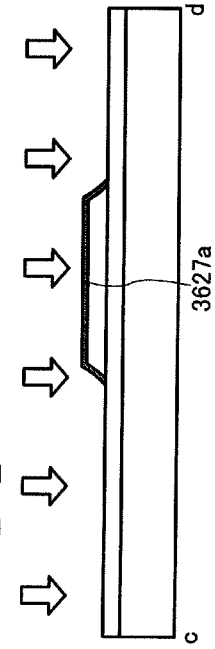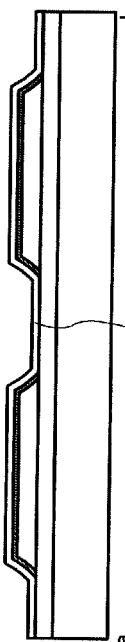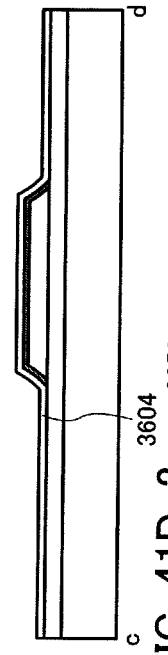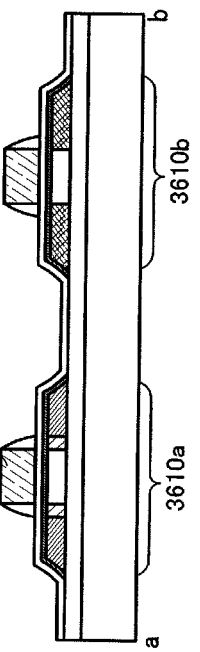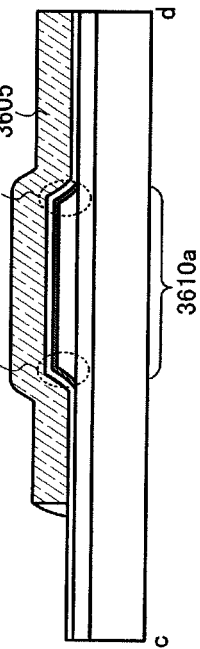

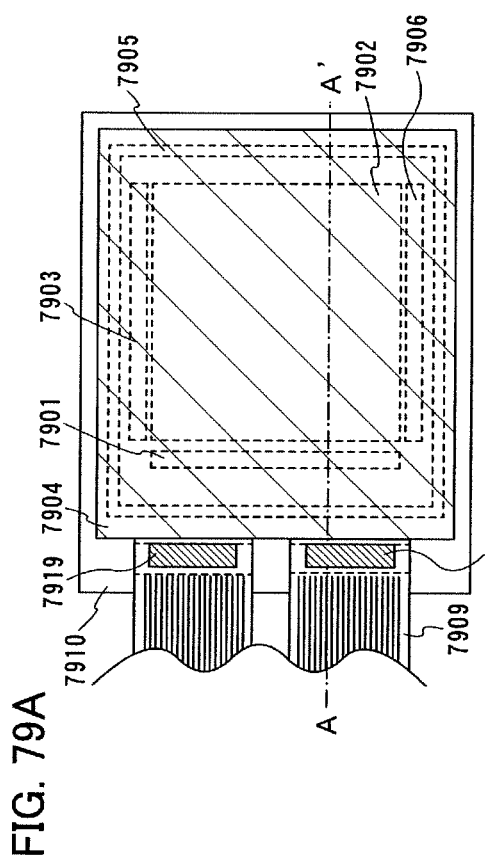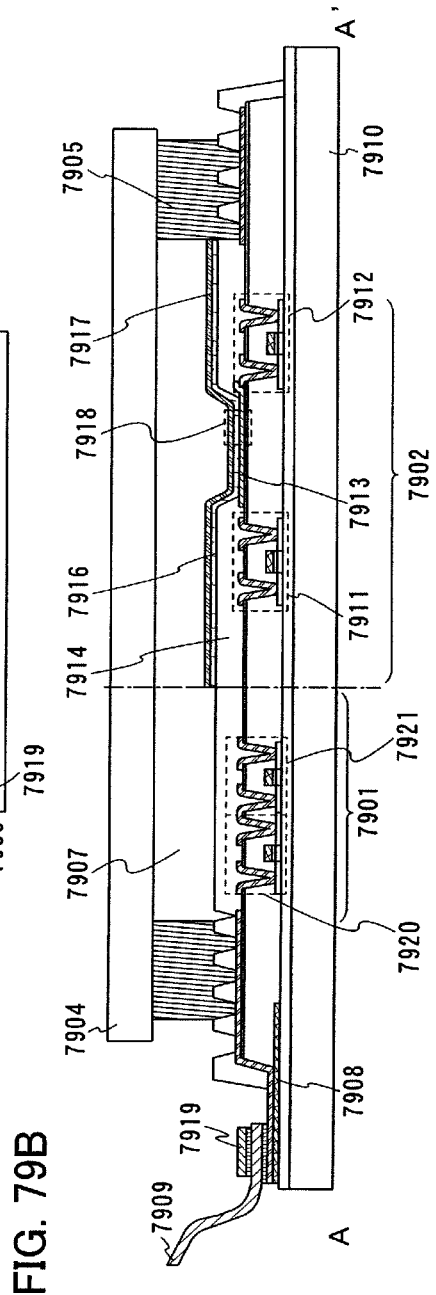

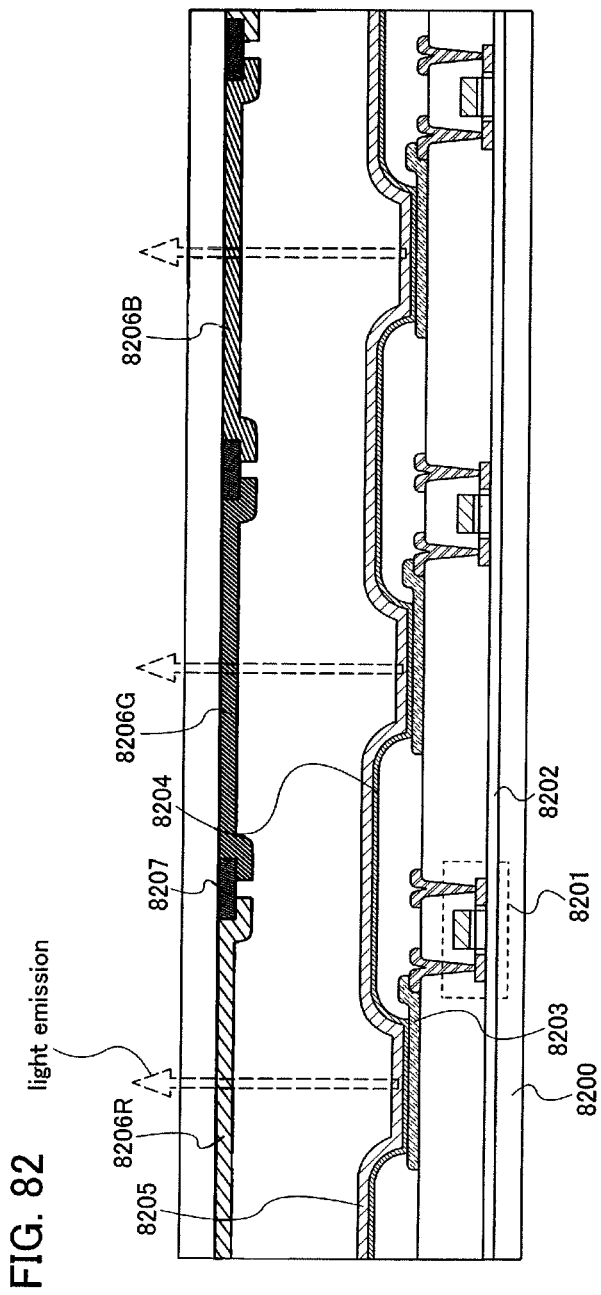

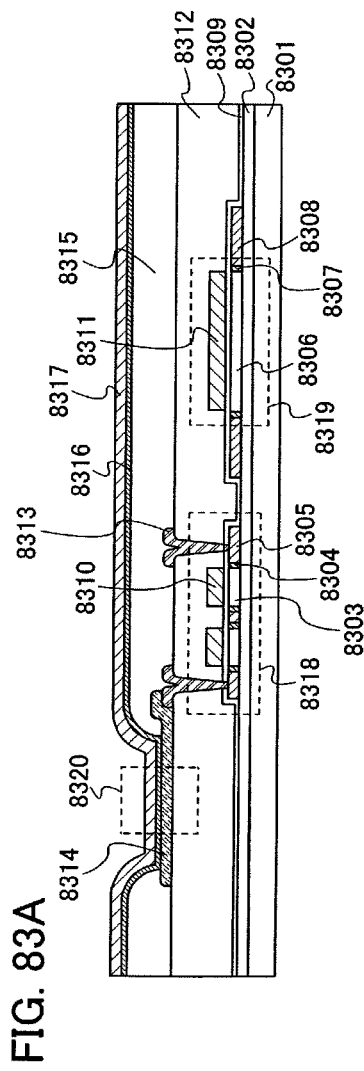
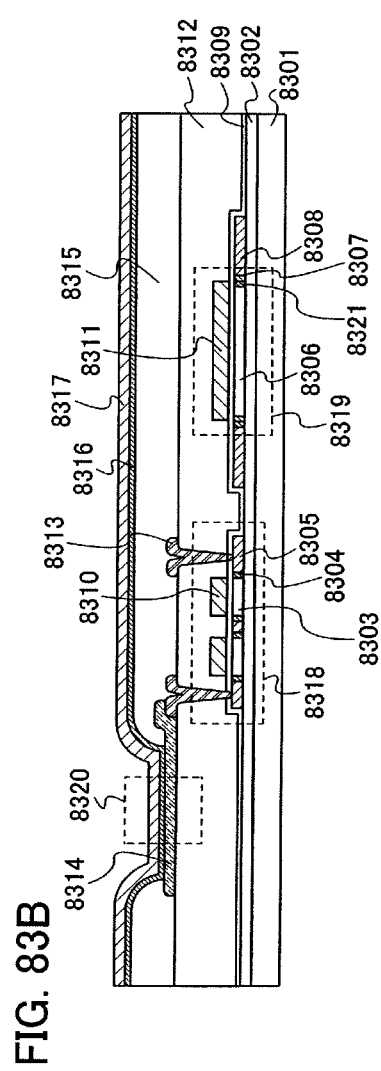
FIG. 83A
FIG. 83B

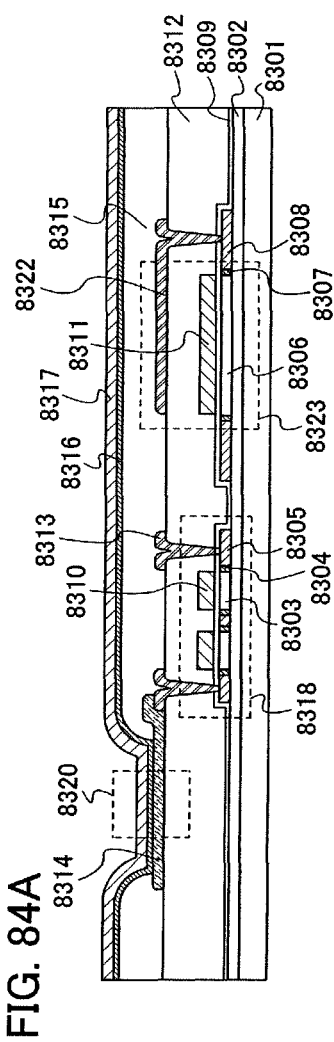
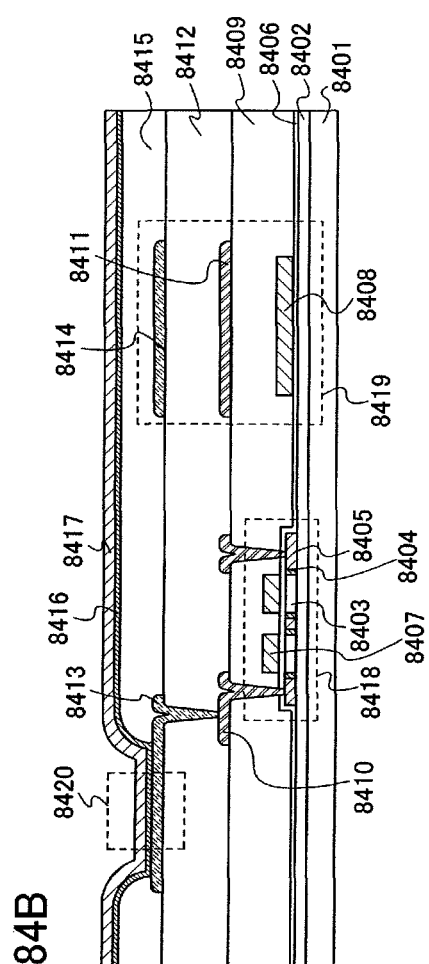
FIG. 84A
FIG. 84B

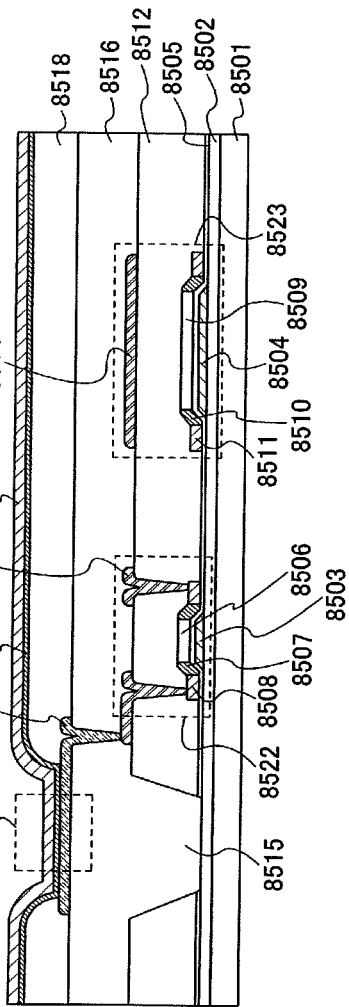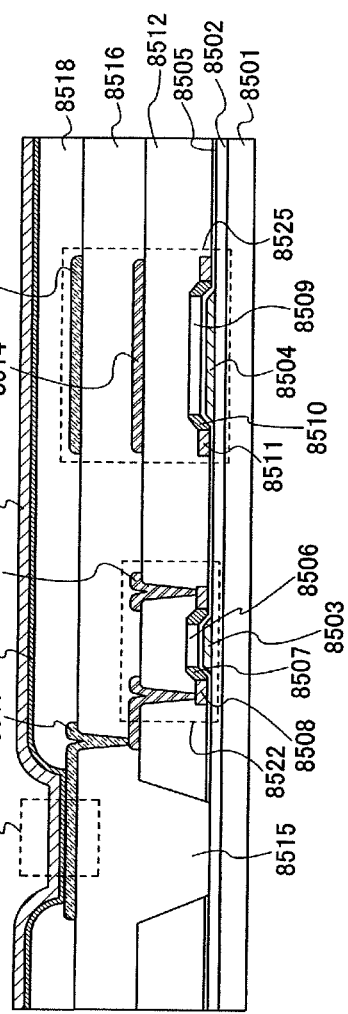

DISPLAY DEVICE AND DRIVING METHOD OF DISPLAY DEVICE

CROSS-REFERENCE TO RELATED APPLICATIONS

This application is a continuation of U.S. application Ser. No. 11/530,654, filed Sep. 11, 2006, now allowed, which claims the benefit of a foreign priority application filed in Japan as Serial No. 2005-269654 on Sep. 16, 2005, both of which are incorporated by reference.

BACKGROUND OF THE INVENTION

1. Field of the Invention

The present invention relates to a structure of a display device having a transistor. In particular, the present invention relates to a structure of an active matrix display device having a thin film transistor manufactured over an insulator such as glass or plastics. In addition, the present invention relates to an electronic device where a display portion thereof is formed by using such a display device.

2. Description of the Related Art

In recent years, a so-called self-luminous type display device having a pixel that is formed of a light-emitting element such as a light-emitting diode (LED) has been attracting attention. As a light-emitting element used for such a self-luminous type display device, an organic light-emitting diode (OLED) (also referred to as an organic EL element, an electro luminescence: EL element, and the like) has been drawing attention and used for an EL display (for example, an organic EL display or the like). Since a light-emitting element such as an OLED is a self-luminous type, it has advantages such as higher visibility of pixels than that of a liquid crystal display, and fast response without requiring a backlight. The luminance of a light-emitting element is controlled by a current value flowing through the light-emitting element.

In addition, in recent years, development of an active matrix display device where a light-emitting element and a transistor for controlling light emission of the light-emitting element are provided in each pixel has been advanced. In the active matrix display device, not only display in high resolution with a large screen, which is difficult in a passive matrix display device, is capable, but also a low power consumption operation that exceeds a passive matrix display device is realized, has high reliability, and practical use thereof has been expected.

As a driving method of a pixel in the active matrix display device, which is classified in accordance with a type of signal inputted into a pixel, a voltage input system and a current input system can be given. The former voltage input system is a system for controlling a luminance of a light-emitting element with a driving element by inputting a video signal (voltage), which is inputted into a pixel, into a gate electrode of the driving element. In addition, the latter current input system is a system for controlling a luminance of a light-emitting element by making a supplied signal current flow through the light-emitting element.

Here, an example of a pixel structure in each display device where a voltage input method and a current input method are applied, and a driving method thereof will be briefly explained with reference to FIGS. 48 and 49. Note that the explanation will be given by exemplifying an EL display device as a typical display device.

FIG. 48 is a diagram showing an example of a pixel structure in the display device where a voltage input system is applied (see Reference 1: Japanese Patent Application Laid-Open No. 2001-147659). A pixel shown in FIG. 48 includes a driving transistor 4801, a switching transistor 4802, a storage capacitor 4803, a signal line 4804, a scanning line 4805, first and second power supply lines 4806, 4807, and a light-emitting element 4808.

In this specification, a transistor being in an on state refers to a state in which a gate-source voltage of the transistor exceeds the threshold voltage of the transistor, and a source-drain current thereof flows. A transistor being in an off state refers to a state in which a gate-source voltage of the transistor is less than the threshold value of the transistor, and a source-drain current thereof does not flow.

When the switching transistor 4802 is turned on by changing the potential of the scanning line 4805, a video signal inputted into the signal line 4804 is inputted into a gate electrode of the driving transistor 4801. In accordance with the potential of the inputted video signal, the gate-source voltage of the driving transistor 4801 is determined; thus, the source-drain current of the driving transistor 4801 is determined. This current is supplied to the light-emitting element 4808; thus, the light-emitting element 4808 emits light.

In such a manner, a voltage input system refers to a system for supplying the gate-source voltage and the source-drain current of the driving transistor 4801 by the potential of the video signal and making the light-emitting element 4811 emit light with a luminance in accordance with this current.

As a semiconductor element for driving the light-emitting element, a poly-silicon (p-Si) transistor is used. However, the poly-silicon transistor is likely to cause variation in electronic characteristics of a threshold voltage, an on current, mobility, or the like due to a defect in a crystal grain boundary. Even in a case where the same video signal is inputted when there is variation in the characteristics of the driving transistor 4801 in each pixel in the pixel shown in FIG. 48, there is variation in a luminance of the light-emitting element 4808 because the amount of the drain current of the driving transistor 4801 in accordance with the video signal is different.

On the other hand, with a current input system, the amount of a current supplied to a light-emitting element can be controlled without depending on characteristics of a transistor.

FIG. 49 is a diagram showing an example of a pixel structure in a display device where a current input system is applied (see Reference 2: Japanese Patent Application Laid-Open No. 2004-163673). A pixel shown in FIG. 49 includes a driving transistor 4901, first to third switching transistors 4902 to 4904, a storage capacitor 4905, a signal line 4906, first and second scanning lines 4907, 4908, first and second power supply lines 4909, 4910, and a light-emitting element 4911. A current source circuit 4912 is arranged in each signal line (each column).

First, the first and second switching transistors 4902 and 4903 are turned on by changing the potential of the first scanning line 4907. At this time, a video signal current flowing through the signal line 4906 is referred to as $I_{data}$. Since the first and second switching transistors 4902 and 4903 are turned on, the driving transistor 4901 is in a state of diode connection. Since the video signal current $I_{data}$ flows through the signal line 4906 at this time, current flows between both the electrodes of the storage capacitor 4905 and the electric charge is held in the storage capacitor 4905; thus, it begins to generate potential difference between both the electrodes. Then, gate potential of the driving transistor 4901 decreases; thus, current flows through a source from a drain. In the storage capacitor 4905, the storage of the electric charge is continued until the potential difference between both the electrodes, that is, the gate-source voltage of the driving transistor 4901 becomes a desired voltage. In other words, the storage of the electric charge is continued until an enough voltage for the driving transistor 4901 to make an $I_{data}$ current flow is obtained. Meanwhile, when the storage of the electric charge is finished, current does not flow through the storage capacitor 4905; thus, an enough gate-source voltage for the driving transistor 4901 to make an $I_{data}$ current flow is held in the storage capacitor 4905. Through the above operations, a writing operation of a signal to a pixel is completed. Lastly, with the selection of the first scanning line 4907 finished, the first and second switching transistors 4902 and 4903 are turned off.

Subsequently, the third switching transistors 4904 is turned on by changing the potential of the second scanning line 4908. Since the gate-source voltage, which is previously written, is held in the storage capacitor 4905, the driving transistor 4901 is turned on and a current equivalent to $I_{data}$ current flows from the first power supply line 4909. Accordingly, the light-emitting element 4911 emits light. At this time, the light-emitting current flowing through the light-emitting element 4911 flows without any change even the source-drain voltage of the driving transistor 4901 is changed, as long as the driving transistor 4901 is made to operate in a saturation region.

In such a manner, a current input system refers to a system for supplying the drain current of the driving transistor 4901 so as to be the same current value as the video signal current $I_{data}$ supplied in the current source circuit 4912 and making the light-emitting element 4911 emit light with a luminance in accordance with this drain current. By using the pixel of the above structure, a desired current can be applied to a light-emitting element by suppressing adverse effect of variation in characteristics of a transistor constituting a pixel.

However, in the pixel structure of the conventional current input system, it takes up much time to charge a parasitic capacitance or the like of a signal line by a video signal current $I_{data}$. In particular, in a case where it is desired to display a low gray scale, the video signal current $I_{data}$ becomes extremely low; therefore, the charge time of a parasitic capacitance or the like of a signal line is not sufficient against a horizontal scanning period; thus, a video signal becomes incapable of writing accurately.

In addition, in each of the conventional pixel circuits (FIG. 48 and FIG. 49), the storage capacitor is connected between the gate and the source of the driving transistor. However, in a case of forming this storage capacitor with a MOS transistor, a channel region is not evoked in the MOS transistor when a gate-source voltage of the MOS transistor becomes almost equivalent to the threshold voltage of the MOS transistor; therefore, the MOS transistor does not serve as a storage capacitor. As a result, a video signal cannot be held accurately.

In such a manner, with the conventional voltage input system, variation in a luminance is caused due to variation in electronic characteristics of a transistor, whereas with the conventional current input system, particularly in a low gray scale display, the charge time of a parasitic capacitance or the like of a signal line is not sufficient; thus, a video signal cannot be written accurately.

SUMMARY OF THE INVENTION

In view of the above problems, it is an object of the present invention to provide a display device capable of compensating variation in the threshold voltage, mobility, or the like of a transistor, sufficiently charging a signal line even in a case of a low gray scale display, and displaying an accurate gray scale, and a driving method using the display device.

According to one feature of the present invention, a display device, having a pixel provided with a light-emitting element, includes first to fifth transistors, first and second storage capacitors, a signal line, first to fourth scanning lines, first and second power supply lines, and a capacitor line in the pixel, where a gate electrode of the first transistor is electrically connected to a first electrode of the second transistor, a first electrode of the third transistor, a second electrode of the fourth transistor, and a first electrode of the second storage capacitor; a first electrode of the first transistor is electrically connected to the first power supply line; and a second electrode of the first transistor is electrically connected to a first electrode of the fourth transistor and a first electrode of the fifth transistor, where a gate electrode of the second transistor is electrically connected to the first scanning line, and a second electrode of the second transistor is electrically connected to the signal line, where a gate electrode of the third transistor is electrically connected to the second scanning line, and a second electrode of the third transistor is electrically connected to a first electrode of the first storage capacitor, where a gate electrode of the fourth transistor is electrically connected to the third scanning line, where a gate electrode of the fifth transistor is electrically connected to the fourth scanning line, and a second electrode of the fifth transistor is electrically connected to a first electrode of the light-emitting element, where a second electrode of the first storage capacitor is electrically connected to the capacitor line, where a second electrode of the second storage capacitor is electrically connected to the capacitor line, and where a second electrode of the light-emitting element is electrically connected to the second power supply line.

According to another feature of the present invention, a display device, having a pixel provided with a light-emitting element, includes first to sixth transistors, first and second storage capacitors, a signal line, first to fifth scanning lines, first to third power supply lines, and a capacitor line in the pixel, where a gate electrode of the first transistor is electrically connected to a first electrode of the second transistor, a first electrode of the third transistor, a second electrode of the fourth transistor, and a first electrode of the second storage capacitor; a first electrode of the first transistor is electrically connected to the first power supply line; and a second electrode of the first transistor is electrically connected to a first electrode of the fourth transistor, a first electrode of the fifth transistor, and a first electrode of the sixth transistor, where a gate electrode of the second transistor is electrically connected to the first scanning line, and a second electrode of the second transistor is electrically connected to the signal line, where a gate electrode of the third transistor is electrically connected to the second scanning line, and a second electrode of the third transistor is electrically connected to a first electrode of the first storage capacitor, where a gate electrode of the fourth transistor is electrically connected to the third scanning line, where a gate electrode of the fifth transistor is electrically connected to the fourth scanning line, and a second electrode of the fifth transistor is electrically connected to a first electrode of the light-emitting element, where a gate electrode of the sixth transistor is electrically connected to the fifth scanning line, and a second electrode of the sixth transistor is electrically connected to the third power supply line, where a second electrode of the first storage capacitor is electrically connected to the capacitor line, where a second electrode of the second storage capacitor is electrically connected to the capacitor line, and where a second electrode of the light-emitting element is electrically connected to the second power supply line.

According to another feature of the present invention, a display device, having a pixel provided with a light-emitting element, includes first to fifth transistors, first and second storage capacitors, a signal line, first to fourth scanning lines, first and second power supply lines, and a capacitor line in the pixel, where a gate electrode of the first transistor is electrically connected to a first electrode of the second transistor, a second electrode of the fourth transistor, and a first electrode of the first storage capacitor; a first electrode of the first transistor is electrically connected to the first power supply line; and a second electrode of the first transistor is electrically connected to a first electrode of the fourth transistor and a first electrode of the fifth transistor, where a gate electrode of the second transistor is electrically connected to the first scanning line, and a second electrode of the second transistor is electrically connected to the signal line, where a gate electrode of the third transistor is electrically connected to the second scanning line, a first electrode of the third transistor is electrically connected to a second electrode of the first storage capacitor and a first electrode of the second storage capacitor, and a second electrode of the third transistor is electrically connected to the capacitor line, where a gate electrode of the fourth transistor is electrically connected to the third scanning line, where a gate electrode of the fifth transistor is electrically connected to the fourth scanning line, and a second electrode of the fifth transistor is electrically connected to a first electrode of the light-emitting element, where a second electrode of the second storage capacitor is electrically connected to the capacitor line, and where a second electrode of the light-emitting element is electrically connected to the second power supply line.

According to another feature of the present invention, a display device, having a pixel provided with a light-emitting element, includes first to sixth transistors, first and second storage capacitors, a signal line, first to fifth scanning lines, first to third power supply lines, and a capacitor line in the pixel, where a gate electrode of the first transistor is electrically connected to a first electrode of the second transistor, a second electrode of the fourth transistor, and a first electrode of the first storage capacitor; a first electrode of the first transistor is electrically connected to the first power supply line; and a second electrode of the first transistor is electrically connected to a first electrode of the fourth transistor, a first electrode of the fifth transistor, and a first electrode of the sixth transistor, where a gate electrode of the second transistor is electrically connected to the first scanning line, and a second electrode of the second transistor is electrically connected to the signal line, where a gate electrode of the third transistor is electrically connected to the second scanning line, a first electrode of the third transistor is electrically connected to a second electrode of the first storage capacitor and a first electrode of the second storage capacitor, and a second electrode of the third transistor is electrically connected to the capacitor line, where a gate electrode of the fourth transistor is electrically connected to the third scanning line, where a gate electrode of the fifth transistor is electrically connected to the fourth scanning line, and a second electrode of the fifth transistor is electrically connected to a first electrode of the light-emitting element, where a gate electrode of the sixth transistor is electrically connected to the fifth scanning line, and a second electrode of the sixth transistor is electrically connected to the third power supply line, where a second electrode of the second storage capacitor is electrically connected to the capacitor line, and where a second electrode of the light-emitting element is electrically connected to the second power supply line.

According to another feature of the present invention, a display device, having a pixel provided with a light-emitting element, includes first to fourth transistors, first and second storage capacitors, a signal line, first to third scanning lines, first and second power supply lines, and a capacitor line in the pixel, where a gate electrode of the first transistor is electrically connected to a first electrode of the second transistor, a first electrode of the third transistor, a second electrode of the fourth transistor, and a first electrode of the second storage capacitor; a first electrode of the first transistor is electrically connected to the first power supply line; and a second electrode of the first transistor is electrically connected to a first electrode of the fourth transistor and a first electrode of the light-emitting element, where a gate electrode of the second transistor is electrically connected to the first scanning line, and a second electrode of the second transistor is electrically connected to the signal line, where a gate electrode of the third transistor is electrically connected to the second scanning line, and a second electrode of the third transistor is electrically connected to a first electrode of the first storage capacitor, where a gate electrode of the fourth transistor is electrically connected to the third scanning line, where a second electrode of the first storage capacitor is electrically connected to the capacitor line, where a second electrode of the second storage capacitor is electrically connected to the capacitor line, and where a second electrode of the light-emitting element is electrically connected to the second power supply line.

According to another feature of the present invention, a display device, having a pixel provided with a light-emitting element, includes first to fourth transistors, first and second storage capacitors, a signal line, first to third scanning lines, first and second power supply lines, and a capacitor line in the pixel, where a gate electrode of the first transistor is electrically connected to a first electrode of the second transistor, a second electrode of the fourth transistor, and a first electrode of the first storage capacitor; a first electrode of the first transistor is electrically connected to the first power supply line; and a second electrode of the first transistor is electrically connected to a first electrode of the fourth transistor and a first electrode of the light-emitting element, where a gate electrode of the second transistor is electrically connected to the first scanning line, and a second electrode of the second transistor is electrically connected to the signal line, where a gate electrode of the third transistor is electrically connected to the second scanning line, a first electrode of the third transistor is electrically connected to a second electrode of the first storage capacitor and a first electrode of the second storage capacitor, and a second electrode of the third transistor is electrically connected to the capacitor line, where a gate electrode of the fourth transistor is electrically connected to the third scanning line, where a second electrode of the second storage capacitor is electrically connected to the capacitor line, and where a second electrode of the light-emitting element is electrically connected to the second power supply line.

Note that, in each display device of the present invention, the second transistor and the third transistor each may have a conductive type which is mutually different. In addition, the fourth transistor and the fifth transistor each may have a conductive type which is mutually different.

According to another feature of the present invention, a method for driving a display device, having a pixel provided with a light-emitting element, and having at least first and second transistors, first and second storage capacitors, a signal line, and first and second power supply lines in the pixel, where a first electrode of the second transistor is electrically connected to a second electrode of the first transistor and a first electrode of the light-emitting element, and a second electrode of the second transistor is electrically connected to a gate electrode of the first transistor and the signal line, and where the first and second storage capacitors are connected to each other in parallel, including the first to third steps of having convergence of a voltage between both of electrodes of the first and second storage capacitors into a voltage corresponding to a difference between a voltage applied to the first power supply line and a threshold voltage of the first transistor; having convergence of a voltage between both of the electrodes of the second storage capacitors into a voltage corresponding to a difference between a voltage applied to the first power supply line and a gate-source voltage of the first transistor, which is necessary to supply the light-emitting element with a current equivalent to a video signal current inputted into the signal line; and applying, to the gate electrode of the first transistor, a voltage based on a voltage corresponding to a difference between the first power supply line and the threshold voltage, and a voltage corresponding to a difference between the first power supply line and the gate-source voltage, supplying the light-emitting element with a current through the first transistor, and emitting light, where the second transistor is in a conductive state in the first and second steps, and the second transistor is in a non-conductive state in the third step.

According to another feature of the present invention, a method for driving a display device, having a pixel provided with a light-emitting element, and having at least first and second transistors, first and second storage capacitors, a signal line, and first and second power supply lines in the pixel, where a first electrode of the second transistor is electrically connected to a second electrode of the first transistor and a first electrode of the light-emitting element, and a second electrode of the second transistor is electrically connected to a gate electrode of the first transistor and the signal line, where the first and second storage capacitors are connected to each other in series, including the first to third steps of having convergence of a voltage between both of electrodes of the first storage capacitor into a voltage corresponding to a difference between a voltage applied to the first power supply line and a threshold voltage of the first transistor; having convergence of each voltage between both of electrodes of the first and second storage capacitors into a voltage based on a voltage corresponding to a difference between a voltage applied to the first power supply line and a gate-source voltage of the first transistor, which is necessary to supply the light-emitting element with a current equivalent to a video signal current inputted into the signal line; and applying, to the gate electrode of the first transistor, a voltage equivalent to a voltage held between both of the electrodes of the first storage capacitor, supplying the light-emitting element with a current through the first transistor, and emitting light, where the second transistor is in a conductive state in the first and second steps, and the second transistor is in a non-conductive state in the third step.

Note that, in each method for driving a display device, the voltage to be applied to the second power supply line is different in the first and second steps, and the third step.

According to another feature of the present invention, a method for driving a display device, having a pixel provided with a light-emitting element, and having at least first and second transistors, first and second storage capacitors, a signal line, first to third power supply lines, and a capacitor line in the pixel, where a first electrode of the second transistor is electrically connected to a second electrode of the first transistor and a first electrode of the light-emitting element, and a second electrode of the second transistor is electrically connected to a gate electrode of the first transistor and the signal line, and where the first and second storage capacitors are connected to each other in parallel, including the first to fourth steps of having convergence of each voltage between both of electrodes of the first and second storage capacitors into a voltage corresponding to a difference between a voltage applied to the third power supply line and a voltage applied to the capacitor line; having convergence of each voltage between both of the electrodes of the first and second storage capacitors into a voltage corresponding to a difference between a voltage applied to the first power supply line and a threshold voltage of the first transistor; having convergence of a voltage between both of the electrodes of the second storage capacitors into a voltage corresponding to a difference between the voltage applied to the first supply line and a gate-source voltage of the first transistor, which is necessary to supply the light-emitting element with a current equivalent to a video signal current inputted into the signal line; and applying, to the gate electrode of the first transistor, a voltage based on a voltage corresponding to a difference between the first power supply line and the threshold voltage, and a voltage corresponding to a difference between the first power supply line and the gate-source voltage, supplying the light-emitting element with a current through the first transistor, and emitting light, where the second transistor is in a conductive state in the first to third steps, and the second transistor is in a non-conductive state in the fourth step.

According to another feature of the present invention, a method for driving a display device, having a pixel provided with a light-emitting element, and having at least first and second transistors, first and second storage capacitors, a signal line, first to third power supply lines, and a capacitor line in the pixel, where a first electrode of the second transistor is electrically connected to a second electrode of the first transistor and a first electrode of the light-emitting element, and a second electrode of the second transistor is electrically connected to a gate electrode of the first transistor and the signal line, and where the first and second storage capacitors are connected to each other in series, including the first to fourth steps of having convergence of each voltage between both of electrodes of the first and second storage capacitors into a voltage corresponding to a difference between a voltage applied to the third power supply line and a voltage applied to the capacitor line; having convergence of a voltage between both of the electrodes of the first storage capacitor into a voltage corresponding to a difference between a voltage applied to the first power supply line and a threshold voltage of the first transistor; having convergence of each voltage between both of the electrodes of the first and second storage capacitors into a voltage based on a voltage corresponding to a difference between the voltage applied to the first supply line and a gate-source voltage of the first transistor, which is necessary to supply the light-emitting element with a current equivalent to a video signal current inputted into the signal line; and applying, to the gate electrode of the first transistor, a voltage equivalent to a voltage held between both of the electrodes of the first storage capacitor, supplying the light-emitting element with a current through the first transistor, and emitting light, where the second transistor is in a conductive state in the first to third steps, and the second transistor is in a non-conductive state in the fourth step.

Note that, in each method for driving a display device, the voltage to be applied to the second power supply line is different in the first to third steps, and the fourth step.

Note that it is difficult to distinguish between a source and a drain because of a structure of a transistor. Further, there is also a case where the height of potential is switched depending on an operation of a circuit. Therefore, in this specification, without particularly limited, a source and a drain are each referred to as a first electrode or a second electrode. For example, when the first electrode is a source, the second electrode refers to a drain, and on the other hand, when the first electrode is a drain, the second electrode refers to a source.

Note that, in the present invention, one pixel shows one color element. Therefore, in a case of a color display device including color elements of R (red), G (green), and B (blue), a minimum unit of an image includes three pixels of R, G, and B. Note that the color element is not limited to three colors and three or more colors may be used or a color other than RGB may also be used. For example, R, G, B, and W (white) may also be employed by adding white. In addition, R, G and B added with one or more colors of yellow, cyan, magenta, and the like may also be employed, for example. Moreover, for example, as for at least one color of RGB, a similar color may also be added. For example, R, G, B1, and B2 may be used. Both B1 and B2 are blue but have a different wavelength. By using such a color element, it is possible to perform display that is much similar to the real and to reduce power consumption. Note that brightness of one color element may be controlled by using a plurality of regions. In this case, one color element is considered as one pixel, and each region where brightness thereof is controlled is considered as a sub-pixel. Thus, for example, in a case of performing an area gray scale, there is a plurality of regions where brightness is controlled per one color element and a gray scale is expressed in the whole region, and each region where brightness is controlled is considered as a sub-pixel. Thus, in this case, one color element includes a plurality of sub-pixels. In addition, in this case, the size of a region that contributes to display may be different depending on a sub-pixel. Moreover, in a region where a plurality of brightness is controlled per one color element, that is, a plurality of sub-pixels that constitutes one color element, a viewing angle may be expanded so that a signal supplied to each is slightly made different.

Note that, in the present invention, a pixel includes a case where pixels are arranged in matrix. Here, "pixels are arranged in matrix" includes a case of an arrangement in which pixels are arranged in a row on a straight line in a perpendicular direction or a horizontal direction, or a case of an arrangement in which pixels are arranged in a raw on a notched line. Thus, in a case where dots of three color elements have a so-called delta arrangement when full color display is performed using three color elements (for example, R, G, and B), and further a case of Bayer arrangement.

Note that, in the present invention, a transistor of various modes can be applied. Thus, a type of transistor that can be applied is not limited. Therefore, a thin film transistor (TFT) having a non-single crystalline semiconductor film typified by amorphous silicon or polycrystalline silicon, or the like can be applied. Accordingly, a display device can be manufactured even when a manufacturing temperature is not high or with a low cost, over a large-sized substrate or a transparent substrate, or by transmitting light through the transistor. In addition, a MOS transistor, which is formed using a semiconductor substrate or an SOI substrate, a junction transistor, a bipolar transistor, or the like can be applied. Accordingly, a transistor with less variation can be manufactured, a transistor having high current supply capacity can be manufactured, a transistor small in size can be manufactured, or a circuit with low power consumption can be formed. In addition, a transistor using a compound semiconductor such as ZnO, a-In-GaZnO, SiGe, or GaAs, further a thin film transistor thinning the transistor or the like can be applied. Accordingly, a display device can be manufactured even when a manufacturing temperature is not high or at a room temperature, or by forming a transistor directly on a substrate having low heat resistance, for example, a plastic substrate or a film substrate. In addition, such a transistor that is manufactured using an ink-jet or a printing method can be applied. Accordingly, a display device can be manufactured at a room temperature, in a low degree of a vacuum, or with a large-sized substrate. Moreover, a display device can be manufactured without using a mask (a reticle); therefore, a layout of a transistor can be changed easily. Further, a transistor using an organic semiconductor or a carbon nanotube, or other transistors can be applied. Accordingly, a transistor can be formed over a flexible substrate. Note that hydrogen or halogen may also be contained in the non-single crystalline semiconductor film. In addition, various substrates can be used as a type of substrate where a transistor is disposed, and the substrate is not limited to a specific one. Thus, a transistor can be disposed over a single-crystalline substrate, an SOI substrate, a glass substrate, a quartz substrate, a plastic substrate, a paper substrate, a cellophane substrate, a stone material substrate, a stainless steel substrate, a substrate having stainless steel foil, or the like, for example. Furthermore, a transistor may also be formed over one substrate and thereafter the transistor is moved to another substrate to be disposed over another substrate. By using these substrates, a transistor having a preferable characteristic can be formed, a transistor with low power consumption can be formed, a device unlikely to break can be obtained, or heat resistance can be given to a transistor.

Note that, as for the switches described in the present invention, one in various modes can be used, and there are, for example, an electrical switch, a mechanical switch, and the like. In other words, the switches are not particularly limited as long as current flow can be controlled and various switches can be used. For example, the switches may be a transistor, a diode (for example, a PN diode, a PIN diode, a Schottky diode, a transistor connected as a diode, or the like), a thyristor, or a logic circuit that is a combination thereof. Thus, in a case of using a transistor as the switch, the transistor operates as a mere switch; therefore, the polarity (conductivity type) of the transistor is not particularly limited. However, in a case where lower off-current is desired, it is desirable to use a transistor having a polarity with lower off-current. As the transistor with low off-current, a transistor provided with an LDD region, a transistor having a multi-gate structure, or the like can be used. In addition, it is desirable to use an N-channel transistor when a transistor to be operated as a switch operates in a state where potential of a source terminal thereof is close to a lower potential side power supply (such as VSS, GND, or 0 V), whereas it is desirable to use a P-channel transistor when a transistor operates in a state where potential of a source terminal thereof is close to a higher potential side power supply (such as VDD). This is because the absolute value of a gate-source voltage can be increased, and the transistor easily operates as a switch. Note that the switch may be of a CMOS type using both the N-channel transistor and the P-channel transistor When the CMOS-type switch is employed, it is possible to make current flow, if a switch of either a P-channel type or an N-channel type is conducted. Therefore, a transistor serves as a switch easily. For example, a voltage can be appropriately outputted even when a voltage of an input signal into a switch is high or low. In addition, since a voltage amplitude value of a signal for turning a switch on or off can be lowered, power consumption can be reduced.

Note that, in the present invention, the description of "being formed over a certain object" does not necessarily refer to "being in direct contact with the certain object." This includes a case where there is no direct contact, that is, a case where another object is interposed therebetween. Therefore, for example, a case where a layer B is formed over a layer A includes a case where the layer B is formed on the layer A to be in direct contact therewith and a case where another layer (for example, a layer C, a layer D, or the like) is formed on the layer A to be in direct contact therewith and the layer B is formed thereon to be in direct contact therewith. In addition, the same can be said for the description of "above a certain object," which does not necessarily refer to "being in direct contact with the certain object," and a case where another object is interposed therebetween is included. Therefore, for example, a case where a layer B is formed above a layer A includes a case where the layer B is formed on the layer A to be in direct contact therewith and a case where another layer (for example, a layer C, a layer D, or the like) is formed on the layer A to be in direct contact therewith and the layer B is formed thereon to be in direct contact therewith. Note that the same can be said for the description of "under a certain object" or "below a certain object," which includes a case where there is direct contact and there is no direct contact.

Note that a display device of the present invention can be manufactured by using various modes or having various display elements. For example, a display medium in which contrast varies by an electromagnetic action can be applied, such as an EL element (such as an organic EL element, an inorganic EL element, or an EL element containing an organic material and an inorganic material), an electron-emitting element, a liquid crystal element, electronic ink, a grating light valve (GLV), a plasma display panel (PDP), a digital micromirror device (DMD), a piezoelectric ceramic display, or a carbon nanotube. Note that an EL display is used as a display device using the EL element; a field emission display (FED), an SED (Surface-conduction Electron-emitter Display) type flat display, or the like is used as a display device using the electron-emitting element; a liquid crystal display, a transmissive liquid crystal display, a semi-transmissive liquid crystal display, or a reflective liquid crystal display is used as a display device using the liquid crystal element; and an electronic paper is used as a display device using the electronic ink.

Note that the light-emitting element in the present invention refers to an element capable of controlling a light-emission luminance depending on a value of current flowing through the element. Typically, an EL element can be applied. Besides the EL element, for example, a light-emitting element such as an element used in a field emission display (field emission display) or an SED (Surface-conduction Electron-emitter Display) which is one type of FED can be applied.

Note that, in the present invention, "being connected" is synonymous with being electrically connected. Therefore, in a structure disclosed by the present invention, in addition to a predetermined connection relation, other elements that enable electrical connection therebetween (for example, other element, switch, or the like) may also be disposed.

Since the display device of the present invention is capable of controlling current flowing through a light-emitting element, a signal line can be sufficiently charged within one horizontal scanning period. Accordingly, a display can be performed accurately even in a case where a low gray scale is displayed. In addition, since the current flowing through a light-emitting element is determined without depending on the threshold voltage or mobility of a transistor, variation in the threshold voltage or mobility of a transistor can be compensated. Accordingly, variation in a luminance of a light-emitting element can be reduced; thus, image quality can be improved.

BRIEF DESCRIPTION OF THE DRAWINGS

In the accompanying drawings:

FIGS. 33A and 33B are views each showing an example of a structure of a display device of the present invention;

FIGS. 34A and 34B are views each showing an example of a structure of a display device of the present invention;

FIGS. 37A-1 to 37D-1 and FIGS. 37A-2 to 37D-2 are views each showing a manufacturing method of a transistor used for a display device of the present invention;

FIGS. 38A-1 to 38C-1 and FIGS. 38A-2 to 38C-2 are views each showing a manufacturing method of a transistor used for a display device of the present invention;

FIGS. 39A-1 to 39D-1 and FIGS. 39A-2 to 39D-2 are views each showing a manufacturing method of a transistor used for a display device of the present invention;

FIGS. 40A-1 to 40D-1 and FIGS. 40A-2 to 40D-2 are views each showing a manufacturing method of a transistor used for a display device of the present invention;

FIGS. 41A-1 to 41D-1 and FIGS. 41A-2 to 41D-2 are views each showing a manufacturing method of a transistor used for a display device of the present invention;

FIGS. 42A-1, 42B-1, 42A-2, and 42B-2 are views each showing a manufacturing method of a transistor used for a display device of the present invention;

FIGS. 79A and 79B are views each showing an example of a structure of a display panel used for a display device of the present invention;

FIG. 82 is a view showing an example of a structure of a display device of the present invention;

FIGS. 83A and 83B are views each showing an example of a structure of a display device of the present invention;

FIGS. 84A and 84B are views each showing an example of a structure of a display device of the present invention;

FIGS. 85A and 85B are views each showing an example of a structure of a display device of the present invention;

DETAILED DESCRIPTION OF THE INVENTION

Hereinafter, embodiment modes of the present invention will be explained with reference to the accompanying drawings. However, it is to be easily understood that various changes and modifications will be apparent to those skilled in the art. Therefore, unless such changes and modifications depart from the purport and the scope of the present invention, they should be construed as being included therein.

Embodiment Mode 1

First, a basic structure of a pixel circuit in a display device of this embodiment mode will be explained with reference to FIG. 1. Note that the explanation will be given by exemplifying an EL element as a light-emitting element.

Figure 1:
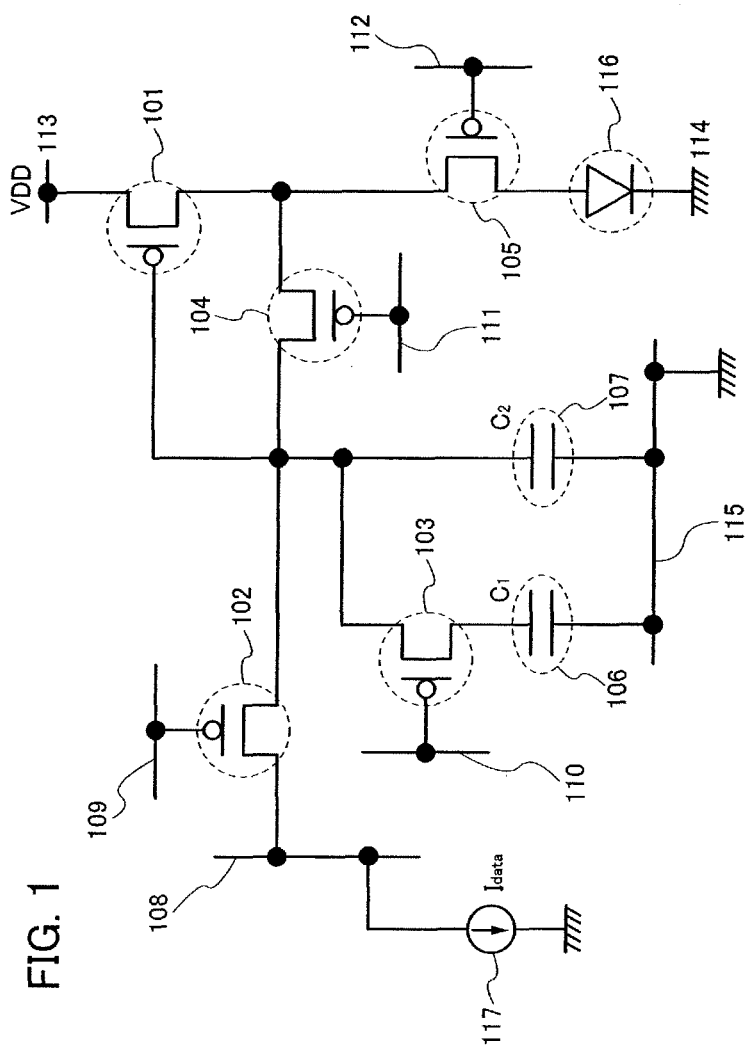
FIG. 1 is a diagram showing an example of a pixel structure in a display device of the present invention.

FIG. 1 is a diagram showing a circuit diagram of a pixel circuit of this embodiment mode. The pixel circuit of this embodiment mode includes first to fifth transistors 101 to 105, first and second storage capacitors 106 and 107, a signal line 108, first to fourth scanning lines 109 to 112, first and second power supply lines 113 and 114, a capacitor line 115, a light-emitting element 116, and a current source circuit 117. Note that the current source circuit 117 is arranged in each signal line (each column).

Note that, in the pixel circuit shown in FIG. 1, all of the transistors 101 to 105 are p-channel types.

A gate electrode of the first transistor 101 is connected to a first electrode of the second transistor 102, a first electrode of the third transistor 103, a second electrode of the fourth transistor 104, and a first electrode of the second storage capacitor 107; a first electrode of the first transistor is connected to the first power supply line 113; and a second electrode of the first transistor is connected to a first electrode of the fourth transistor 104 and a first electrode of the fifth transistor 105. A gate electrode of the second transistor 102 is connected to the first scanning line 109, and a second electrode of the second transistor is connected to the signal line 108. A gate electrode of the third transistor 103 is connected to the second scanning line 110, and a second electrode of the third transistor is connected to a first electrode of the first storage capacitor 106. A gate electrode of the fourth transistor 104 is connected to the third scanning line 111. A gate electrode of the fifth transistor 105 is connected to the fourth scanning line 112, and a second electrode of the fifth transistor is connected to a first electrode of the light-emitting element 116. A second electrode of the first storage capacitor 106 is connected to the capacitor line 115. A second electrode of the second storage capacitor 107 is connected to the capacitor line 115. A second electrode of the light-emitting element 116 is connected to the second power supply line 114.

Next, an operation of the pixel circuit of this embodiment mode will be explained with reference to FIGS. 2 to 5.

Figure 2:
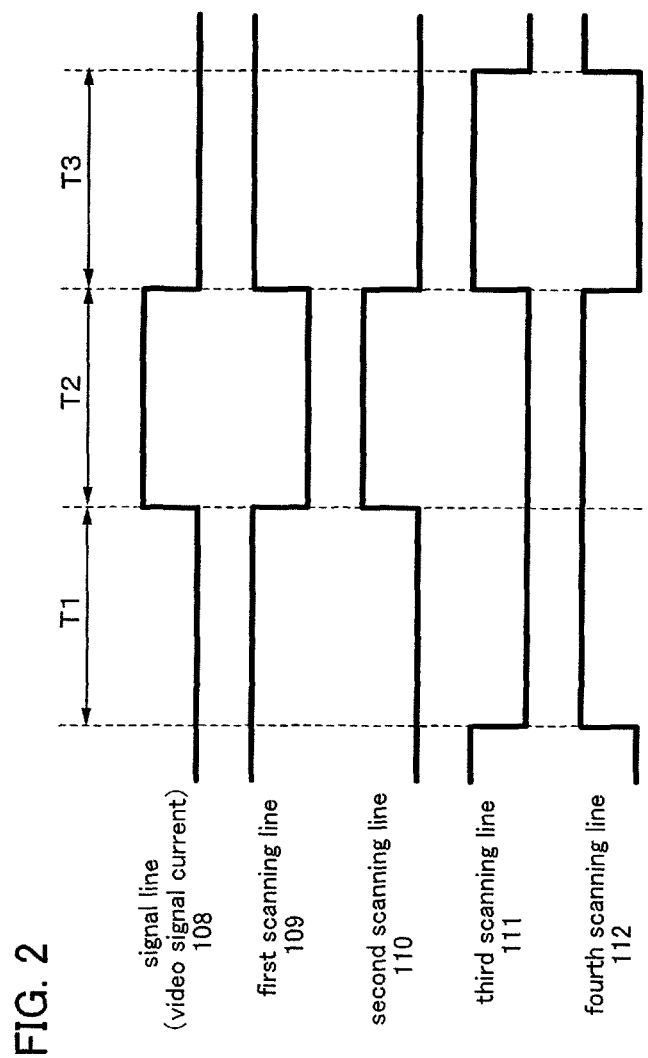
FIG. 2 is a diagram explaining an operation of a pixel circuit in a display device of the present invention.

FIG. 2 shows timing of a video signal current and pulses inputted into the signal line 108 and the first to fourth scanning lines 109 to 112. An operation cycle of the pixel circuit is divided into three periods of first to third periods T1 to T3, in accordance with each operation of pixel circuits shown in FIGS. 3 to 5.

Figure 3:
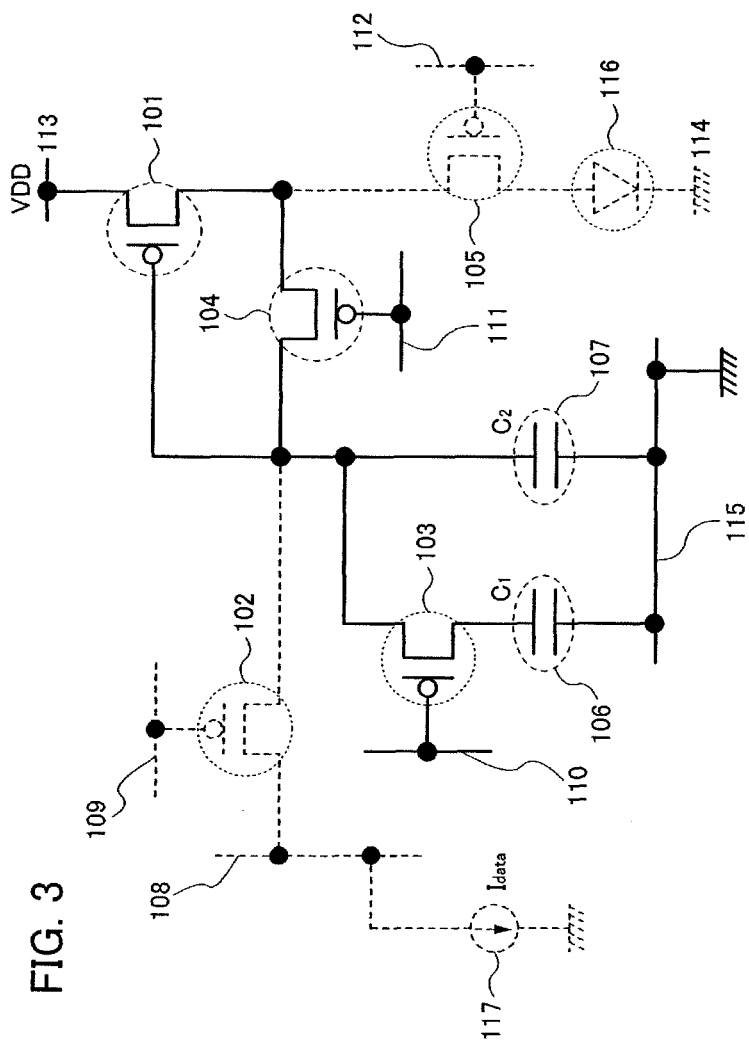
FIG. 3 is a diagram explaining an operation of a pixel circuit in a display device of the present invention.
Figure 4:
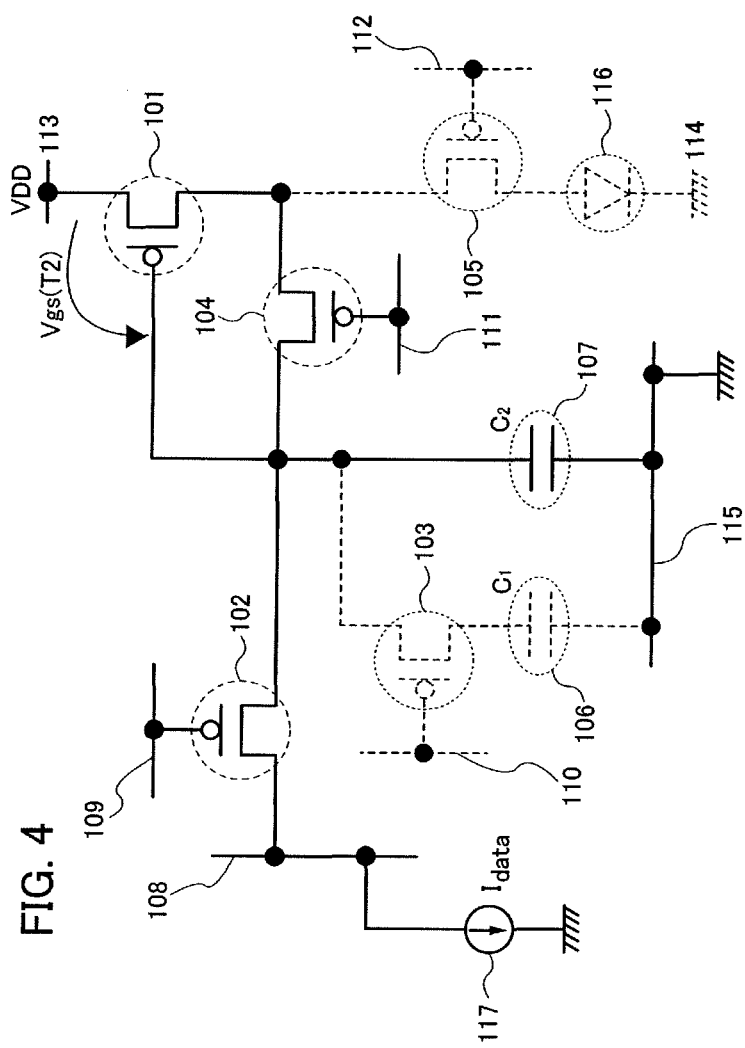
FIG. 4 is a diagram explaining an operation of a pixel circuit in a display device of the present invention.
Figure 5:
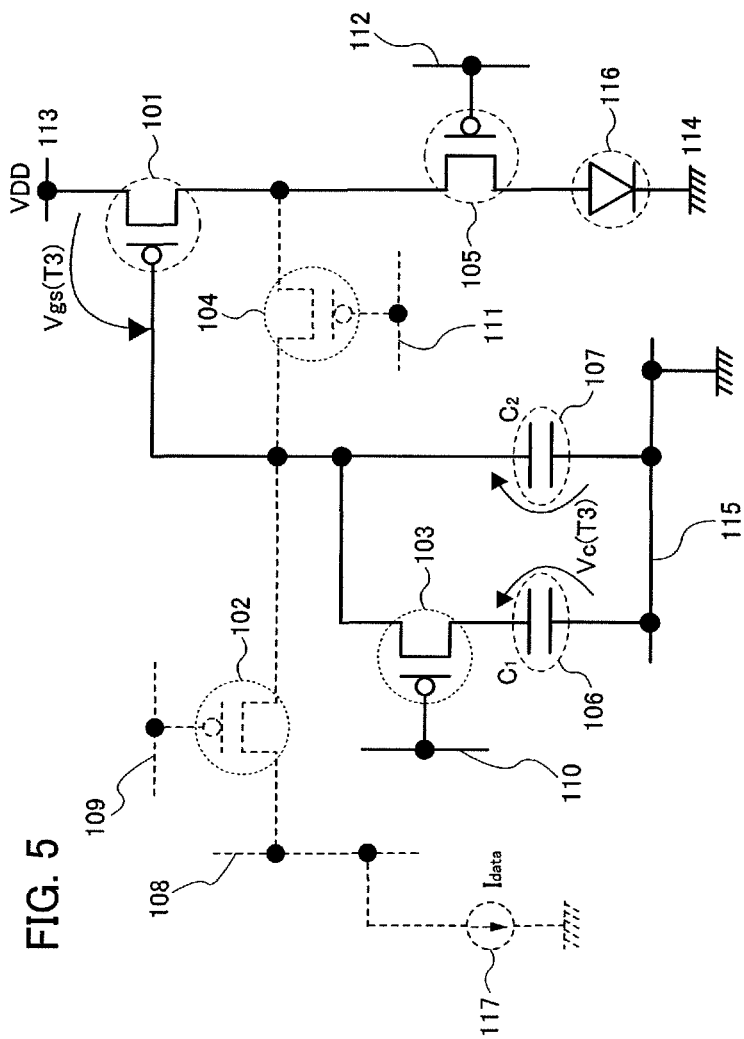
FIG. 5 is a diagram explaining an operation of a pixel circuit in a display device of the present invention.

FIGS. 3 to 5 are diagrams each showing a connection state of the pixel circuit of this embodiment mode in each period. Note that, in FIGS. 3 to 5, it shows that the place shown in a solid line is in a conductive state, whereas the place shown in a broken line is in a non-conductive state.

First, the operation of the pixel circuit in the first period T1 will be explained with reference to FIG. 3. FIG. 3 is a diagram showing a connection state of the pixel circuit in the first period T1. In the first period T1, the second and third scanning lines 110 and 111 are in an L level; thus, the third and fourth transistors 103 and 104 are turned on. In addition, the first and fourth scanning lines 109 and 112 are in an H level; thus, the second and fifth transistors 102 and 105 are turned off. Accordingly, the first transistor 101 becomes a diode-connected state, and current flows through the first and second storage capacitors 106 and 107, which are connected in parallel; thus, both the first and second storage capacitors 106 and 107 are charged. The first and second storage capacitors 106 and 107 are charged until a voltage held in the first and second storage capacitors 106 and 107 becomes a voltage corresponding to a difference between a power supply voltage VDD and the threshold voltage $|V_{th}|$ of the first transistor 101, that is, VDD$-|V_{th}|$. When the voltage held in the first and second storage capacitors 106 and 107 becomes VDD$-|V_{th}|$, the first transistor 101 is turned off and current does not flow through the first and second storage capacitors 106 and 107.

Through the above operations, in the first period T1, the threshold voltage $|V_{th}|$ of the first transistor 101 is held in the first and second storage capacitors 106 and 107.

Next, the operation of the pixel circuit in the second period T2 will be explained with reference to FIG. 4. FIG. 4 is a diagram showing a connection state of the pixel circuit in the second period T2. In the second period T2, the first and third scanning lines 109 and 111 are in an L level; thus, the second and fourth transistors 102 and 104 are turned on. In addition, the second and fourth scanning lines 110 and 112 are in an H level; thus, the third and fifth transistors 103 and 105 are turned off. Moreover, a video signal current $I_{data}$ flows through the signal line 108 from the current source circuit 117. Accordingly, the first transistor 101 becomes a diode-connected state, and current flows through the second storage capacitor 107; thus, the second storage capacitor 107 is charged. At this time, the video signal current $I_{data}$ flows through the signal line 108; therefore, $I_{data}$ flows through the drain and source of the first transistor 101. Therefore, a gate-source voltage of the first transistor 101 is a voltage necessary for the first transistor 101 to make $I_{data}$ flow. When the gate-source voltage of the first transistor 101 at this time is considered as $V_{gs}(T2)$, the video signal current $I_{data}$ is expressed as the following equation (1). The gate-source voltage of the first transistor 101 $V_{gs}(T2)$ in the period T2 is expressed as the following equation (2).

$$I_{data} = \frac{\beta}{2}(|V_{gs}(T2)| - |V_{th}|)^2 \quad (1)$$

$$|V_{gs}(T2)| = |V_{th}| + \sqrt{\frac{2I_{data}}{\beta}} \quad (2)$$

However, β is a constant given by mobility or a size of a transistor, capacitance of an oxide film, or the like.

The second storage capacitor 107 is charged until a voltage held in the second storage capacitor 107 becomes a voltage corresponding to a difference between a power supply voltage VDD and the gate-source voltage $|V_{gs}(T2)|$ of the first transistor 101, that is, VDD$-|V_{gs}(T2)|$. When the voltage held in the second storage capacitor 107 becomes VDD$-|V_{gs}(T2)|$, the first transistor 101 is turned off and current does not flow through the second storage capacitor 107. Since the first electrode of the first storage capacitor 106 is in a floating state, the voltage VDD$-|V_{th}|$ held in the first period T1 is held without any change.

Through the above operations, in the second period T2, the gate-source voltage $|V_{gs}(T2)|$ necessary for the first transistor 101 to make the video signal current $I_{data}$ flow is held in the second storage capacitor 107.

Next, the operation of the pixel circuit in the third period T3 will be explained with reference to FIG. 5. FIG. 5 is a diagram showing a connection state of the pixel circuit in the third period T3. In the third period T3, the second and fourth scanning lines 110 and 112 are in an L level; thus, the third and fifth transistors 103 and 105 are turned on. In addition, the first and third scanning lines 109 and 111 are in an H level; thus, the second and fourth transistors 102 and 104 are turned off. Accordingly, first, the first and second storage capacitors 106 and 107 are connected in parallel. When the voltage held in the first and second storage capacitors 106 and 107 at this time is considered as $V_c$ (T3), $V_c$ (T3) is expressed as the following equation (3).

$$V_C(T3) = VDD - \frac{C_1}{C_1+C_2}|V_{th}| - \frac{C_2}{C_1+C_2}|V_{gs}(T2)| \quad (3)$$

Note that $C_1$ expresses capacitance of the first storage capacitor 106, and $C_2$ expresses capacitance of the second storage capacitor 107.

In the gate electrode of the first transistor 101, a voltage $|V_c$ (T3)| held in the first and second storage capacitors 106 and 107 is added. Therefore, when a gate-source voltage of the first transistor 101 in the period T3 is considered as $V_{gs}$ (T3), $V_{gs}$ (T3) is expressed as the following equation (4). Note that, since an electric charge is distributed by connecting the first and second storage capacitors 106 and 107 in parallel in the period T3, the gate-source voltage $|V_{gs}$ (T3)| of the first transistor 101 in the period T3 is lower than the gate-source voltage $|V_{gs}$ (T2)| of the first transistor 101 in the period T2.

$$|V_{gs}(T3)| = VDD - V_C(T3) \quad (4)$$
$$= \frac{C_1}{C_1+C_2}|V_{th}| + \frac{C_2}{C_1+C_2}|V_{gs}(T2)|$$

Therefore, a current $I_{OLED}$ flowing through the drain and source of the first transistor 101 is expressed as the following equation (5), and this current flows through the light-emitting element 116, through the fifth transistor 105; thus, the light-emitting element 116 emits light. Note that, since the gate-source voltage of the first transistor 101 in the period T3 is lower than that in the period T2, a current $I_{OLED}$ flowing through the drain and source of the first transistor 101 in the period T3 is lower than the current $I_{data}$ flowing through the drain and source of the first transistor 101 in the period T2.

$$I_{OLED} = \frac{\beta}{2}(|V_{gs}(T3)| - |V_{th}|)^2 = \left(\frac{C_2}{C_1+C_2}\right)^2 I_{data} \quad (5)$$

Through the above operations, in the third period T3, the current $I_{OLED}$ lower than the video signal current $I_{data}$ flows through the light-emitting element 116; thus, the light-emitting element 116 emits light.

As described in the equation (5), the current $I_{OLED}$ flowing through the light-emitting element 116 is expressed without depending on the threshold voltage $V_{th}$ or mobility (included in the constant β) of the first transistor 101; therefore, variation in the threshold voltage or mobility of the transistor can be compensated.

In addition, since the current $I_{OLED}$ flowing through the light-emitting element 116 is a value approximately $[C_2/(C_1+C_2)]^2$ times as low as the video signal current $I_{data}$, it is possible to make a current which is $[(C_1+C_2)/C_2]^2$ times as high as the current $I_{OLED}$ flow as the video signal current $I_{data}$. Accordingly, wiring capacitance of a signal line can be suf-ficiently charged within one horizontal scanning period; thus, a display can be performed accurately even in a case where a low gray scale is displayed.

Moreover, the current $I_{OLED}$ flowing through the light-emitting element 116 depends on a capacitance ratio of the first and second storage capacitors 106 and 107, and when the capacitance ratio is constant, $I_{OLED}$ is also constant. Here, since the first and second storage capacitors are generally formed in the same process, an error in capacitance is almost the same ratio in the first and second storage capacitors 106 and 107, even when misalignment of a mask pattern is caused during manufacturing the display device. Therefore, even in a case of a manufacturing error, it is possible to maintain a substantially constant value of a value $[C_1/(C_1+C_2)]$, and to maintain a substantially constant value of $I_{OLED}$.

Through the above, according to the pixel structure of this embodiment mode, variation in the threshold value of a transistor can be compensated to reduce variation in a luminance; therefore, image quality can be improved.

Note that the potential of the second power supply line and the capacitor line is ground potential (GND) in FIG. 1; however, the present invention is not limited thereto. Any potential is acceptable as long as the potential is lower than VDD−$|V_{th}|$ which is a difference between the power supply voltage VDD and the threshold voltage $|V_{th}|$ of the first transistor 101.

Note that, in this embodiment mode, the storage capacitor may be formed of metal or a MOS transistor. In particular, when the storage capacitor is formed of a MOS transistor, an occupation area of the storage capacitor can be reduced more than in a case where the storage capacitor is formed of metal; thus, an aperture ratio of a pixel can be increased.

Figure 67:
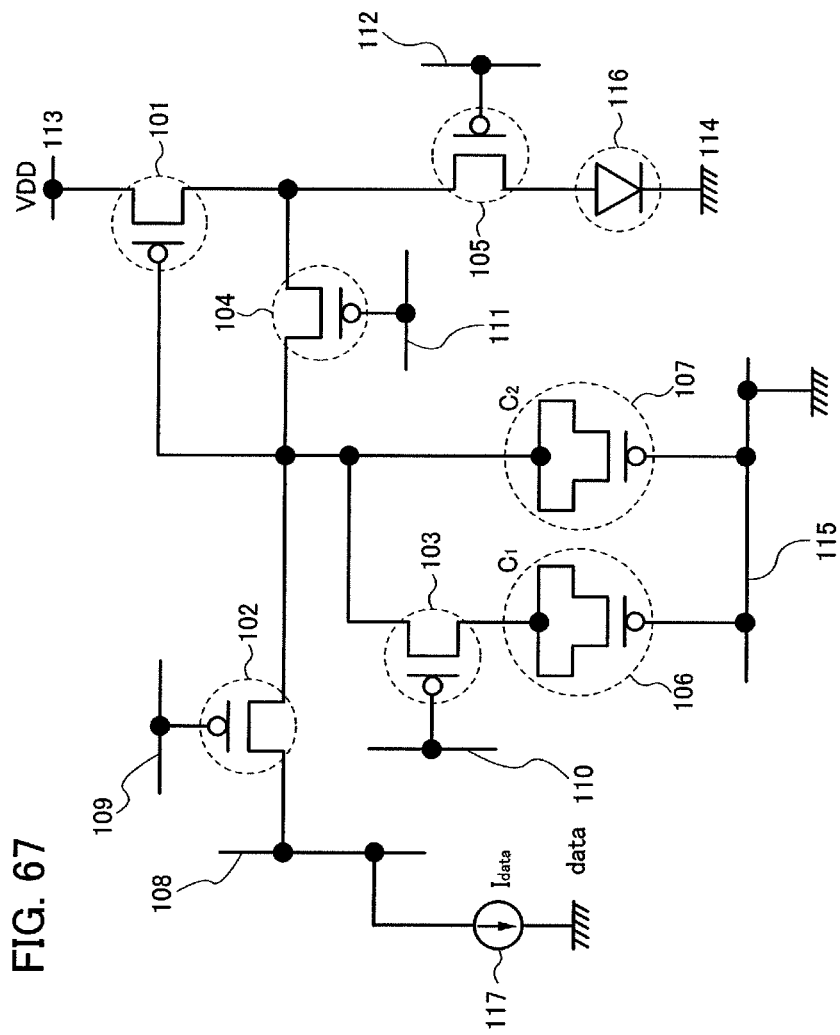
FIG. 67 is a diagram showing an example of a pixel structure in a display device of the present invention.
Figure 68:
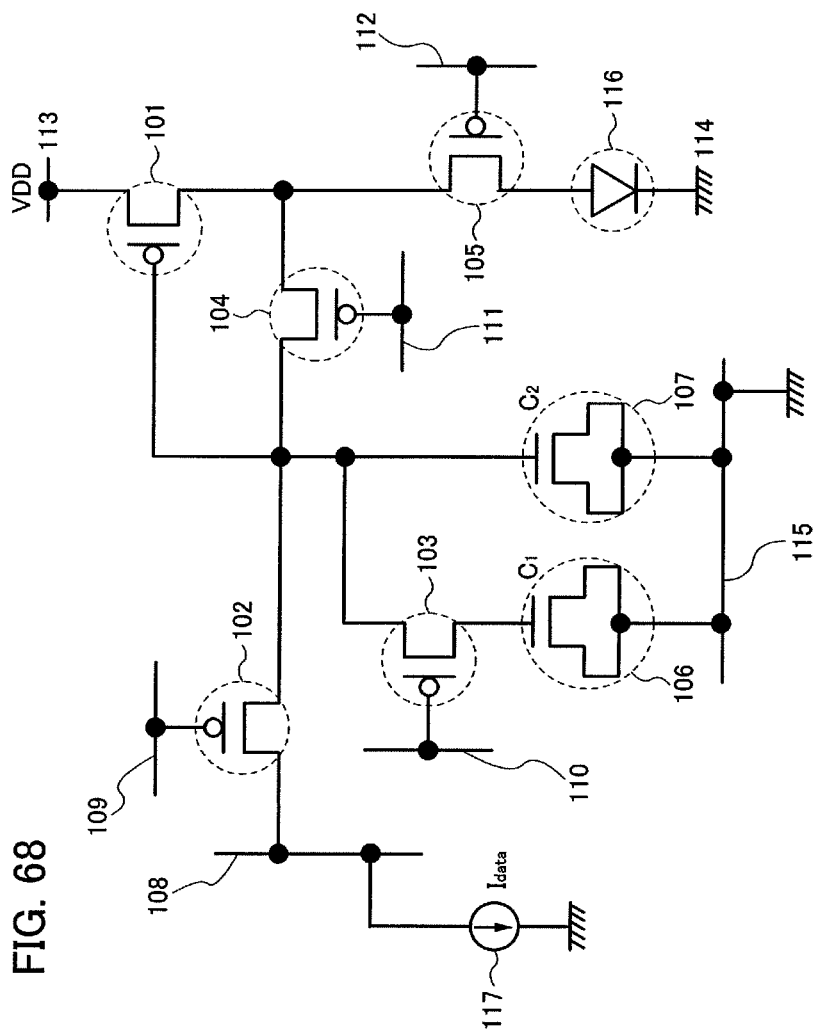
FIG. 68 is a diagram showing an example of a pixel structure in a display device of the present invention.

For example, FIGS. 67 and 68 each show an example of a case of forming the storage capacitor with a MOS transistor in the pixel circuit shown in FIG. 1.

FIG. 67 shows a case of forming the first and second storage capacitors 106 and 107 with P-channel transistors. When each storage capacitor is formed of a P-channel transistor, it is necessary to induce a channel region to the P-channel transistor in order to hold an electric charge. Therefore, potential of a gate electrode of the P-channel transistor has to be reduced more than potential of a first electrode and a second electrode of the P-channel transistor. In the meantime, in the first and second storage capacitors 106 and 107 in the case of the pixel circuit shown in FIG. 1, potential of the first electrode is higher than that of the second electrode. Therefore, in order to make the P-channel transistor serve as a storage capacitor, the first and second electrodes of the P-channel transistor are made to serve as the first electrodes of the first and second storage capacitors 106 and 107, which are connected to the gate electrode of the first transistor 101 and the second electrode of the fourth transistor 104. In addition, the gate electrode of the P-channel transistor is made to serve as the second electrodes of the first and second storage capacitors 106 and 107, which are connected to the capacitor line 115.

FIG. 68 shows a case of forming the first and second storage capacitors 106 and 107 with N-channel transistors. When each storage capacitor is formed of an N-channel transistor, it is necessary to induce a channel region to the N-channel transistor in order to hold an electric charge. Therefore, potential of a gate electrode of the N-channel transistor has to be reduced more than potential of a first electrode and a second electrode of the N-channel transistor. Therefore, in order to make the N-channel transistor serve as a storage capacitor, the gate electrode of the N-channel transistor is made to serve as the first electrodes of the first and second storage capacitors 106 and 107, which are connected to the gate electrode of the first transistor 101 and the second electrode of the fourth transistor 104. In addition, the first and second electrodes of the N-channel transistor are made to serve as the second electrodes of the first and second storage capacitors 106 and 107, which are connected to the capacitor line 115.

As in this embodiment mode, in a case of forming the first and second storage capacitors 106 and 107 with a MOS transistor, a voltage higher than the threshold voltage of the MOS transistor is constantly applied between a gate and a source of the MOS transistor by connecting the first and second storage capacitors between the gate electrode of the first transistor 101 and the capacitor line 115. Therefore, the MOS transistor can be made to constantly serve as a storage capacitor. Thus, a desired voltage can appropriately be held in the storage capacitors in the operating process of the pixel circuit.

Note that, in the pixel circuit shown in FIG. 1, the first to fifth transistors 101 to 105 are all P-channel types; however, all of these transistors can be N-channel transistors. Here, FIG. 6 shows a structure in the case where the first to fifth transistors are all N-channel types.

Figure 6:
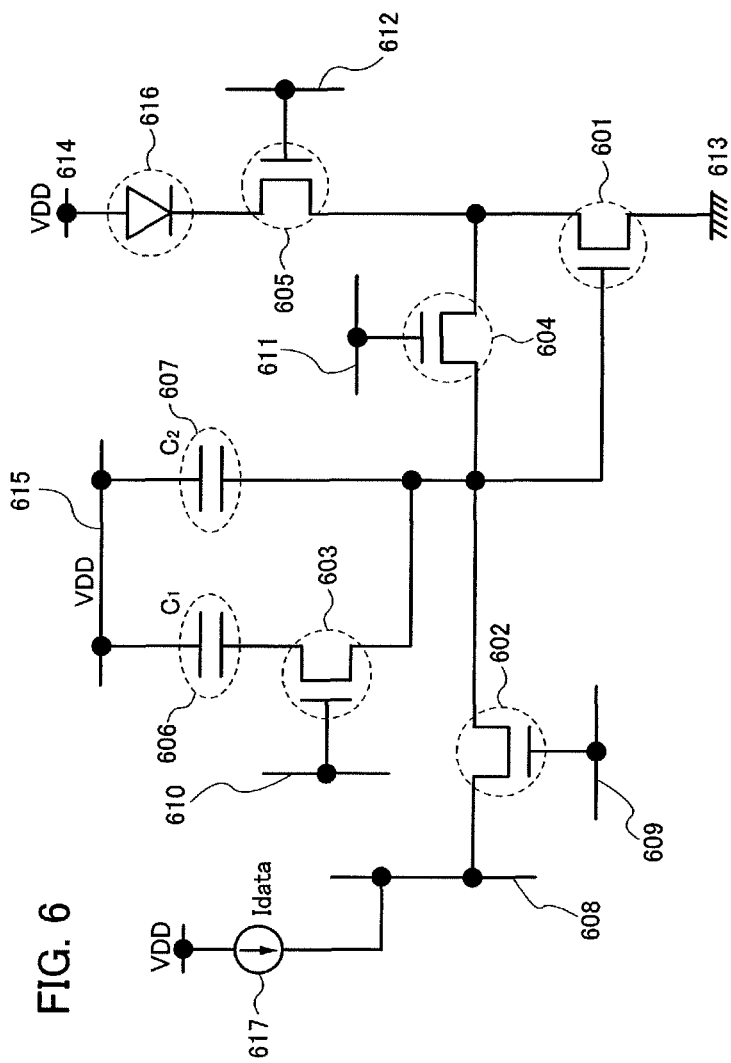
FIG. 6 is a diagram showing an example of a pixel structure in a display device of the present invention.

A pixel circuit of FIG. 6 includes first to fifth transistors 601 to 605, first and second storage capacitors 606 and 607, a signal line 608, first to fourth scanning lines 609 to 612, first and second power supply lines 613 and 614, a capacitor line 615, a light-emitting element 616, and a current source circuit 617. Note that the current source circuit 617 is arranged in each signal line (each column).

A gate electrode of the first transistor 601 is connected to a first electrode of the second transistor 602, a first electrode of the third transistor 603, a second electrode of the fourth transistor 604, and a first electrode of the second storage capacitor 607; a first electrode of the first transistor is connected to the first power supply line 613; and a second electrode of the first transistor is connected to a first electrode of the fourth transistor 604 and a first electrode of the fifth transistor 605. A gate electrode of the second transistor 602 is connected to the first scanning line 609, and a second electrode of the second transistor is connected to the signal line 608. A gate electrode of the third transistor 603 is connected to the second scanning line 610, and a second electrode of the third transistor is connected to a first electrode of the first storage capacitor 606. A gate electrode of the fourth transistor 604 is connected to the third scanning line 611. A gate electrode of the fifth transistor 605 is connected to the fourth scanning line 612, and a second electrode of the fifth transistor is connected to a second electrode of the light-emitting element 616. A second electrode of the first storage capacitor 606 is connected to the capacitor line 615. A second electrode of the second storage capacitor 607 is connected to the capacitor line 615. A first electrode of the light-emitting element 616 is connected to the second power supply line 614.

Next, an operation of the pixel circuit of this embodiment mode will be explained with reference to FIG. 7.

Figure 7:
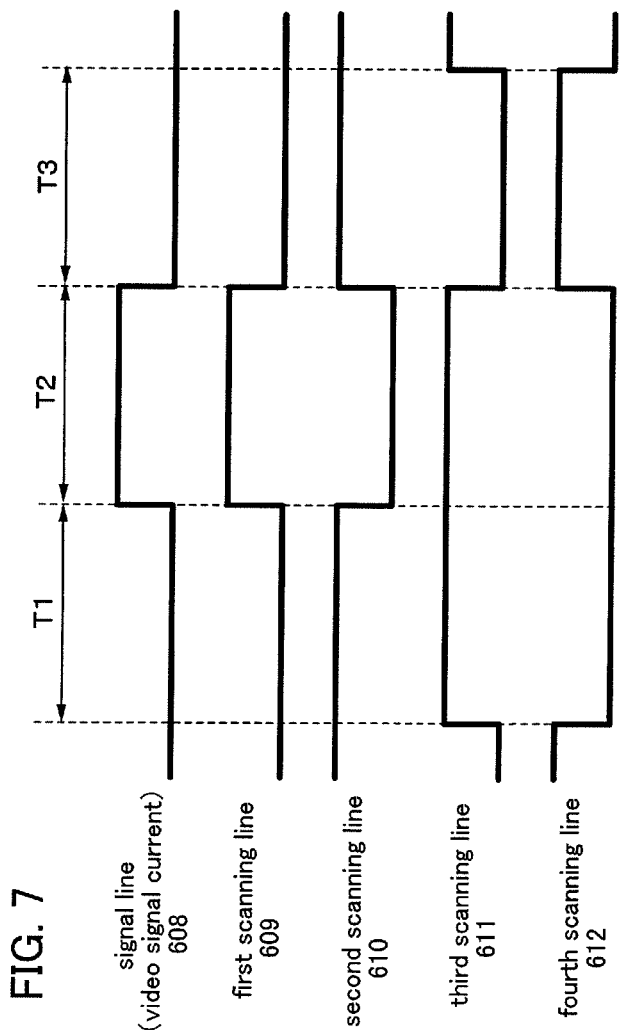
FIG. 7 is a diagram explaining an operation of a pixel circuit in a display device of the present invention.

FIG. 7 shows timing of a video signal current and pulses inputted into the signal line 608 and the first to fourth scanning lines 609 to 612. Since the first to fifth transistors are all N-channel types, an H level and an L level of the timing of the pulses inputted into the first to fourth scanning lines 609 to 612 are reversed against the case where all transistors are P-channel types (FIG. 2). In addition, an operation cycle of the pixel circuit is divided into three periods of first to third periods T1 to T3, in accordance with each operation of the pixel circuit.

The operation of the pixel circuit in FIG. 6 in the first to third periods of T1 to T3 is the same as the operation of the pixel circuit shown in FIG. 1. In other words, in the first period T1, the threshold voltage $|V_{th}|$ of the first transistor 601 is held in the first and second storage capacitors 606 and 607. Next, in the second period T2, a gate-source voltage $|V_{ga}$ (T2)$|$ which is necessary for the first transistor 601 to make a video signal current $I_{data}$ flow is held in the second storage capacitor 607. Then, in the third period T3, a current $I_{OLED}$ that is lower than the video signal current $I_{data}$ flows through the light-emitting element 616; thus, the light-emitting element 616 emits light. Note that, as well as the pixel circuit shown in FIG. 1, the current $I_{OLED}$ flowing through the light-emitting element 616 is expressed as the equation (5).

Also in the pixel circuit shown in FIG. 6, the current $I_{OLED}$ flowing through the light-emitting element 616 is expressed without depending on the threshold voltage $V_{th}$ or mobility (included in the constant β) of the first transistor 601; therefore, variation in the threshold voltage or mobility of the transistor can be compensated.

In addition, since the current $I_{OLED}$ flowing through the light-emitting element 616 is a value approximately $[C_2/(C_1+C_2)]^2$ times as low as the video signal current $I_{data}$, it is possible to make a current which is $[(C_1+C_2)/C_2]^2$ times as high as the current $I_{OLED}$ flow as the video signal current $I_{data}$. Accordingly, a signal line can be sufficiently charged within one horizontal scanning period; thus, a display can be performed accurately even in a case where a low gray scale is displayed.

Moreover, the current $I_{OLED}$ flowing through the light-emitting element 616 depends on a capacitance ratio of the first and second storage capacitors 606 and 607, and when the capacitance ratio is constant, $I_{OLED}$ is also constant. Here, since the first and second storage capacitors are generally formed in the same process, an error in capacitance is almost the same ratio in the first and second storage capacitors 606 and 607, even when misalignment of a mask pattern is caused during manufacturing the display device. Therefore, even in a case of a manufacturing error, it is possible to maintain a substantially constant value of a value $[C_1/(C_1+C_2)]$, and to maintain a substantially constant value of $I_{OLED}$.

Also in the pixel circuit shown in FIG. 6, in a case of forming the first and second storage capacitors 606 and 607 with a MOS transistor, a voltage higher than the threshold voltage of the MOS transistor is constantly applied between a gate and a source of the MOS transistor by connecting the first and second storage capacitors between the capacitor line 615 and the gate electrode of the first transistor 601. Therefore, the MOS transistor can be made to constantly serve as a storage capacitor. Thus, a desired voltage can appropriately be held in the storage capacitors in the operating process of the pixel circuit.

Through the above, according to the pixel structure of this embodiment mode, variation in the threshold value of a transistor can be compensated to reduce variation in a luminance; therefore, image quality can be improved.

Note that the potential of the first power supply line is ground potential (GND) in this embodiment mode; however, the present invention is not limited thereto. Any potential is acceptable as long as the potential is lower than VDD–$|V_{th}|$ which is a difference between a power supply voltage VDD and the threshold voltage $|V_{th}|$ of the first transistor 601. In addition, the potential of the capacitor line is the power supply potential VDD; however, the present invention is not limited thereto. Any potential is acceptable as long as the potential is higher than the threshold voltage $|V_{th}|$ of the first transistor 601.

Note that the transistors have the same conductivity type like the first to fifth transistors all of which can be formed to be P-channel types or N-channel types in this embodiment mode; however, the present invention is not limited thereto. The circuit may be formed by using both a P-channel transistor and an N-channel transistor.

Figure 8:
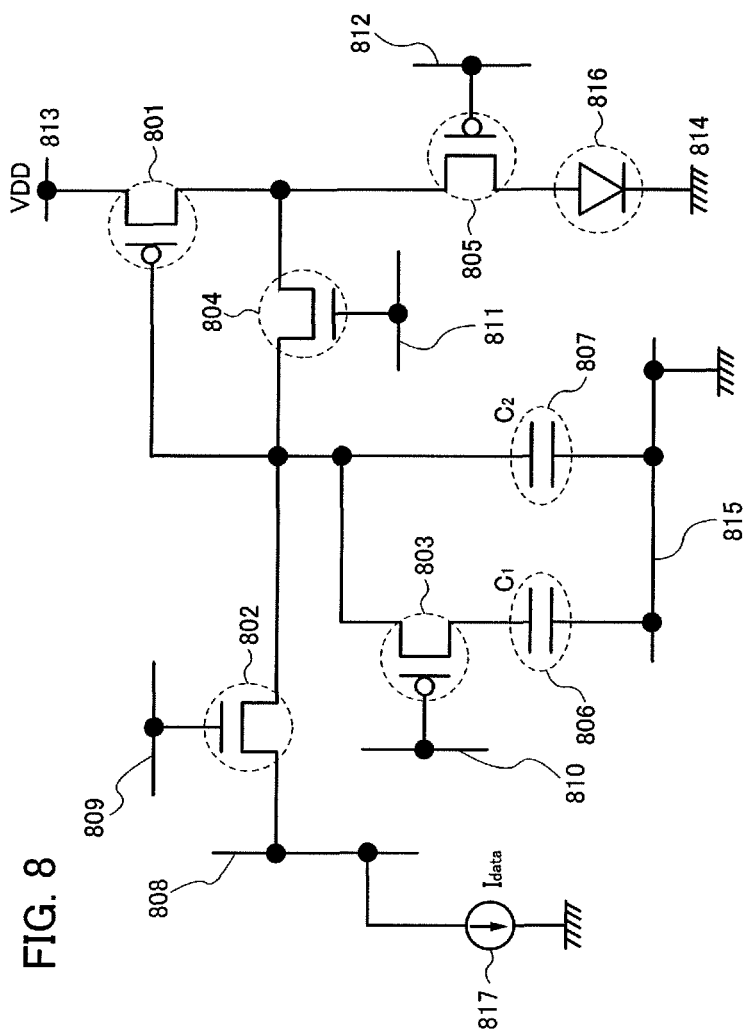
FIG. 8 is a diagram showing an example of a pixel structure in a display device of the present invention.

For example, the second and fourth transistors may be formed to be N-channel types, and the first, third, and fifth transistors may be formed to be P-channel types. This pixel circuit is shown in FIG. 8. In addition, timing of a video signal current and pulses inputted into a signal line and first to fourth scanning lines is shown in FIG. 9.

A pixel circuit of FIG. 8 includes first to fifth transistors 801 to 805, first and second storage capacitors 806 and 807, a signal line 808, first to fourth scanning lines 809 to 812, first and second power supply lines 813 and 814, a capacitor line 815, a light-emitting element 816, and a current source circuit 817. Note that the current source circuit 817 is arranged in each signal line (each column).

Figure 9:
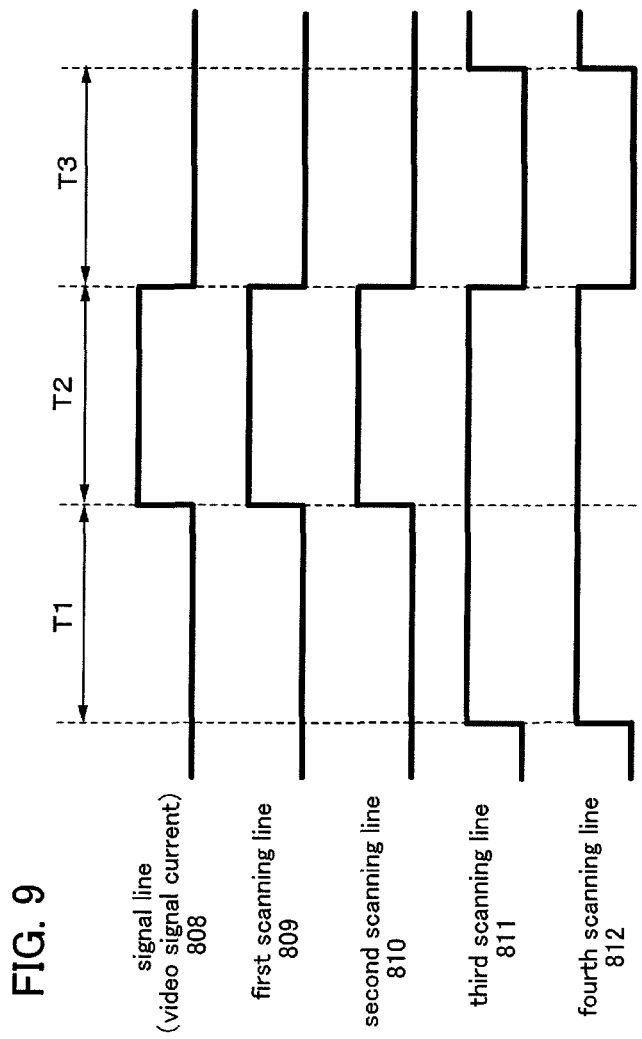
FIG. 9 is a diagram explaining an operation of a pixel circuit in a display device of the present invention.
Figure 50:
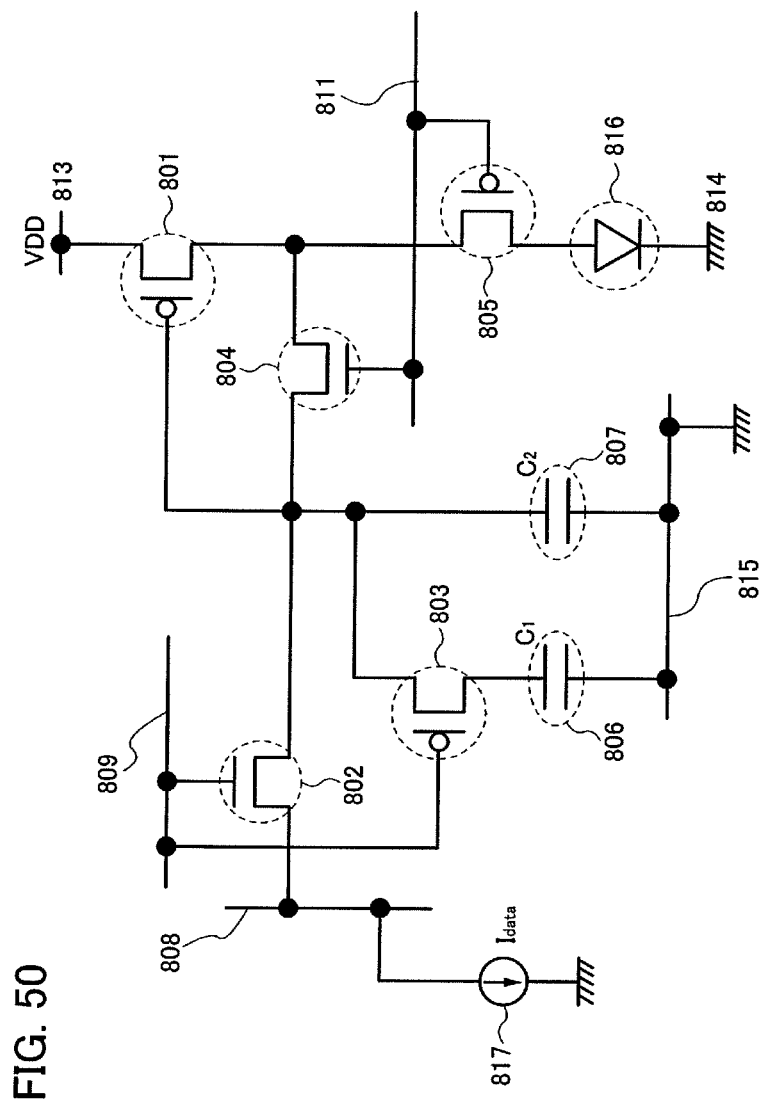
FIG. 50 is a diagram showing an example of a pixel structure in a display device of the present invention.

In such a circuit configuration that is shown in FIG. 8, the timing of the pulses inputted into the first and second scanning lines are the same as shown in FIG. 9; therefore, the second and third transistors can be controlled with the scanning line in common. In the same manner, the timing of the pulses inputted into the third and fourth scanning lines are the same; therefore, the fourth and fifth transistors can be controlled with the scanning line in common. Here, FIG. 50 shows an example in a case of controlling the second and third transistors by the first scanning line, and the fourth and fifth transistors by the third scanning line.

Figure 10:
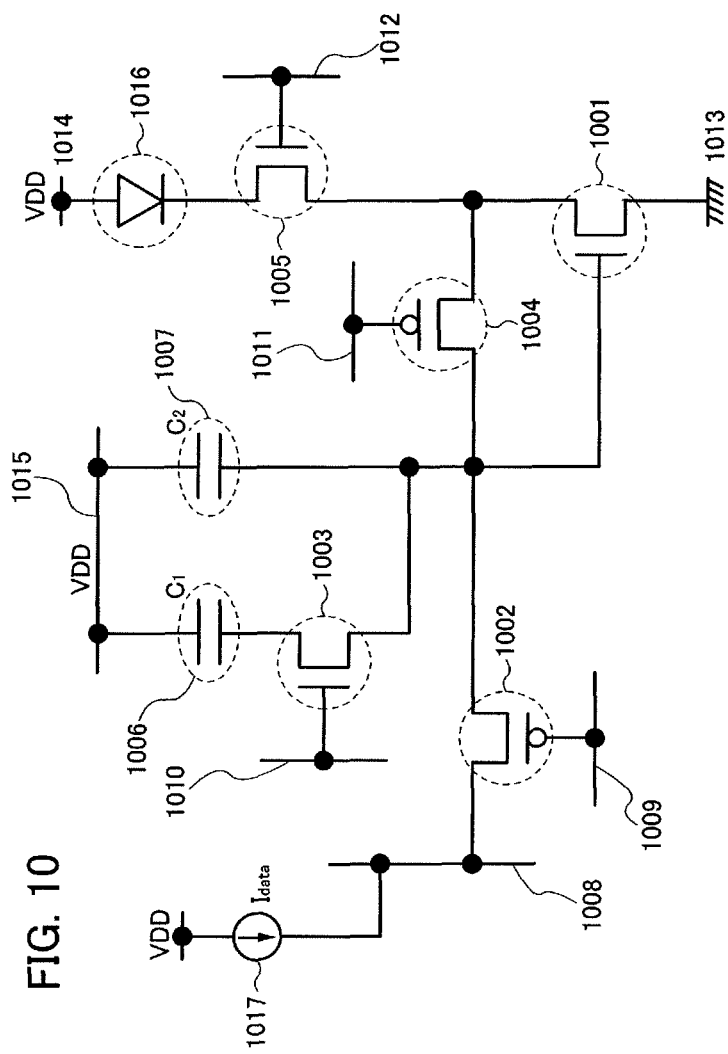
FIG. 10 is a diagram showing an example of a pixel structure in a display device of the present invention.

In addition, as another example, the second and fourth transistors may be formed to be P-channel types, and the first, third, and fifth transistors may be formed to be N-channel types. This pixel circuit is shown in FIG. 10. In addition, timing of a video signal current and pulses inputted into a signal line and first to fourth scanning lines is shown in FIG. 11.

A pixel circuit of FIG. 10 includes first to fifth transistors 1001 to 1005, first and second storage capacitors 1006 and 1007, a signal line 1008, first to fourth scanning lines 1009 to 1012, first and second power supply lines 1013 and 1014, a capacitor line 1015, a light-emitting element 1016, and a current source circuit 1017. Note that the current source circuit 1017 is arranged in each signal line (each column).

Figure 11:
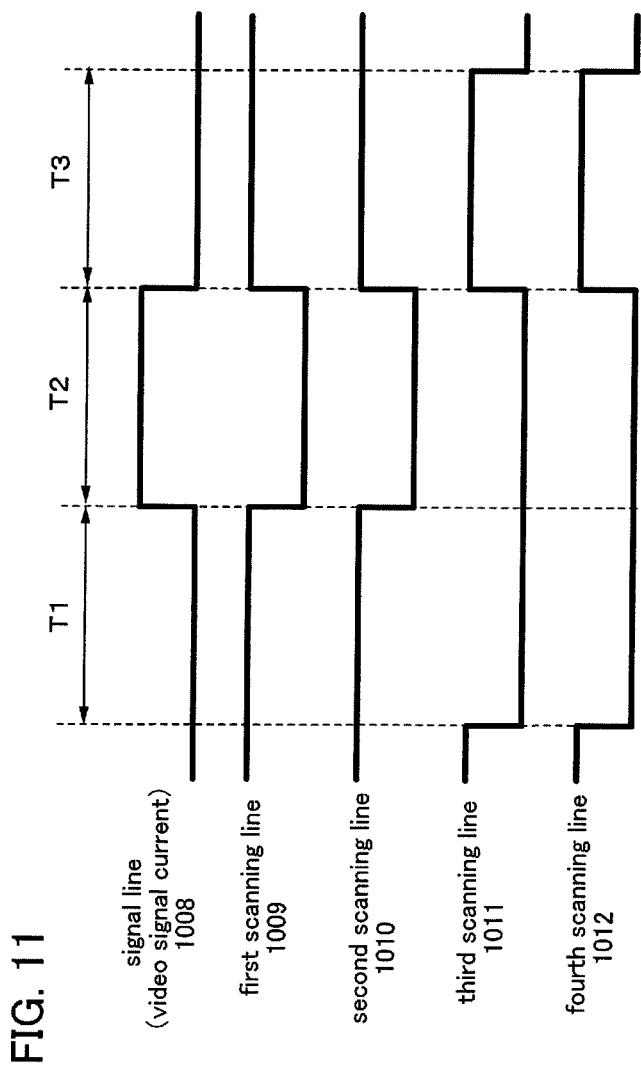
FIG. 11 is a diagram explaining an operation of a pixel circuit in a display device of the present invention.
Figure 51:
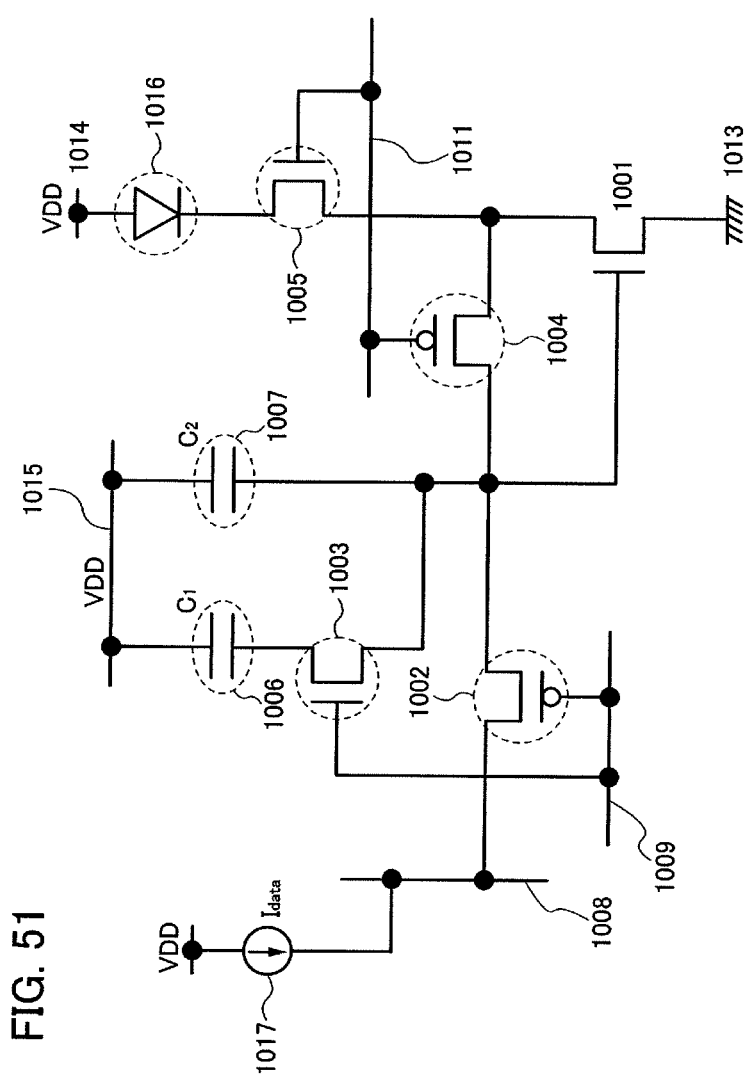
FIG. 51 is a diagram showing an example of a pixel structure in a display device of the present invention.

In such a circuit configuration that is shown in FIG. 10, the timing of the pulses inputted into the first and second scanning lines are the same as shown in FIG. 11; therefore, the second and third transistors can be controlled with the scanning line in common. In the same manner, the timing of the pulses inputted into the third and fourth scanning lines are the same; therefore, the fourth and fifth transistors can be controlled with the scanning line in common. Here, FIG. 51 shows an example in a case of controlling the second and third transistors by the first scanning line, and the fourth and fifth transistors by the third scanning line.

As shown in FIGS. 8 to 11, 50, and 51, when the second and third transistors are formed to have a different conductivity type to each other, the second and third transistors can be controlled with the scanning line in common. In the same manner, when the fourth and fifth transistors are formed to have a different conductivity type to each other, the fourth and fifth transistors can be controlled with the scanning line in common. Accordingly, the number of scanning lines can be reduced; thus, an aperture ratio of a pixel can be improved. In addition, the number of scanning line driver circuits can also be reduced; thus, power consumption can be reduced.

Note that which of the conductivity type the first to fifth transistors have is not limited to the content described above.

Note that, in this embodiment mode, second electrodes of the first and second storage capacitors are connected to the capacitor line in common; however, each of the second electrodes of the first and second storage capacitors may be connected to a different wiring.

Figure 69:
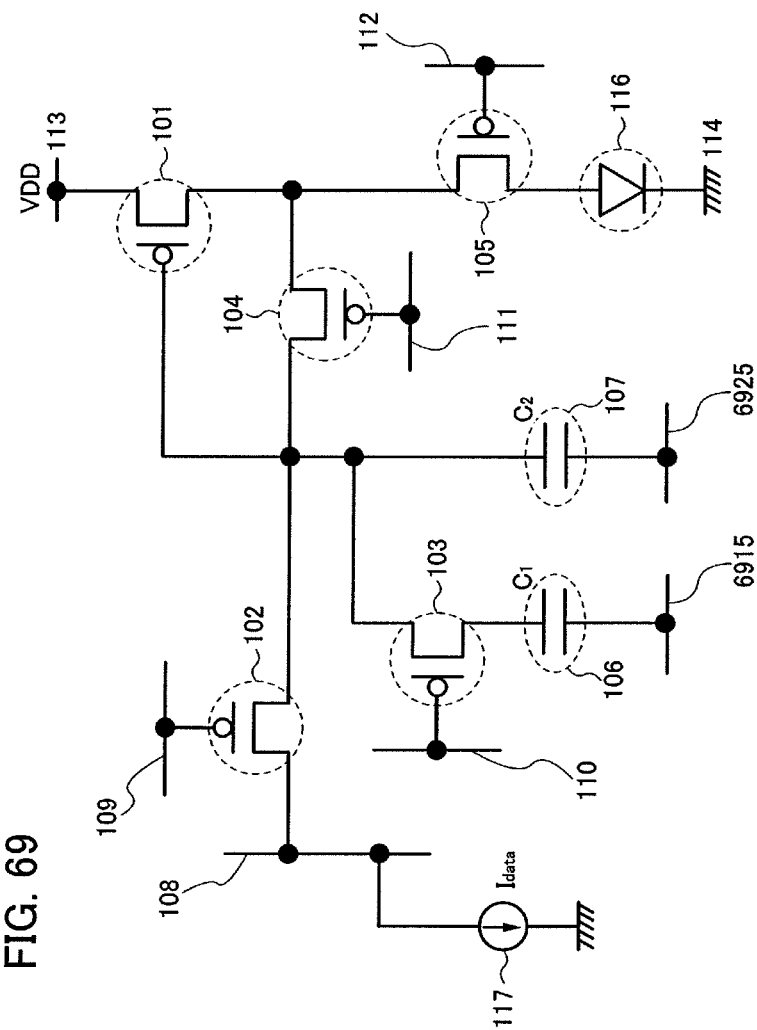
FIG. 69 is a diagram showing an example of a pixel structure in a display device of the present invention.

For example, FIG. 69 shows a pixel structure in a case of connecting each of the second electrodes of the first and second storage capacitors to a different wiring in the circuit shown in FIG. 1. In the pixel structure shown in FIG. 69, a second electrode of a first storage capacitor 106 is connected to a first capacitor line 6915, and a second electrode of a second storage capacitor 107 is connected to a second capacitor line 6925.

As shown in FIG. 69, a voltage held in the first and second storage capacitors can be controlled separately by connecting each of the second electrodes of the first and second storage capacitors to a different wiring.

Note that, before holding the threshold voltage of the first transistor in the storage capacitor, a period in which a voltage held in the storage capacitor is set to be a certain initial voltage may be provided. In this specification, this operation is to be referred to as initialization. As one method for performing initialization, a method for changing potential of the second electrode of the first transistor by making current flow through the light-emitting element may be used.

Figure 70:
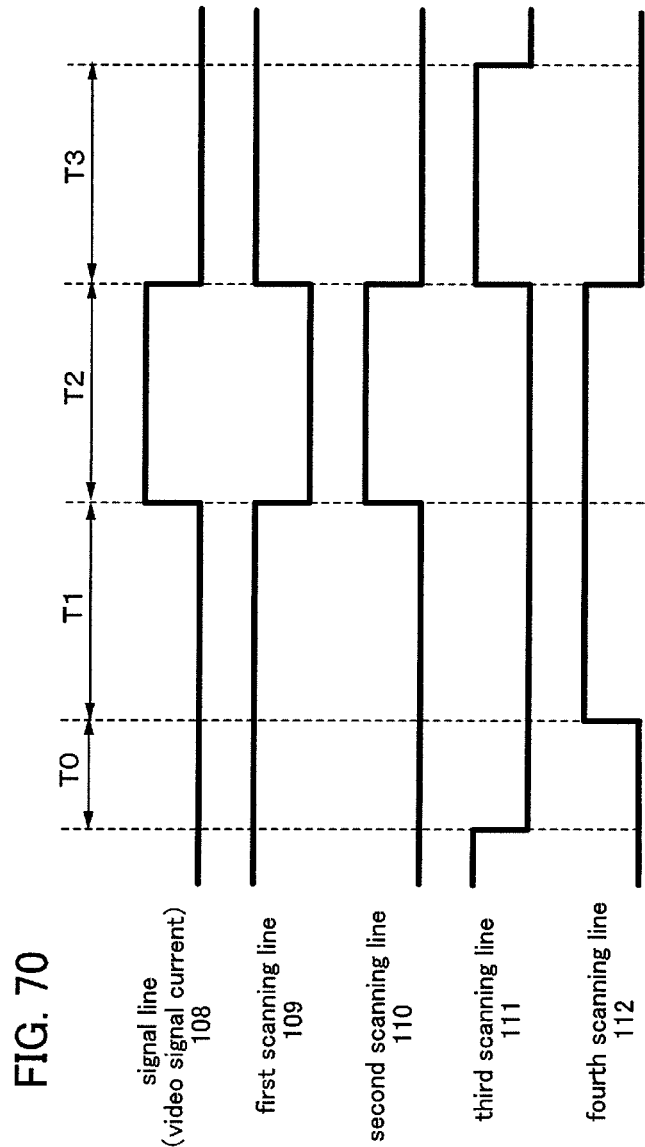
FIG. 70 is a diagram explaining an operation of a pixel circuit in a display device of the present invention.

For example, FIG. 70 shows a timing chart of a case of performing initialization in the pixel circuit shown in FIG. 1. FIG. 70 shows timing of a video signal current and pulses inputted into the signal line 108 and the first to fourth scanning lines 109 to 112. An operation cycle of the pixel circuit is divided into four periods of T0 to T3, in accordance with each operation of the pixel circuit.

The operation of the initialization is performed in the period T0. In the period T0, the second to fourth scanning lines 110 to 112 are in an L level; thus, the third to fifth transistors 103 to 105 are turned on. In addition, the first scanning line 109 is in an H level; thus, the second transistor 102 is turned off. Accordingly, the first transistor 101 becomes a diode-connected state, and current flows through the light-emitting element 116. As a result, potential of the second electrode of the first transistor 101, the first electrode of the first storage capacity 106, and the first electrode of the second storage capacity 107 is decreased; thus, a certain initial voltage is held in the first and second storage capacitors 106 and 107.

Through the above operations, in the period T0, a certain initial voltage is held in the first and second storage capacitors 106 and 107.

Moreover, as another method for performing initialization, the pixel circuits that have been described up to here may be newly provided with an initialization transistor (a sixth transistor) and an initialization power supply line (a third power supply line).

Figure 12:
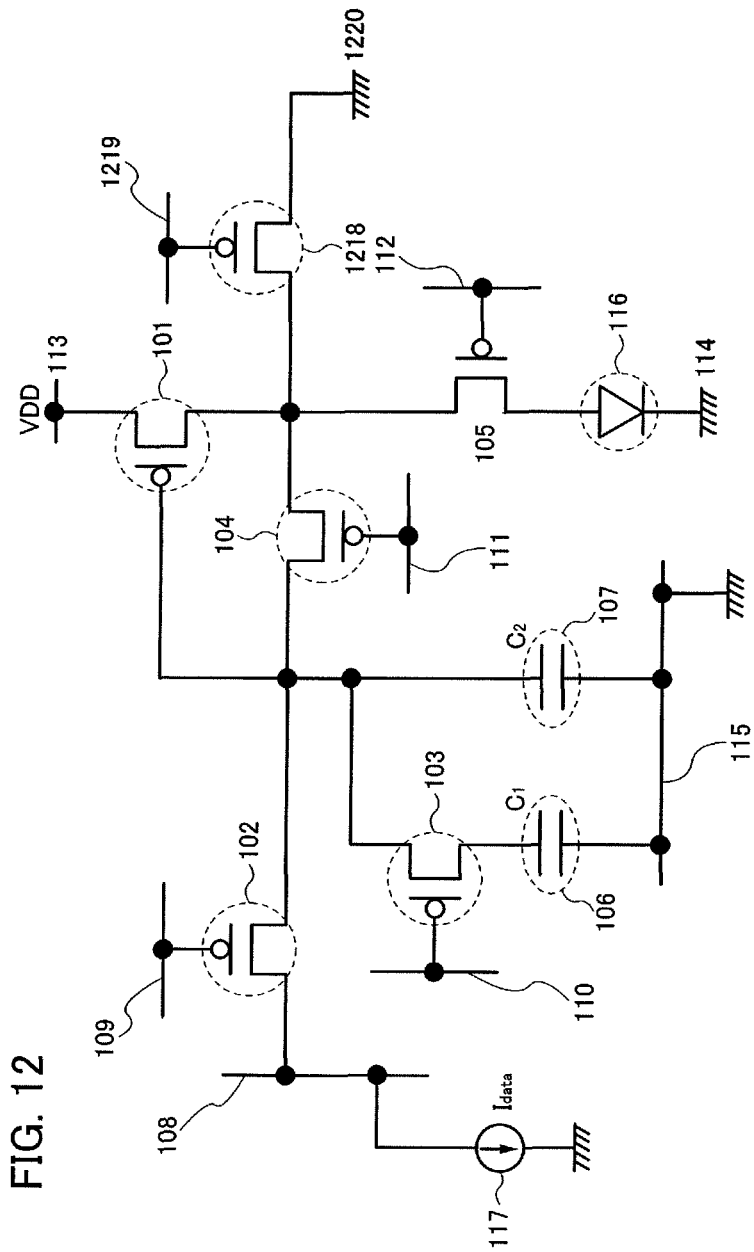
FIG. 12 is a diagram showing an example of a pixel structure in a display device of the present invention.

For example, FIG. 12 shows an example of a case where the pixel circuit shown in FIG. 1 is provided with an initialization transistor. In FIG. 12, a sixth transistor 1218, a fifth scanning line 1219, and a third power supply line 1220 are added to the pixel circuit shown in FIG. 1. Note that a gate electrode of the sixth transistor 1218 is connected to the fifth scanning line 1219; a first electrode of the sixth transistor is connected to a second electrode of a first transistor 101, a first electrode of a fourth transistor 104, and a first electrode of a fifth transistor 105; and a second electrode of the sixth transistor is connected to the third power supply line 1220.

Note that the sixth transistor 1218 is a P-channel type in FIG. 12; however, the present invention is not limited thereto. The sixth transistor 1218 may also be an N-channel type.

Next, an operation of the pixel circuit shown in FIG. 12 will be explained with reference to FIGS. 13 and 14.

Figure 13:
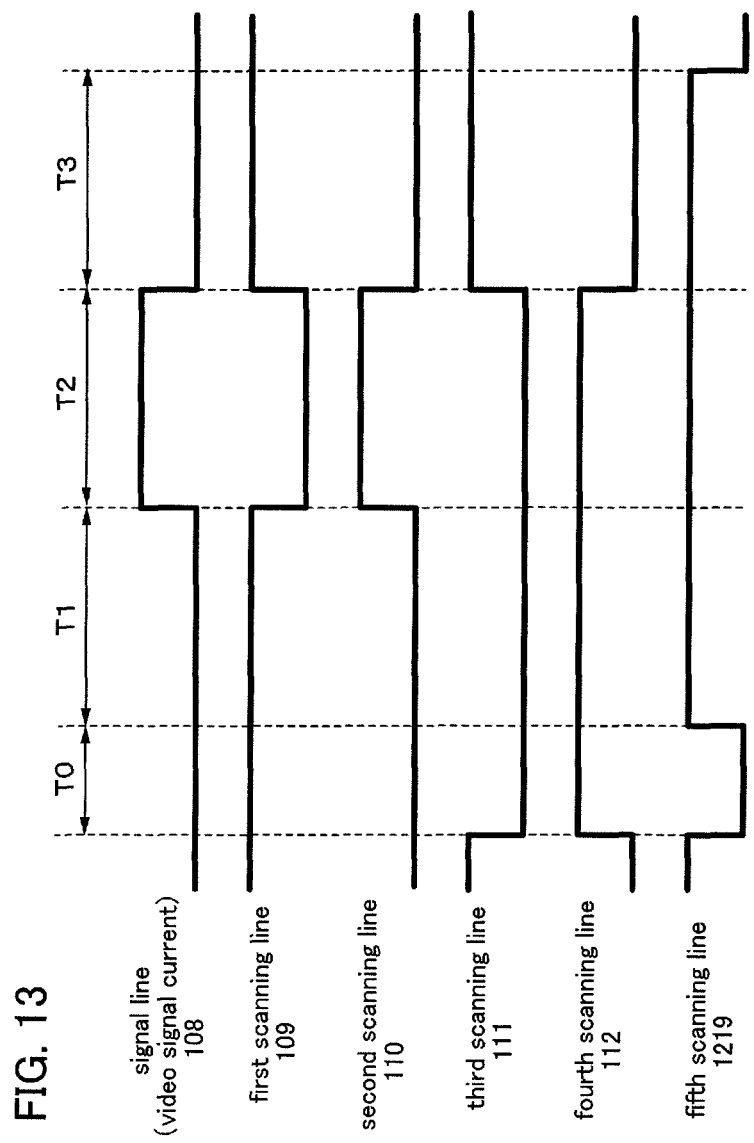
FIG. 13 is a diagram explaining an operation of a pixel circuit in a display device of the present invention.
Figure 14:
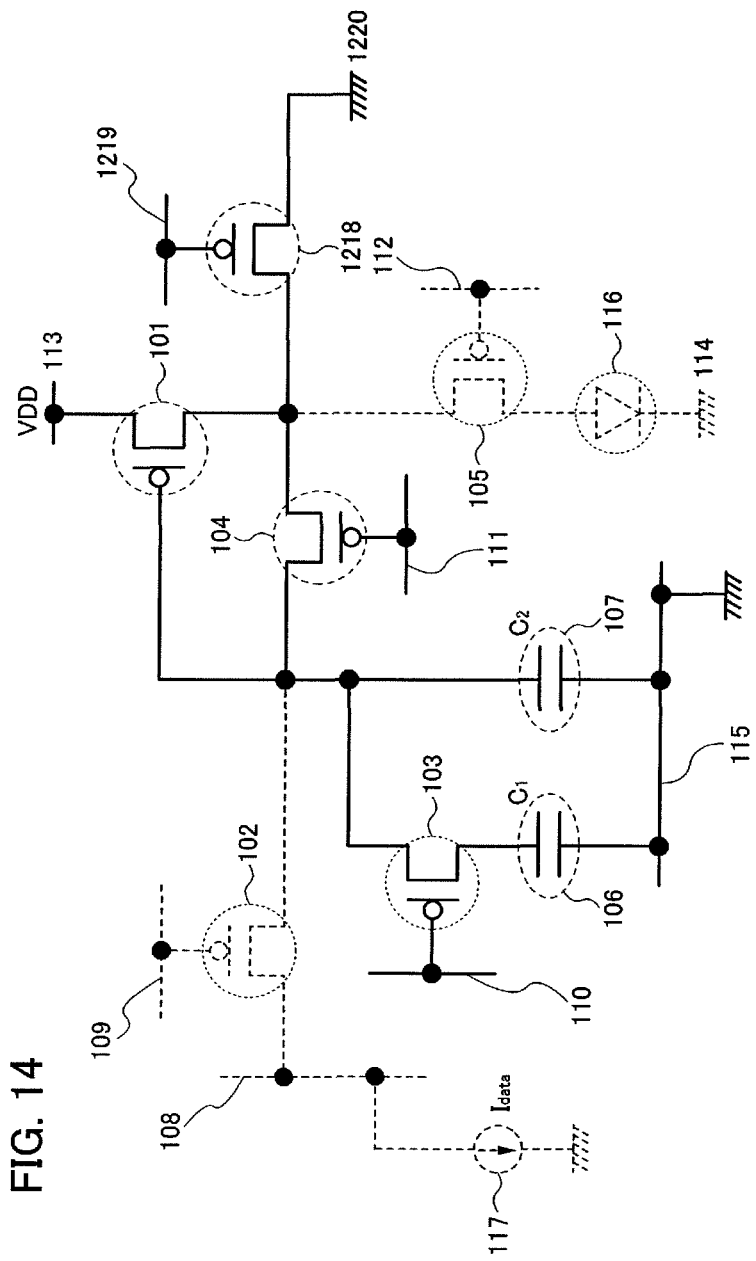
FIG. 14 is a diagram explaining an operation of a pixel circuit in a display device of the present invention.

FIG. 13 shows timing of a video signal current and pulses inputted into a signal line 108 and first to fifth scanning lines 109 to 112, and 1219. An operation cycle of the pixel circuit is divided into four periods of T0 to T3, in accordance with each operation of the pixel circuit.

The operation of the initialization is performed in the period T0. The operation of the pixel circuit in the period T0 will be explained with reference to FIG. 14. In the period T0, the second, third and fifth scanning lines 110, 111, and 1219 are in an L level; thus, a third transistor 103 and the fourth and sixth transistors 104 and 1218 are turned on. In addition, the first and fourth scanning lines 109 and 112 are in an H level; thus, a second transistor 102 and the fifth transistor 105 are turned off. Accordingly, the first transistor 101 becomes a diode-connected state, and current flows through the third power supply line 1220. As a result, potential of a second electrode of the first transistor 101, and first electrodes of first and second storage capacitors 106 and 107 becomes equivalent to the potential of the third power supply line 1220, and a voltage corresponding to a difference between the potential of the third power supply line 1220 and potential of a capacitor line 115 is held in the first and second storage capacitors 106 and 107.

Through the above operations, in the period T0, the voltage corresponding to a difference between the potential of the third power supply line 1220 and potential of the capacitor line 115 is held as the initialization voltage in the first and second storage capacitors 106 and 107.

In addition, in the periods T1 to T3, the fifth scanning line 1219 is made to be in an H level; thus, the sixth transistor 1218 is turned off. Then, the same operation as the pixel circuit shown in FIG. 1 is performed. In other words, in the first period T1, the threshold voltage $|V_{th}|$ of the first transistor 101 is held in the first and second storage capacitors 106 and 107. Next, in the second period T2, a gate-source voltage $|V_{ga}(T2)|$ which is necessary for the first transistor 101 to make a video signal current $I_{data}$ flow is held in the second storage capacitor 107. Then, in the third period T3, a current $I_{OLED}$ that is lower than the video signal current $I_{data}$ flows through a light-emitting element 116; thus, the light-emitting element 116 emits light. Note that, as well as the pixel circuit shown in FIG. 1, the current $I_{OLED}$ flowing through the light-emitting element 116 is expressed as the equation (5).

Note that, in the case of the pixel circuit shown in FIG. 1, in order to hold the threshold voltage of the first transistor in the storage capacitors, in advance, the potential of the second electrode of the first transistor has to be lower than a voltage corresponding to a difference between power supply potential VDD and the threshold voltage $|V_{th}|$ of the first transistor, that is, VDD$-|V_{th}|$. Therefore, by providing the initialization period, the potential of the second electrode of the first transistor can certainly be made lower than VDD$-|V_{th}|$, and it becomes possible to certainly compensate the threshold voltage.

Note that the potential of the third power supply line 1220 is ground potential (GND) in FIG. 12; however, the present invention is not limited thereto. Any potential is acceptable as long as the potential is lower than VDD$-|V_{th}|$ which is a difference between the power supply voltage VDD and the threshold voltage $|V_{th}|$ of the first transistor. In addition, the potential of the third power supply line 1220 does not have to be equivalent to the potential of the capacitor line 115.

Figure 71:
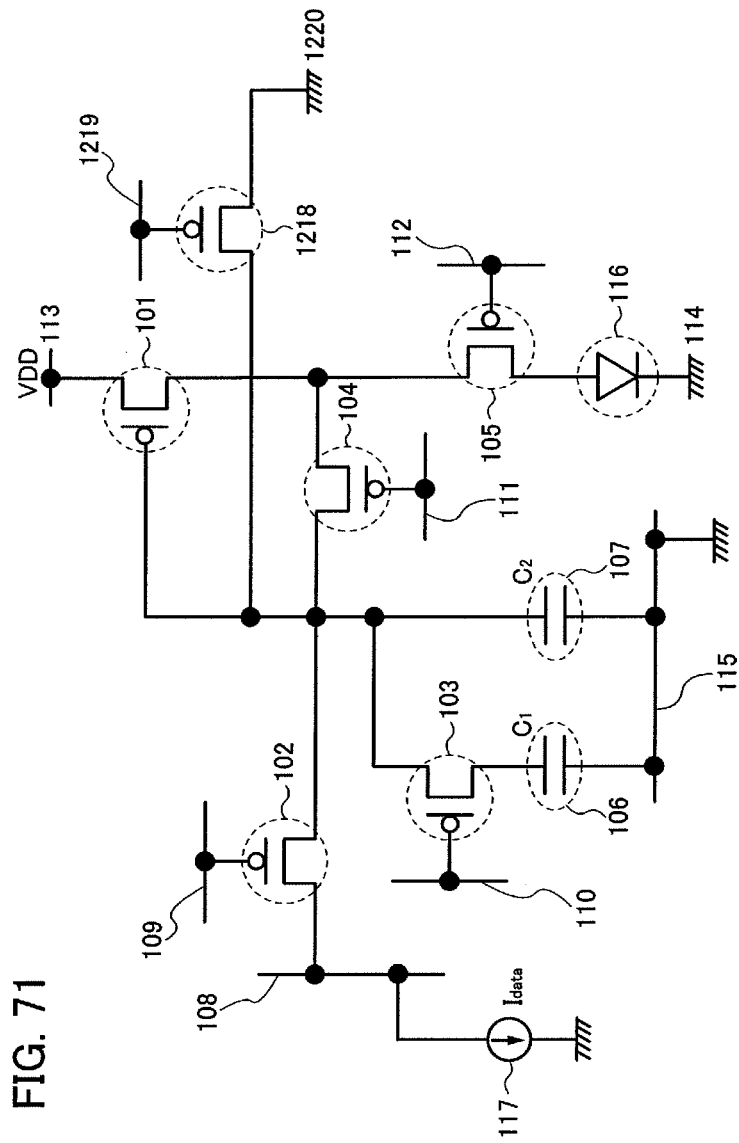
FIG. 71 is a diagram showing an example of a pixel structure in a display device of the present invention.

Note that the first electrode of the sixth transistor 1218 is connected to the second electrode of the first transistor 101, the first electrode of the fourth transistor 104, and the first electrode of the fifth transistor 105 in this embodiment mode; however, the transistor to which the first electrode of the sixth transistor 1218 is connected is not limited thereto. For example, as shown in FIG. 71, a first electrode of a sixth transistor 1218 may be connected to a gate electrode of a first transistor 101, a first electrode of a second transistor 102, a first electrode of a third transistor 103, a second electrode of a fourth transistor 104, and a first electrode of a second storage capacitor 107.

Figure 15:
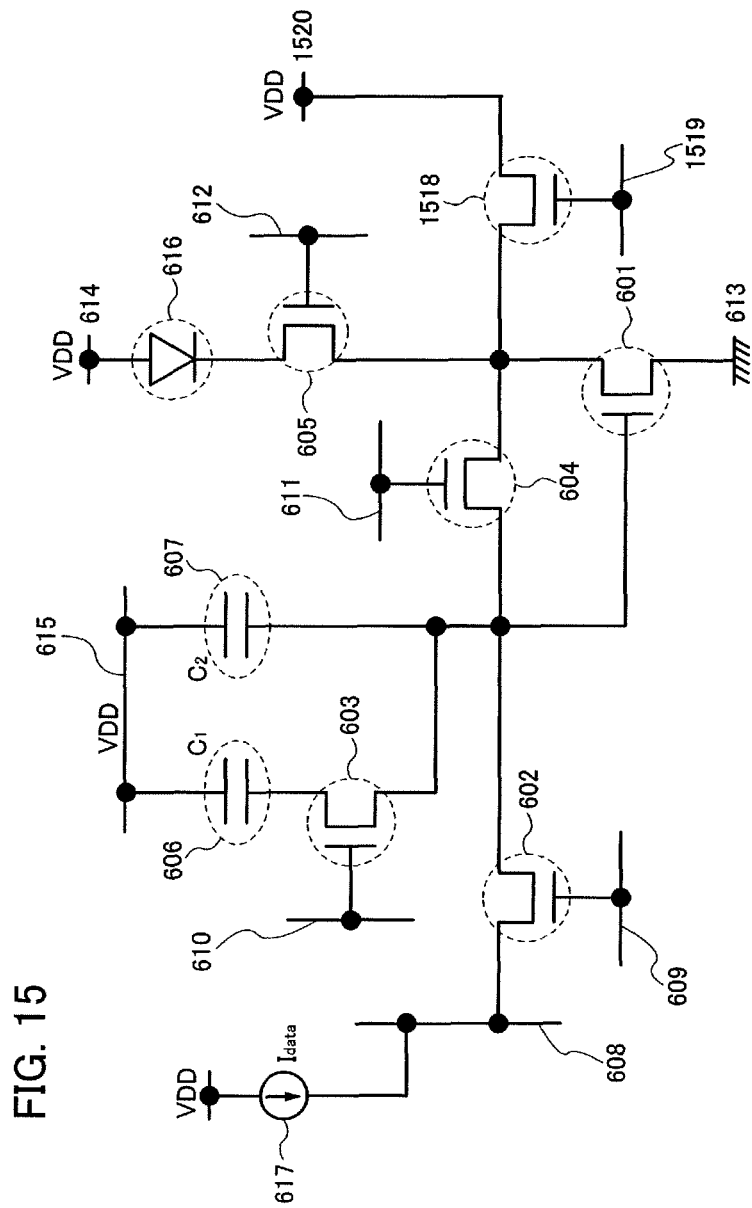
FIG. 15 is a diagram showing an example of a pixel structure in a display device of the present invention.

In addition, as another example, FIG. 15 shows an example of a case where the pixel circuit shown in FIG. 6 is provided with an initialization transistor. In FIG. 15, a sixth transistor 1518, a fifth scanning line 1519, and a third power supply line 1520 are added to the pixel circuit shown in FIG. 6. Note that a gate electrode of the sixth transistor 1518 is connected to the fifth scanning line 1519; a first electrode of the sixth transistor 1518 is connected to a second electrode of a first transistor 601, a first electrode of a fourth transistor 604, and a first electrode of a fifth transistor 605; and a second electrode of the sixth transistor 1518 is connected to the third power supply line 1520.

Note that the sixth transistor 1518 is an N-channel type in FIG. 15; however, the present invention is not limited thereto. The sixth transistor 1518 may also be a P-channel type.

Next, an operation of the pixel circuit shown in FIG. 15 will be explained with reference to FIG. 16.

Figure 16:
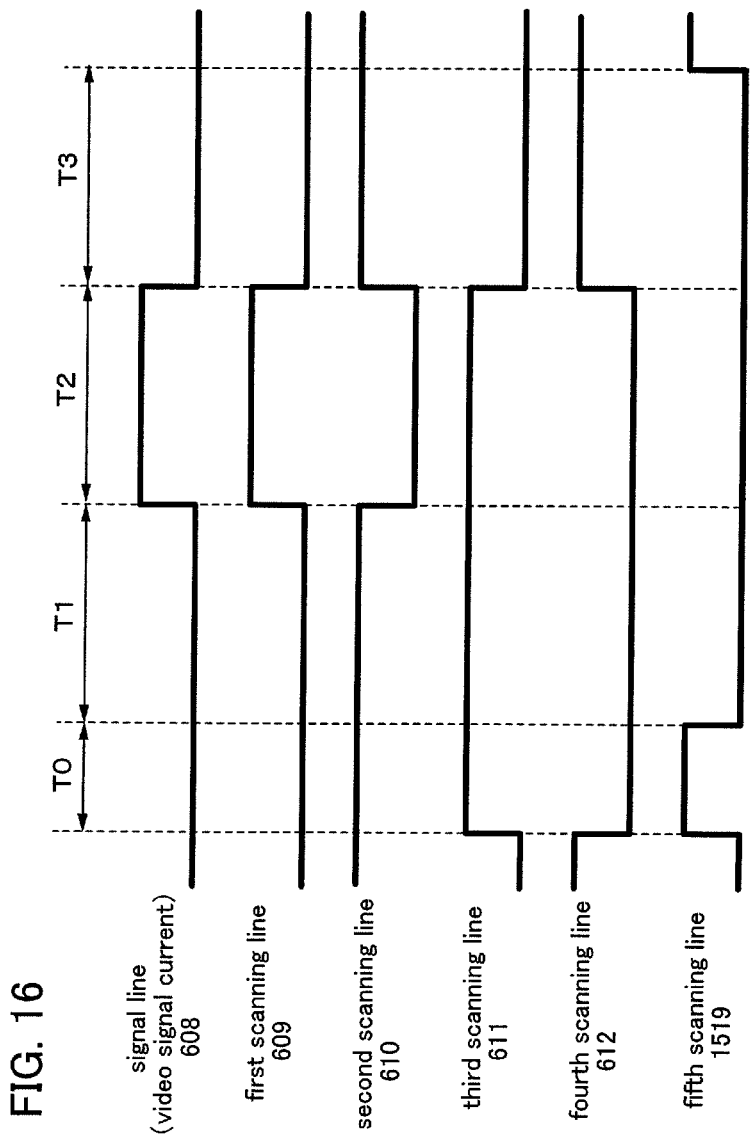
FIG. 16 is a diagram explaining an operation of a pixel circuit in a display device of the present invention.

FIG. 16 shows timing of a video signal current and pulses inputted into a signal line 608 and first to fifth scanning lines 609 to 612, and 1519. An operation cycle of the pixel circuit is divided into four periods of T0 to T3, in accordance with each operation of the pixel circuit. Note that, since second and third transistors, the first, fourth, fifth, and sixth transistors are all N-channel types, an H level and an L level of the timing of the pulses inputted into the first to fifth scanning lines 609 to 612, and 1519 are reversed against the case where all transistors are P-channel types (FIG. 12).

The operation of the initialization is performed in the period T0. The operation of the pixel circuit in the period T0 is the same as the pixel circuit shown in FIG. 12. In other words, in the period T0, the voltage corresponding to a difference between potential of a capacitor line 615 and the potential of the third power supply line 1520 is held as the initialization voltage in first and second storage capacitors 606 and 607.

In addition, in the periods T1 to T3, the fifth scanning line 1519 is made to be in an L level; thus, the sixth transistor 1518 is turned off. Then, the same operation as the pixel circuit shown in FIG. 6 is performed. In other words, in the first period T1, the threshold voltage $|V_{th}|$ of the first transistor 601 is held in the first and second storage capacitors 606 and 607. Next, in the second period T2, a gate-source voltage $|V_{ga}(T2)|$ which is necessary for the first transistor 601 to make a video signal current $I_{data}$ flow is held in the second storage capacitor 607. Then, in the third period T3, a current $I_{OLED}$ that is lower than the video signal current $I_{data}$ flows through a light-emitting element 616; thus, the light-emitting element 616 emits light. Note that, as well as the pixel circuit shown in FIG. 1, the current $I_{OLED}$ flowing through the light-emitting element 616 is expressed as the equation (5).

Note that, in the case of the pixel circuit shown in FIG. 6, in order to hold the threshold voltage of the first transistor in the storage capacitors, in advance, the potential of the second electrode of the first transistor has to be higher than the threshold voltage $|V_{th}|$ of the first transistor. Therefore, by providing the initialization period, the potential of the second electrode of the first transistor can certainly be made higher than the threshold voltage |V$_{th}$| of the first transistor, and it becomes possible to certainly compensate the threshold voltage.

Note that the potential of the third power supply line 1520 is power supply potential VDD in FIG. 15; however, the present invention is not limited thereto. Any potential is acceptable as long as the potential is higher than the threshold voltage of the first transistor. In addition, the potential of the third power supply line 1520 does not have to be equivalent to the potential of the capacitor line 615.

Figure 72:
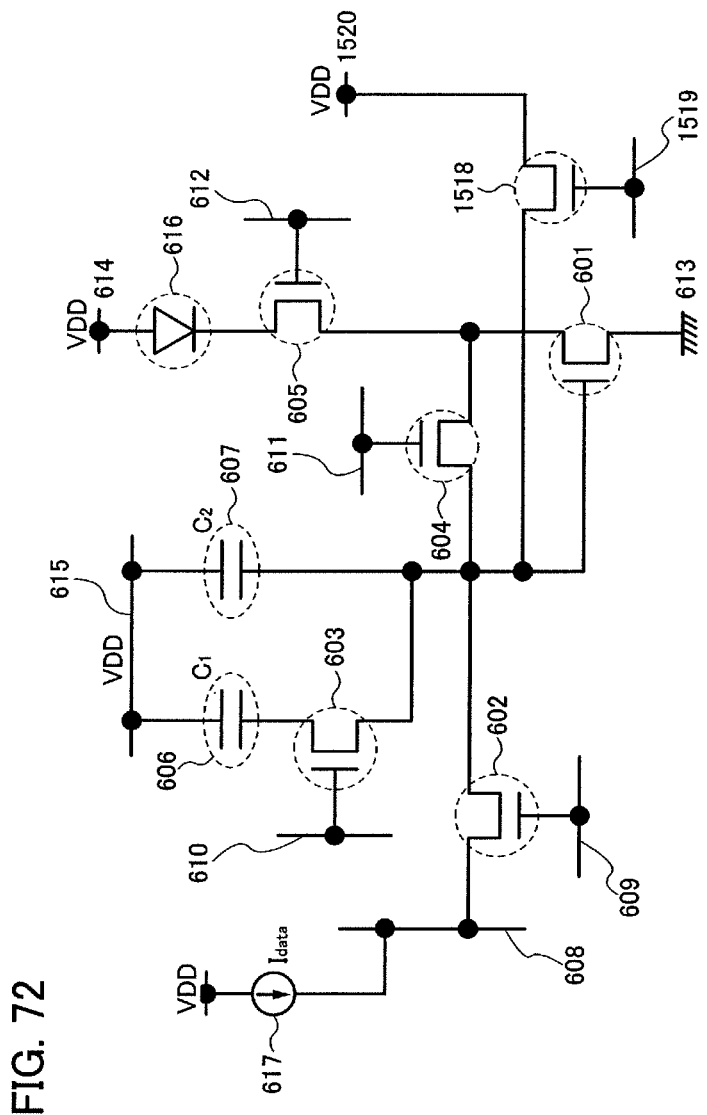
FIG. 72 is a diagram showing an example of a pixel structure in a display device of the present invention.

Note that the first electrode of the sixth transistor 1518 is connected to the second electrode of the first transistor 601, the first electrode of the fourth transistor 604, and the first electrode of the fifth transistor 605 in this embodiment mode; however, the transistor to which the first electrode of the sixth transistor 1518 is connected is not limited thereto. For example, as shown in FIG. 72, a first electrode of a sixth transistor 1518 may be connected to a gate electrode of a first transistor 601, a first electrode of a second transistor 602, a first electrode of a third transistor 603, a second electrode of a fourth transistor 604, and a first electrode of a second storage capacitor 607.

Note that, although the third power supply line is separately provided in this embodiment mode, other existing wiring may also be used instead of the third power supply line. For example, by using any one of scanning lines of a pixel in this row instead of the third power supply line, the third power supply line can be deleted. Accordingly, the number of wirings can be reduced; thus, an aperture ratio of a pixel can be improved. In addition, it is not necessary to generate a new voltage applied to the third power supply line; therefore, as well as a circuit for generating the new voltage, the power consumption can also be reduced. Note that the scanning line that is used instead of the third power supply line is not limited to one having a pixel in this row, and a scanning line of a pixel in a previous row or a scanning line of a pixel in a subsequent row may be used.

Note that the potential of the second power supply line is fixed potential; however, the present invention is not limited thereto. The potential of the second power supply line may be changed depending on the first to third periods.

For example, although, in the first and second periods of T1 and T2 of the pixel circuit shown in FIG. 1, current is made not to flow through the light-emitting element 116 by turning the fifth transistor 105 off, the same operation can be performed by increasing the potential of the second power supply line 114 in the first and second periods T1 and T2, for example. This is because a bias in a reverse direction is applied to the light-emitting element 116 by increasing the potential of the second power supply line 114. Accordingly, the fifth transistor 105 and the fourth scanning line 112 can be deleted. An example of this case is shown in FIGS. 54 and 55.

Figure 54:
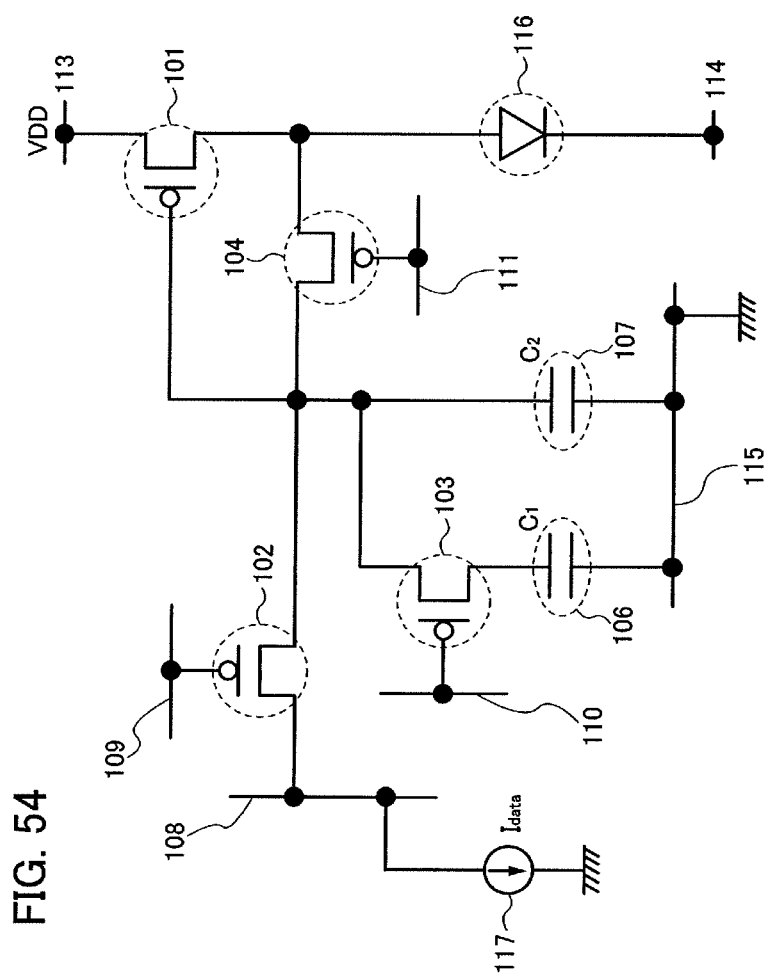
FIG. 54 is a diagram showing an example of a pixel structure in a display device of the present invention.
Figure 55:
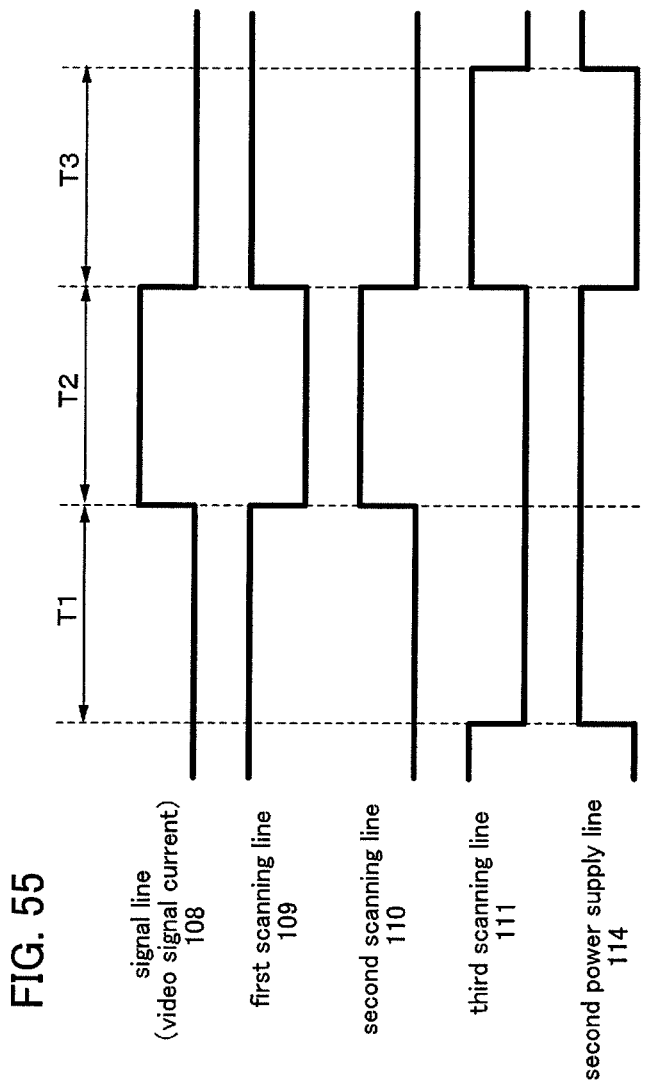
FIG. 55 is a diagram explaining an operation of a pixel circuit in a display device of the present invention.

In FIG. 54, against the pixel circuit shown in FIG. 1, a second electrode of a first transistor 101 is connected to a first electrode of a light-emitting element 116. In addition, FIG. 55 shows timing of a video signal current and pulses inputted into a signal line 108, first to third scanning lines 109 to 111, and a second power supply line 114.

Note that the above operation can be performed by increasing the potential of the second power supply line 114 to be higher than a difference between power supply potential VDD and the threshold voltage |V$_{th}$| of the first transistor 101, that is, VDD−|V$_{th}$| in the first and second periods T1 and T2.

In addition, in a case of providing an initialization period, current is made not to flow through the light-emitting element 116 even in an initialization period by increasing the potential of the second power supply line 114 to be higher than VDD−|V$_{th}$|.

Figure 56:
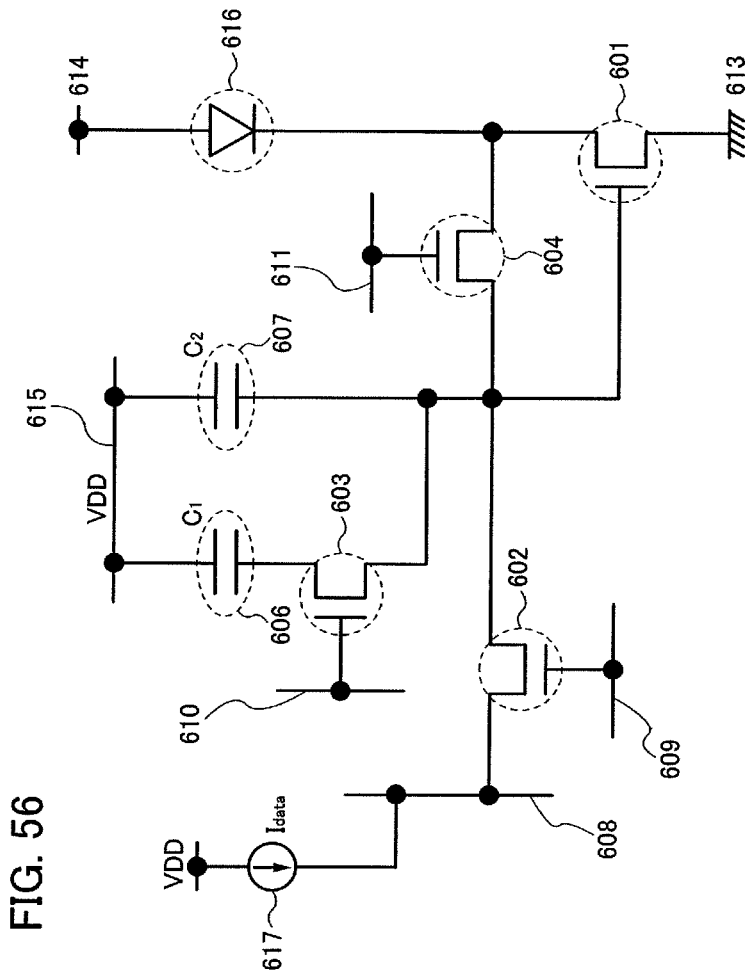
FIG. 56 is a diagram showing an example of a pixel structure in a display device of the present invention.
Figure 57:
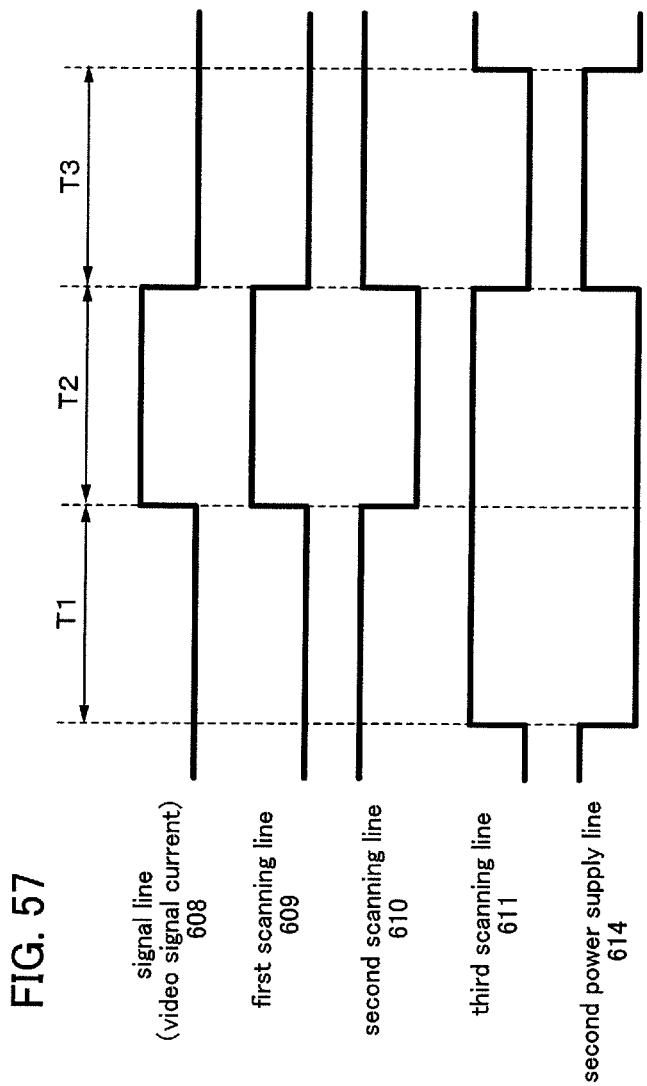
FIG. 57 is a diagram explaining an operation of a pixel circuit in a display device of the present invention.

Moreover, as another example, FIGS. 56 and 57 each show an example of a case where the potential of the second power supply line is changed in the pixel circuit shown in FIG. 6.

In FIG. 56, against the pixel circuit shown in FIG. 6, a second electrode of a first transistor 601 is connected to a second electrode of a light-emitting element 616. In addition, FIG. 57 shows timing of a video signal current and pulses inputted into a signal line 608, first to third scanning lines 609 to 611, and a second power supply line 614. Since a bias in a reverse direction is applied to the light-emitting element 616 by reducing the potential of the second power supply line 614 in the first and second periods T1 and T2, current does not flow through the light-emitting element 616 in the periods T1 and T2.

Note that the above operation can be performed by reducing the potential of the second power supply line 614 to be lower than the threshold voltage |V$_{th}$| of the first transistor 601 in the first and second periods T1 and T2.

In addition, in a case of providing an initialization period, current is made not to flow through the light-emitting element 616 even in an initialization period by reducing the potential of the second power supply line 614 to be lower than the threshold voltage |V$_{th}$| of the first transistor 601.

As shown in FIGS. 54 to 57, since a fifth transistor and a fourth scanning line have not to be provided by changing the potential of the second power supply line depending on a period; thus, an aperture ratio of a pixel can be improved.

Note that, although the capacitor line is separately provided in this embodiment mode, other existing wiring may also be used instead of the capacitor line. For example, by using any one of scanning lines of a pixel in this row instead of the capacitor line, the capacitor line can be deleted. Accordingly, the number of wirings can be reduced; thus, an aperture ratio of a pixel can be improved. In addition, it is not necessary to generate a new voltage applied to the capacitor line; therefore, as well as a circuit for generating the new voltage, the power consumption can also be reduced. Note that the scanning line that is used instead of the capacitor line is not limited to one having a pixel in this row, and a scanning line of a pixel in a previous row or a scanning line of a pixel in a subsequent row may be used.

Embodiment Mode 2

Although the first and second storage capacitors are connected in parallel in Embodiment Mode 1, the storage capacitors may also be connected in series. Thus, this embodiment mode will explain a case where first and second storage capacitors are connected in series. A basic structure of a pixel circuit in a display device of this embodiment mode will be explained with reference to FIG. 17. Note that the explanation will be given by exemplifying an EL element as a light-emitting element.

Figure 17:
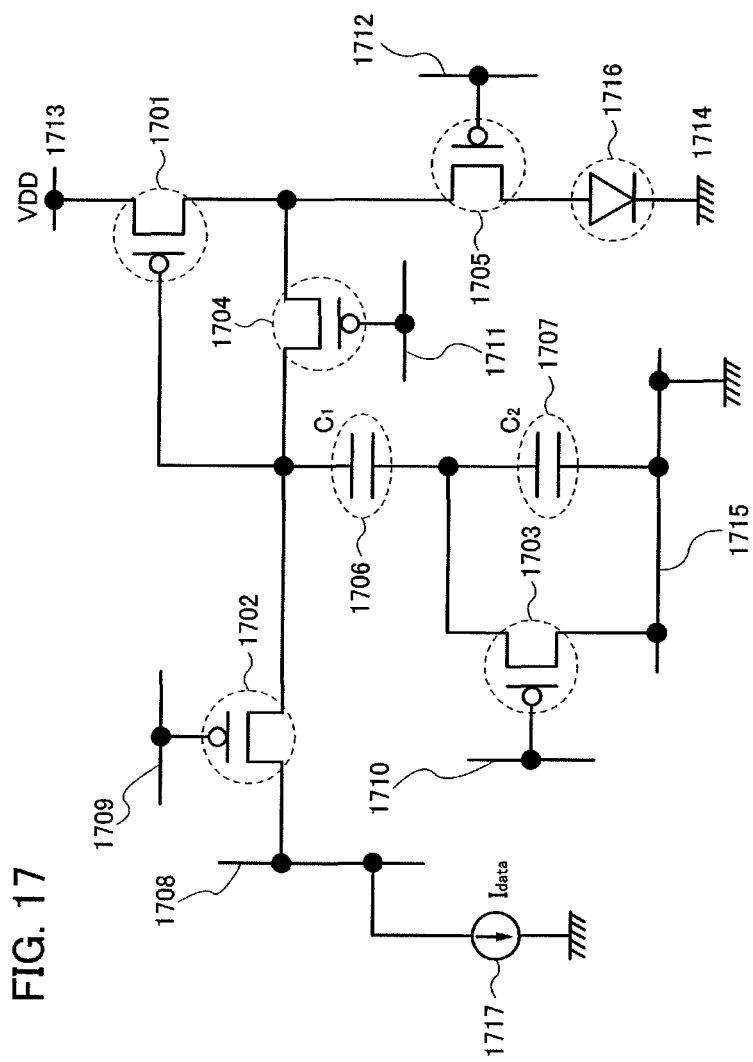
FIG. 17 is a diagram showing an example of a pixel structure in a display device of the present invention.

FIG. 17 is a diagram showing a circuit diagram of a pixel circuit of this embodiment mode. The pixel circuit of this embodiment mode includes first to fifth transistors 1701 to 1705, first and second storage capacitors 1706 and 1707, a signal line 1708, first to fourth scanning lines 1709 to 1712, first and second power supply lines 1713 and 1714, a capacitor line 1715, a light-emitting element 1716, and a current source circuit 1717. Note that the current source circuit 1717 is arranged in each signal line (each column).

Note that, in the pixel circuit shown in FIG. 17, the first to fifth transistors 1701 to 1705 are all P-channel types.

A gate electrode of the first transistor 1701 is connected to a first electrode of the second transistor 1702, a second electrode of the fourth transistor 1704, and a first electrode of the first storage capacitor 1706; a first electrode of the first transistor is connected to the first power supply line 1713; and a second electrode of the first transistor is connected to a first electrode of the fourth transistor 1704 and a first electrode of the fifth transistor 1705. A gate electrode of the second transistor 1702 is connected to the first scanning line 1709, and a second electrode of the second transistor is connected to the signal line 1708. A gate electrode of the third transistor 1703 is connected to the second scanning line 1710; a first electrode of the third transistor is connected to a second electrode of the first storage capacitor 1706 and a first electrode of the second storage capacitor 1707; and a second electrode of the third transistor is connected to the capacitor line 1715. A gate electrode of the fourth transistor 1704 is connected to the third scanning line 1711. A gate electrode of the fifth transistor 1705 is connected to the fourth scanning line 1712, and a second electrode of the fifth transistor is connected to a first electrode of the light-emitting element 1716. A second electrode of the second storage capacitor 1707 is connected to the capacitor line 1715. A second electrode of the light-emitting element 1716 is connected to the second power supply line 1714.

Next, an operation of the pixel circuit of this embodiment mode will be explained with reference to FIGS. 18 to 21.

Figure 18:
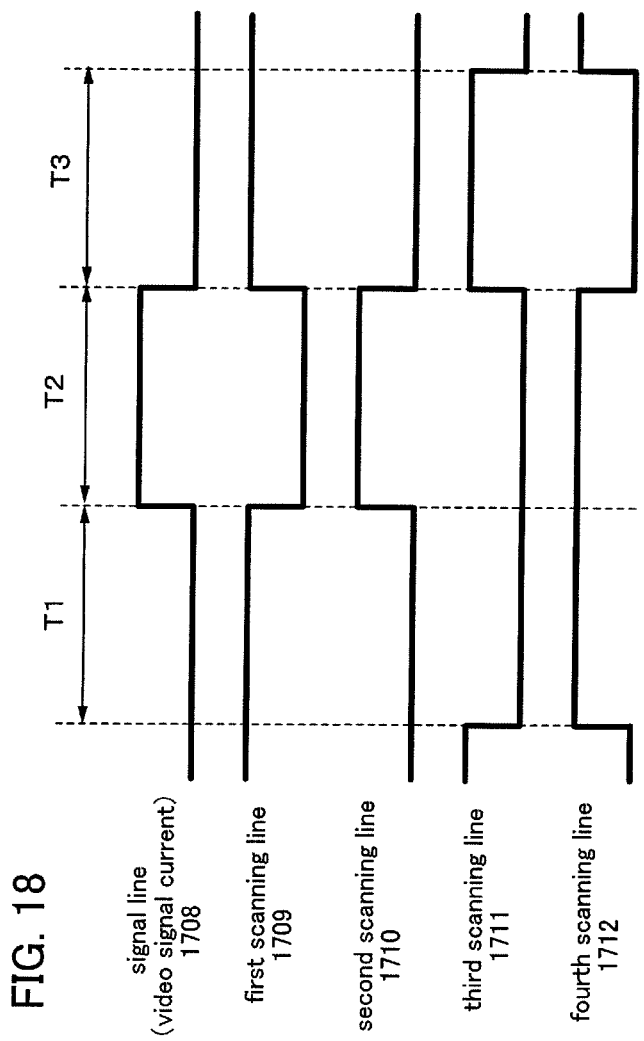
FIG. 18 is a diagram explaining an operation of a pixel circuit in a display device of the present invention.

FIG. 18 shows timing of a video signal current and pulses inputted into the signal line 1708 and the first to fourth scanning lines 1709 to 1712. An operation cycle of the pixel circuit is divided into three periods of first to third periods T1 to T3, in accordance with each operation of pixel circuits shown in FIGS. 19 to 21.

Figure 19:
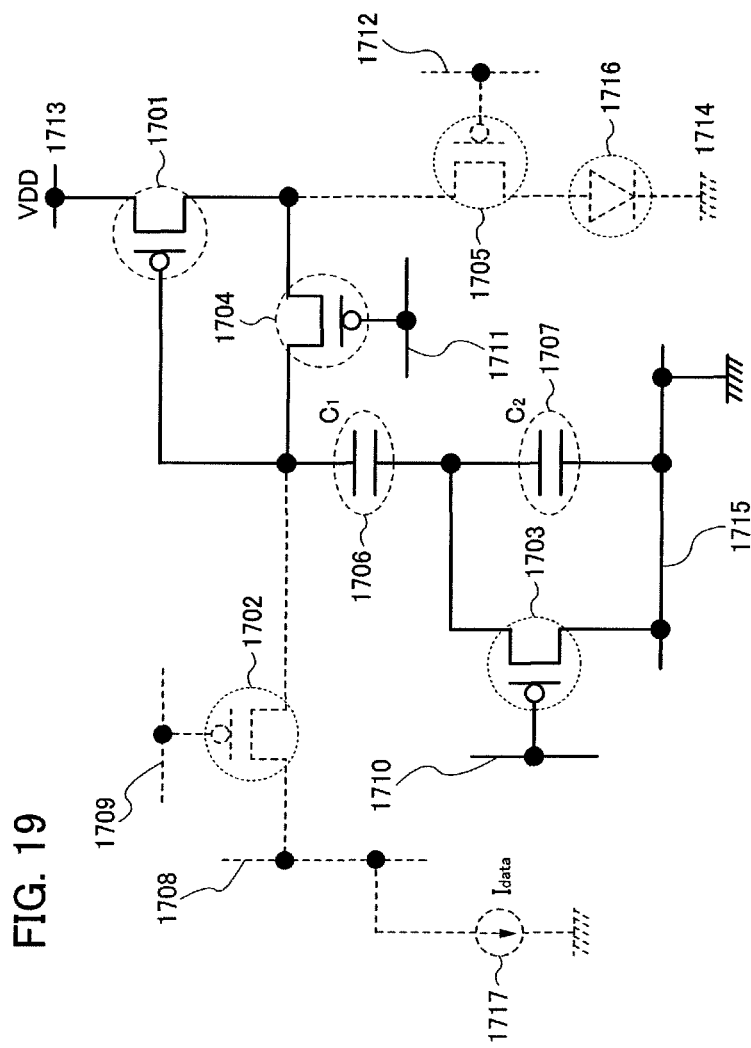
FIG. 19 is a diagram explaining an operation of a pixel circuit in a display device of the present invention.
Figure 20:
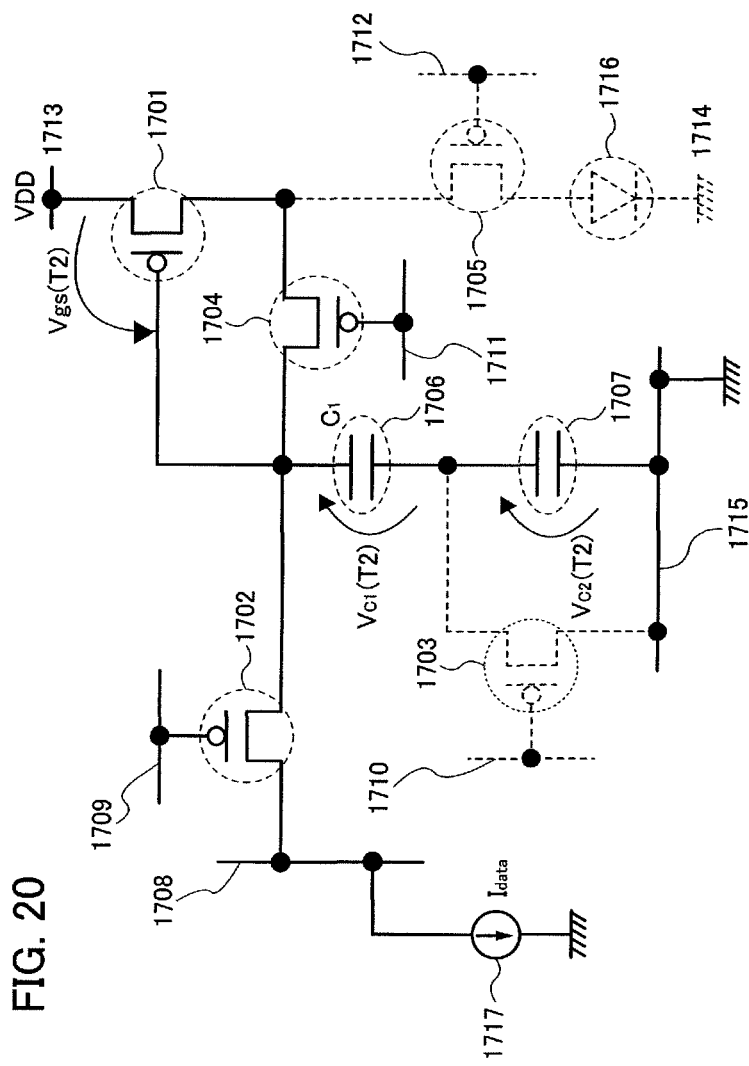
FIG. 20 is a diagram explaining an operation of a pixel circuit in a display device of the present invention.
Figure 21:
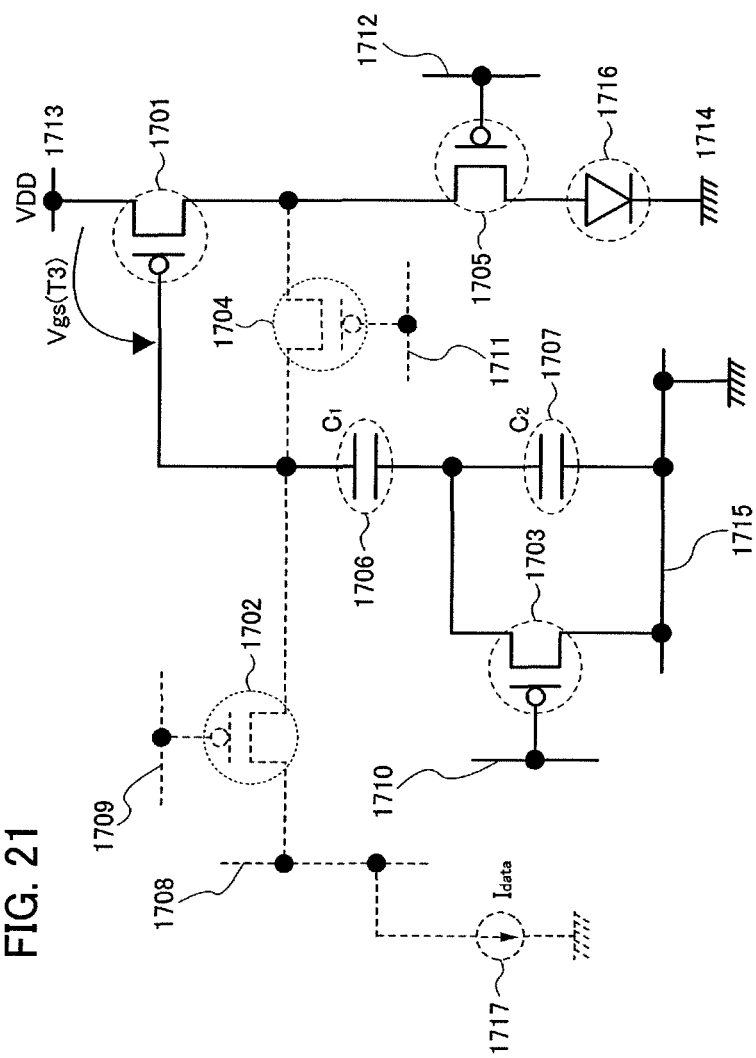
FIG. 21 is a diagram explaining an operation of a pixel circuit in a display device of the present invention.

FIGS. 19 to 21 are diagrams each showing a connection state of the pixel circuit of this embodiment mode in each period. Note that, in FIGS. 19 to 21, it shows that the place shown in a solid line is in a conductive state, whereas the place shown in a broken line is in a non-conductive state.

First, the operation of the pixel circuit in the first period T1 will be explained with reference to FIG. 19. FIG. 19 is a diagram showing a connection state of the pixel circuit in the first period T1. In the first period T1, the second and third scanning lines 1710 and 1711 are in an L level; thus, the third and fourth transistors 1703 and 1704 are turned on. In addition, the first and fourth scanning lines 1709 and 1712 are in an H level; thus, the second and fifth transistors 1702 and 1705 are turned off. Accordingly, the second electrode of the first storage capacitor 1706 and both the electrodes of the second storage capacitor 1707 are connected to the capacitor line 1715. In addition, the first transistor 1701 becomes a diode-connected state, and current flows through the first storage capacitor 1706; thus, the first storage capacitor 1706 is charged. Note that since both the electrodes of the second storage capacitor 1707 are connected to the capacitor line, the potential between both the electrodes becomes equivalent; thus, the second storage capacitor 1707 is not charged. The first storage capacitor 1706 is charged until a voltage held in the first storage capacitor 1706 becomes a voltage corresponding to a difference between a power supply voltage VDD and the threshold voltage $|V_{th}|$ of the first transistor 1701, that is, VDD–$|V_{th}|$. When the voltage held in the first storage capacitor 1706 becomes VDD–$|V_{th}|$, the first transistor 1701 is turned off and current does not flow through the first storage capacitor 1706.

Through the above operations, in the first period T1, the threshold voltage $|V_{th}|$ of the first transistor 1701 is held in the first storage capacitor 1706.

Next, the operation of the pixel circuit in the second period T2 will be explained with reference to FIG. 20. FIG. 20 is a diagram showing a connection state of the pixel circuit in the second period T2. In the second period T2, the first and third scanning lines 1709 and 1711 are in an L level; thus, the second and fourth transistors 1702 and 1704 are turned on. In addition, the second and fourth scanning lines 1710 and 1712 are in an H level; thus, the third and fifth transistors 1703 and 1705 are turned off. Moreover, a video signal current $I_{data}$ flows through the signal line 1708 from the current source circuit 1717. Accordingly, the first transistor 1701 becomes a diode-connected state, and current flows through the first and second storage capacitors 1706 and 1707, which are connected in series; thus, the first and second storage capacitors 1706 and 1707 are charged. At this time, the video signal current $I_{data}$ flows through the signal line 1708; therefore, $I_{data}$ flows through the drain and source of the first transistor 1701. Therefore, a gate-source voltage of the first transistor 1701 is a voltage necessary for the first transistor 1701 to make $I_{data}$ flow. When the gate-source voltage of the first transistor 1701 at this time is considered as $V_{gs}$(T2), the video signal current $I_{data}$ is expressed as the equation (1) as mentioned above. The gate-source voltage of the first transistor 1701 $V_{gs}$(T2) in the period T2 is expressed as the equation (2) as mentioned above.

The first and second storage capacitors 1706 and 1707 are charged until the sum of a voltage held in each storage capacitor becomes a voltage corresponding to a difference between the power supply voltage VDD and the gate-source voltage $|V_{gs}(T2)|$ of the first transistor 1701, that is, VDD–$|V_{gs}(T2)|$. When the sum of the voltage held in each storage capacitor becomes VDD–$|V_{gs}$(T2)|, the first transistor 1701 is turned off and a current does not flow through each storage capacitor. At this time, when a voltage held in each of the first and second storage capacitors 1706 and 1707 is considered as $V_{C1}$(T2) and $V_{C2}$(T2), $V_{C1}$(T2) and $V_{C2}$(T2) are expressed as the following equations (6) and (7).

$$V_{C1}(T2) = VDD - \frac{C_1}{C_1 + C_2}|V_{th}| - \frac{C_2}{C_1 + C_2}|V_{gs}(T2)| \quad (6)$$

$$V_{C2}(T2) = \frac{C_1}{C_1 + C_2}(|V_{th}| - |V_{gs}(T2)|) \quad (7)$$

Note that $C_1$ expresses capacitance of the first storage capacitor 1706, and $C_2$ expresses capacitance of the second storage capacitor 1707.

Through the above operations, in the second period T2, a gate-source voltage $|V_{ga}(T2)|$ which is necessary for the first transistor 1701 to make a video signal current $I_{data}$ flow is held in the first and second storage capacitors 1706 and 1707.

Next, the operation of the pixel circuit in the third period T3 will be explained with reference to FIG. 21. FIG. 21 is a diagram showing a connection state of the pixel circuit in the third period T3. In the third period T3, the second and fourth scanning lines 1710 and 1712 are in an L level; thus, the third and fifth transistors 1703 and 1705 are turned on. In addition, the first and third scanning lines 1709 and 1711 are in an H level; thus, the second and fourth transistors 1702 and 1704 are turned off. Accordingly, the second electrode of the first storage capacitor 1706 and both the electrodes of the second storage capacitor 1707 are connected to the capacitor line. At this time, since the first electrode of the first storage capacitor 1706 is in a floating state, the voltage $V_{C1}$(T2) held in the period T2 is held without any change. In addition, since both the electrodes of the second storage capacitor 1707 is connected to the capacitor line, the potential between both the electrodes becomes equivalent; thus, the voltage held in the second storage capacitor 1707 becomes 0.

In the gate electrode of the first transistor 1701, a voltage $V_{c1}$ (T2) held in the first storage capacitor 1706 is added. Therefore, when a gate-source voltage of the first transistor 1701 in the period T3 is considered as $V_{gs}$ (T3), $V_{gs}$ (T3) is expressed as the following equation (8). Note that only the voltage $V_{c1}$ (T2) held in the first storage capacitor 1706 is added to the gate electrode of the first transistor 1701 in the period T3, the gate-source voltage $|V_{gs}$ (T3)$|$ of the first transistor 1701 in the period T3 is lower than the gate-source voltage $|V_{gs}$ (T2)$|$ of the first transistor 1701 in the period T2.

$$|V_{gs}(T3)| = VDD - V_{C1}(T2) \qquad (8)$$
$$= \frac{C_1}{C_1+C_2}|V_{th}| + \frac{C_2}{C_1+C_2}|V_{gs}(T2)|$$

Therefore, a current $I_{OLED}$ flowing through the drain and source of the first transistor 1701 is expressed as the following equation (9), and this current flows through the light-emitting element 1716 through the fifth transistor 1705; thus, the light-emitting element 1716 emits light. Note that, since the gate-source voltage of the first transistor 1701 in the period T3 is lower than that in the period T2, a current $I_{OLED}$ flowing through the drain and source of the first transistor 1701 in the period T3 is lower than the current $I_{data}$ flowing through the drain and source of the first transistor 1701 in the period T2.

$$I_{OLED} = \frac{\beta}{2}(|V_{gs}(T3)| - |V_{th}|)^2 = \left(\frac{C_2}{C_1+C_2}\right)^2 I_{data} \qquad (9)$$

Through the above operations, in the third period T3, the current $I_{OLED}$ lower than the video signal current $I_{data}$ flows through the light-emitting element 1716; thus, the light-emitting element 1716 emits light.

As described in the equation (9), the current $I_{OLED}$ flowing through the light-emitting element 1716 is expressed without depending on the threshold voltage $V_{th}$ or mobility (included in the constant β) of the first transistor 1701; therefore, variation in the threshold voltage or mobility of the transistor can be compensated.

In addition, since the current $I_{OLED}$ flowing through the light-emitting element 1716 is a value approximately $[C_2/(C_1+C_2)]^2$ times as low as the video signal current $I_{data}$, it is possible to make a current which is $[(C_1+C_2)/C_2]^2$ times as high as the current $I_{OLED}$ flow as the video signal current $I_{data}$. Accordingly, a signal line can be sufficiently charged within one horizontal scanning period; thus, a display can be performed accurately even in a case where a low gray scale is displayed.

Moreover, the current $I_{OLED}$ flowing through the light-emitting element 1716 depends on a capacitance ratio of the first and second storage capacitors 1706 and 1707, and when the capacitance ratio is constant, $I_{OLED}$ is also constant. Here, since the first and second storage capacitors are generally formed in the same process, an error in capacitance is almost the same ratio in the first and second storage capacitors 1706 and 1707, even when misalignment of a mask pattern is caused during manufacturing the display device. Therefore, even in a case of a manufacturing error, it is possible to maintain a substantially constant value of a value $[C_1/(C_1+C_2)]$, and to maintain a substantially constant value of $I_{OLED}$.

Through the above, according to the pixel structure of this embodiment mode, variation in the threshold value of a transistor can be compensated to reduce variation in a luminance; therefore, image quality can be improved.

Note that, the potential of the second power supply line and the capacitor line is ground potential (GND) in FIG. 17; however, the present invention is not limited thereto. Any potential is acceptable as long as the potential is lower than VDD−$|V_{th}|$ which is a difference between the power supply voltage VDD and the threshold voltage $|V_{th}|$ of the first transistor 1701.

Note that, in this embodiment mode, the storage capacitor may be formed of metal or a MOS transistor. In particular, when the storage capacitor is formed of a MOS transistor, an occupation area of the storage capacitor can be reduced more than in a case where the storage capacitor is formed of metal; thus, an aperture ratio of a pixel can be increased.

Figure 73:
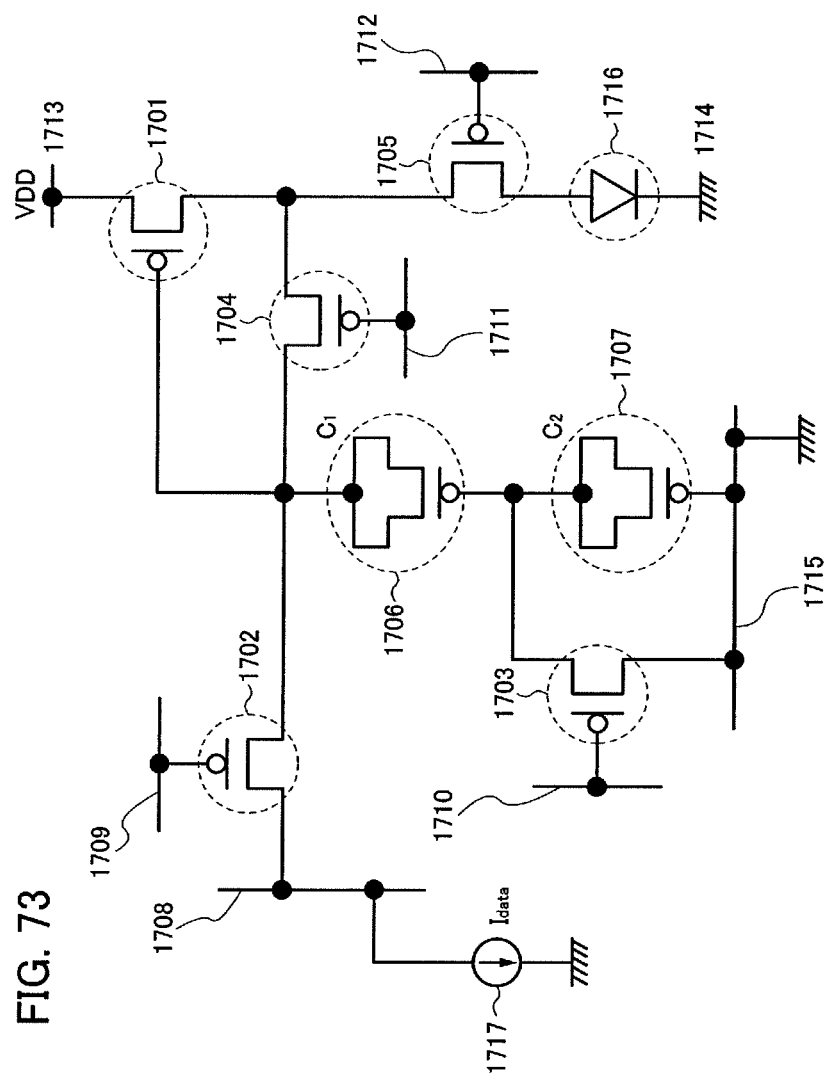
FIG. 73 is a diagram showing an example of a pixel structure in a display device of the present invention.
Figure 74:
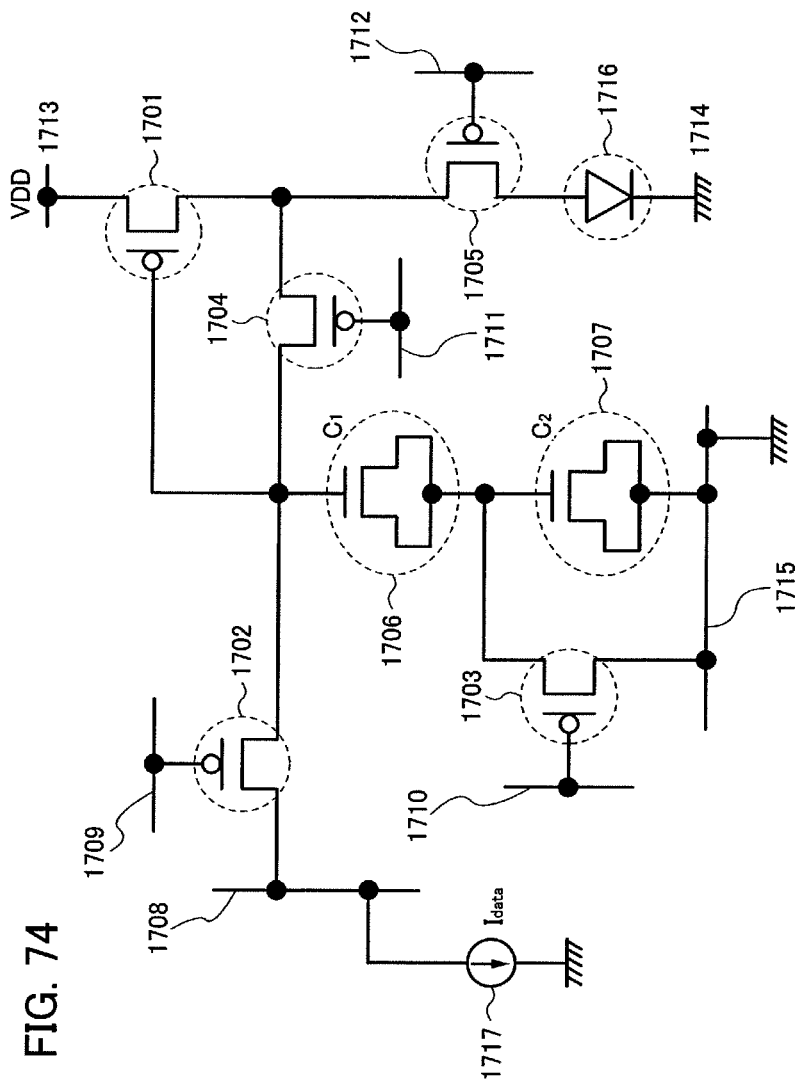
FIG. 74 is a diagram showing an example of a pixel structure in a display device of the present invention.

For example, FIGS. 73 and 74 each show an example of a case of forming the storage capacitor with a MOS transistor in the pixel circuit shown in FIG. 17.

FIG. 73 shows a case of forming the first and second storage capacitors 1706 and 1707 with P-channel transistors. In the first and second storage capacitors 1706 and 1707 in the case of the pixel circuit shown in FIG. 17, potential of the first electrode is higher than that of the second electrode. Therefore, in order to make the P-channel transistor serve as a storage capacitor, first and second electrodes of the P-channel transistor are made to serve as the first electrodes of the first and second storage capacitors 1706 and 1707, and a gate electrode of the P-channel transistor is made to serve as the second electrodes of the first and second storage capacitors 1706 and 1707.

FIG. 74 shows a case of forming the first and second storage capacitors 1706 and 1707 with N-channel transistors. In order to make the N-channel transistor serve as a storage capacitor in the case of the pixel circuit shown in FIG. 17, a gate electrode of the N-channel transistor is made to serve as first electrodes of the first and second storage capacitors 1706 and 1707, and first and second electrodes of the N-channel transistor are made to serve as second electrodes of the first and second storage capacitors 1706 and 1707.

As in this embodiment mode, in a case of forming the first and second storage capacitors 1706 and 1707 with a MOS transistor, a voltage higher than the threshold voltage of the MOS transistor is constantly applied between a gate and a source of the MOS transistor by connecting the first and second storage capacitors between the gate electrode of the first transistor 1701 and the capacitor line 1715. Therefore, the MOS transistor can be made to constantly serve as a storage capacitor. Thus, a desired voltage can appropriately be held in the storage capacitors in the operating process of the pixel circuit.

Note that, in the pixel circuit shown in FIG. 17, the first to fifth transistors 1701 to 1705 are all P-channel types; however, all of these transistors can be N-channel transistors. Here, FIG. 22 shows a structure in the case where the first to fifth transistors are all N-channel types.

Figure 22:
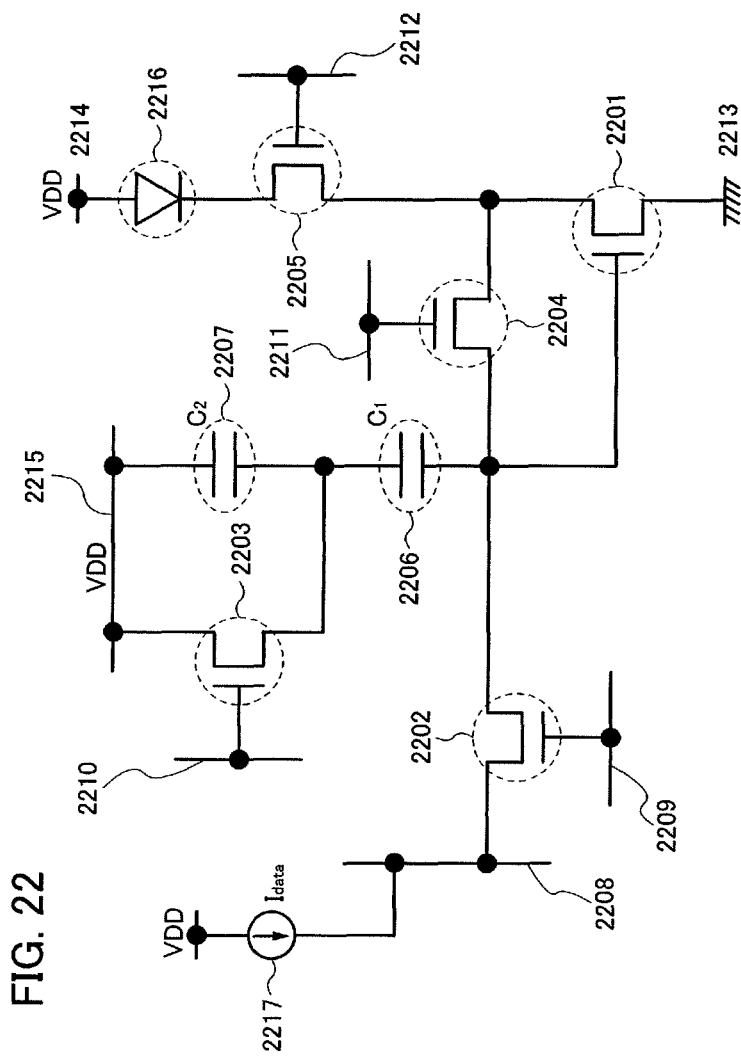
FIG. 22 is a diagram showing an example of a pixel structure in a display device of the present invention.

A pixel circuit of FIG. 22 includes first to fifth transistors 2201 to 2205, first and second storage capacitors 2206 and 2207, a signal line 2208, first to fourth scanning lines 2209 to 2212, first and second power supply lines 2213 and 2214, a capacitor line 2215, a light-emitting element 2216, and a current source circuit 2217. Note that the current source circuit 2217 is arranged in each signal line (each column).

A gate electrode of the first transistor 2201 is connected to a first electrode of the second transistor 2202, a second electrode of the fourth transistor 2204, and a first electrode of the first storage capacitor 2206; a first electrode of the first transistor is connected to the first power supply line 2213; and a second electrode of the first transistor is connected to a first electrode of the fourth transistor 2204 and a first electrode of the fifth transistor 2205. A gate electrode of the second transistor 2202 is connected to the first scanning line 2209, and a second electrode of the second transistor is connected to the signal line 2208. A gate electrode of the third transistor 2203 is connected to the second scanning line 2210; a first electrode of the third transistor is connected to a second electrode of the first storage capacitor 2206 and a first electrode of the second storage capacitor 2207; and a second electrode of the third transistor is connected to the capacitor line 2215. A gate electrode of the fourth transistor 2204 is connected to the third scanning line 2211. A gate electrode of the fifth transistor 2205 is connected to the fourth scanning line 2212, and a second electrode of the fifth transistor is connected to a second electrode of the light-emitting element 2216. A second electrode of the second storage capacitor 2207 is connected to the capacitor line 2215. A first electrode of the light-emitting element 2216 is connected to the second power supply line 2214.

Next, an operation of the pixel circuit of this embodiment mode will be explained with reference to FIG. 23.

Figure 23:
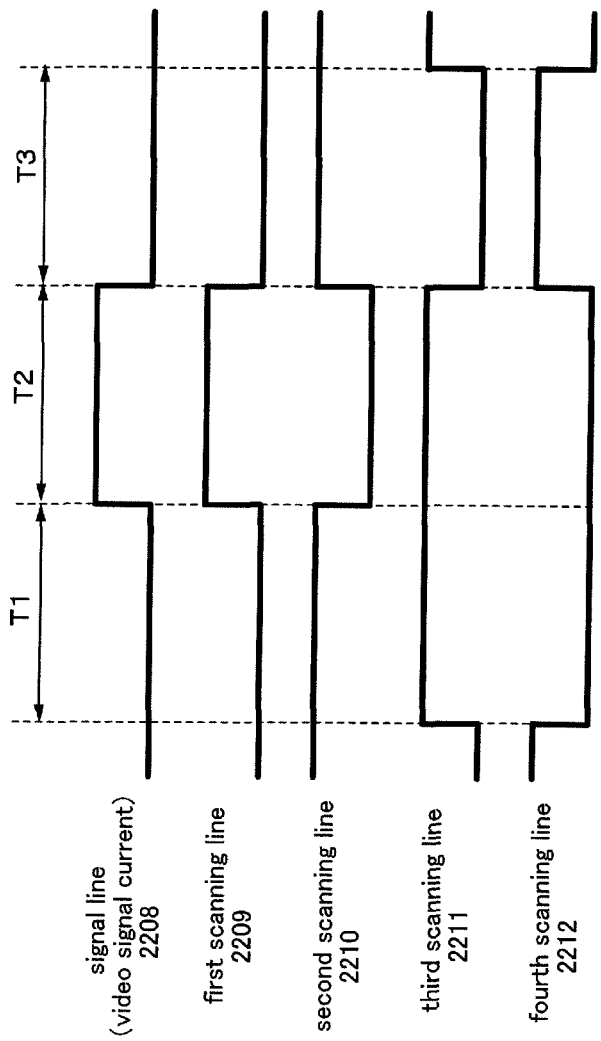
FIG. 23 is a diagram explaining an operation of a pixel circuit in a display device of the present invention.

FIG. 23 shows timing of a video signal current and pulses inputted into the signal line 2208 and the first to fourth scanning lines 2209 to 2212. Since the first to fifth transistors are all N-channel types, an H level and an L level of the timing of the pulses inputted into the first to fourth scanning lines 2209 to 2212 are reversed against the case where all transistors are P-channel types (FIG. 2). In addition, an operation cycle of the pixel circuit is divided into three periods of first to third periods T1 to T3, in accordance with each operation of the pixel circuit.

The operation of the pixel circuit in FIG. 22 in the first to third periods of T1 to T3 is the same as the operation of the pixel circuit shown in FIG. 17. In other words, in the first period T1, the threshold voltage $|V_{th}|$ of the first transistor 2201 is held in the first storage capacitor 2206. Next, in the second period T2, a gate-source voltage $|V_{ga}(T2)|$ which is necessary for the first transistor 2201 to make a video signal current $I_{data}$ flow is held in the first and second storage capacitors 2206 and 2207. Then, in the third period T3, a current $I_{OLED}$ that is lower than the video signal current $I_{data}$ flows through the light-emitting element 2216; thus, the light-emitting element 2216 emits light. Note that, as well as the pixel circuit shown in FIG. 17, the current $I_{OLED}$ flowing through the light-emitting element 2216 is expressed as the equation (9).

Also in the pixel circuit shown in FIG. 22, the current $I_{OLED}$ flowing through the light-emitting element 2216 is expressed without depending on the threshold voltage $V_{th}$ or mobility (included in the constant β) of the first transistor 2201; therefore, variation in the threshold voltage or mobility of the transistor can be compensated.

In addition, since the current $I_{OLED}$ flowing through the light-emitting element 2216 is a value approximately $[C_2/(C_1+C_2)]^2$ times as low as the video signal current $I_{data}$, it is possible to make a current which is $[(C_1+C_2)/C_2]^2$ times as high as the current $I_{OLED}$ flow as the video signal current $I_{data}$. Accordingly, a signal line can be sufficiently charged within one horizontal scanning period; thus, a display can be performed accurately even in a case where a low gray scale is displayed.

Moreover, the current $I_{OLED}$ flowing through the light-emitting element 2216 depends on a capacitance ratio of the first and second storage capacitors 2206 and 2207, and when the capacitance ratio is constant, $I_{OLED}$ is also constant. Here, since the first and second storage capacitors are generally formed in the same process, an error in capacitance is almost the same ratio in the first and second storage capacitors 2206 and 2207, even when misalignment of a mask pattern is caused during manufacturing the display device. Therefore, even in a case of a manufacturing error, it is possible to maintain a substantially constant value of a value $[C_1/(C_1+C_2)]$, and to maintain a substantially constant value of $I_{OLED}$.

Also in the pixel circuit shown in FIG. 22, in a case of forming the first and second storage capacitors 2206 and 2207 with a MOS transistor, a voltage higher than the threshold voltage of the MOS transistor is constantly applied between a gate and a source of the MOS transistor by connecting the first and second storage capacitors between the capacitor line 2215 and the gate electrode of the first transistor 2201. Therefore, the MOS transistor can be made to constantly serve as a storage capacitor. Thus, a desired voltage can appropriately be held in the storage capacitors in the operating process of the pixel circuit.

Through the above, according to the pixel structure of this embodiment mode, variation in the threshold value of a transistor can be compensated to reduce variation in a luminance; therefore, image quality can be improved.

Note that the potential of the first power supply line is ground potential (GND) in this embodiment mode; however, the present invention is not limited thereto. Any potential is acceptable as long as the potential is lower than $VDD-|V_{th}|$ which is a difference between a power supply voltage VDD and the threshold voltage $|V_{th}|$ of the first transistor 2201. In addition, the potential of the capacitor line is the power supply potential VDD; however, the present invention is not limited thereto. Any potential is acceptable as long as the potential is higher than the threshold voltage $|V_{th}|$ of the first transistor 2201.

Note that the transistors have the same conductivity type like the first to fifth transistors all of which can be formed to be P-channel types or N-channel types in this embodiment mode; however, the present invention is not limited thereto. The circuit may be formed by using both a P-channel transistor and an N-channel transistor.

Figure 24:
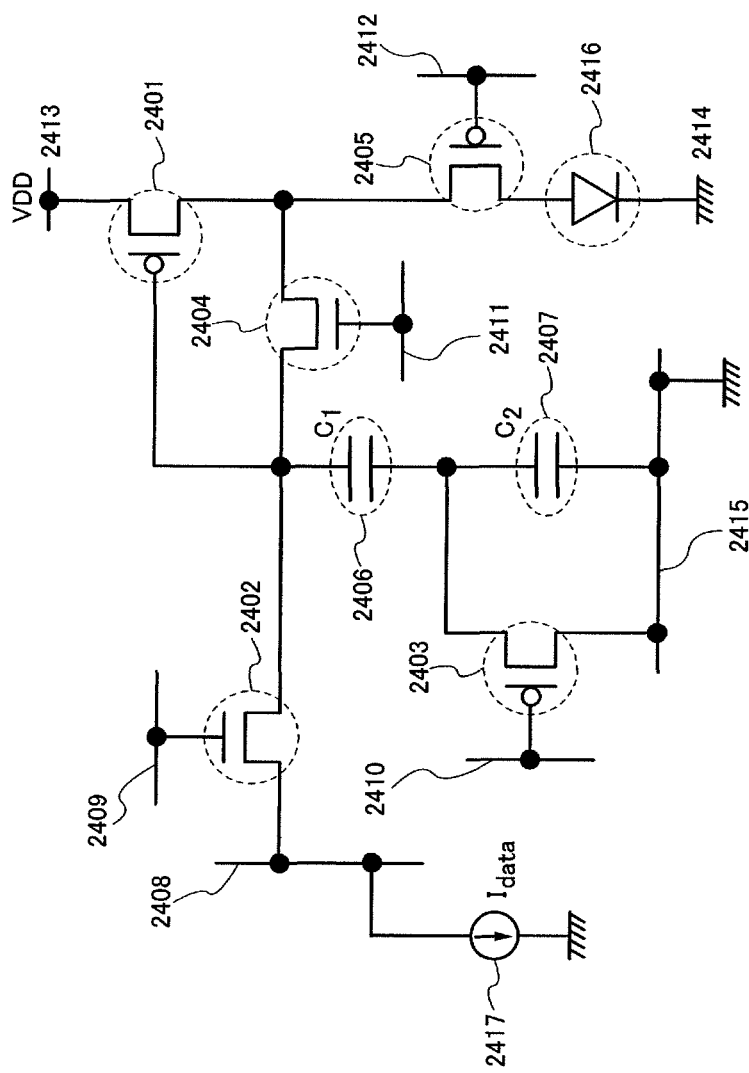
FIG. 24 is a diagram showing an example of a pixel structure in a display device of the present invention.

For example, the second and fourth transistors may be formed to be N-channel types, and the first, third, and fifth transistors may be formed to be P-channel types. This pixel circuit is shown in FIG. 24. In addition, timing of a video signal current and pulses inputted into a signal line and first to fourth scanning lines is shown in FIG. 25.

A pixel circuit of FIG. 24 includes first to fifth transistors 2401 to 2405, first and second storage capacitors 2406 and 2407, a signal line 2408, first to fourth scanning lines 2409 to 2412, first and second power supply lines 2413 and 2414, a capacitor line 2415, a light-emitting element 2416, and a current source circuit 2417. Note that the current source circuit 2417 is arranged in each signal line (each column).

Figure 25:
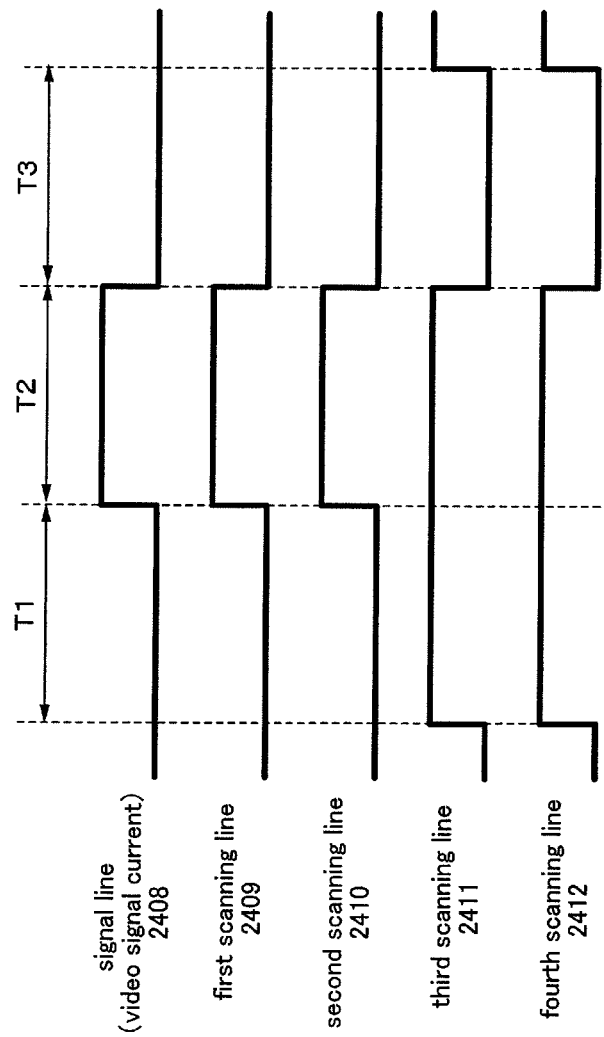
FIG. 25 is a diagram explaining an operation of a pixel circuit in a display device of the present invention.
Figure 52:
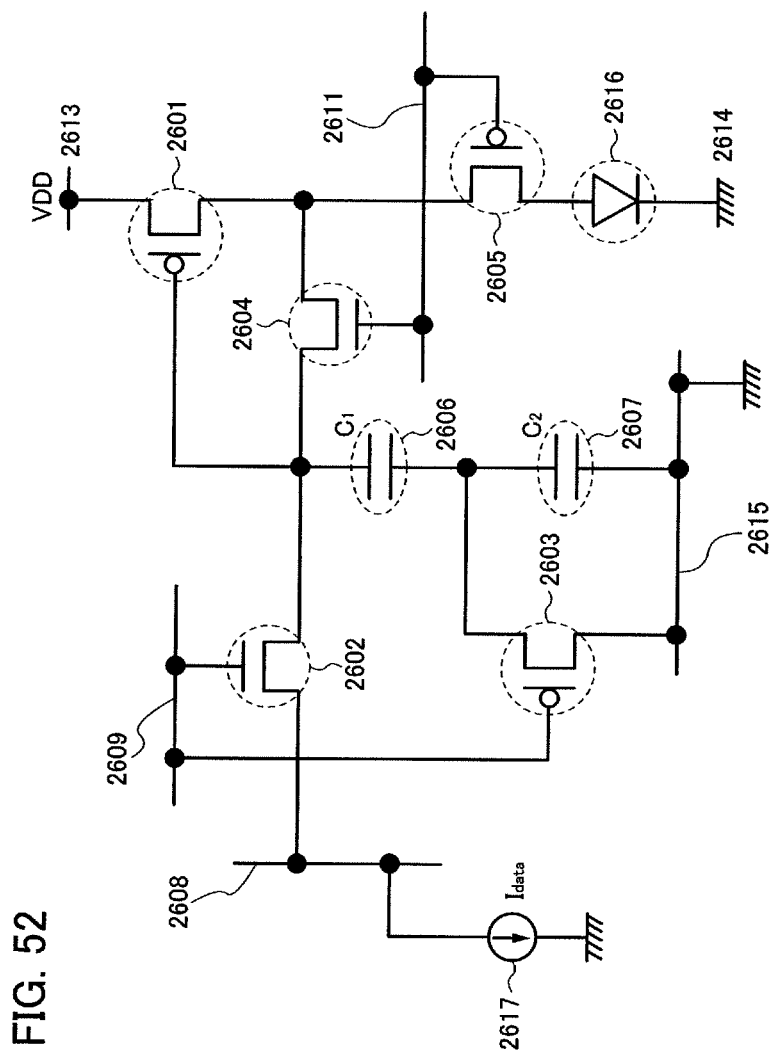
FIG. 52 is a diagram showing an example of a pixel structure in a display device of the present invention.

In such a circuit configuration that is shown in FIG. 24, the timing of the pulses inputted into the first and second scanning lines are the same as shown in FIG. 25; therefore, the second and third transistors can be controlled with the scanning line in common. In the same manner, the timing of the pulses inputted into the third and fourth scanning lines are the same; therefore, the fourth and fifth transistors can be controlled with the scanning line in common. Here, FIG. 52 shows an example in a case of controlling the second and third transistors by the first scanning line, and the fourth and fifth transistors by the third scanning line.

Figure 26:
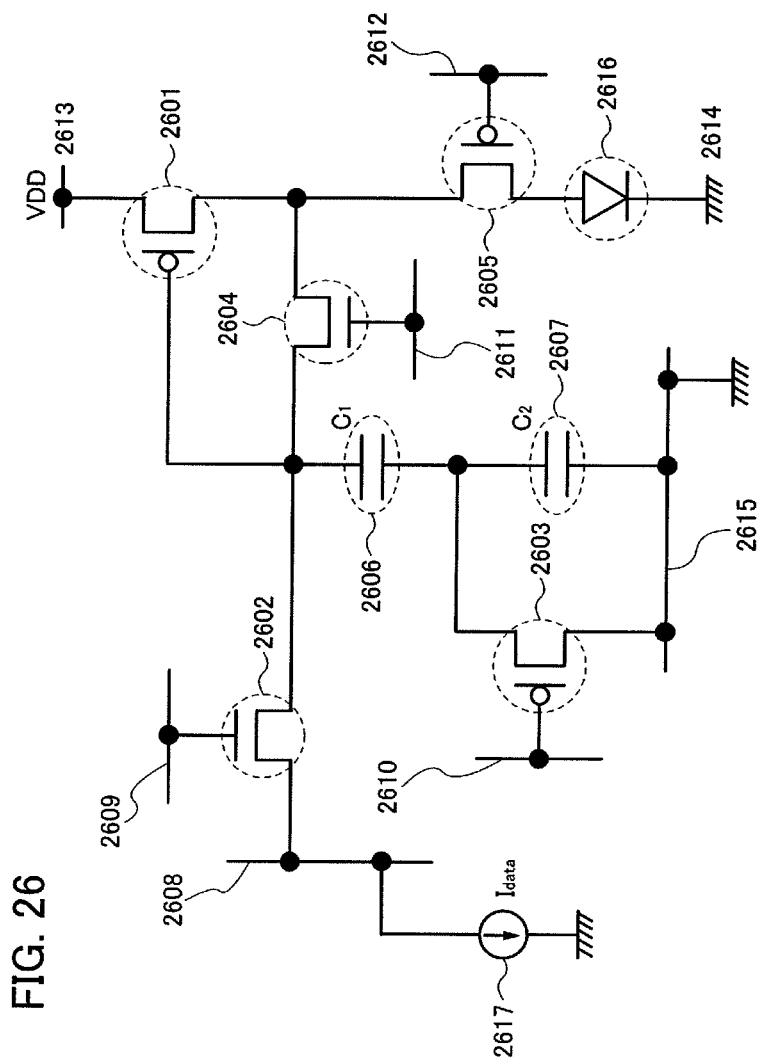
FIG. 26 is a diagram showing an example of a pixel structure in a display device of the present invention.

In addition, as another example, the second and fourth transistors may be formed to be P-channel types, and the first, third, and fifth transistors may be formed to be N-channel types. This pixel circuit is shown in FIG. 26. In addition, timing of a video signal current and pulses inputted into a signal line and first to fourth scanning lines is shown in FIG. 27.

A pixel circuit of FIG. 26 includes first to fifth transistors 2601 to 2605, first and second storage capacitors 2606 and 2607, a signal line 2608, first to fourth scanning lines 2609 to 2612, first and second power supply lines 2613 and 2614, a capacitor line 2615, a light-emitting element 2616, and a current source circuit 2617. Note that the current source circuit 2617 is arranged in each signal line (each column).

Figure 27:
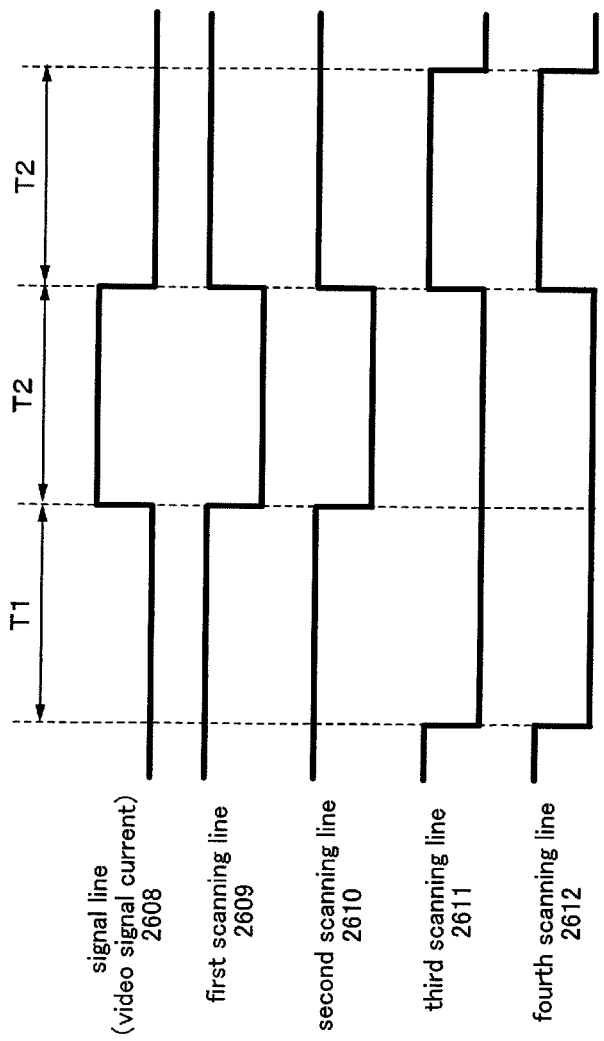
FIG. 27 is a diagram explaining an operation of a pixel circuit in a display device of the present invention.
Figure 53:
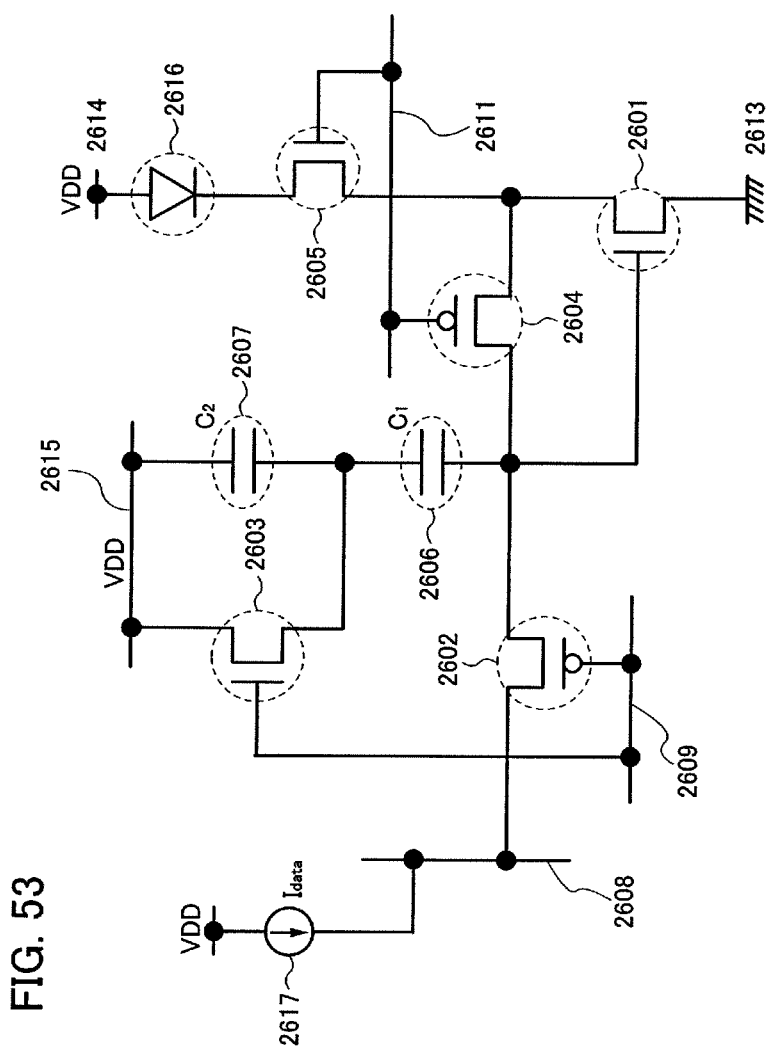
FIG. 53 is a diagram showing an example of a pixel structure in a display device of the present invention.

In such a circuit configuration that is shown in FIG. 26, the timing of the pulses inputted into the first and second scanning lines are the same as shown in FIG. 27; therefore, the second and third transistors can be controlled with the scanning line in common. In the same manner, the timing of the pulses inputted into the third and fourth scanning lines are the same; therefore, the fourth and fifth transistors can be controlled with the scanning line in common. Here, FIG. 53 shows an example in a case of controlling the second and third transistors by the first scanning line, and the fourth and fifth transistors by the third scanning line.

As shown in FIGS. 24 to 27, 52, and 53, when the second and third transistors are formed to have a different conductivity type to each other, the second and third transistors can be controlled with the scanning line in common. In the same manner, when the fourth and fifth transistors are formed to have a different conductivity type to each other, the fourth and fifth transistors can be controlled with the scanning line in common. Accordingly, the number of scanning lines can be reduced; thus, an aperture ratio of a pixel can be improved. In addition, the number of scanning line driver circuits can also be reduced; thus, power consumption can be reduced.

Note that which of the conductivity type the first to fifth transistors have is not limited to the content described above.

Note that, in this embodiment mode, a second electrode of the third transistor and a second electrode of the second storage capacitor are connected to the capacitor line in common; however, each of the second electrode of the third transistor and the second electrode of the second storage capacitor may be connected to a different wiring.

Figure 75:
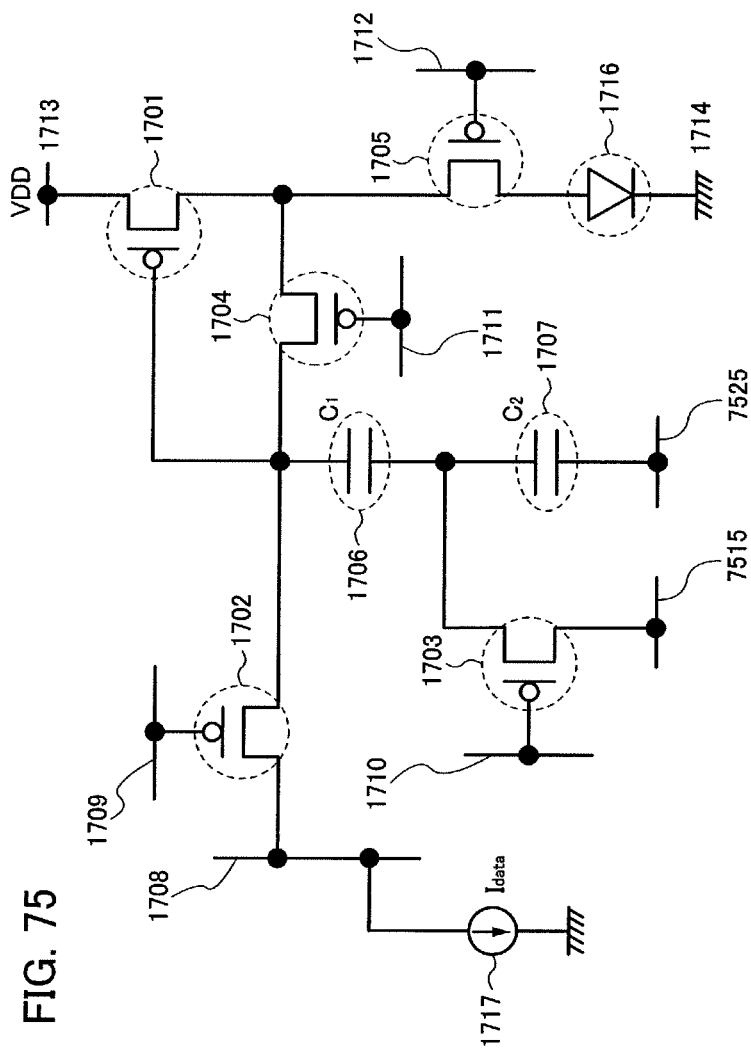
FIG. 75 is a diagram showing an example of a pixel structure in a display device of the present invention.

For example, FIG. 75 shows a pixel structure in a case of connecting each of the second electrode of the third transistor and the second electrode of the second storage capacitor to a different wiring in the circuit shown in FIG. 17. In the pixel structure shown in FIG. 75, a second electrode of a third transistor 1703 is connected to a first capacitor line 7515, and a second electrode of a second storage capacitor 1707 is connected to a second capacitor line 7525.

As shown in FIG. 75, a voltage held in the first and second storage capacitors can be controlled by connecting each of the second electrode of the third transistor and the second electrode of the second storage capacitor to a different wiring.

Note that, in the same manner as the pixel circuit described in Embodiment Mode 1, before holding the threshold voltage of the first transistor in the storage capacitor, a period in which a voltage held in the storage capacitor is set to be a certain initial voltage may be provided. As one method for performing initialization, a method for changing potential of the second electrode of the first transistor by making current flow through the light-emitting element may be used.

Figure 76:
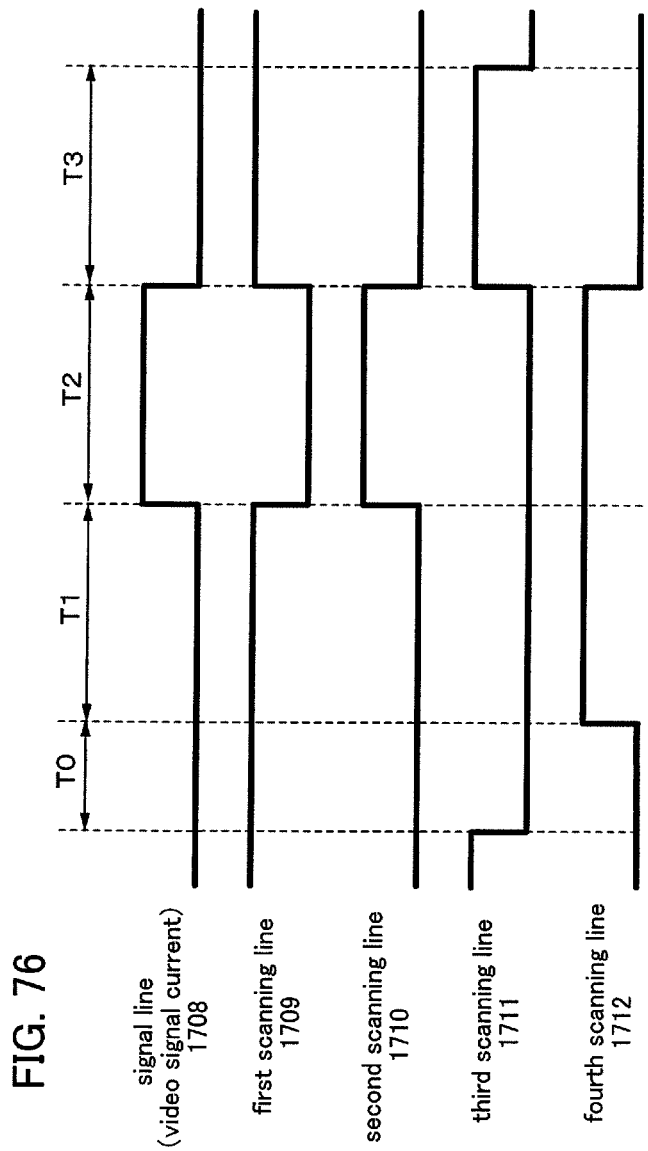
FIG. 76 is a diagram explaining an operation of a pixel circuit in a display device of the present invention.

For example, FIG. 76 shows a timing chart in a case of performing initialization in the pixel circuit shown in FIG. 17. FIG. 76 shows timing of a video signal current and pulses inputted into the signal line 1708 and the first to fourth scanning lines 1709 to 1712. An operation cycle of the pixel circuit is divided into four periods of T0 to T3, in accordance with each operation of the pixel circuit.

The operation of the initialization is performed in the period T0. In the period T0, the second to fourth scanning lines 1710 to 1712 are in an L level; thus, the third to fifth transistors 1703 to 1705 are turned on. In addition, the first scanning line 1709 is in an H level; thus, the second transistor 1702 is turned off. Accordingly, the first transistor 1701 becomes a diode-connected state, and current flows through the light-emitting element 1716. As a result, potential of the second electrode of the first transistor 1701 and the first electrode of the first storage capacity 1706 is decreased; thus, a certain initial voltage is held in the first storage capacitors 1706.

Through the above operations, in the period T0, a certain initial voltage is held in the first storage capacitor 1706.

Moreover, as another method for performing initialization, it is preferable that the pixel circuits that have been described up to here be newly provided with an initialization transistor (a sixth transistor) and an initialization power supply line (a third power supply line).

Figure 28:
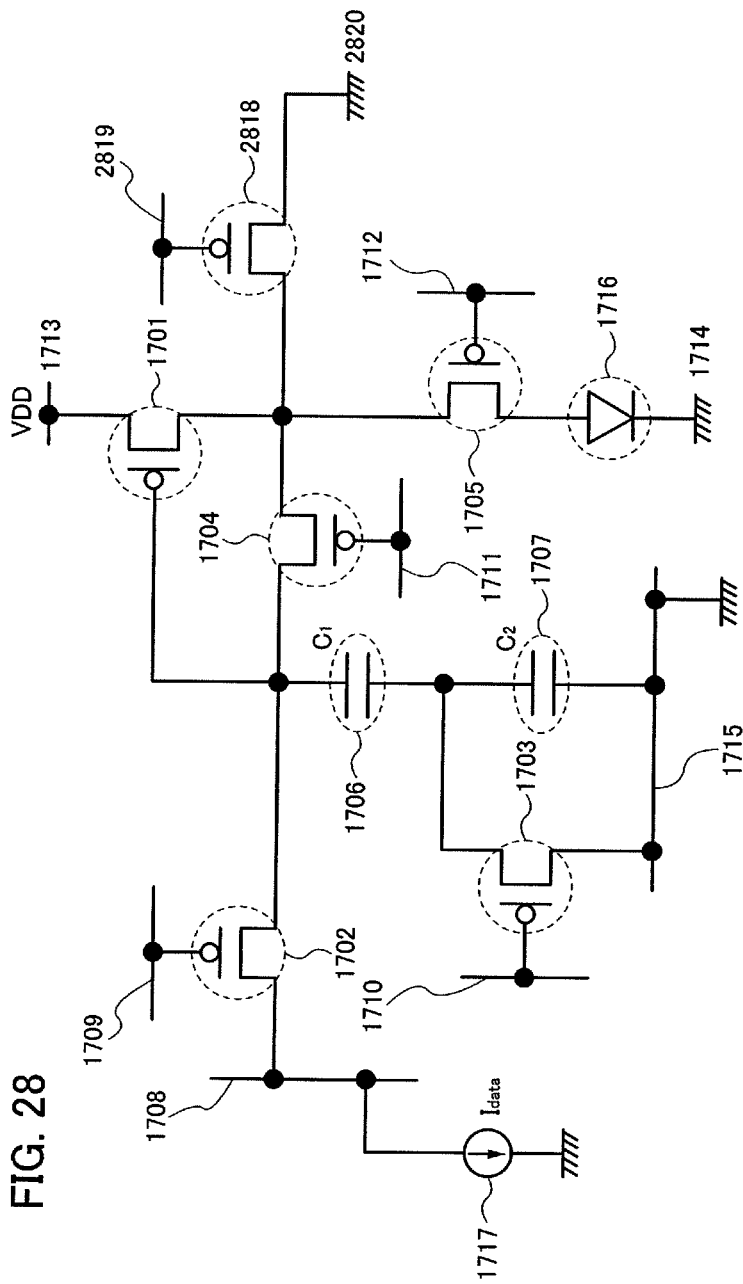
FIG. 28 is a diagram showing an example of a pixel structure in a display device of the present invention.

For example, FIG. 28 shows an example of a case where the pixel circuit shown in FIG. 17 is provided with an initialization transistor. In FIG. 28, a sixth transistor 2818, a fifth scanning line 2819, and a third power supply line 2820 are added to the pixel circuit shown in FIG. 17. Note that a gate electrode of the sixth transistor 2818 is connected to the fifth scanning line 2819; a first electrode of the sixth transistor is connected to a second electrode of a first transistor 1701, a first electrode of a fourth transistor 1704, and a first electrode of a fifth transistor 1705; and a second electrode of the sixth transistor is connected to the third power supply line 2820.

Note that the sixth transistor 2818 is a P-channel type in FIG. 12; however, the present invention is not limited thereto. The sixth transistor 2818 may also be an N-channel type.

Next, an operation of the pixel circuit shown in FIG. 28 will be explained with reference to FIGS. 29 and 30.

Figure 29:
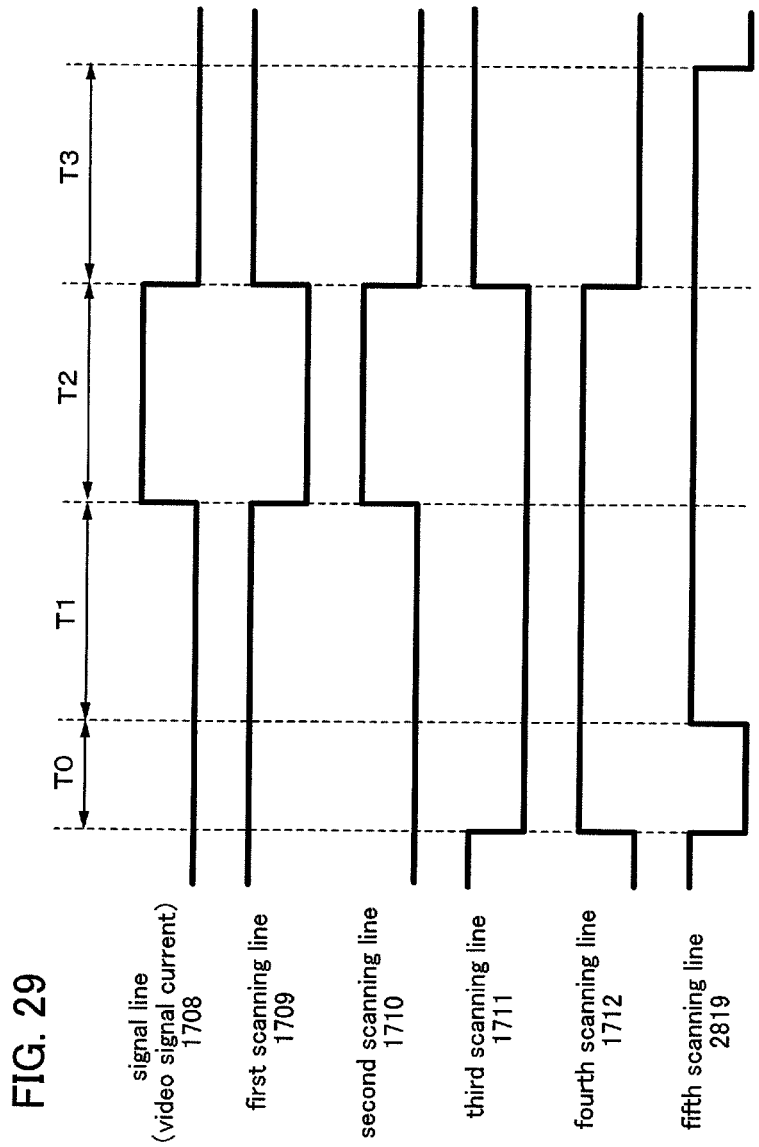
FIG. 29 is a diagram explaining an operation of a pixel circuit in a display device of the present invention.
Figure 30:
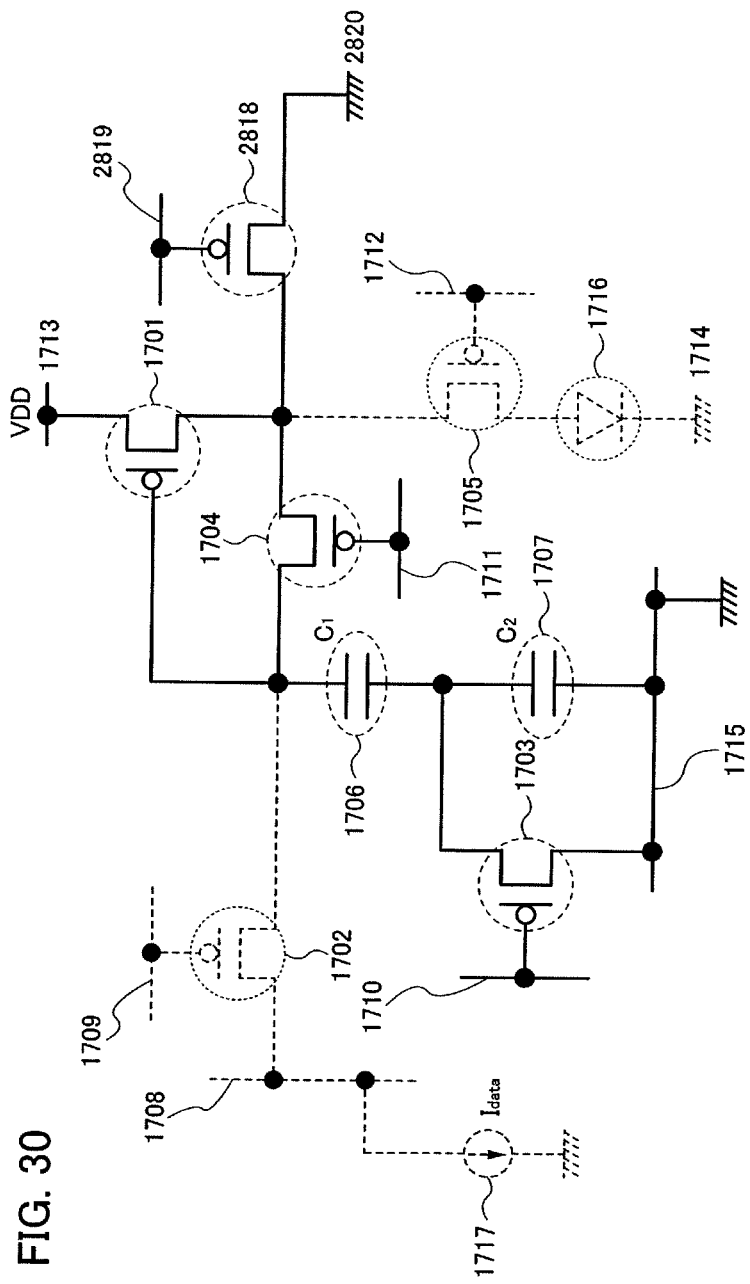
FIG. 30 is a diagram explaining an operation of a pixel circuit in a display device of the present invention.

FIG. 29 shows timing of a video signal current and pulses inputted into a signal line 1708 and first to fifth scanning lines 1709 to 1712, and 2819. An operation cycle of the pixel circuit is divided into four periods of T0 to T3, in accordance with each operation of the pixel circuit.

The operation of the initialization is performed in the period T0. The operation of the pixel circuit in the period T0 will be explained with reference to FIG. 30. In the period T0, the second, third and fifth scanning lines 1710, 1711, and 2819 are in an L level; thus, a third transistor 1703 and the fourth and sixth transistors 1704 and 2818 are turned on. In addition, the first and fourth scanning lines 1709 and 1712 are in an H level; thus, a second transistor 1702 and the fifth transistor 1705 are turned off. Accordingly, the first transistor 1701 becomes a diode-connected state, and current flows through the third power supply line 2820. As a result, potential of a second electrode of the first transistor 1701 and a first electrode of a first storage capacitor 106 becomes equivalent to the potential of the third power supply line 2820, and a voltage corresponding to a difference between the potential of the third power supply line 2820 and potential of a capacitor line 1715 is held in the first storage capacitor 1706.

Through the above operations, in the period T0, the voltage corresponding to a difference between the potential of the third power supply line 2820 and potential of the capacitor line 1715 is held as the initialization voltage in the first storage capacitor 1706.

In addition, in the periods T1 to T3, the fifth scanning line 2819 is made to be in an H level; thus, the sixth transistor 2818 is turned off. Then, the same operation as the pixel circuit shown in FIG. 17 is performed. In other words, in the first period T1, the threshold voltage $|V_{th}|$ of the first transistor 1701 is held in the first storage capacitor 1706. Next, in the second period T2, a gate-source voltage $|V_{ga}(T2)|$ which is necessary for the first transistor 1701 to make a video signal current $I_{data}$ flow is held in the first and second storage capacitors 1706 and 1707. Then, in the third period T3, a current $I_{OLED}$ that is lower than the video signal current $I_{data}$ flows through a light-emitting element 1716; thus, the light-emitting element 1716 emits light. Note that, as well as the pixel circuit shown in FIG. 17, the current $I_{OLED}$ flowing through the light-emitting element 1716 is expressed as the equation (9).

Note that, in the case of the pixel circuit shown in FIG. 17, in order to hold the threshold voltage of the first transistor in the storage capacitors, in advance, the potential of the second electrode of the first transistor has to be lower than a voltage corresponding to a difference between power supply potential VDD and the threshold voltage $|V_{th}|$ of the first transistor, that is, VDD-$|V_{th}|$. Therefore, by providing the initialization period, the potential of the second electrode of the first transistor can certainly be made lower than VDD-$|V_{th}|$, and it becomes possible to certainly compensate the threshold voltage.

Note that the potential of the third power supply line 2820 is ground potential (GND) in FIG. 28; however, the present invention is not limited thereto. Any potential is acceptable as long as the potential is lower than VDD-$|V_{th}|$ which is a difference between the power supply voltage VDD and the threshold voltage $|V_{th}|$ of the first transistor. In addition, the potential of the third power supply line 2820 does not have to be equivalent to the potential of the capacitor line 1715.

Figure 77:
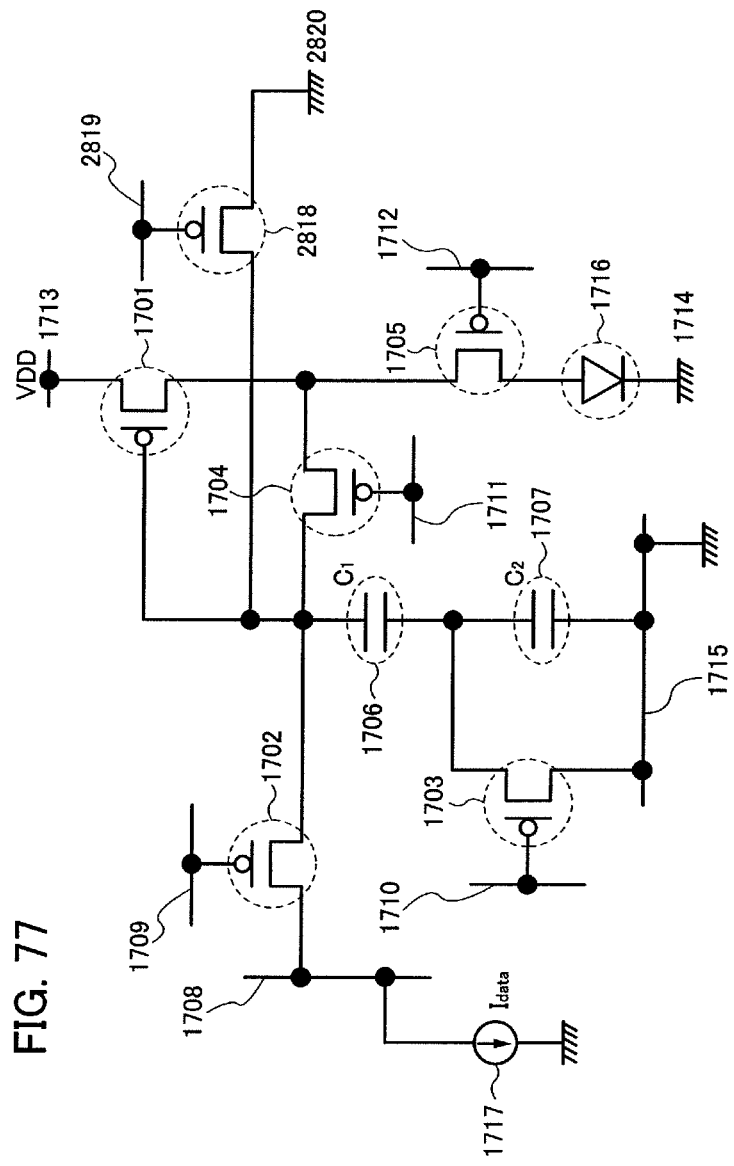
FIG. 77 is a diagram showing an example of a pixel structure in a display device of the present invention.

Note that the first electrode of the sixth transistor 2818 is connected to the second electrode of the first transistor 1701, the first electrode of the fourth transistor 1704, and the first electrode of the fifth transistor 1705 in this embodiment mode; however, the transistor to which the first electrode of the sixth transistor 2818 is connected is not limited thereto. For example, as shown in FIG. 77, a first electrode of a sixth transistor 2818 may be connected to a gate electrode of a first transistor 1701, a first electrode of a second transistor 1702, a second electrode of a fourth transistor 1704, a second electrode of a fourth transistor 104, and a first electrode of a first storage capacitor 1706.

Figure 31:
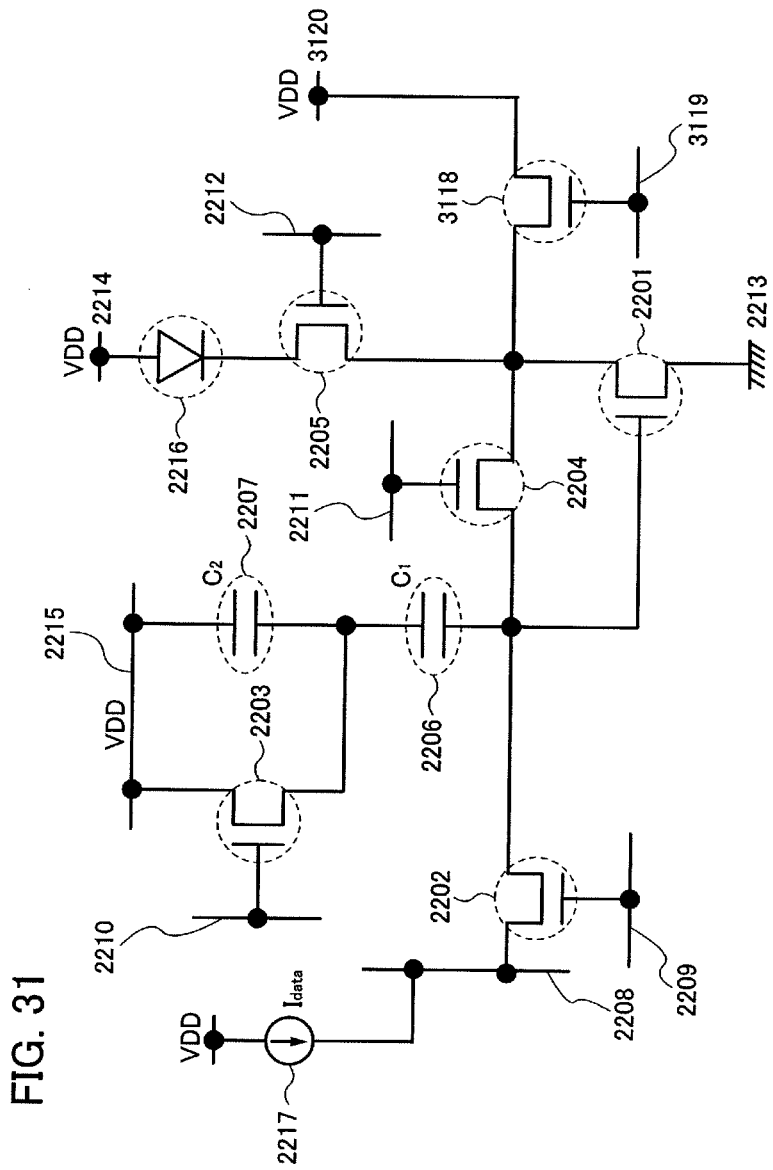
FIG. 31 is a diagram showing an example of a pixel structure in a display device of the present invention.

In addition, as another example, FIG. 31 shows an example of a case where the pixel circuit shown in FIG. 22 is provided with an initialization transistor. In FIG. 31, a sixth transistor 3118, a fifth scanning line 3119, and a third power supply line 3120 are added to the pixel circuit shown in FIG. 22. Note that a gate electrode of the sixth transistor 3118 is connected to the fifth scanning line 3119; a first electrode of the sixth transistor is connected to a second electrode of a first transistor 2201, a first electrode of a fourth transistor 2204, and a first electrode of a fifth transistor 2205; and a second electrode of the sixth transistor is connected to the third power supply line 3120.

Note that the sixth transistor 3118 is an N-channel type in FIG. 15; however, the present invention is not limited thereto. The sixth transistor 3118 may also be a P-channel type.

Next, an operation of the pixel circuit shown in FIG. 31 will be explained with reference to FIG. 32.

Figure 32:
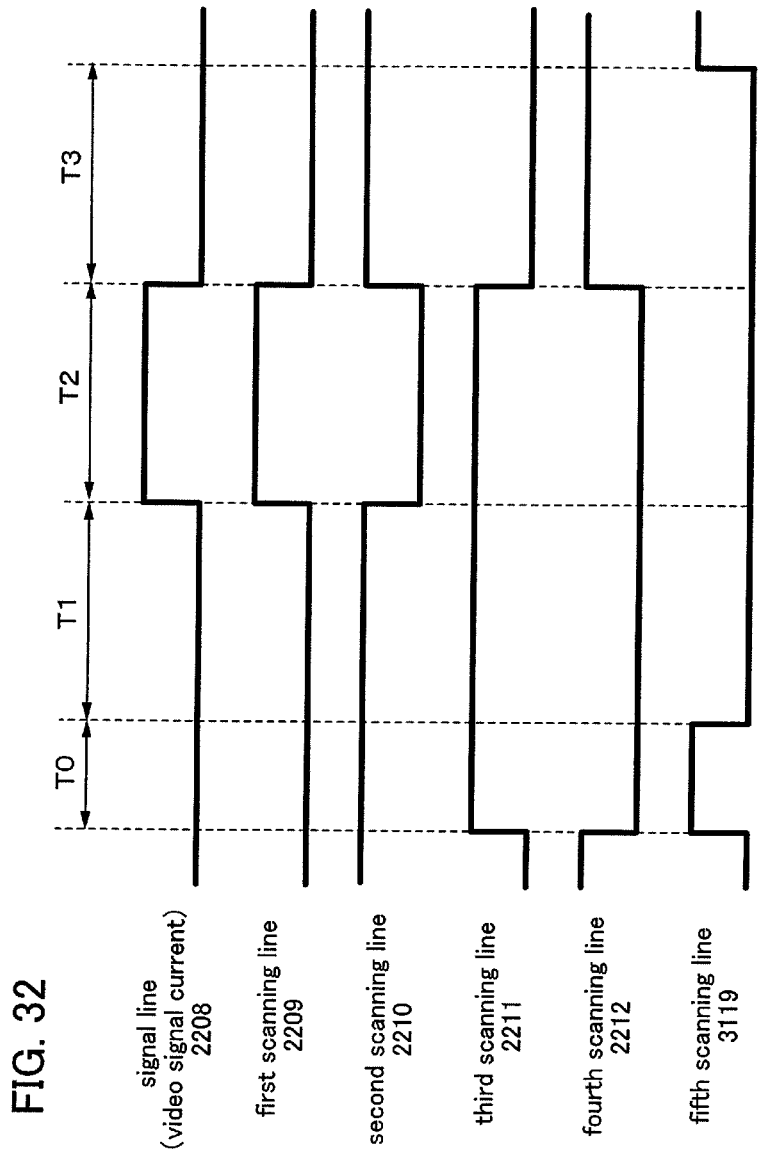
FIG. 32 is a diagram explaining an operation of a pixel circuit in a display device of the present invention.

FIG. 32 shows timing of a video signal current and pulses inputted into a signal line 2208 and first to fifth scanning lines 2209 to 2212, and 3119. An operation cycle of the pixel circuit is divided into four periods of T0 to T3, in accordance with each operation of the pixel circuit. Note that, since second and third transistors, the first, fourth, fifth, and sixth transistors are all N-channel types, an H level and an L level of the timing of the pulses inputted into the first to fifth scanning lines 2209 to 2212, and 3119 are reversed against the case where all transistors are P-channel types (FIG. 28).

The operation of the initialization is performed in the period T0. The operation of the pixel circuit in the period T0 is the same as the pixel circuit shown in FIG. 28. In other words, in the period T0, the voltage corresponding to a difference between potential of a capacitor line 2215 and the potential of the third power supply line 3120 is held as the initialization voltage in a first storage capacitor 2206.

In addition, in the periods T1 to T3, the fifth scanning line 3119 is made to be in an L level; thus, the sixth transistor 3118 is turned off. Then, the same operation as the pixel circuit shown in FIG. 22 is performed. In other words, in the first period T1, the threshold voltage $|V_{th}|$ of the first transistor 2201 is held in the first storage capacitor 2206. Next, in the second period T2, a gate-source voltage $|V_{ga}(T2)|$ which is necessary for the first transistor 2201 to make a video signal current $I_{data}$ flow is held in the first and second storage capacitors 2206 and 2207. Then, in the third period T3, a current $I_{OLED}$ that is lower than the video signal current $I_{data}$ flows through a light-emitting element 2216; thus, the light-emitting element 2216 emits light. Note that, as well as the pixel circuit shown in FIG. 17, the current $I_{OLED}$ flowing through the light-emitting element 2216 is expressed as the equation (9).

Note that, in the case of the pixel circuit shown in FIG. 22, in order to hold the threshold voltage of the first transistor in the storage capacitors, in advance, the potential of the second electrode of the first transistor has to be higher than the threshold voltage $|V_{th}|$ of the first transistor. Therefore, by providing the initialization period, the potential of the second electrode of the first transistor can certainly be made higher than the threshold voltage $|V_{th}|$ of the first transistor, and it becomes possible to certainly compensate the threshold voltage.

Note that the potential of the third power supply line 3120 is power supply potential VDD in FIG. 15; however, the present invention is not limited thereto. Any potential is acceptable as long as the potential is higher than the threshold voltage of the first transistor. In addition, the potential of the third power supply line 3120 does not have to be equivalent to the potential of the capacitor line 2215.

Figure 78:
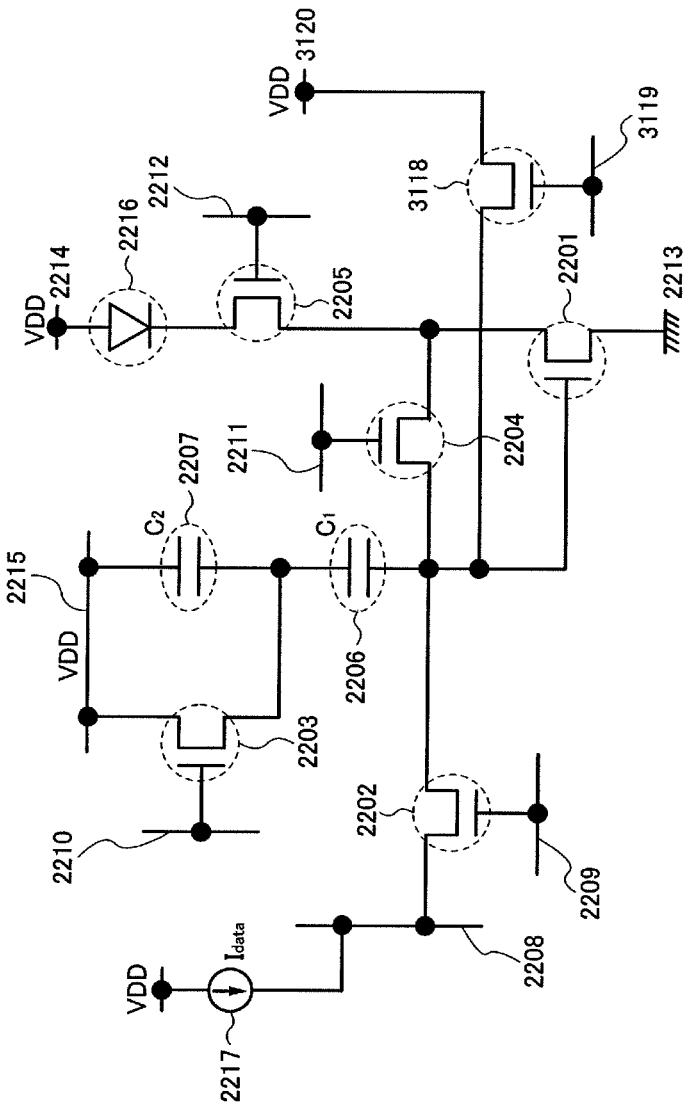
FIG. 78 is a diagram showing an example of a pixel structure in a display device of the present invention.

Note that the first electrode of the sixth transistor 3118 is connected to the second electrode of the first transistor 2201, the first electrode of the fourth transistor 2204, and the first electrode of the fifth transistor 2205 in this embodiment mode; however, the transistor to which the first electrode of the sixth transistor 3118 is connected is not limited thereto. For example, as shown in FIG. 78, a first electrode of a sixth transistor 3118 may be connected to a gate electrode of a first transistor 2201, a first electrode of a second transistor 2202, a first electrode of a third transistor 2203, a second electrode of a fourth transistor 2204, and a first electrode of a first storage capacitor 2206.

Note that the potential of the second power supply line is fixed potential; however, the present invention is not limited thereto. As described in Embodiment Mode 1, the potential of the second power supply line may be changed depending on the first to third periods.

Figure 58:
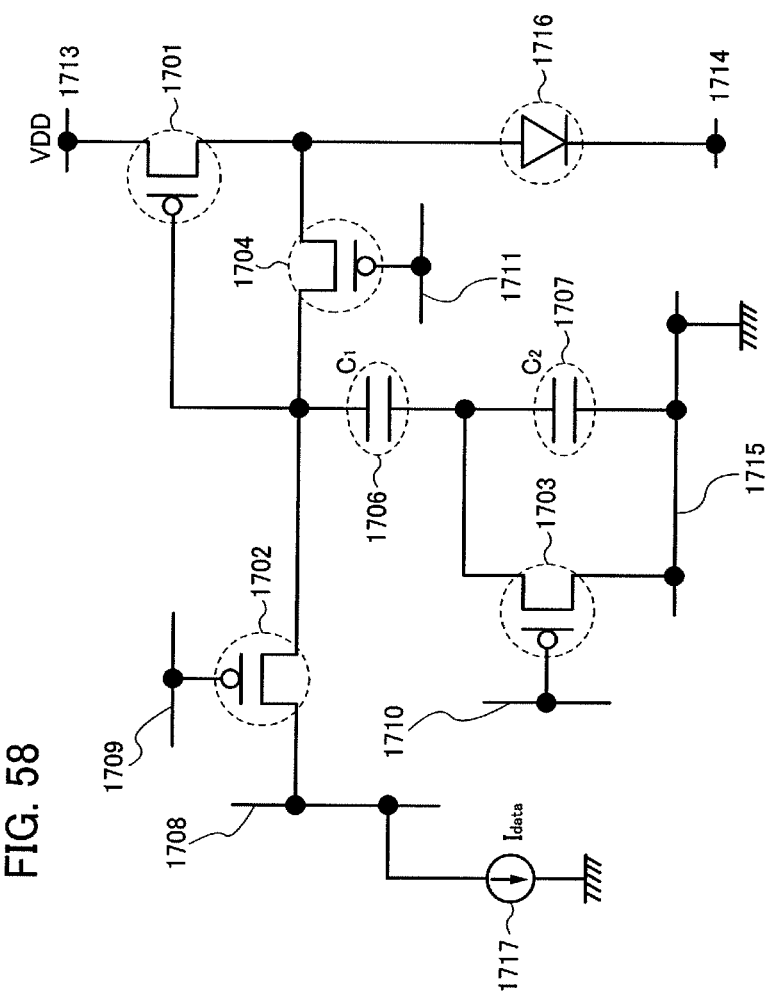
FIG. 58 is a diagram showing an example of a pixel structure in a display device of the present invention.
Figure 59:
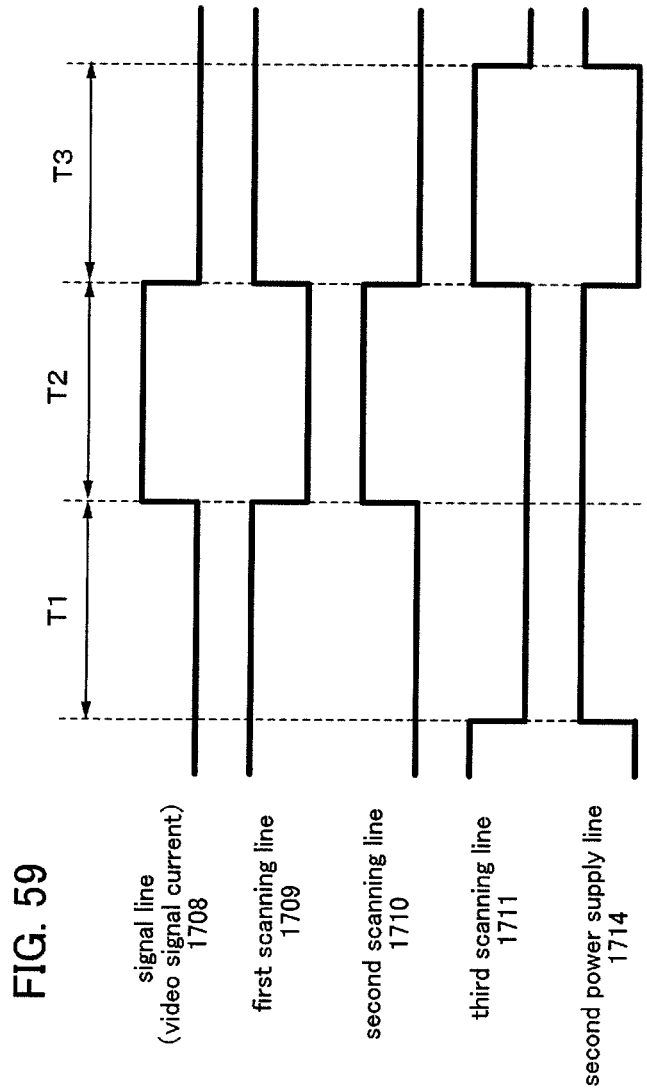
FIG. 59 is a diagram explaining an operation of a pixel circuit in a display device of the present invention.

For example, FIGS. 58 and 59 each show an example of a case where the potential of the second power supply line is changed in the pixel circuit shown in FIG. 17.

In FIG. 58 against the pixel circuit shown in FIG. 17, a second electrode of a first transistor 1701 is connected to a first electrode of a light-emitting element 1716. In addition, FIG. 59 shows timing of a video signal current and pulses inputted into a signal line 1708, first to third scanning lines 1709 to 1711, and a second power supply line 1714. Since a bias in a reverse direction is applied to the light-emitting element 1716 by increasing the potential of the second power supply line 1714 in the first and second periods T1 and T2, current does not flow through the light-emitting element 1716 in the periods T1 and T2.

Note that the above operation can be performed by increasing the potential of the second power supply line 1714 to be higher than a difference between a power supply voltage VDD and the threshold voltage $|V_{th}|$ of the first transistor 1701, that is, VDD$-|V_{th}|$ in the first and second periods T1 and T2.

In addition, in a case of providing an initialization period, current is made not to flow through the light-emitting element 1716 even in an initialization period by increasing the potential of the second power supply line 1714 to be higher than VDD$-|V_{th}|$.

Figure 60:
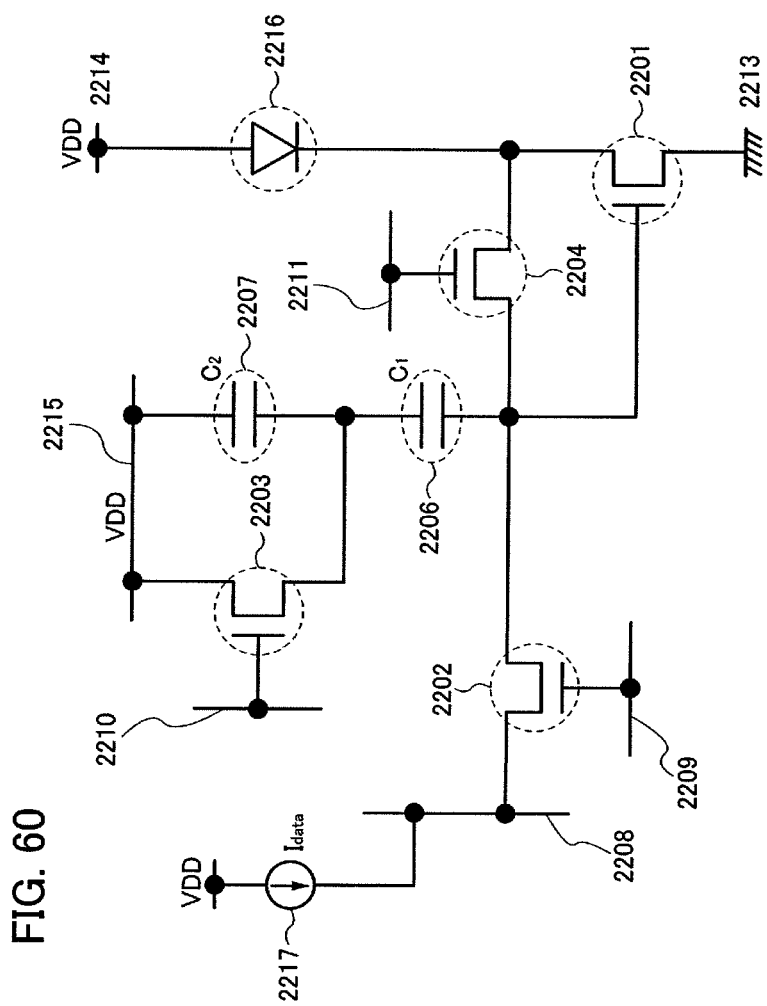
FIG. 60 is a diagram showing an example of a pixel structure in a display device of the present invention.
Figure 61:
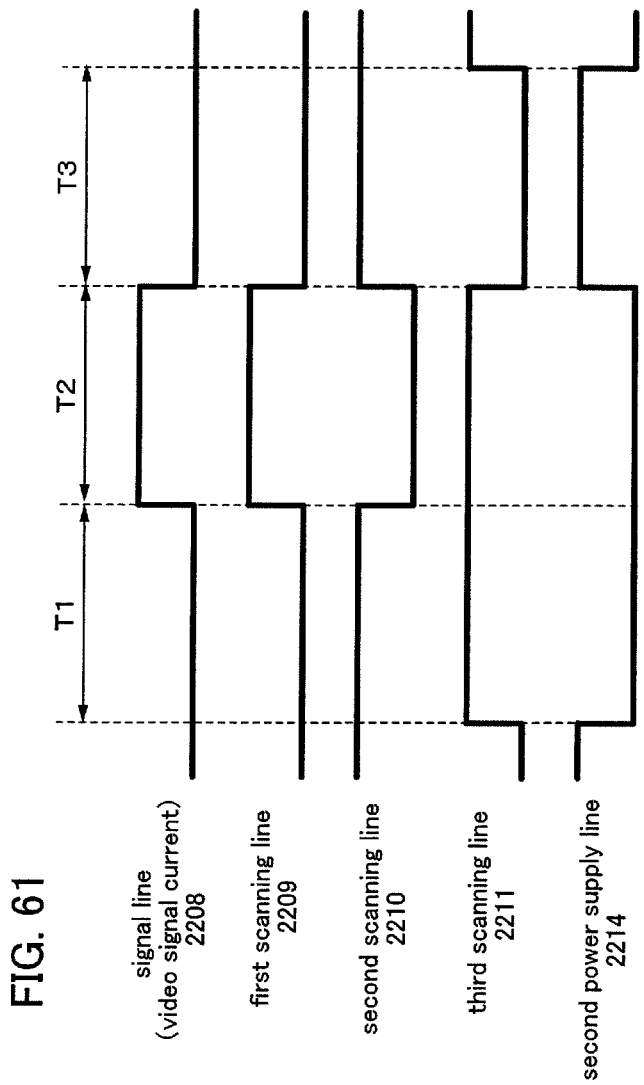
FIG. 61 is a diagram explaining an operation of a pixel circuit in a display device of the present invention.

Moreover, as another example, FIGS. 60 and 61 each show an example of a case where the potential of the second power supply line is changed in the pixel circuit shown in FIG. 22.

In FIG. 60 against the pixel circuit shown in FIG. 22, a second electrode of a first transistor 2201 is connected to a second electrode of a light-emitting element 2216. In addition, FIG. 61 shows timing of a video signal current and pulses inputted into a signal line 2208, first to third scanning lines 2209 to 2211, and a second power supply line 2214. Since a bias in a reverse direction is applied to the light-emitting element 2216 by reducing the potential of the second power supply line 2214 in the first and second periods T1 and T2, current does not flow through the light-emitting element 2216 in the periods T1 and T2.

Note that the above operation can be performed by reducing the potential of the second power supply line 2214 to be lower than the threshold voltage $|V_{th}|$ of the first transistor 2201 in the first and second periods T1 and T2.

In addition, in a case of providing an initialization period, current is made not to flow through the light-emitting element 2216 even in an initialization period by reducing the potential of the second power supply line 2214 to be lower than the threshold voltage $|V_{th}|$ of the first transistor 2201.

As shown in FIGS. 58 to 61, since a fifth transistor and a fourth scanning line have not to be provided by changing the potential of the second power supply line depending on a period; thus, an aperture ratio of a pixel can be improved.

Note that the content described in this embodiment mode can be implemented by being arbitrarily combined with the content described in Embodiment Mode 1.

Embodiment Mode 3

This embodiment mode will explain a configuration of a signal line driver circuit, a scanning line driver circuit, and the like in a display device, and an operation thereof.

Figure 62:
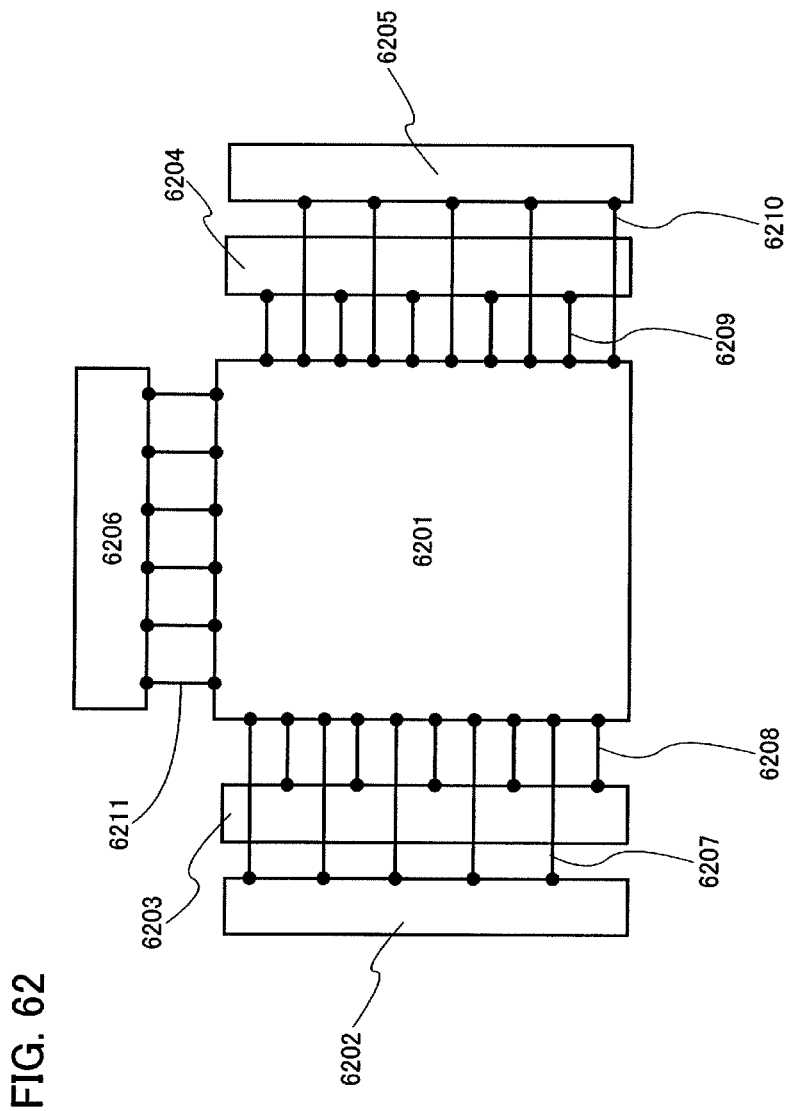
FIG. 62 is a diagram showing a structure example of a display device of the present invention.

For example, a display device, as shown in FIG. 1, having a pixel circuit that controls an operation by using the signal line and the first to fourth scanning lines has a configuration as shown in FIG. 62. The display device as shown in FIG. 62 has a pixel portion 6201, first to fourth scanning line driver circuits 6202 to 6205, and a signal line driver circuit 6206.

First, the signal line driver circuit will be explained. The signal line driver circuit 6206 sequentially outputs a video signal current to the pixel portion 6201 through a signal line 6211. In the pixel portion 6201, an image is displayed by controlling a state of light in accordance with the video signal current.

Figure 63A:
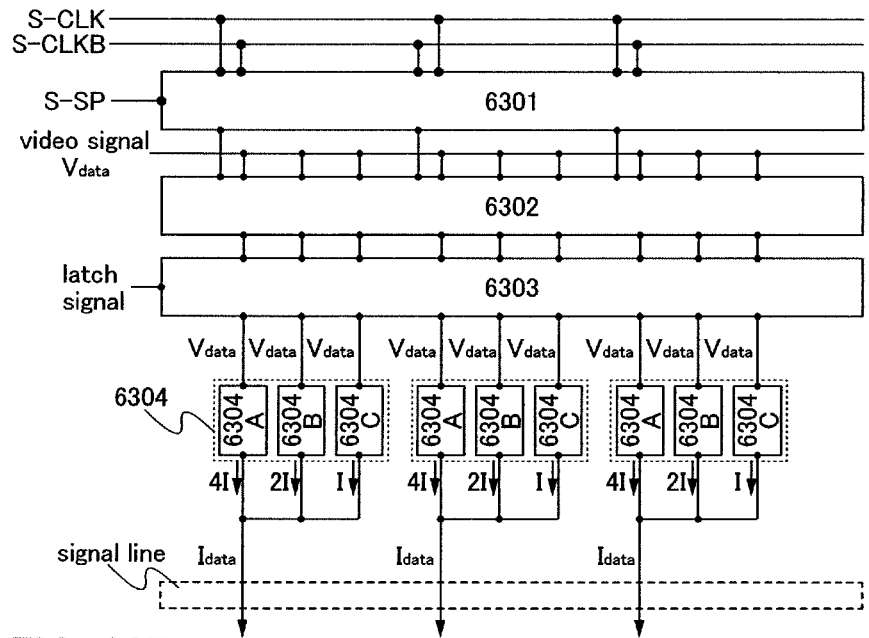
FIGS. 63A and 63B are diagrams each showing a structure example of a signal line driver circuit in a display device of the present invention.
Figure 63B:
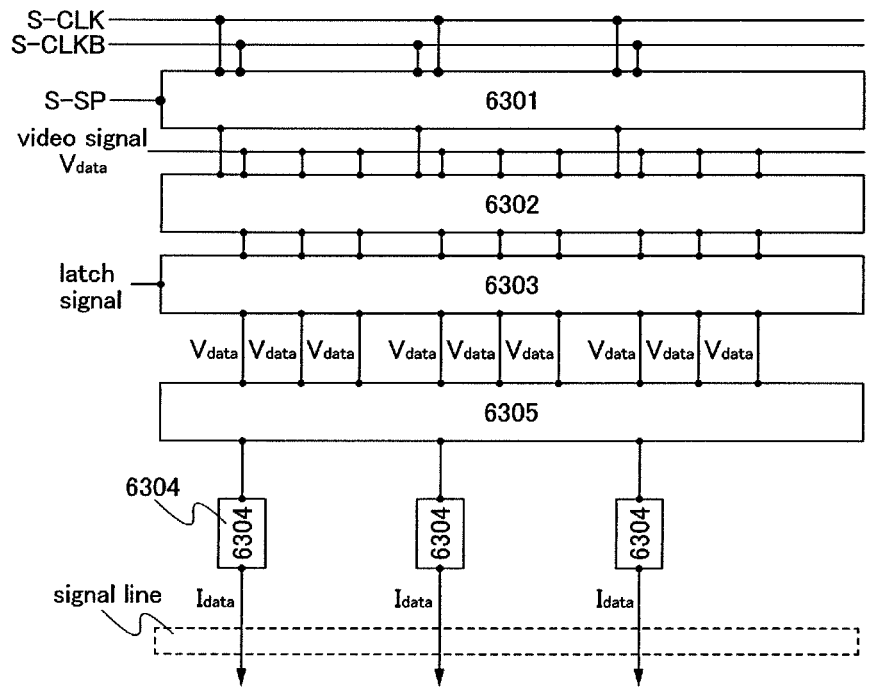

FIGS. 63A and 63B each show an example of a configuration of the signal line driver circuit 6206. The signal line driver circuit 6206 mainly includes a shift register 6301, a first latch circuit 6302, a second latch circuit 6303, and a current source circuit 6304.

Here, an operation of the signal line driver circuit 6206 will be briefly explained. A clock signal (S-CLK), a start pulse (S-SP), and an inverted clock signal (S-CLKB) are inputted into the shift resister 6301, and a sampling pulse is sequentially outputted in accordance with the timing of these signals.

The sampling pulse outputted from the shift register 6301 is inputted into the first latch circuit 6302. A video signal is inputted from a video signal line into the first latch circuit 6302 with a voltage $V_{data}$. The first latch circuit 6302 holds a video signal of each column in accordance with the timing at which the sampling pulse is inputted. Here, the video signal is a digital signal.

After holding of video signals is completed to the last column in the first latch circuit 6302, a latch signal is inputted from a latch control line during a horizontal retrace period, and the video signals held in the first latch circuit 6302 are transferred to the second latch circuit 6303 at once. Thereafter, the video signals of one row, which are held in the second latch circuit 6303, are inputted into the current source circuit 6304. Then, in the current source circuit, the video signal voltage $V_{data}$ is simultaneously converted into a video signal current $I_{data}$, which is inputted from each signal line into the pixel portion 6201.

While the video signal held in the second latch circuit 6303 is inputted into the current source circuit 6304 and then inputted into the pixel portion 6201, a sampling pulse is outputted again from the shift register 6301. In other words, two operations are performed at the same time. According to this, a line sequential driving can be enabled. Thereafter, these operations are repeated.

A difference of the signal line driver circuits shown in FIGS. 63A and 63B is a method for converting a video signal voltage into a video signal current.

In a signal line driver circuit shown in FIG. 63A, a digital video signal held in the second latch circuit 6303 is inputted into current source circuits 6304A to 6304C. Here, a current value outputted from each of the current source circuits 6304A to 6304C is different. For example, a ratio of the current value is 1:2:4. In other words, a current value $I_{data}$ to be outputted can be linearly changed by arranging the n-number of current source circuits in parallel, setting a current value thereof is to be 1:2:4: . . . $2^{n-1}$, and adding a current outputted from each of the current source circuits.

In a signal line driver circuit shown in FIG. 63B, a digital video signal held in the second latch circuit 6303 is transferred to a D/A conversion circuit 6305 by inputting latch signals, converted into an analog video signal, and inputted into each current source circuit 6304; thus, the video signal current $I_{data}$ is outputted.

In addition, for example, a function of gamma correction may be given to such D/A conversion circuit 6305.

Figure 64:
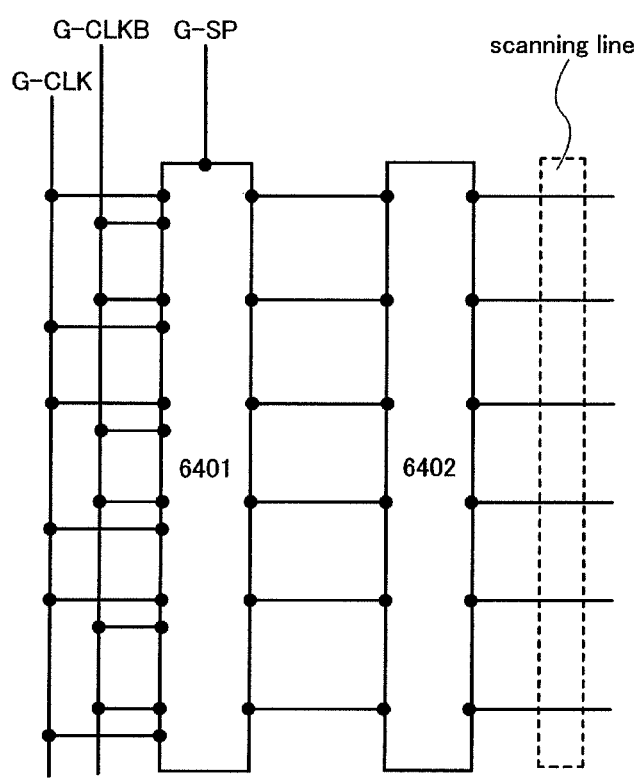
FIG. 64 is a diagram showing a structure example of a scanning line driver circuit in a display device of the present invention.

Next, the scanning line driver circuits will be explained. The first to fourth scanning line driver circuits 6202 to 6205 each sequentially output a select signal to the pixel portion 6201. FIG. 64 shows an example of a configuration of the first to fourth scanning line driver circuits 6202 to 6205. Each of the scanning line driver circuits mainly includes a shift register 6401, an amplifier circuit 6402, and the like.

Then, an operation of the first to fourth scanning line driver circuits 6202 to 6205 will be briefly explained. A clock signal (S-CLK), a start pulse (G-SP), and an inverted clock signal (S-CLKB) are inputted into the shift resister 6401, and a sampling pulse is sequentially outputted in accordance with the timing of these signals. The outputted sampling pulse is amplified in the amplifier circuit 6402 and inputted from each scanning line to the pixel portion 6201.

Note that a buffer circuit or a level shifter circuit may also be included as the component of the amplifier circuit 6402. In addition, in addition to the shift resister 6401 and the amplifier circuit 6402, a pulse-width control circuit or the like may also be arranged in each of the scanning line driver circuits.

Here, the first to fourth scanning line driver circuits 6202 to 6205 are each a driver circuit for sequentially outputting a select signal to first to fourth scanning lines 6207 to 6210.

By using the signal line driver circuits and the scanning line driver circuits as described above, the pixel circuit of the present invention can be driven.

Figure 65:
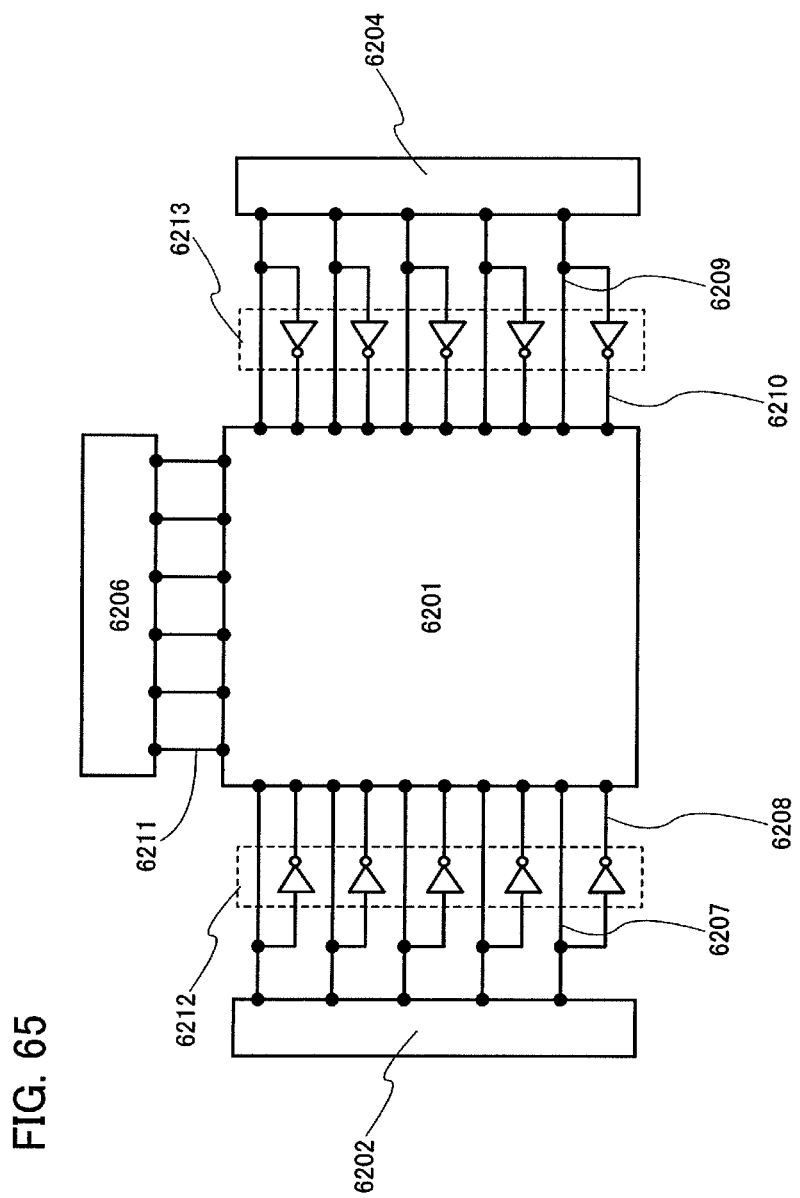
FIG. 65 is a diagram showing a structure example of a display device of the present invention.

Note that, in the pixel circuit shown in FIG. 1, for example, select signals mutually inverted are inputted into the first and second scanning lines. Thus, the select signal inputted into one of the first and second scanning lines may be controlled by using one of the first and second scanning line driver circuits, and an inverted signal of the select signal may be inputted into the other scanning line. In the same manner, since select signals mutually inverted are inputted into the third and fourth scanning lines, the select signal inputted into one of the third and fourth scanning lines may be controlled by using one of the third and fourth scanning line driver circuits, and an inverted signal of the select signal may be inputted into the other scanning line. A configuration example of the display device of this case is shown in FIG. 65. In FIG. 65, select signals inputted into the first and third scanning lines 6207 and 6209 are controlled by using the first and third scanning line driver circuits 6202 and 6204. In addition, inverted signals of the select signals inputted into the first and third scanning lines 6207 and 6209 are generated by using inverters 6212 and 6213; thus, the second and fourth scanning lines 6208 and 6210 are inputted.

Figure 66:
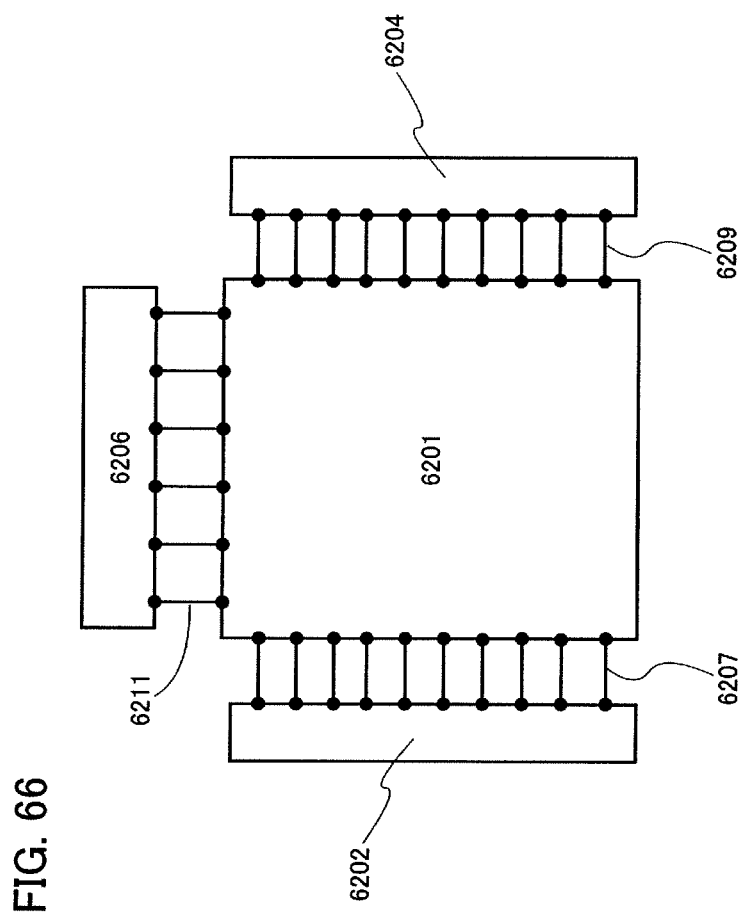
FIG. 66 is a diagram showing a structure example of a display device of the present invention.

In addition, FIG. 66 shows a configuration example of the display device in the case of controlling the second and third transistors, or the fourth and fifth transistors by using the scanning line in common, like the pixel circuit shown in FIG. 50, for example. In FIG. 66, in the case of controlling the second and third transistors by using the first scanning line, and the fourth and fifth transistors by using the third scanning line, first and third scanning lines 6207 and 6209 are controlled by first and third scanning line driver circuits 6202 and 6204.

Note that the configuration of the signal line driver circuits, the scanning line driver circuits, and the like is not limited to those shown in FIGS. 62 to 66.

Note that the transistor in the present invention may be a transistor of any type or may be formed over any substrate. Therefore, the circuits as shown in FIGS. 62 to 66 may be all formed over any substrate including a glass substrate, a plastic substrate, a single crystalline substrate, and an SOI substrate. Alternatively, part of the circuits in FIGS. 62 to 66 may be formed over one substrate, and the other part of the circuits in FIGS. 62 to 66 may be formed over the other substrate. In other words, not all of the circuits in FIGS. 62 to 66 have to be formed over the same substrate. For example, in each of FIGS. 62 to 66, the pixel portion and the scanning line driver circuits may be formed over a glass substrate by using a transistor, and the signal line driver circuit (or part thereof) may be formed by connecting an IC chip, in which the signal line driver circuit (or part thereof) is formed over a single crystalline substrate, by COG (Chip On Glass) to be arranged over a glass substrate. Alternatively, the IC chip may be connected to a glass substrate by TAB (Tape Automated Bonding) or a printed wiring board.

Note that the content described in this embodiment mode can be implemented by being arbitrarily combined with the content described in Embodiment Modes 1 and 2.

Embodiment Mode 4

This embodiment mode will explain a display panel used for a display device of the present invention with reference to FIGS. 79A and 79B and the like. FIG. 79A is a top view showing a display panel and FIG. 79B is a cross-sectional view taken along a line A-A' of FIG. 79A. The display panel includes a signal line driver circuit 7901, a pixel portion 7902, a first scanning line driver circuit 7903, and a second scanning line driver circuit 7906, which are indicated by a dotted line. Further, a sealing substrate 7904 and a sealing material 7905 are provided. A portion surrounded by the sealing material 7905 is a space 7907.

Note that a wiring 7908 is a wiring for transmitting a signal inputted into the first scanning line driver circuit 7903, the second scanning line driver circuit 7906, and the signal line driver circuit 7901 and receives a video signal, a clock signal, a start signal, and the like from an FPC 7909 which serves as an external input terminal. An IC chip (a semiconductor chip where a memory circuit, a buffer circuit, and the like are formed) 7919 is mounted on a connecting portion of the FPC 7909 and the display panel by COG (Chip On Glass) or the like. Note that only the FPC is shown here; however, a printed wiring board (PWB) may be attached to the FPC.

Next, a cross-sectional structure will be explained with reference to FIG. 79B. The pixel portion 7902 and the peripheral driver circuits thereof (the first scanning line driver circuit 7903, the second scanning line driver circuit 7906, and the signal line driver circuit 7901) are formed over the substrate 7910. Here, the signal line driver circuit 7901 and the pixel portion 7902 are shown.

Note that the signal line driver circuit 7901 is formed of a number of transistors such as transistors 7920 and 7921. Further, in this embodiment mode, a display panel in which the pixel portion and the peripheral driver circuits are formed in an integrated manner is shown; however, the present invention is not necessarily limited thereto. All or some of the peripheral driver circuits may be formed over an IC chip or the like and mounted by COG or the like.

Further, the pixel portion 7902 has a plurality of circuits which form a pixel, including a switching transistor 7911 and a driving transistor 7912. Note that a source electrode of the driving transistor 7912 is connected to a first electrode 7913. An insulating film 7914 is formed so as to cover an edge portion of the first electrode 7913. Here, a positive photosensitive acrylic resin film is used for the insulating film 7914.

In order to obtain favorable coverage, the insulating film 7914 is formed so that a curved surface having a curvature is formed at a top edge portion or a bottom edge portion of the insulating film 7914. For example, in a case of using positive photosensitive acrylic as a material for the insulating film 7914, it is preferable that only the top edge portion of the insulating film 7914 have a curved surface having a curvature radius (0.2 to 3 µm). Moreover, either negative photosensitive acrylic which becomes insoluble in etchant by light or positive photosensitive acrylic which becomes soluble in etchant by light can be used as the insulating film 7914.

A layer 7916 containing an organic compound and a second electrode 7917 are formed over the first electrode 7913. Here, as a material used for the first electrode 7913 which serves as an anode, a material having a high work function is preferably used. For example, a single layer film such as an ITO (indium tin oxide) film, an indium zinc oxide (IZO) film, a titanium nitride film, a chromium film, a tungsten film, a Zn film, or a Pt film; a stacked layer of a titanium nitride film and a film containing aluminum as its main component; a three-layer structure of a titanium nitride film, a film containing aluminum as its main component, and a titanium nitride film; or the like can be used. With a stacked layer structure, the first electrode 7913 has low resistance as a wiring and a favorable ohmic contact, and can be made to serve as an anode.

The layer 7916 containing an organic compound is formed by an evaporation method using an evaporation mask, or an ink-jet method. A metal complex belonging to Group 4 in the periodic table is used for part of the layer 7916 containing an organic compound. Besides, a low molecular-based material or a high molecular-based material may be used in combination as well. Further, as a material used for the layer containing an organic compound, a single layer or a stacked layer of an organic compound is used in many cases; however, in this embodiment mode, an inorganic compound may be used in part of a film formed of an organic compound. Moreover, a known triplet material can also be used.

Further, as a material used for the second electrode 7917 which serves as a cathode and is formed over the layer 7916 containing an organic compound, a material having a low work function (Al, Ag, Li, Ca, or alloy thereof such as MgAg, MgIn, AlLi, $CaF_2$, or calcium nitride) is preferably used. In a case where light generated in the layer 7916 containing an organic compound is transmitted through the second electrode 7917, a stacked layer of a metal thin film with a thin thickness and a transparent conductive film (ITO (indium tin oxide), alloy of indium oxide and zinc oxide ($In_2O_3$—ZnO), zinc oxide (ZnO), or the like) is preferably used as the second electrode 7917.

Further, by attaching the sealing substrate 7904 to the substrate 7910 with the sealing material 7905, a light emitting element 7918 is provided in the space 7907 surrounded by the substrate 7910, the sealing substrate 7904, and the sealing material 7905. Note that the space 7907 may be filled with the sealing material 7905 as well as an inert gas (nitrogen, argon, or the like).

Note that an epoxy-based resin is preferably used for the sealing material 7905. Further, it is desirable that these materials do not transmit moisture or oxygen as much as possible. As a material for the sealing substrate 7904, a glass substrate, a quartz substrate, a plastic substrate formed of FRP (Fiber-glass-Reinforced Plastics), PVF (polyvinylfluoride), myler, polyester, acrylic, or the like can be used.

As described above, a display panel having a pixel structure of the present invention can be obtained.

As shown in FIGS. 79A and 79B, the signal line driver circuit 7901, the pixel portion 7902, the first scanning line driver circuit 7903, and the second scanning line driver circuit 7906 are formed in an integrated manner, whereby cost reduction of the display device can be achieved. Further, when unipolar transistors are used for the signal line driver circuit 7901, the pixel portion 7902, the first scanning line driver circuit 7903, and the second scanning line driver circuit 7906, a manufacturing process can be simplified. As a result, further cost reduction can be achieved. Further, by using amorphous silicon for a semiconductor layer of a transistor of each of the signal line driver circuit 7901, the pixel portion 7902, the first scanning line driver circuit 7903, and the second scanning line driver circuit 7906, further cost reduction can be achieved.

Note that the structure of the display panel is not limited to the structure, as shown in FIG. 79A, in which the signal line driver circuit 7901, the pixel portion 7902, the first scanning line driver circuit 7903, and the second scanning line driver circuit 7906 are formed in an integrated manner, and a signal line driver circuit corresponding to the signal line driver circuit 7901 may be formed over an IC chip and mounted on the display panel by COG or the like.

In other words, only the signal line driver circuit, in which high-speed operation of a driver circuit is required, is formed over an IC chip using a CMOS or the like, thereby achieving lower power consumption. Further, by using a semiconductor chip formed of a silicon wafer or the like as the IC chip, higher-speed operation and lower power consumption can be realized.

By forming the scanning line driver circuit and the pixel portion in an integrated manner, cost reduction can be achieved. When unipolar transistors are used for the scanning line driver circuit and the pixel portion, further cost reduction can be achieved. As a pixel structure of the pixel portion, the structures described in Embodiment Modes 1 and 2 can be applied. Further, by using amorphous silicon for a semiconductor layer of a transistor, a manufacturing process is simplified and further cost reduction can be achieved.

In such a manner, cost reduction of a high-resolution display device can be realized. Further, by mounting an IC chip over which a functional circuit (memory or buffer) is formed at a connecting portion of the FPC 7909 and the substrate 7910, a substrate area can be efficiently utilized.

Alternatively, a signal line driver circuit, a first scanning line driver circuit, and a second scanning line driver circuit each corresponding to the signal line driver circuit 7901, the first scanning line driver circuit 7903, and the second scanning line driver circuit 7906 shown in FIG. 79A may be formed over an IC chip and mounted on a display panel by COG or the like. In this case, lower power consumption of a high-resolution display device can be realized. Therefore, in order to obtain a display device with lower power consumption, it is desirable to use polysilicon for a semiconductor layer of a transistor used in the pixel portion.

Further, by using amorphous silicon for a semiconductor layer of a transistor of the pixel portion 7902, cost reduction can be achieved. Moreover, a large-sized display panel can be manufactured.

Further, the scanning line driver circuit and the signal line driver circuit are not necessarily provided in a row direction and a column direction of the pixels.

Figure 80:
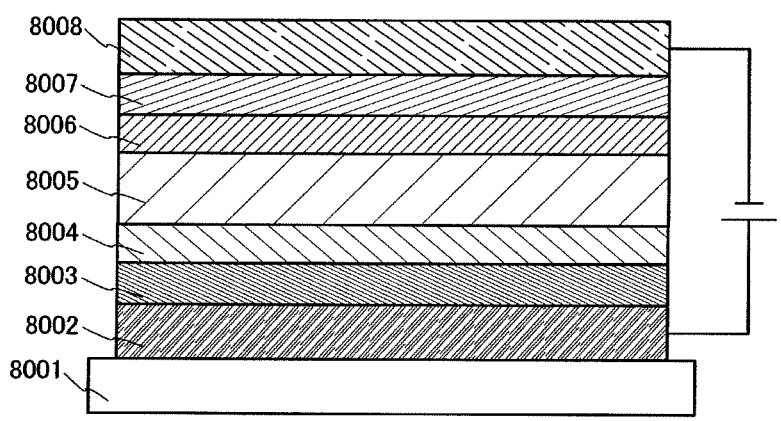
FIG. 80 is a view showing an example of a structure of a light-emitting element used for a display device of the present invention.

Next, FIG. 80 shows an example of a light emitting element which can be applied to the light emitting element 7918.

The light emitting element has an element structure where an anode 8002, a hole injecting layer 8003 formed of a hole injecting material, a hole transporting layer 8004 formed of a hole transporting material, a light emitting layer 8005, an electron transporting layer 8006 formed of an electron transporting material, an electron injecting layer 8007 formed of an electron injecting material, and a cathode 8008 are stacked over a substrate 8001. Here, the light emitting layer 8005 may be formed of only one kind of a light emitting material; however, the light emitting layer 8005 may be formed of two or more kinds of materials. An element structure of the present invention is not limited to this structure.

In addition to the stacked layer structure shown in FIG. 80 where individual functional layers are stacked, there are wide variations such as an element using a high molecular compound and a high efficiency element utilizing a triplet light emitting material which emits light from a triplet excited state in a light emitting layer. The present invention can also be applied to a white light emitting element which can be obtained by controlling a recombination region of carriers using a hole blocking layer and by dividing a light emitting region into two regions, and the like.

Next, a manufacturing method of an element of the present invention shown in FIG. 80 will be explained. First, a hole injecting material, a hole transporting material, and a light emitting material are sequentially deposited over the substrate 8001 having the anode 8002 (ITO (indium tin oxide)). Next, an electron transporting material and an electron injecting material are deposited, and finally, the cathode 8008 is formed by deposition.

Then, materials suitable for the hole injecting material, the hole transporting material, the electron transporting material, the electron injecting material, and the light emitting material are as follows.

As the hole injecting material, an organic compound such as a porphyrin-based compound, phthalocyanine (hereinafter referred to as "H$_2$Pc"), or copper phthalocyanine (hereinafter referred to as "CuPc") is effective. Further, a material which has a smaller value of ionization potential than that of the hole transporting material to be used and has a hole transporting function can also be used as the hole injecting material. There is also a material obtained by performing chemical doping to a conductive high molecular compound, which includes polyethylene dioxythiophene (hereinafter referred to as "PEDOT") doped with polystyrene sulfonate (hereinafter referred to as "PSS"), polyaniline, and the like. In addition, a high molecular compound of an insulator is effective in terms of planarization of an anode, and polyimide (hereinafter referred to as "PI") is often used. Further, an inorganic compound is also used, which includes an ultra thin film of aluminum oxide (hereinafter referred to as "alumina") in addition to a metal thin film such as gold or platinum.

An aromatic amine-based (that is, an object having a bond of benzene ring-nitrogen) compound is most widely used as the hole transporting material. A material which is widely used includes 4,4'-bis(diphenylamino)-biphenyl (hereinafter referred to as "TAD"), derivatives thereof such as 4,4'-bis[N-(3-methylphenyl)-N-phenyl-amino]-biphenyl (hereinafter referred to as "TPD") and 4,4'-bis[N-(1-naphthyl)-N-phenyl-amino]-biphenyl (hereinafter referred to as "α-NPD"), and star burst aromatic amine compounds such as 4,4',4"-tris(N,N-diphenyl-amino)-triphenylamine (hereinafter referred to as "TDATA") and 4,4',4"-tris[N-(3-methylphenyl)-N-phenyl-amino]-triphenylamine (hereinafter referred to as "MTDATA").

As the electron transporting material, a metal complex is often used, which includes a metal complex having a quinoline skeleton or a benzoquinoline skeleton such as tris(8-quinolinolato) aluminum (hereinafter referred to as Alq$_3$), BAlq, tris(4-methyl-8-quinolinolato)aluminum (hereinafter referred to as "Almq"), and bis(10-hydroxybenzo[h]-quinolinato)beryllium (hereinafter referred to as "BeBq"), and in addition, a metal complex having an oxazole-based or thiazole-based ligand such as bis[2-(2-hydroxyphenyl)-benzoxazolato]zinc (hereinafter referred to as "Zn(BOX)$_2$") and bis[2-(2-hydroxyphenyl)-benzothiazolato]zinc (hereinafter referred to as "Zn(BTZ)$_2$"). Further, in addition to the metal complex, an oxadiazole derivative such as 2-(4-biphenylyl)-5-(4-tert-butylphenyl)-1,3,4-oxadiazole (hereinafter referred to as "PBD") and OXD-7, a triazole derivative such as TAZ and 3-(4-tert-butylphenyl)-4-(4-ethylphenyl)-5-(4-biphenylyl)-1,2,4-triazole (hereinafter referred to as "p-EtTAZ"), and a phenanthroline derivative such as bathophenanthroline (hereinafter referred to as "BPhen") and BCP have an electron transporting property.

As the electron injecting material, the above electron transporting materials can be used. In addition, an ultra thin film of an insulator such as metal halide such as calcium fluoride, lithium fluoride, or cesium fluoride; or alkali metal oxide such as lithium oxide is often used. Further, an alkali metal complex such as lithium acetylacetonate (hereinafter referred to as "Li(acac)") or 8-quinolinolato-lithium (hereinafter referred to as "Liq") is also effective.

As the light emitting material, in addition to the above metal complexes such as Alq$_3$, Almq, BeBq, BAlq, Zn(BOX)$_2$, and Zn(BTZ)$_2$, various fluorescent pigments are effective. The fluorescent pigments include 4,4'-bis(2,2-diphenyl-vinyl)-biphenyl, which is blue, 4-(dicyanomethylene)-2-methyl-6-(p-dimethylaminostyryl)-4H-pyran, which is red-orange, and the like. A triplet light emitting material is also available, which mainly includes a complex with platinum or iridium as a central metal. As the triplet light emitting material, tris(2-phenylpyridine)iridium, bis(2-(4'-tryl)pyridinato-N,C$^{2'}$)acetylacetonato iridium (hereinafter referred to as "acacIr(tpy)$_2$"), 2,3,7,8,12,13,17,18-octaethyl-21H,23Hporphyrin-platinum, and the like are known.

By using the materials each having a function as described above in combination, a highly reliable light emitting element can be manufactured.

A light emitting element in which layers are formed in reverse order to that of FIG. 80 can also be used. In other words, a cathode 8008, an electron injecting layer 8007 formed of an electron injecting material, an electron transporting layer 8006 formed of an electron transporting material, a light emitting layer 8005, a hole transporting layer 8004 formed of a hole transporting material, a hole injecting layer 8003 formed of a hole injecting material, and an anode 8002 are stacked over a substrate 8001.

In addition, in order to extract light emission of a light emitting element, at least one of an anode and a cathode may be transparent. A transistor and a light emitting element are formed over a substrate, and there are light emitting elements having a top emission structure where light emission is extracted through a surface opposite to the substrate, having a bottom emission structure where light emission is extracted through a surface on the substrate side, and having a dual emission structure where light emission is extracted through a surface on the substrate side and a surface opposite to the substrate. The pixel structure of the present invention can be applied to the light emitting element having any of the emission structures.

First, a light emitting element with a top emission structure will be explained with reference to FIG. 81A.

A driving transistor 8101 is formed over a substrate 8100, a first electrode 8102 is formed to be in contact with a source electrode of the driving transistor 8101, and a layer 8103 containing an organic compound and a second electrode 8104 are formed thereover.

Further, the first electrode 8102 is an anode of a light emitting element. The second electrode 8104 is a cathode of the light emitting element. In other words, a region where the layer 8103 containing an organic compound is interposed between the first electrode 8102 and the second electrode 8104 corresponds to the light emitting element.

Further, as a material used for the first electrode 8102 which serves as an anode, a material having a high work function is desirably used. For example, a single layer film of a titanium nitride film, a chromium film, a tungsten film, a Zn film, a Pt film, or the like; a stacked layer of a titanium nitride film and a film containing aluminum as its main component; a three-layer structure of a titanium nitride film, a film containing aluminum as its main component, and a titanium nitride film; or the like can be used. With a stacked layer structure, the first electrode 8102 has low resistance as a wiring and a favorable ohmic contact, and can serve as an anode. By using a metal film which reflects light, an anode which does not transmit light can be formed.

As a material used for the second electrode 8104 which serves as a cathode, a stacked layer of a metal thin film formed of a material having a low work function (Al, Ag, Li, Ca, or alloy thereof such as MgAg, MgIn, AlLi, $CaF_2$, or calcium nitride) and a transparent conductive film (ITO (indium tin oxide), indium zinc oxide (IZO), zinc oxide (ZnO), or the like) is preferably used. By using a metal thin film and a transparent conductive film in such a manner, a cathode which can transmit light can be formed.

Figure 81A:
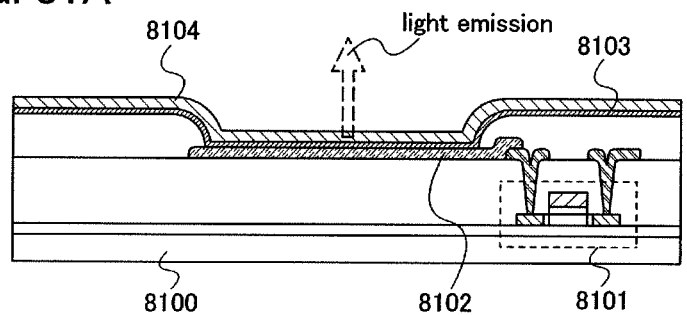
FIGS. 81A to 81C are views each showing an example of a structure of a display device of the present invention.

In such a manner, light from the light emitting element can be extracted to the top surface as indicated by an arrow in FIG. 81A. In other words, in a case of applying the light emitting element with the top emission structure to the display panel shown in FIGS. 79A and 79B, light is emitted to the sealing substrate 7904 side. Therefore, in a case of using the light emitting element with the top emission structure to a display device, a substrate having a light transmitting property is used as the sealing substrate 7904.

In a case of providing an optical film, an optical film may be provided for the sealing substrate 7904.

A metal film formed of a material which serves as a cathode and has a low work function, such as MgAg, MgIn, or AlLi can be used for the first electrode 8102. In this case, for the second electrode 8104, a transparent conductive film such as an ITO (indium tin oxide) film or an indium zinc oxide (IZO) film can be used. Accordingly, with this structure, the transmittance of the top emission can be improved.

Next, a light emitting element with a bottom emission structure will be explained with reference to FIG. 81B. The same reference numerals as those in FIG. 81A are used because the structures are the same except for an emission structure.

Here, as a material used for a first electrode 8102 which serves as an anode, a material having a high work function is desirably used. For example, a transparent conductive film such as an ITO (indium tin oxide) film or an indium zinc oxide (IZO) film can be used. By using a transparent conductive film, an anode which can transmit light can be formed.

As a material used for a second electrode 8104 which serves as a cathode, a metal film formed of a material having a low work function (Al, Ag, Li, Ca, or alloy thereof such as MgAg, MgIn, AlLi, CaF, or calcium nitride) can be used. By using a metal film which reflects light, a cathode which does not transmit light can be formed.

Figure 81B:
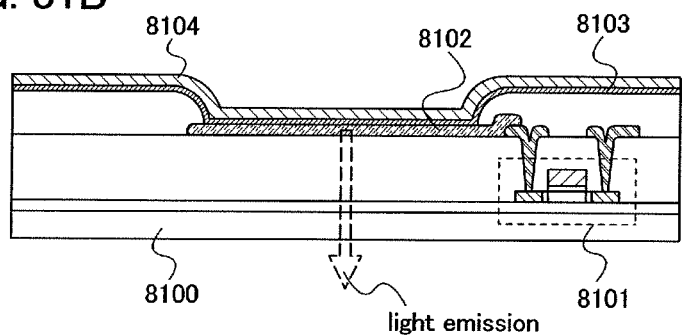

In such a manner, light from the light emitting element can be extracted to a bottom surface as indicated by an arrow in FIG. 81B. In other words, in a case of applying the light emitting element with the bottom emission structure to the display panel shown in FIGS. 79A and 79B, light is emitted to the substrate 7910 side. Therefore, in a case of using the light emitting element with the bottom emission structure to a display device, a substrate having a light transmitting property is used as the substrate 7910.

In a case of providing an optical film, an optical film may be provided for the substrate 7910.

A light emitting element with a dual emission structure will be explained with reference to FIG. 81C. The same reference numerals as those in FIG. 81A are used because the structures are the same except for an emission structure.

Here, as a material used for a first electrode 8102 which serves as an anode, a material having a high work function is preferably used. For example, a transparent conductive film such as an ITO (indium tin oxide) film or an indium zinc oxide (IZO) film can be used. By using a transparent conductive film, an anode which can transmit light can be formed.

As a material used for the second electrode 8104 which serves as a cathode, a stacked layer of a metal thin film formed of a material having a low work function (Al, Ag, Li, Ca, or alloy thereof such as MgAg, MgIn, AlLi, $CaF_2$, or calcium nitride), and a transparent conductive film (ITO (indium tin oxide), alloy of indium oxide and zinc oxide ($In_2O_3$—ZnO), zinc oxide (ZnO), or the like) is preferably used. By using a metal thin film and a transparent conductive film in such a manner, a cathode which can transmit light can be formed.

Figure 81C:
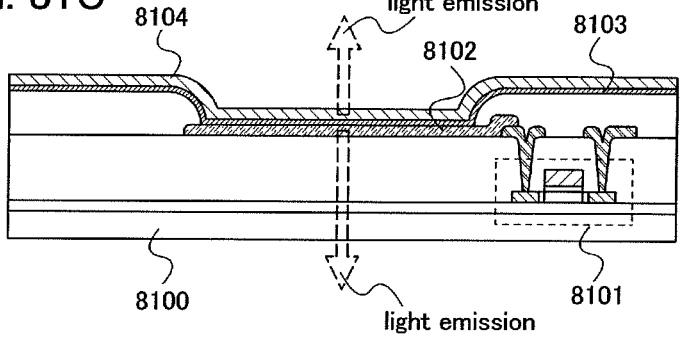

In such a manner, light from the light emitting element can be extracted to both sides as indicated by arrows in FIG. 81C. In other words, in a case of applying the light emitting element with the dual emission structure to the display panel shown in FIGS. 79A and 79B, light is emitted to the substrate 7910 side and the sealing substrate 7904 side. Therefore, in a case of using the light emitting element with the dual emission structure to a display device, a substrate which transmits light is used as the substrate 7910 and the sealing substrate 7904.

In a case of providing an optical film, an optical film may be provided for each of the substrate 7910 and the sealing substrate 7904.

The present invention can also be applied to a display device which realizes full color display using a white light emitting element and a color filter.

As shown in FIG. 82, a base film 8202 is formed over a substrate 8200, and a driving transistor 8201 is formed over the base film 8202. A first electrode 8203 is formed to be in contact with a source electrode of the driving transistor 8201, and a layer 8204 containing an organic compound and a second electrode 8205 are formed thereover.

The first electrode 8203 is an anode of a light emitting element. The second electrode 8205 is a cathode of the light emitting element. In other words, a region where the layer 8204 containing an organic compound is interposed between the first electrode 8203 and the second electrode 8205 corresponds to the light emitting element. In the structure shown in FIG. 82, white light is emitted. A red color filter 8206R, a green color filter 8206G, and a blue color filter 8206B are provided above the light emitting element, whereby full color display can be performed. Further, a black matrix (also referred to as BM) 8207 for separating these color filters is provided.

The aforementioned structures of the light emitting element can be used in combination and can be appropriately used for the display device of the present invention. In addition, the structures of the display panel and the light emitting elements which are described above are examples, and can also be applied to display devices having a structure different from the aforementioned structure.

Next, a partial cross-sectional view of a pixel portion of a display panel will be described.

First, a case of using a polysilicon (p-Si) film as a semiconductor layer of a transistor will be explained with reference to FIGS. 83A and 83B, FIGS. 84A and 84B, and FIGS. 85A and 85B.

Here, the semiconductor layer is obtained by, for example, forming an amorphous silicon (a-Si) film over a substrate by a known film deposition method. Note that the semiconductor layer is not limited to the amorphous silicon film, and any semiconductor film having an amorphous structure (including a microcrystalline semiconductor film) may be used. Further, a compound semiconductor film having an amorphous structure, such as an amorphous silicon germanium film may be used.

Then, the amorphous silicon film is crystallized by a laser crystallization method, a thermal crystallization method using RTA or an annealing furnace, a thermal crystallization method using a metal element which promotes crystallization, or the like. Needless to say, such methods may be used in combination.

As a result of the aforementioned crystallization, a crystallized region is formed in part of the amorphous semiconductor film.

In addition, a crystalline semiconductor film of which crystallinity is partially increased is patterned into a desired shape, and an island-like semiconductor film is formed from the crystallized region. This semiconductor film is used for a semiconductor layer of a transistor.

As shown in FIG. 83A, a base film 8302 is formed over a substrate 8301, and semiconductor layers are formed thereover. The semiconductor layers have a channel formation region 8303, an LDD region 8304, and an impurity region 8305, which serves as a source or drain region, in a driving transistor 8318; and a channel formation region 8306, an LDD region 8307, and an impurity region 8308, which serves as a lower electrode of a capacitor element 8319, respectively. Note that channel doping may be performed to the channel formation regions 8303 and 8306.

As the substrate, a glass substrate, a quartz substrate, a ceramic substrate, or the like can be used. The base film 8302 can be formed using a single layer of aluminum nitride (AlN), silicon oxide ($SiO_2$), silicon oxynitride ($SiO_xN_y$), or the like or a stacked layer thereof.

A gate electrode 8310 and an upper electrode 8311 of the capacitor element 8319 are formed over the semiconductor layer with a gate insulating film 8309 interposed therebetween.

An interlayer insulating film 8312 is formed so as to cover the capacitor element 8319 and the driving transistor 8318. A wiring 8313 is formed over the interlayer insulating film 8312 to be in contact with the impurity region 8305 through a contact hole. A pixel electrode 8314 is formed to be in contact with the wiring 8313, and an insulating film 8315 is formed so as to cover an edge portion of the pixel electrode 8314 and the wiring 8313. Here, the insulating film 8315 is formed of a positive photosensitive acrylic resin film. Then, a layer 8316 containing an organic compound and an opposite electrode 8317 are formed over the pixel electrode 8314. Thus, a light emitting element 8320 is formed in a region where the layer 8316 containing an organic compound is interposed between the pixel electrode 8314 and the opposite electrode 8317.

In addition, as shown in FIG. 83B, a region 8321 where an LDD region, which forms part of a lower electrode of a capacitor element 8319, overlaps with an upper electrode 8311 of the capacitor element 8319 may be provided. Note that common portions to those in FIG. 83A are denoted by the same reference numerals, and description thereof is omitted.

In addition, as shown in FIG. 84A, a capacitor element 8323 may be provided with a second upper electrode 8322, which is formed in the same layer as a wiring 8313 in contact with an impurity region 8305 of a driving transistor 8318. Note that common portions to those in FIG. 83A are denoted by the same reference numerals, and description thereof is omitted. Since the second upper electrode 8322 is in contact with an impurity region 8308, a first capacitor element having such a structure that a gate insulating film 8309 is interposed between an upper electrode 8311 and a channel formation region 8306, and a second capacitor element having such a structure that an interlayer insulating film 8312 is interposed between the upper electrode 8311 and the second upper electrode 8322 are connected in parallel; thus, the capacitor element 8323 having the first and second capacitor elements is obtained. Since the capacitor element 8323 has a capacitance that is a total capacitance of those of the first and second capacitor elements, the capacitor element having a small area and a large capacitance can be formed. In other words, when the capacitor element with the pixel structure of the present invention is used, an aperture ratio can be further improved.

Alternatively, a structure of a capacitor element as shown in FIG. 84B may be employed. A base film 8402 is formed over a substrate 8401, and a semiconductor layer is formed thereover. The semiconductor layer has a channel formation region 8403, an LDD region 8404, and an impurity region 8405 serving as a source or drain region of a driving transistor 8418. Note that channel doping may be performed to the channel formation region 8403.

As the substrate, a glass substrate, a quartz substrate, a ceramic substrate, or the like can be used. The base film 8402 can be formed using a single layer of aluminum nitride (AlN), silicon oxide ($SiO_2$), silicon oxynitride ($SiO_xN_y$), or the like or a stacked layer thereof.

A gate electrode 8407 and a first electrode 8408 are formed over the semiconductor layer with a gate insulating film 8406 interposed therebetween.

A first interlayer insulating film 8409 is formed so as to cover the driving transistor 8418 and the first electrode 8408. A wiring 8410 is formed over the first interlayer insulating film 8409 to be in contact with the impurity region 8405 through a contact hole. Further, a second electrode 8411 is formed in the same layer and with the same material as the wiring 8410.

Furthermore, a second interlayer insulating film 8412 is formed so as to cover the wiring 8410 and the second electrode 8411. Then, a pixel electrode 8413 is formed over the second interlayer insulating film 8412 to be in contact with the wiring 8410 through a contact hole. A third electrode 8414 is formed in the same layer and with the same material as the pixel electrode 8413. Here, a capacitor element 8419 is formed of the first electrode 8408, the second electrode 8411, and the third electrode 8414.

A layer 8416 containing an organic compound and an opposite electrode 8417 are formed over the pixel electrode 8413. Then, a light emitting element 8420 is formed in a region where the layer 8416 containing an organic compound is interposed between the pixel electrode 8413 and the opposite electrode 8417.

As described above, each of the structures as shown in FIGS. 83A and 83B and FIGS. 84A and 84B can be given as a structure of a transistor using a crystalline semiconductor film for its semiconductor layer Note that the transistors having the structures shown in FIGS. 83A and 83B and FIGS. 84A and 84B are examples of transistors with a top-gate structure. In other words, the LDD region may overlap with the gate electrode or not overlap with the gate electrode, or part of the LDD region may be formed so as to overlap with the gate electrode. Further, the gate electrode may have a tapered shape and the LDD region may be provided below the tapered portion of the gate electrode in a self-aligned manner. In addition, the number of gate electrodes is not limited to two, and a multi-gate structure with three or more gate electrodes may be employed, or a single-gate structure may also be employed.

By using a crystalline semiconductor film for a semiconductor layer (a channel formation region, a source region, a drain region, or the like) of a transistor included in the pixel of the present invention, it becomes easier to form the scanning line driver circuit, the signal line driver circuit, and the pixel portion in an integrated manner. In addition, part of the signal line driver circuit and the pixel portion may be formed in an integrated manner, and the other part thereof may be formed over an IC chip and mounted by COG or the like as shown in the display panel in FIGS. 79A and 79B. With such a structure, reduction in the manufacturing cost can be achieved.

As a structure of a transistor using polysilicon (p-Si) for the semiconductor layer, a transistor with a structure, in which a gate electrode is interposed between a substrate and a semiconductor layer, that is, a bottom-gate structure where a gate electrode is located below a semiconductor layer, may be applied. Here, FIGS. 85A and 85B each show a partial cross-sectional view of a pixel portion of a display panel to which a transistor with a bottom-gate structure is applied.

As shown in FIG. 85A, a base film 8502 is formed over a substrate 8501. Further, a gate electrode 8503 is formed over the base film 8502. A first electrode 8504 is formed in the same layer and with the same material as the gate electrode 8503. As a material for the gate electrode 8503, polycrystalline silicon to which phosphorus is added can be used. Besides polycrystalline silicon, silicide which is a compound of metal and silicon may be used.

Then, a gate insulating film 8505 is formed so as to cover the gate electrode 8503 and the first electrode 8504. As the gate insulating film 8505, a silicon oxide film, a silicon nitride film, or the like is used.

Semiconductor layers are formed over the gate insulating film 8505. The semiconductor layers have a channel formation region 8506, an LDD region 8507, and an impurity region 8508, which serves as a source or drain region, in a driving transistor 8522; and a channel formation region 8509, an LDD region 8510, and an impurity region 8511, which serves as a second electrode of a capacitor element 8523, respectively. Note that channel doping may be performed to the channel formation regions 8506 and 8509.

As the substrate, a glass substrate, a quartz substrate, a ceramic substrate, or the like can be used. The base film 8502 can be formed using a single layer of aluminum nitride (AlN), silicon oxide ($SiO_2$), silicon oxynitride ($SiO_xN_y$), or the like or a stacked layer thereof.

A first interlayer insulating film 8512 is formed so as to cover the semiconductor layers. A wiring 8513 is formed over the first interlayer insulating film 8512 to be in contact with the impurity region 8508 through a contact hole. Further, a third electrode 8514 is formed in the same layer and with the same material as the wiring 8513. The capacitor element 8523 is formed of the first electrode 8504, the second electrode, and the third electrode 8514.

In addition, an opening portion 8515 is formed in the first interlayer insulating film 8512. A second interlayer insulating film 8516 is formed so as to cover the driving transistor 8522, the capacitor element 8523, and the opening portion 8515. A pixel electrode 8517 is formed over the second interlayer insulating film 8516 through a contact hole. Then, an insulating film 8518 is formed so as to cover an edge portion of the pixel electrode 8517. For example, a positive photosensitive acrylic resin film can be used. Subsequently, a layer 8519 containing an organic compound and an opposite electrode 8520 are formed over the pixel electrode 8517. A light emitting element 8521 is formed in a region where the layer 8519 containing an organic compound is interposed between the pixel electrode 8517 and the opposite electrode 8520. The opening portion 8515 is located below the light emitting element 8521. In other words, in a case where light emitted from the light emitting element 8521 is extracted from the substrate side, the transmittance can be improved owing to the existence of the opening portion 8515.

Furthermore, a fourth electrode 8524 may be formed in the same layer and with the same material as the pixel electrode 8517 in FIG. 85A so as to obtain a structure shown in FIG. 85B. In this case, a capacitor element 8525 can be formed of a first electrode 8504, a second electrode, a third electrode 8514, and the fourth electrode 8524.

Next, a case of using an amorphous silicon (a-Si:H) film as a semiconductor layer of a transistor will be explained with reference to FIGS. 33A and 33B, FIGS. 34A and 34B, and FIGS. 35A and 35B.

FIGS. 33A and 33B each show a partial cross-sectional view of a pixel portion of a display panel to which a transistor with a top-gate structure using amorphous silicon for a semiconductor layer is applied. As shown in FIG. 33A, a base film 3302 is formed over a substrate 3301. Further, a pixel electrode 3303 is formed over the base film 3302. In addition, a first electrode 3304 is formed in the same layer and with the same material as the pixel electrode 3303.

As the substrate, a glass substrate, a quartz substrate, a ceramic substrate, or the like can be used. The base film 3302 can be formed using a single layer of aluminum nitride (AlN), silicon oxide ($SiO_2$), silicon oxynitride ($SiO_xN_y$), or the like or a stacked layer thereof.

Wirings 3305 and 3306 are formed over the base film 3302, and an edge portion of the pixel electrode 3303 is covered with the wiring 3305. N-type semiconductor layers 3307 and 3308 each having N-type conductivity are formed above the wirings 3305 and 3306, respectively. In addition, a semiconductor layer 3309 is formed between the wirings 3305 and 3306 and over the base film 3302, and part of the semiconductor layer 3309 is extended over the N-type semiconductor layers 3307 and 3308. Note that this semiconductor layer is formed of a non-crystalline semiconductor film such as amorphous silicon (a-Si:H) or a microcrystalline semiconductor (μ-Si:H). Then, a gate insulating film 3310 is formed over the semiconductor layer 3309, and an insulating film 3311 is formed in the same layer and with the same material as the gate insulating film 3310, and also over the first electrode 3304. Note that as the gate insulating film 3310, a silicon oxide film, a silicon nitride film, or the like is used.

A gate electrode 3312 is formed over the gate insulating film 3310. In addition, a second electrode 3313 is formed in the same layer and with the same material as the gate electrode, and over the first electrode 3304 with the insulating film 3311 interposed therebetween. A capacitor element 3319 is formed, in which the insulating film 3311 is interposed between the first electrode 3304 and the second electrode 3313. An interlayer insulating film 3314 is formed so as to cover an edge portion of the pixel electrode 3303, a driving transistor 3318, and the capacitor element 3319.

A layer 3315 containing an organic compound and an opposite electrode 3316 are formed over the interlayer insulating film 3314 and the pixel electrode 3303 located in an opening portion of the interlayer insulating film 3314. Thus, a light emitting element 3317 is formed in a region where the layer 3315 containing an organic compound is interposed between the pixel electrode 3303 and the opposite electrode 3316.

The first electrode 3304 shown in FIG. 33A may also be formed of a first electrode 3320 as shown in FIG. 33B. The first electrode 3320 is formed in the same layer and with the same material as the wirings 3305 and 3306.

FIGS. 34A and 34B are partial cross-sectional views of a panel of a display device having a bottom-gate transistor which uses amorphous silicon for a semiconductor layer.

A base film 3402 is formed over a substrate 3401. A gate electrode 3403 is formed over the base film 3402. Further, a first electrode 3404 is formed in the same layer and with the same material as the gate electrode. As a material for the gate electrode 3403, polycrystalline silicon to which phosphorus is added can be used. Besides polycrystalline silicon, silicide which is a compound of metal and silicon may be used.

Then, a gate insulating film 3405 is formed so as to cover the gate electrode 3403 and the first electrode 3404. As the gate insulating film 3405, a silicon oxide film, a silicon nitride film, or the like is used.

A semiconductor layer 3406 is formed over the gate insulating film 3405. In addition, a semiconductor layer 3407 is formed in the same layer and with the same material as the semiconductor layer 3406.

As the substrate, a glass substrate, a quartz substrate, a ceramic substrate, or the like can be used. The base film 3402 can be formed using a single layer of aluminum nitride (MN), silicon oxide ($SiO_2$), silicon oxynitride ($SiO_xN_y$), or the like or a stacked layer thereof.

N-type semiconductor layers 3408 and 3409 each having N-type conductivity are formed over the semiconductor layer 3406, and an N-type semiconductor layer 3410 is formed over the semiconductor layer 3407.

Wirings 3411 and 3412 are formed over the N-type semiconductor layers 3408, 3409, and 3410, respectively, and a conductive layer 3413 is formed in the same layer and with the same material as the wirings 3411 and 3412, over the N-type semiconductor layer 3410.

Thus, a second electrode is formed of the semiconductor layer 3407, the N-type semiconductor layer 3410, and the conductive layer 3413. Note that a capacitor element 3420 having a structure where the gate insulating film 3405 is interposed between the second electrode and the first electrode 3404 is formed.

One edge portion of the wiring 3411 is extended, and a pixel electrode 3414 is formed so as to be in contact with an upper portion of the extended wiring 3411.

In addition, an insulating film 3415 is formed so as to cover an edge portion of the pixel electrode 3414, a driving transistor 3419, and the capacitor element 3420.

Then, a layer 3416 containing an organic compound and an opposite electrode 3417 are formed over the pixel electrode 3414 and the insulating film 3415. A light emitting element 3418 is formed in a region where the layer 3416 containing an organic compound is interposed between the pixel electrode 3414 and the opposite electrode 3417.

The semiconductor layer 3407 and the N-type semiconductor layer 3410 to be part of the second electrode of the capacitor element are not necessarily provided. In other words, the second electrode may be the conductive layer 3413 so as to have the capacitor element having such a structure that the gate insulating film is interposed between the first electrode 3404 and the conductive layer 3413.

Note that, when the pixel electrode 3414 is formed before forming the wiring 3411 in FIG. 34A, a capacitor element 3422 as shown in FIG. 34B can be obtained, which has a structure where a gate insulating film 3405 is interposed between a first electrode 3404 and a second electrode 3421 formed of the pixel electrode 3414.

Although FIGS. 34A and 34B show inverted staggered channel-etched transistors, a channel-protective transistor may be used as a matter of course. A case of a channel-protective transistor will be explained with reference to FIGS. 35A and 35B.

Figure 35A:
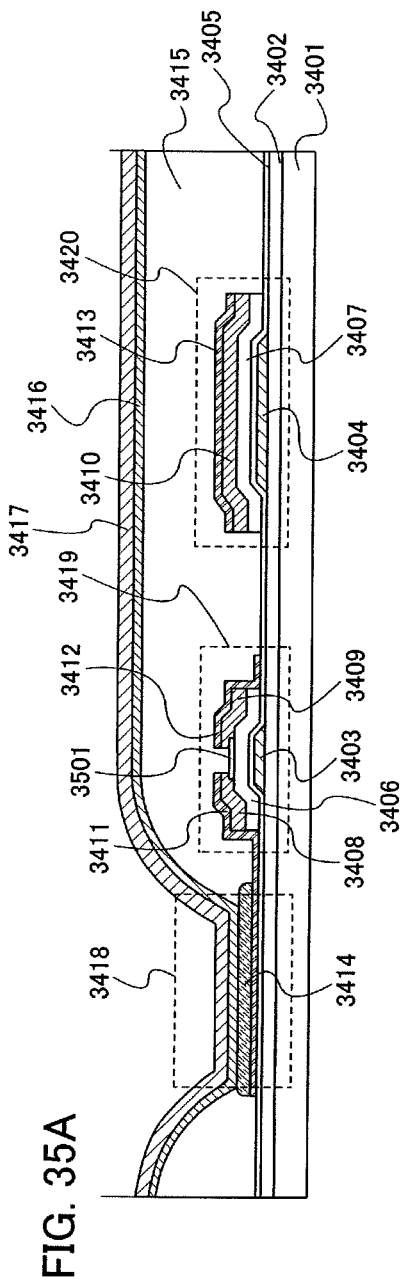
FIGS. 35A and 35B are views each showing an example of a structure of a display device of the present invention.

A channel-protective transistor shown in FIG. 35A is different from the channel-etched driving transistor 3419 shown in FIG. 34A in that an insulating film 3501 serving as an etching mask is provided over the channel formation region in the semiconductor layer 3406. Common portions except that point are denoted by the same reference numerals.

Figure 35B:
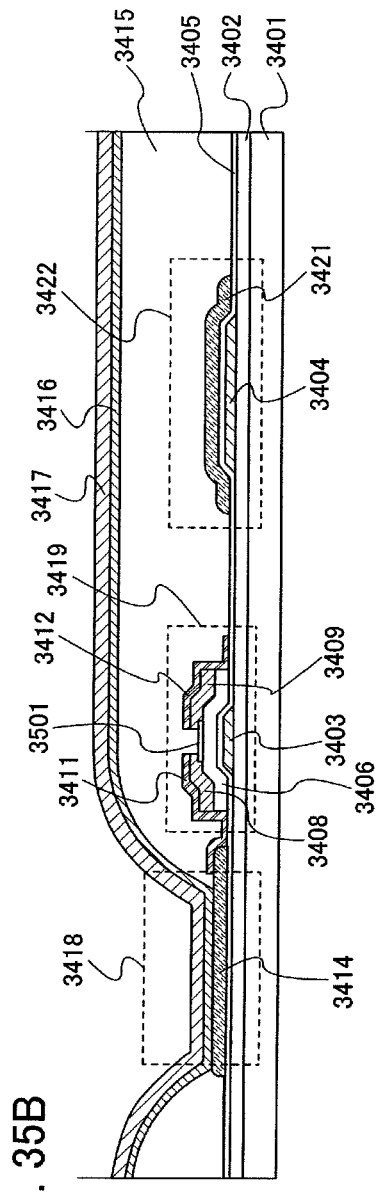

In the same manner, a channel-protective transistor shown in FIG. 35B is different from the channel-etched driving transistor 3419 shown in FIG. 34B in that an insulating film 3501 serving as an etching mask is provided over a channel formation region in the semiconductor layer 3406. Common portions except that point are denoted by the same reference numerals.

By using an amorphous semiconductor film as a semiconductor layer (a channel formation region, a source region, a drain region, or the like) of a transistor included in the pixel of the present invention, the manufacturing cost can be reduced.

Note that structures of the transistors and capacitor elements which can be applied to the pixel structure of the present invention are not limited to those described above, and various structures of transistors and capacitor elements can be used.

The content described in this embodiment mode can be implemented by being arbitrarily combined with the content described in Embodiment Modes 1 to 3.

Embodiment Mode 5

This embodiment mode will explain a method for manufacturing a semiconductor device using plasma treatment as a method for manufacturing a semiconductor device including a transistor.

Figure 36A:
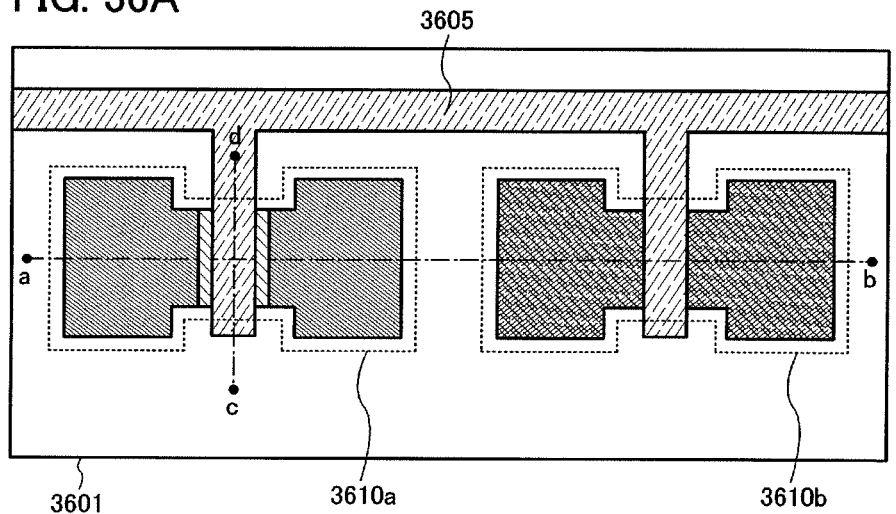
FIGS. 36A to 36C are views each showing a structure of a transistor used for a display device of the present invention.
Figure 36B:
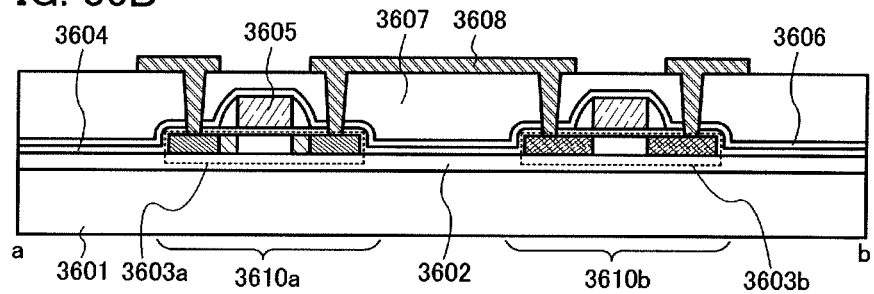
Figure 36C:
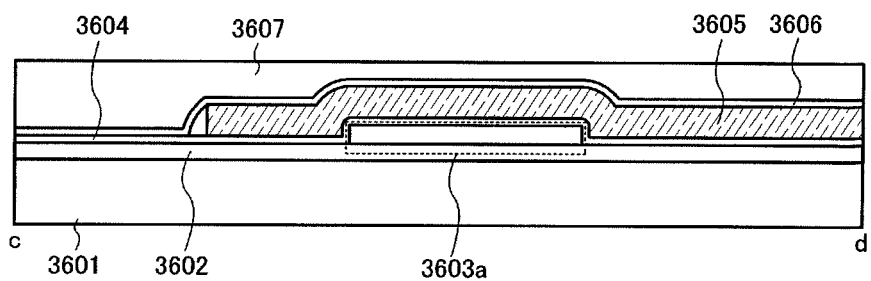

FIGS. 36A to 36C are views each showing a structural example of a semiconductor device including a transistor. Note that, in FIGS. 36A to 36C, FIG. 36B corresponds to a cross-sectional view taken along a line a-b of FIG. 36A, and FIG. 36C corresponds to a cross-sectional view taken along a line c-d of FIG. 36A.

A semiconductor device shown in FIGS. 36A to 36C includes semiconductor films 3603a and 3603b provided over a substrate 3601 with an insulating film 3602 interposed therebetween, gate electrodes 3605 provided over the semiconductor films 3603a and 3603b with a gate insulating film 3604 interposed therebetween, insulating films 3606 and 3607 provided to cover the gate electrodes, and a conductive film 3608 which is electrically connected to source and drain regions of the semiconductor films 3603a and 3603b and provided over the insulating film 3607. Note that FIGS. 36A to 36C each show a case of providing an N-channel transistor 3610a using part of the semiconductor film 3603a as a channel region and a P-channel transistor 3610b using part of the semiconductor film 3603b as a channel region; however, the present invention is not limited to this structure. For example, although, in FIGS. 36A to 36C, an LDD region is provided in the N-channel transistor 3610a but not in the P-channel transistor 3610b, a structure in which an LDD region is provided in both of the transistors or a structure in which an LDD region is provided in neither of the transistors may be employed.

Note that, in this embodiment mode, the semiconductor device shown in FIGS. 36A to 36C is manufactured by oxidizing or nitriding at least one of the substrate 3601, the insulating film 3602, the semiconductor films 3603a and 3603b, the gate insulating film 3604, the insulating film 3606, and the insulating film 3607 by plasma treatment, so that the semiconductor film or the insulating film is oxidized or nitrided. In such a manner, the semiconductor film or the insulating film is oxidized or nitrided by plasma treatment. Accordingly, the surface of the semiconductor film or the insulating film is modified, and a minuter insulating film can be formed, compared with an insulating film formed by a CVD method or a sputtering method. Therefore, a defect such as pinholes can be suppressed, and the characteristics of a semiconductor device or the like can be improved.

This embodiment mode will explain a method for manufacturing a semiconductor device by performing plasma treatment to the semiconductor film 3603a and 3603b, or the gate insulating film 3604 in the above FIGS. 36A to 36C, and oxidizing or nitriding the semiconductor film 3603a and 3603b, or the gate insulating film 3604 with reference to the drawings.

Initially, a case will be described where the edge portions of the island-like semiconductor film provided over a substrate are provided to be almost perpendicular.

First, the island-like semiconductor films 3603a and 3603b are formed over the substrate 3601 (FIGS. 37A-1 and 37A-2). The island-like semiconductor films 3603a and 3603b can be provided by forming an amorphous semiconductor film with the use of a material containing silicon (Si) as its main component (for example, $Si_xGe_{1-x}$ or the like), or the like over the insulating film 3602, which is formed in advance over the substrate 3601, by a known means (a sputtering method, an LPCVD method, a plasma CVD method, or the like), then crystallizing the amorphous semiconductor film, and then selectively etching the semiconductor film. Note that the amorphous semiconductor film can be crystallized by a known crystallization method such as a laser crystallization method, a thermal crystallization method using RTA or an annealing furnace, a thermal crystallization method using a metal element which promotes crystallization, or a method using these methods in combination. Note that, in FIGS. 37A-1 to 37D-1 and FIGS. 37A-2 to 37D-2, the edge portions of the island-like semiconductor films 3603a and 3603b are formed to be almost perpendicular ($\theta=85$ to $100°$).

Next, the semiconductor films 3603a and 3603b are oxidized or nitrided by plasma treatment to form insulating films 3621a and 3621b over the surfaces of the semiconductor films 3603a and 3603b, respectively (FIGS. 37B-1 and 37B-2). Note that an oxide film or a nitride film can be used as the insulating films 3621a and 3621b. In a case of using Si for the semiconductor films 3603a and 3603b, for example, silicon oxide (SiOx) or silicon nitride (SiNx) is formed as the insulating films 3621a and 3621b. In addition, after oxidizing the semiconductor films 3603a and 3603b by plasma treatment, the semiconductor films 3603a and 3603b may be nitrided by plasma treatment again. In this case, silicon oxide (SiOx) is formed to be in contact with the semiconductor films 3603a and 3603b and silicon nitride oxide (SiNxOy) (x>y) is formed over the surface of the silicon oxide. Note that, in the case of oxidizing the semiconductor films by plasma treatment, the plasma treatment is performed under an oxygen atmosphere (for example, under an atmosphere containing oxygen ($O_2$) and a rare gas (containing at least one of He, Ne, Ar, Kr, and Xe); an atmosphere containing oxygen, hydrogen ($H_2$), and a rare gas; or an atmosphere containing dinitrogen monoxide and a rare gas). On the other hand, in the case of nitriding the semiconductor films by plasma treatment, the plasma treatment is performed under a nitrogen atmosphere (for example, under an atmosphere containing nitrogen ($N_2$) and a rare gas (containing at least one of He, Ne, Ar, Kr, and Xe); an atmosphere containing nitrogen, hydrogen, and a rare gas; or an atmosphere containing $NH_3$ and a rare gas). As a rare gas, for example, Ar can be used. A gas in which Ar and Kr are mixed may also be used as well. Accordingly, the rare gas (containing at least one of He, Ne, Ar, Kr, and Xe) used for the plasma treatment is contained in the insulating films 3621a and 3621b. When Ar is used, Ar is contained in the insulating films 3621a and 3621b.

In addition, the plasma treatment is performed with an electron density of $1\times10^{11}$ $cm^{-3}$ to $1\times10^{13}$ $cm^{-3}$ and an electron temperature of plasma of 0.5 eV to 1.5 eV in the atmosphere containing the gas described above. The electron density of plasma is high and the electron temperature around an object to be treated (here, the semiconductor films 3603a and 3603b) formed over the substrate 3601 is low. Thus, plasma damages to the object to be treated can be prevented. In addition, since the electron density of plasma is as high as $1\times10^{11}$ $cm^3$ or more, the oxide film or the nitride film formed by oxidizing or nitriding the object to be treated by the plasma treatment is superior in evenness of a film thickness or the like, compared with a film formed by a CVD method, a sputtering method, or the like; thus, a minute film can be formed. Moreover, since the electron temperature of plasma is as low as 1 eV or less, the oxidation treatment or the nitriding treatment can be performed at a lower temperature than conventional plasma treatment or thermal oxidation method. For example, the oxidization treatment or the nitriding treatment can be performed sufficiently even when the plasma treatment is performed at a temperature lower than a distortion point of a glass substrate by $100°$ C. or more. As the frequency for producing plasma, a high frequency wave such as a microwave (2.45 GHz) can be employed. Hereinafter, the plasma treatment is performed under the above conditions unless specifically referred.

Next, the gate insulating film 3604 is formed so as to cover the insulating films 3621a and 3621b (FIGS. 37C-1 and 37C-2). The gate insulating film 3604 can be formed to have a single layer structure or a multilayer structure of insulating films containing oxygen or nitrogen such as silicon oxide (SiOx), silicon nitride (SiNx), silicon oxynitride (SiOxNy) (x>y), or silicon nitride oxide (SiNxOy) (x>y) by a known means (a sputtering method, an LPCVD method, a plasma CVD method, or the like). For example, when Si is used for the semiconductor films 3603a and 3603b and the Si is oxidized by the plasma treatment, silicon oxide is formed as the insulating films 3621a and 3621b over the surfaces of the semiconductor films 3603a and 3603b. In this case, silicon oxide (SiOx) is formed as the gate insulating film over the insulating films 3621a and 3621b. In addition, in FIGS. 37B-1 and 37B-2, when the insulating films 3621a and 3621b, which are formed by oxidizing or nitriding the semiconductor films 3603a and 3603b by the plasma treatment, are sufficiently thick, the insulating films 3621a and 3621b can also be used as the gate insulating film.

Then, by forming the gate electrode 3605 or the like over the gate insulating film 3604, it is possible to manufacture a semiconductor device having the N-channel transistor 3610a and the P-channel transistor 3610b using the island-like semiconductor films 3603a and 3603b as channel regions, respectively (FIGS. 37D-1 and 37D-2).

Before forming the gate insulating film 3604 over the semiconductor films 3603a and 3603b in such a manner, the surface of each of the semiconductor films 3603a and 3603b is oxidized or nitrided by the plasma treatment. Consequently, a short-circuit between the gate electrode and the semiconductor film due to a coating defect of the gate insulating film 3604 at edge portions 3651a and 3651b and the like of the channel regions, or the like can be prevented. In other words, in a case where the edge portions of the island-like semiconductor films are formed to be almost perpendicular ($\theta=85$ to $100°$), when the gate insulating film is formed so as to cover the semiconductor films by a CVD method, a sputtering method, or the like, there is fear of a coating defect due to disconnection or the like of the gate insulating film at the edge portions of the semiconductor films. However, when the plasma treatment is performed in advance to the surface of the semiconductor film to oxide or nitride the surface, a coating defect and the like of the gate insulating film at the edge portions of the semiconductor film can be prevented.

In FIGS. 37A-1 to 37D-1 and FIGS. 37A-2 to 37D-2, the gate insulating film 3604 may be oxidized or nitrided by performing plasma treatment after forming the gate insulating film 3604. In this case, a gate insulating film 3604 is formed to cover semiconductor films 3603a and 3603b (FIG. 38A-2), and plasma treatment is performed to the gate insulating film 3604 to oxidize or nitride the gate insulating film 3604. Accordingly, an insulating film 3623 is formed over the surface of the gate insulating film 3604 (FIGS. 38B-1 and 38B-2). Note that an oxide film or a nitride film can be used as the insulating film 3623. The conditions of the plasma treatment can be performed in the same manner to those described above. In addition, a rare gas used in the plasma treatment is contained in the insulating film 3623, and for example, in a case of using Ar, Ar is contained in the insulating film 3623.

In FIGS. 38B-1 and 38B-2, after the plasma treatment is performed once under an oxygen atmosphere to oxidize the gate insulating film 3604, plasma treatment may be performed again under a nitrogen atmosphere to nitride the gate insulating film 3604. In this case, silicon oxide (SiOx) or silicon oxynitride (SiOxNy) (x>y) is formed over the surfaces of the semiconductor films 3603a and 3603b, and silicon nitride oxide (SiNxOy) (x>y) is formed to be in contact with gate electrodes 3605. Thereafter, by forming the gate electrodes 3605 or the like over the insulating film 3623, it is possible to manufacture a semiconductor device having an N-channel transistor 3610a and a P-channel transistor 3610b using the island-like semiconductor films 3603a and 3603b as channel regions, respectively (FIGS. 38C-1 and 38C-2). By performing the plasma treatment to the gate insulating film in such a manner, the surface of the gate insulating film is oxidized or nitrided to be modified. Thus, a minute film can be obtained. The insulating film obtained by the plasma treatment is minuter and has fewer defects such as pinholes, compared with an insulating film formed by a CVD method or a sputtering method; thus, the characteristics of a transistor can be improved.

In FIGS. 38A-1 to 38C-1 and FIGS. 38A-2 to 38C-2, the case is described, where the plasma treatment is performed to the semiconductor films 3603a and 3603b in advance, and the surfaces of the semiconductor films 3603a and 3603b are oxidized or nitrided. However, a method may be employed, by which plasma treatment is performed after forming the gate insulating film 3604 without performing the plasma treatment to the semiconductor films 3603a and 3603b. In such a manner, by performing the plasma treatment before forming the gate electrode, even when a coating defect due to disconnection or the like of the gate insulating film occurs at the edge portion of the semiconductor films, the semiconductor film exposed owing to the coating defect can be oxidized or nitrided; thus, a short-circuit between the gate electrode and the semiconductor film due to the coating defect of the gate insulating film at the edge portion of the semiconductor films, or the like can be prevented.

Even when the edge portions of the island-like semiconductor films are formed to be almost perpendicular in such a manner, the plasma treatment is performed to the semiconductor films or the gate insulating film to oxidize or nitride the semiconductor films or the gate insulating film. Therefore, a short-circuit between the gate electrode and the semiconductor films due to the coating defect of the gate insulating film at the edge portions of the semiconductor films, or the like can be prevented.

Next, a case will be described where the edge portions of the island-like semiconductor film provided over the substrate are tapered (θ=30 to 85°).

First, island-like semiconductor films 3603a and 3603b are formed over a substrate 3601 (FIGS. 39A-1 and 39A-2). The island-like semiconductor films 3603a and 3603b can be provided by forming an amorphous semiconductor film using a material containing silicon (Si) as its main component (for example, $Si_xGe_{1-x}$ or the like), or the like over an insulating film 3602, which is formed in advance over the substrate 3601, by a known means (a sputtering method, an LPCVD method, a plasma CVD method, or the like), then crystallizing the amorphous semiconductor film, and then selectively etching the semiconductor film. Note that the amorphous semiconductor film is crystallized by a known crystallization method such as a laser crystallization method, a thermal crystallization method using RTA or an annealing furnace, or a thermal crystallization method using a metal element which promotes crystallization. In FIGS. 39A-1 to 39D-1 and FIGS. 39A-2 to 39D-2, the edge portions of the island-like semiconductor films are tapered (θ=30 to 85°).

Next, the gate insulating film 3604 is formed so as to cover the semiconductor films 3603a and 3603b (FIGS. 39B-1 and 39B-2). The gate insulating film 3604 can be formed to have a single layer structure or a multilayer structure of insulating films containing oxygen or nitrogen such as silicon oxide (SiOx), silicon nitride (SiNx), silicon oxynitride (SiOxNy) (x>y), or silicon nitride oxide (SiNxOy) (x>y) by a known means (a sputtering method, an LPCVD method, a plasma CVD method, or the like).

Then, the gate insulating film 3604 is oxidized or nitrided by plasma treatment; thus, an insulating film 3624 is formed over the surface of the gate insulating film 3604 (FIGS. 39C-1 and 39C-2). Note that an oxide film or a nitride film can be used as the insulating film 3624. In addition, the conditions of the plasma treatment can be performed in the same manner to those described above. For example, when silicon oxide (SiOx) or silicon oxynitride (SiOxNy) (x>y) is used as the gate insulating film 3604, plasma treatment is performed under an oxygen atmosphere to oxidize the gate insulating film 3604. Therefore, the film obtained over the surface of the gate insulating film by the plasma treatment can be minute and have fewer defects such as pinholes, compared with a gate insulating film formed by a CVD method, a sputtering method, or the like. On the other hand, plasma treatment is performed under a nitrogen atmosphere to nitride the gate insulating film 3604; therefore, silicon nitride oxide (SiNxOy) (x>y) can be provided as the insulating film 3624 over the surface of the gate insulating film 3604. In addition, after plasma treatment is performed once under an oxygen atmosphere to oxidize the gate insulating film 3604, plasma treatment may be performed again under a nitrogen atmosphere to nitride the gate insulating film 3604. Moreover, a rare gas used in the plasma treatment is contained in the insulating film 3624, and for example, in a case of using Ar, Ar is contained in the insulating film 3624.

Next, by forming gate electrodes 3605 and the like over the gate insulating film 3604, it is possible to manufacture a semiconductor device having an N-channel transistor 3610a and a P-channel transistor 3610b using the island-like semiconductor films 3603a and 3603b as channel regions, respectively (FIGS. 39D-1 and 39D-2).

In such a manner, by performing the plasma treatment to the gate insulating film, an insulating film formed of an oxide film or a nitride film can be provided over the surface of the gate insulating film, and the surface of the gate insulating film can be modified. The oxidized or nitrided insulating film by the plasma treatment is minuter and has fewer defects such as pinholes, compared with a gate insulating film formed by a CVD method or a sputtering method; thus, the characteristics of a transistor can be improved. Further, it is possible to prevent a short-circuit between the gate electrode and the semiconductor film due to the coating defect of the gate insulating film at the edge portion of the semiconductor film, or the like by forming the edge portions of the semiconductor films into a tapered shape. However, by performing the plasma treatment after forming the gate insulating film, a short-circuit between the gate electrode and the semiconductor film, or the like can be further prevented.

Subsequently, a manufacturing method of a semiconductor device which is different from that in FIGS. 39A-1 to 39D-1 and FIGS. 39A-2 to 39D-2 will be explained with reference to the drawings. Specifically, a case will be described where plasma treatment is selectively performed to edge portions of semiconductor films having a tapered shape.

First, island-like semiconductor films 3603a and 3603b are formed over a substrate 3601 (FIGS. 40A-1 and 40A-2). As for the island-like semiconductor films 3603a and 3603b, an amorphous semiconductor film is formed using a material containing silicon (Si) as its main component (for example, $Si_xGe_{1-x}$ or the like), or the like over an insulating film 3602 formed in advance over the substrate 3601, by a known means (a sputtering method, an LPCVD method, a plasma CVD method, or the like). Then, the amorphous semiconductor film is crystallized and the semiconductor film is selectively etched using resists 3625a and 3625b as masks. Note that the amorphous semiconductor film can be crystallized by a known crystallization method such as a laser crystallization method, a thermal crystallization method using RTA or an annealing furnace, a thermal crystallization method using a metal element which promotes crystallization, or a method using these methods in combination.

Next, before removing the resists 3625a and 3625b used for etching the semiconductor film, plasma treatment is performed to selectively oxidize or nitride the edge portions of the island-like semiconductor films 3603a and 3603b. Accordingly, an insulating film 3626 is formed at each edge portion of the semiconductor films 3603a and 3603b (FIGS. 40B-1 and 40B-2). An oxide film or a nitride film can be used as the insulating film 3626. The plasma treatment is performed under the above conditions. In addition, a rare gas used in the plasma treatment is contained in the insulating film 3626.

Then, a gate insulating film 3604 is formed so as to cover the semiconductor films 3603a and 3603b (FIGS. 40C-1 and 40C-2). The gate insulating film 3604 can be formed in the same manner as described above.

Next, by forming gate electrodes 3605 and the like over the gate insulating film 3604, it is possible to manufacture a semiconductor device having an N-channel transistor 3610a and a P-channel transistor 3610b using the island-like semiconductor films 3603a and 3603b as channel regions, respectively (FIGS. 40D-1 and 40D-2).

When the edge portions of the semiconductor films 3603a and 3603b are tapered, edge portions 3652a and 3652b of the channel regions formed in parts of the semiconductor films 3603a and 3603b are also tapered. Accordingly, the thickness of the semiconductor film or the gate insulating film varies, compared with the center portion; thus, there is a case where the characteristics of a transistor are affected. Therefore, by selectively oxidizing or nitriding the edge portions of the channel regions by the plasma treatment, insulating films are formed over the semiconductor films which become the edge portions of the channel regions. Thus, an influence on the transistor due to the edge portions of the channel regions can be reduced.

Figures 1, 42A:
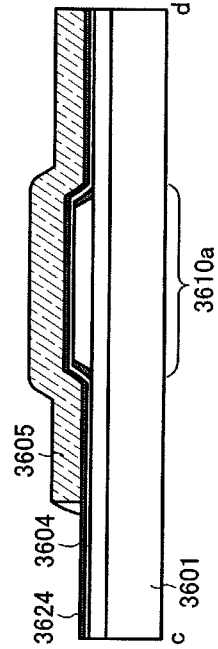
Figures 2, 42A:
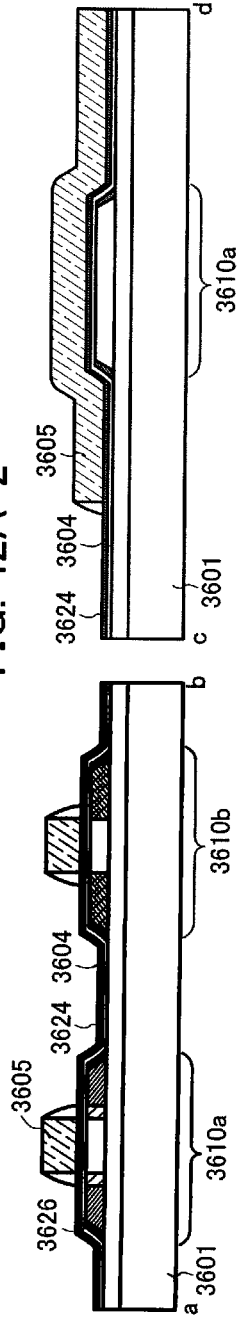

In FIGS. 40A-1 to 40D-1 and FIGS. 40A-2 to 40D-2, an example is shown in which the plasma treatment is performed only to the edge portions of the semiconductor films 3603a and 3603b for oxidation or nitriding. However, as shown in FIGS. 39A-1 to 39D-1 and FIGS. 39A-2 to 39D-2, plasma treatment can also be performed to the gate insulating film 3604 for oxidation or nitriding as a matter of course (FIGS. 42A-1 and 42A-2).

Next, a manufacturing method of a semiconductor device which is different from the above will be explained with reference to the drawings. Specifically, plasma treatment is performed to semiconductor films each having a tapered shape.

First, island-like semiconductor films 3603a and 3603b are formed over a substrate 3601 in the same manner as described above (FIGS. 41A-1 and 41A-2).

Next, plasma treatment is performed to the semiconductor films 3603a and 3603b to oxidize or nitride the semiconductor films 3603a and 3603b; thus, insulating films 3627a and 3627b are formed over the surfaces of the semiconductor films 3603a and 3603b, respectively (FIGS. 41B-1 and 41B-2). An oxide film or a nitride film can be used for the insulating films 3627a and 3627b. The plasma treatment can be performed in the same manner under the conditions described above. For example, when Si is used as the semiconductor films 3603a and 3603b, silicon oxide (SiOx) or silicon nitride (SiNx) is formed as the insulating films 3627a and 3627b. In addition, after oxidizing the semiconductor films 3603a and 3603b by the plasma treatment, plasma treatment may be performed again to nitride the semiconductor films 3603a and 3603b. In this case, silicon oxide (SiOx) or silicon oxynitride (SiOxNy) (x>y) is formed to be in contact with the semiconductor films 3603a and 3603b, and silicon nitride oxide (SiNxOy) (x>y) is formed over the surface of the silicon oxide. Therefore, a rare gas used in the plasma treatment is contained in the insulating films 3627a and 3627b. By the plasma treatment, the edge portions of the semiconductor films 3603a and 3603b are oxidized or nitrided at the same time.

Then, a gate insulating film 3604 is formed so as to cover the insulating films 3627a and 3627b (FIGS. 41C-1 and 41C-2). The gate insulating film 3604 can be provided to have a single layer structure or a stacked layer structure of insulating films containing oxygen or nitrogen such as silicon oxide (SiOx), silicon nitride (SiNx), silicon oxynitride (SiOxNy) (x>y), or silicon nitride oxide (SiNxOy) (x>y) by a known means (a sputtering method, an LPCVD method, a plasma CVD method, or the like). For example, in a case where the semiconductor films 3603a and 3603b using Si are oxidized by plasma treatment to form silicon oxide as the insulating films 3627a and 3627b over the surface of the semiconductor films 3603a and 3603b, silicon oxide (SiOx) is formed as the gate insulating film over the insulating films 3627a and 3627b.

Next, by forming gate electrodes 3605 and the like over the gate insulating film 3604, it is possible to manufacture a semiconductor device having an N-channel transistor 3610a and a P-channel transistor 3610b using the island-like semiconductor films 3603a and 3603b as channel regions, respectively (FIGS. 41D-1 and 41D-2).

When the edge portions of the semiconductor films are tapered, edge portions 3653a and 3653b of the channel regions formed in part of the semiconductor films are also tapered. Thus, there is a case where the characteristics of a semiconductor element are affected. Therefore, as a result of oxidizing or nitriding the semiconductor films by the plasma treatment, the edge portions of the channel regions are oxidized or nitrided; thus, an influence on a semiconductor element can be reduced.

Figures 1, 42B:
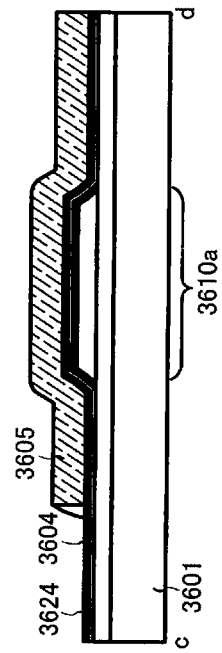
Figures 2, 42B:
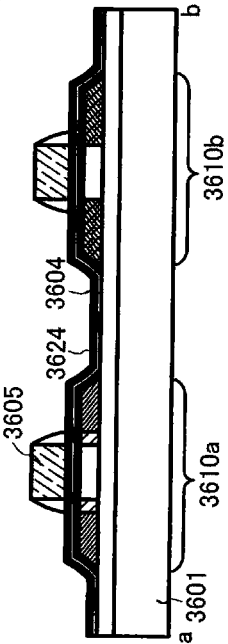

In FIGS. 41A-1 to 41D-1 and FIGS. 41A-2 to 41D-2, an example is shown in which only the semiconductor films 3603a and 3603b are oxidized or nitrided by the plasma treatment; however, as shown in the above FIGS. 39A-1 to 39D-1 and FIGS. 39A-2 to 39D-2, plasma treatment can be performed to the gate insulating film 3604 for oxidation or nitriding as a matter of course (FIGS. 42B-1 and 42B-2). In this case, after the plasma treatment is performed under an oxygen atmosphere once to oxide the gate insulating film 3604, plasma treatment may be performed again under a nitrogen atmosphere to nitride the gate insulating film 3604. In this case, silicon oxide (SiOx) or silicon oxynitride (SiOxNy) (x>y) is formed over the surfaces of the semiconductor films 3603a and 3603b, and silicon nitride oxide (SiNxOy) (x>y) is formed to be in contact with the gate electrodes 3605.

By modifying the surface of the semiconductor films or the gate insulating film by oxidation or nitriding by the plasma treatment in such a manner, a minute insulating film having favorable film quality can be formed. Consequently, even when the insulating film is formed to be thin, defects such as pinholes can be prevented, and miniaturization and high performance of a semiconductor element such as a transistor can be realized.

Note that, in this embodiment mode, plasma treatment is performed to the semiconductor films 3603a and 3603b or the gate insulating film 3604 in the above FIGS. 36A to 36C to oxidize or nitride the semiconductor films 3603a and 3603b or the gate insulating film 3604; however, a layer that is oxidized or nitrided by plasma treatment is not limited thereto. For example, plasma treatment may be performed to the substrate 3601 or the insulating film 3602, or plasma treatment may be performed to the insulating film 3606 or 3607.

The content described in this embodiment mode can be implemented by being arbitrarily combined with the content described in Embodiment Modes 1 to 4.

Embodiment Mode 6

This embodiment mode will describe hardware which controls driving of a display device of the present invention.

Figure 43:
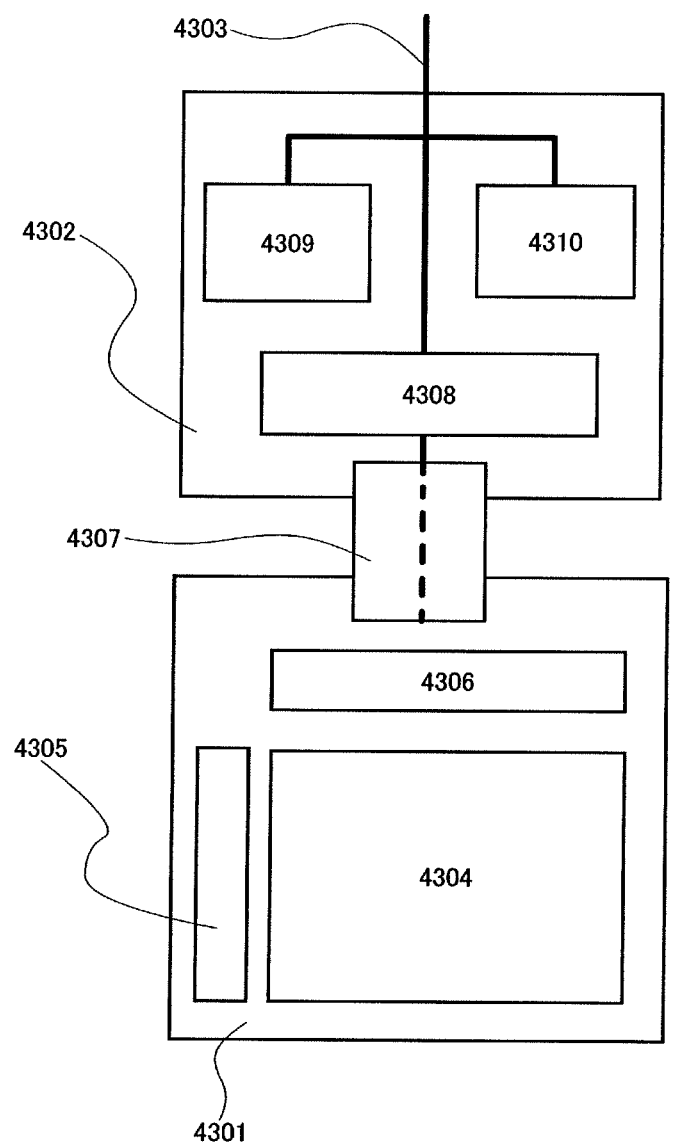
FIG. 43 is a diagram showing an example of hardware for controlling a driving method of the present invention.

FIG. 43 shows a rough constitution diagram. A pixel portion 4304 is arranged over a substrate 4301. A signal line driver circuit 4306 and a scanning line driver circuit 4305 are arranged in many cases. Besides, a power supply circuit, a pre-charge circuit, a timing generation circuit, or the like may be arranged. There is also a case where the signal line driver circuit 4306 and the scanning line driver circuit 4305 are not arranged. In this case, a circuit which is not arranged over the substrate 4301 is formed over an IC in many cases. The IC is also arranged over the substrate 4301 by COG (Chip On Glass) in many cases. Alternatively, there is also a case where the IC is arranged over a connection substrate 4307 which connects a peripheral circuit substrate 4302 and the substrate 4301.

A signal 4303 is inputted into the peripheral circuit substrate 4302. The signal is held in memories 4309 and 4310 or the like under the control of a controller 4308. In a case where the signal 4303 is an analog signal, the signal is converted into a digital signal and stored in the memories 4309 and 4310 or the like in many cases. Then, a signal is outputted by the controller 4308 using the signal held in the memories 4309, and 4310 or the like.

The content described in this embodiment mode can be implemented by being arbitrarily combined with the content described in Embodiment Modes 1 to 5.

Embodiment Mode 7

This embodiment mode will explain a structural example of an EL module and an EL television receiver using a display device of the present invention.

Figure 44:
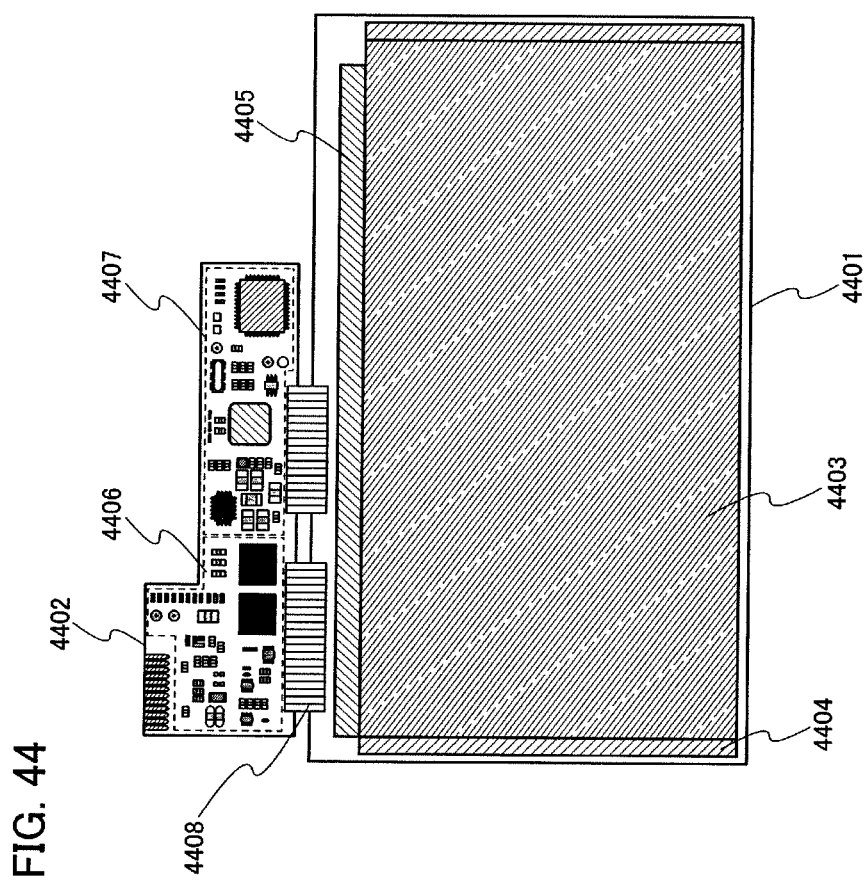
FIG. 44 is a view showing an example of an EL module using a driving method of the present invention.

FIG. 44 shows an EL module in which a display panel 4401 and a circuit board 4402 are combined. The display panel 4401 includes a pixel portion 4403, a scanning line driver circuit 4404, and a signal line driver circuit 4405. Over the circuit board 4402, for example, a control circuit 4406, a signal dividing circuit 4407, and the like are formed. The display panel 4401 and the circuit board 4402 are connected to each other by a connection wiring 4408. As the connection wiring, an FPC or the like can be used.

The control circuit 4406 corresponds to the controller 4308, the memories 4309 and 4310, or the like in Embodiment Mode 6.

In the display panel 4401, the pixel portion and part of peripheral driver circuits (a driver circuit having a low operation frequency among a plurality of driver circuits) may be formed using TFTs over a substrate in an integrated manner, and another part of the peripheral driver circuits (a driver circuit having a high operation frequency among the plurality of driver circuits) may be formed over an IC chip. The IC chip may be mounted on the display panel 4401 by COG (Chip On Glass) or the like. The IC chip may alternatively be mounted on the display panel 4401 by using TAB (Tape Automated Bonding) or a printed wiring board.

In addition, by converting the impedance of a signal set to a scanning line or a signal line by using a buffer, a write period for pixels of each row can be shortened. Accordingly, a high-resolution display device can be provided.

Moreover, in order to further reduce power consumption, a pixel portion may be formed using a transistor over a glass substrate, and all signal line driver circuits may be formed over an IC chip, and the IC chip may be mounted on a display panel by COG (Chip On Glass).

Figure 45:
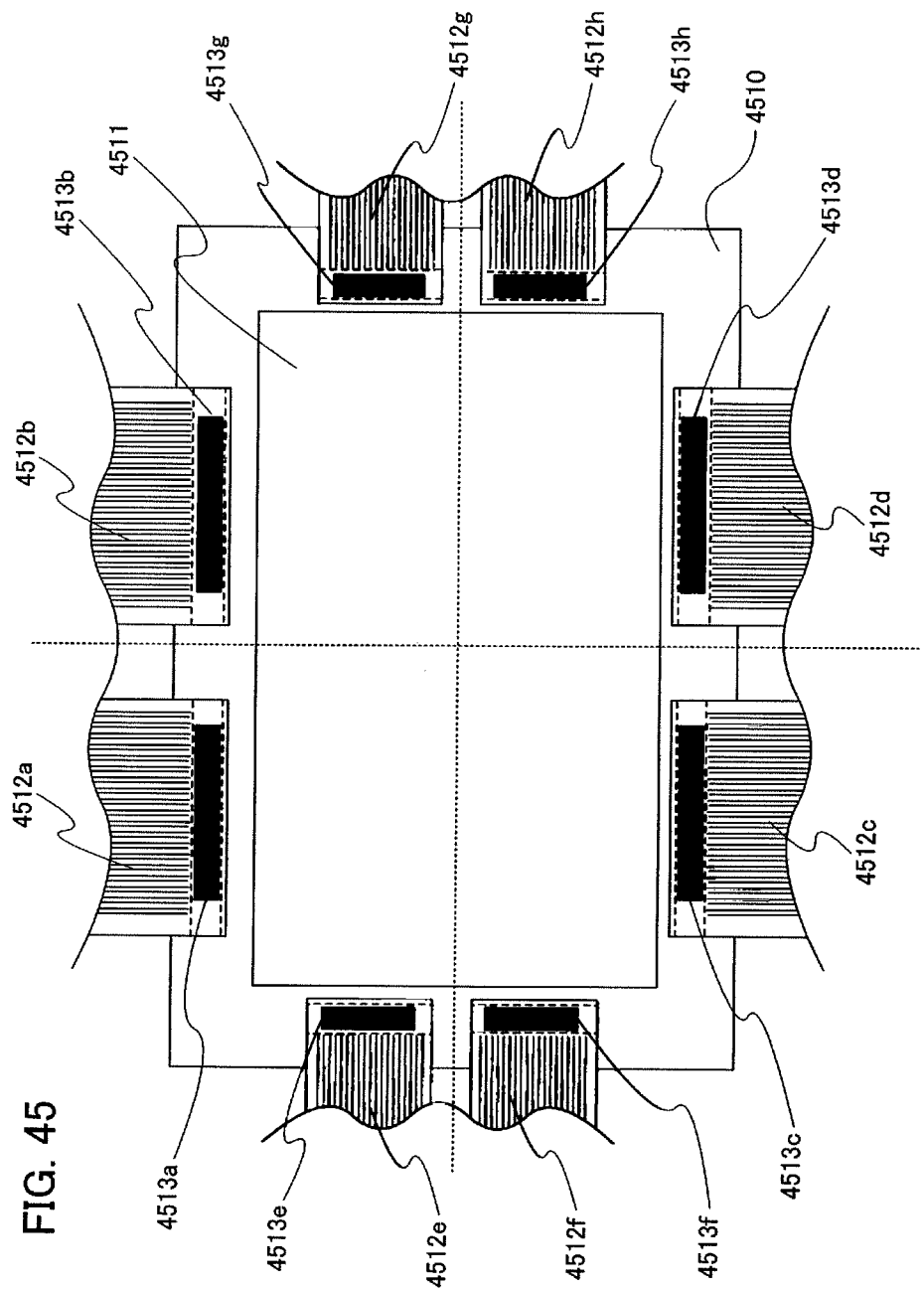
FIG. 45 is a view showing a structure example of a display panel using a driving method of the present invention.

For example, the entire screen of the display panel may be divided into several regions, and an IC chip where part or all of the peripheral driver circuits (the signal line driver circuit, the scanning line driver circuit, and the like) are formed may be arranged in each region to be mounted on the display panel by COG (Chip On Glass) or the like. FIG. 45 shows a structure of the display panel of this case.

FIG. 45 shows an example of driving by dividing the entire screen into four regions and using eight IC chips. A display panel includes, as its structure, a substrate 4510, a pixel portion 4511, FPCs 4512a to 4512h, and IC chips 4513a to 4513h. Among the eight IC chips, a signal line driver circuit is formed in each of the IC chips 4513a to 4513d, and a scanning line driver circuit is formed in each of the IC chips 4513e to 4513h. Then, it becomes possible to drive only an arbitrary screen region of the four screen regions by driving arbitrary IC chips. For example, when only the IC chips 4513a and 4513e are driven, only the upper left region of the four screen regions can be driven. Accordingly, it is possible to reduce power consumption.

Figure 46:
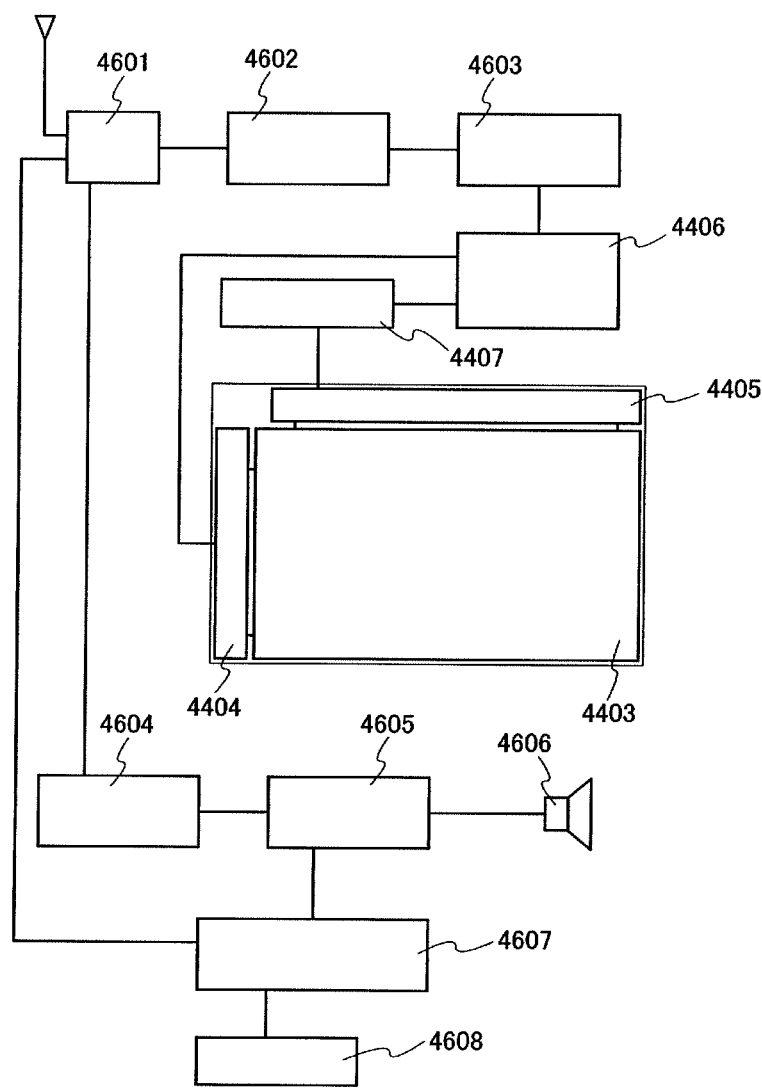
FIG. 46 is a diagram showing an example of an EL television receiver using a driving method of the present invention.

With such an EL module provided with the panel structure as described above, an EL television receiver can be completed. FIG. 46 is a block diagram showing the main configuration of an EL television receiver. A tuner 4601 receives video signals and audio signals. The video signals are processed by a video signal amplifier circuit 4602, a video signal processing circuit 4603 for converting a signal outputted from the video signal amplifier circuit 4602 into a color signal corresponding to each color of red, green, and blue, and a control circuit 4406 for converting the video signal into an input specification of a driver circuit. The control circuit 4406 outputs signals to each of the scanning line side and the signal line side. In a case of performing digital drive, a signal dividing circuit 4407 may be provided on the signal line side, so as to divide an input digital signal into m signals before being supplied to a pixel portion.

Among the signals received at the tuner 4601, audio signals are transmitted to an audio signal amplifier circuit 4604, and an output thereof is supplied to a speaker 4606 through an audio signal processing circuit 4605. A control circuit 4607 receives control data on a receiving station (reception frequency) or sound volume from an input portion 4608 and transmits signals to the tuner 4601 and the audio signal processing circuit 4605.

By incorporating the EL module into a housing, a television receiver can be completed. A display portion of the television receiver is formed with such an EL module. In addition, a speaker, a video input terminal, and the like are appropriately provided.

As a matter of course, the present invention is not limited to the television receiver, and can be applied to various objects as a display medium especially with a large area such as a monitor of a personal computer; an information display board at the train station, airport, or the like; or an advertisement display board on the street.

By using a display device and a driving method thereof according to the present invention, clear images can be displayed. Accordingly, even an image having subtle changes in gray scales such as human skin can be displayed clearly.

The content described in this embodiment mode can be implemented by being arbitrarily combined with the content described in Embodiment Modes 1 to 6.

Embodiment Mode 8

As an electronic device using a display device of the present invention, the following can be given: a camera such as a video camera or a digital camera, a goggle display (a head-mounted display), a navigation system, an audio reproducing device (a car audio, an audio component, or the like), a personal computer, a game machine, a portable information terminal (a mobile computer, a cellular phone, a portable game machine, an electronic book, or the like), an image reproducing device provided with a recording medium (specifically, a device provided with a display which can reproduce a recording medium such as a digital versatile disc (DVD) and display the image), and the like. FIGS. 47A to 47H show specific examples of such electronic devices.

Figure 47A:
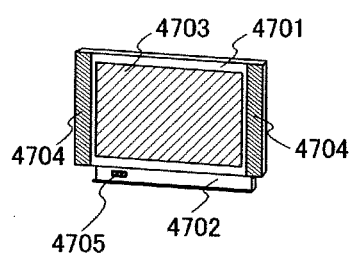
FIGS. 47A to 47H are views each showing an example of an electronic device to which a driving method of the present invention is applied.

FIG. 47A shows a light emitting device, which includes a housing 4701, a supporting stand 4702, a display portion 4703, a speaker portion 4704, a video input terminal 4705, and the like. The present invention can be used for a display device which constitutes the display portion 4703. In addition, according to the present invention, clear images can be displayed with reduced variation in luminance. Since the light emitting device is a self-light emitting type, no backlight is required, and a display portion thinner than a liquid crystal display can be obtained. Note that the light emitting device includes all display devices for information display, for example, for a personal computer, for TV broadcast reception, or for advertisement display.

Figure 47B:
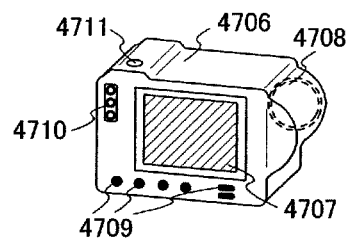

FIG. 47B shows a digital still camera, which includes a main body 4706, a display portion 4707, an image receiving portion 4708, operation keys 4709, an external connection port 4710, a shutter 4711, and the like. The present invention can be used for a display device which constitutes the display portion 4707. In addition, according to the present invention, clear images can be displayed with reduced variation in luminance.

Figure 47C:
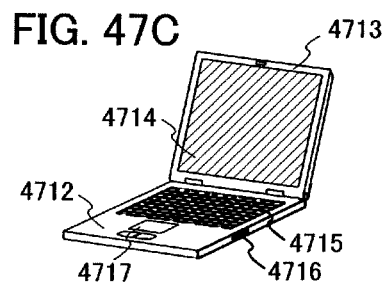

FIG. 47C shows a personal computer, which includes a main body 4712, a housing 4713, a display portion 4714, a keyboard 4715, an external connection port 4716, a pointing mouse 4717, and the like. The present invention can be used for a display device which constitutes the display portion 4714. In addition, according to the present invention, clear images can be displayed with reduced variation in luminance.

Figure 47D:
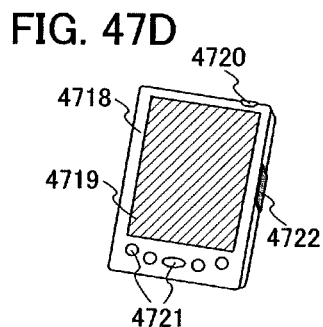

FIG. 47D shows a mobile computer, which includes a main body 4718, a display portion 4719, a switch 4720, operation keys 4721, an infrared port 4722, and the like. The present invention can be used for a display device which constitutes the display portion 4719. In addition, according to the present invention, clear images can be displayed with reduced variation in luminance.

Figure 47E:
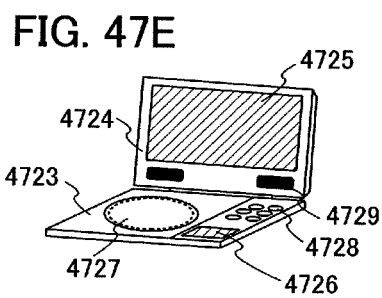

FIG. 47E shows a portable image reproducing device provided with a recording medium (specifically, a DVD reproducing device), which includes a main body 4723, a housing 4724, a display portion A 4725, a display portion B 4726, a recording medium (DVD or the like) reading portion 4727, operation keys 4728, a speaker portion 4729, and the like. The display portion A 4725 mainly displays image data, while the display portion B 4726 mainly displays text data. The present invention can be used for display devices which constitute the display portion A 4725 and the display portion B 4726. In addition, according to the present invention, clear images can be displayed with reduced variation in luminance. Note that the image reproducing device provided with a recording medium also includes a home-use game machine and the like.

Figure 47F:
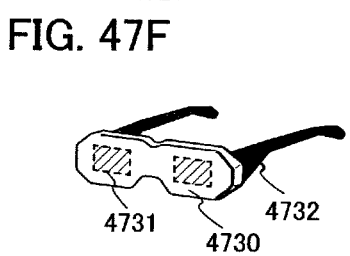

FIG. 47F shows a goggle display (a head-mounted display), which includes a main body 4730, a display portion 4731, an arm portion 4732, and the like. The present invention can be used for a display device which constitutes the display portion 4731. In addition, according to the present invention, clear images can be displayed with reduced variation in luminance.

Figure 47G:
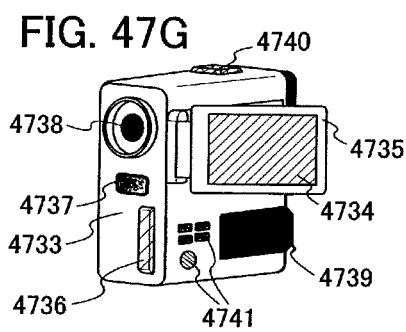

FIG. 47G shows a video camera, which includes a main body 4733, a display portion 4734, a housing 4735, an external connection port 4736, a remote control receiving portion 4737, an image receiving portion 4738, a battery 4739, an audio input portion 4740, operation keys 4741, and the like. The present invention can be used for a display device which constitutes the display portion 4734. In addition, according to the present invention, clear images can be displayed with reduced variation in luminance.

Figure 47H:
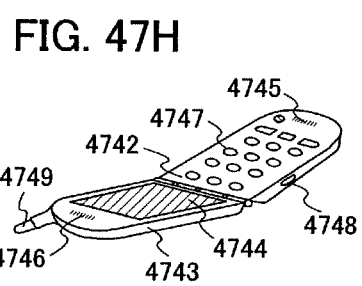
Figure 48:
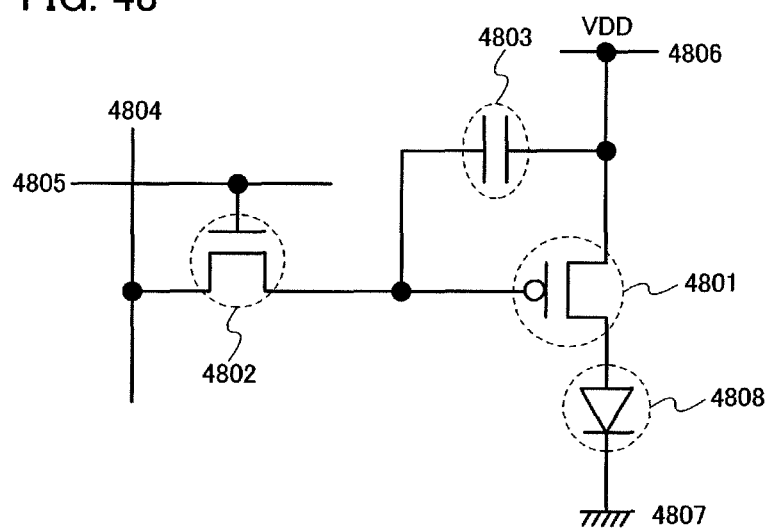
FIG. 48 is a diagram showing a conventional pixel structure.
Figure 49:
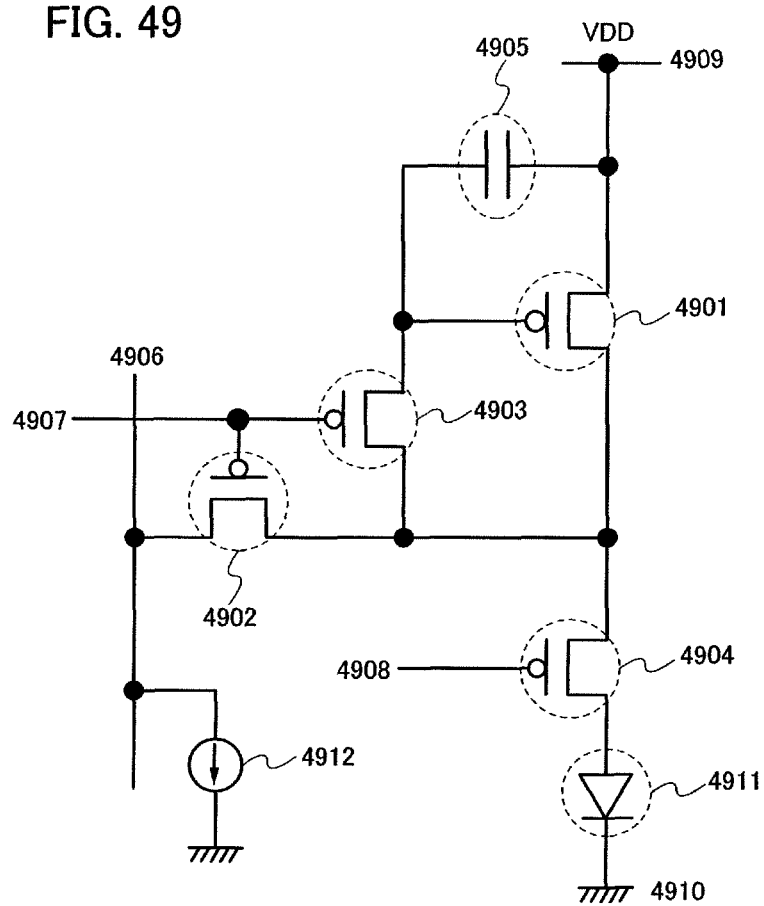
FIG. 49 is a diagram showing a conventional pixel structure.

FIG. 47H shows a cellular phone, which includes a main body 4742, a housing 4743, a display portion 4744, an audio input portion 4745, an audio output portion 4746, operation keys 4747, an external connection port 4748, an antenna 4749, and the like. The present invention can be used for a display device which constitutes the display portion 4744. Note that the current consumption of the cellular phone can be reduced if white text is displayed with a black background on the display portion 4744. In addition, according to the present invention, clear images can be displayed with reduced variation in luminance.

Note that, if a light emitting material with a high emission luminance is used, the present invention can be applied to a front or rear projector which projects and magnifies light including the outputted image data with a lens or the like.

Moreover, the above electronic devices have often been used for displaying data distributed through electronic communication lines such as the Internet or a CATV (Cable TV), and in particular, opportunity to display moving image data has been increased. Since a light emitting material has an extremely high response speed, a light emitting device is suitable for displaying moving images.

Since a light emitting device consumes power in its light emitting portion, it is desirable to display data by utilizing as small a light emitting portion as possible. Therefore, in a case of using a light emitting device for a display portion of a portable information terminal which mainly displays text data, such as a cellular phone or an audio reproducing device in particular, it is desirable to drive the light emitting device in such a manner that text data is displayed with a light emitting portion while using a non-light emitting portion as a background.

As described above, the applicable range of the present invention is so wide that the present invention can be applied to electronic devices of various fields. In addition, the electronic devices in this embodiment mode may employ a display device having any of the structures described in Embodiment Modes 1 to 7.

Embodiment Mode 9

Figure 86:
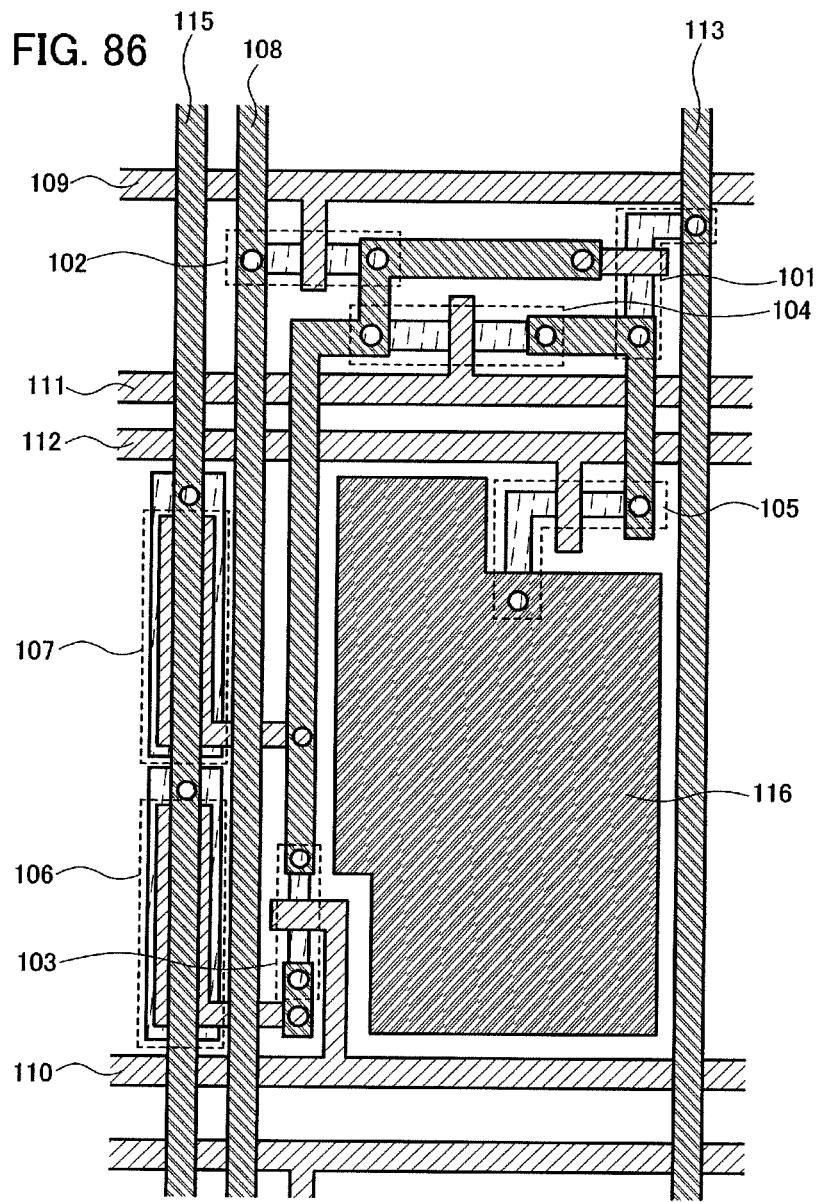
FIG. 86 is a view showing an example of a layout of a pixel structure in a display device of the present invention.

This embodiment mode will describe a layout of a pixel in a display device of the present invention. FIG. 86 shows a layout view of a pixel circuit shown in FIG. 1. Note that reference numeral denoted in FIG. 86 corresponds to those denoted in FIG. 1. The layout view is not limited to FIG. 86.

The pixel circuit shown in FIG. 1 includes first to fifth transistors 101 to 105, first and second storage capacitors 106 and 107, a signal line 108, first to fourth scanning lines 109 to 112, first and second power supply lines 113 and 114, a capacitor line 115, and a light emitting element 116.

The first to fourth scanning lines 109 to 112 are each formed of a first wiring, and the signal line 108, the first and second power supply lines 113 and 114, and the capacitor line 115 are each formed by a second wiring.

Figure 87:
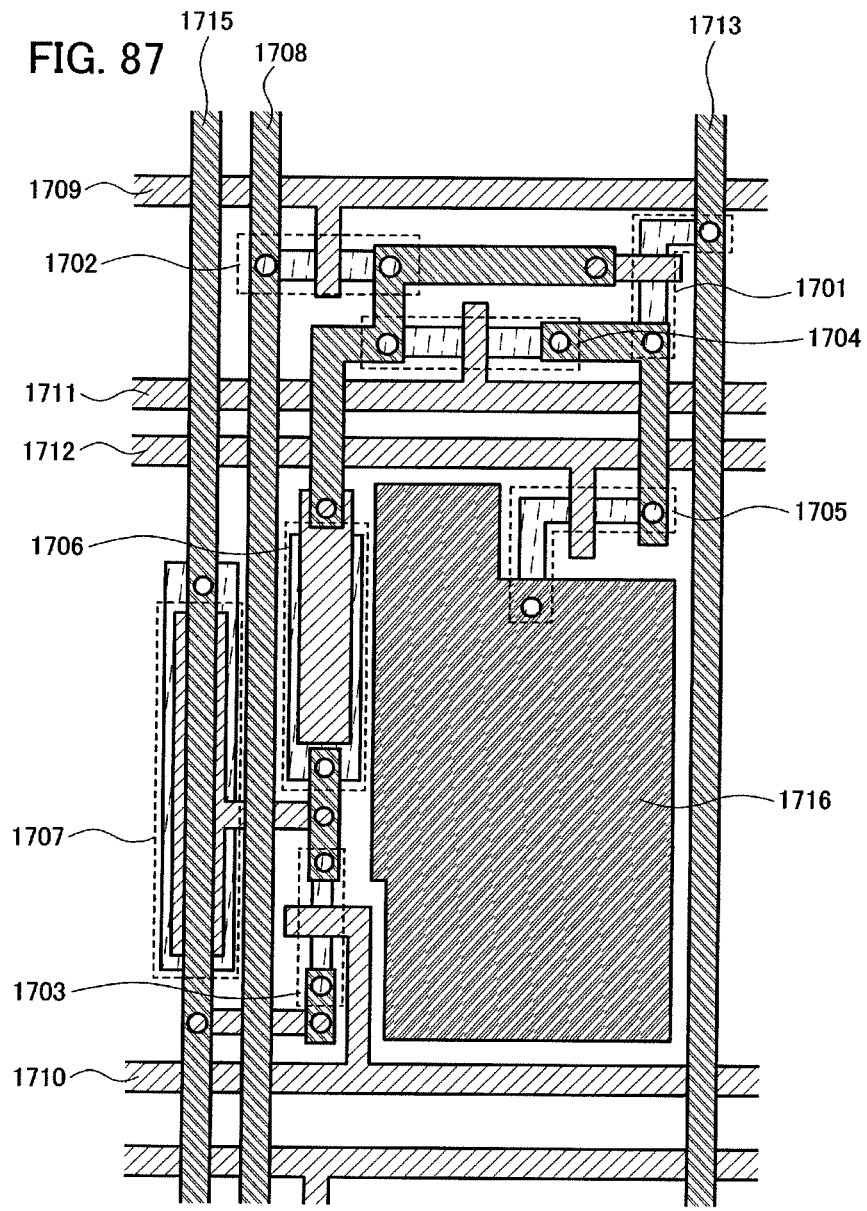
FIG. 87 is a view showing an example of a layout of a pixel structure in a display device of the present invention.

Alternatively, for example, FIG. 87 shows a layout view of the pixel circuit shown in FIG. 17. Note that reference numerals denoted in FIG. 87 correspond to those denoted in FIG. 17. The layout view is not limited to FIG. 87.

The pixel circuit shown in FIG. 17 includes first to fifth transistors 1701 to 1705, first and second storage capacitors 1706 and 1707, a signal line 1708, first to fourth scanning lines 1709 to 1712, first and second power supply lines 1713 and 1714, a capacitor line 1715, and a light emitting element 1716.

The first to fourth scanning lines 1709 to 1712 are each formed of a first wiring, and the signal line 1708, the first and second power supply lines 1713 and 1714, and the capacitor line 1715 are each formed of a second wiring.

In a case of a top-gate structure, a substrate, a semiconductor layer, a gate insulating film, a first wiring, an interlayer insulating film, and a second wiring are sequentially formed. In a case of a bottom-gate structure, a substrate, a first wiring, a gate insulating film, a semiconductor layer, an interlayer insulating film, and a second wiring are sequentially formed.

In a pixel structure of this embodiment mode, among values of W/L representing a ratio between a gate length L and a channel width W included in each of the first to fifth transistors, when a value of W/L included in the first transistor is set to be maximized, current flowing between a drain and a source of the first transistor can be further increased. Accordingly, when a voltage based on a video signal voltage $V_{data}$ and the threshold voltage $|V_{th}|$ of the first transistor is obtained in a period T2, an operation can be performed with further large amount of current. Therefore, further speedy operation can be performed. In addition, a current $I_{OLED}$ flowing through the light emitting element can be increased in a period T3. Therefore, a luminance can be further increased. Thus, in order to maximize the value of W/L included in the first transistor, in FIG. 86, a channel width W included in the first transistor 101 is to be maximized among the first to fifth transistors. In FIG. 87, a channel width W included in the first transistor 1701 is to be maximized among the first to fifth transistors.

The first to fifth transistors are described to have a single-gate structure in this embodiment mode; however, the present invention is not limited thereto. The structures of the first to fifth transistors can have various modes. For example, a multi-gate structure provided with two or more gate electrodes may be used. In accordance with the multi-gate structure, channel regions are connected in series. Thus, a structure is obtained, in which a plurality of transistors are connected in series. By employing the multi-gate structure, an off current can be reduced, reliability can be enhanced by improving a withstand pressure of the transistor, and flat characteristics can be obtained, in which a drain-source current is not changed so much even if a drain-source voltage is changed when the transistor is operated in a saturation region. Alternatively, a structure may be employed, in which gate electrodes are arranged above and below a channel, respectively. By employing the structure where gate electrodes are arranged above and below a channel, respectively, a channel region is increased; therefore, a current value can be increased and an S value can be improved because a depletion layer is easily generated. When gate electrodes are arranged above and below a channel, respectively, a structure is obtained, in which a plurality of transistors are connected in parallel. Further alternatively, the following structure may be employed: a structure where a gate electrode is arranged above a channel, a structure where a gate electrode is arranged below a channel, a staggered structure, or an inverted staggered structure. A channel region may be divided into a plurality of regions, and the channel regions may be connected to each other in parallel or in series. Further, a source electrode or a drain electrode may be overlapped with a channel (or part thereof). By employing the structure where a source electrode or a drain electrode is overlapped with a channel (or part thereof), instability of an operation due to hold of electric charge in part of a channel can be prevented. In addition, an LDD region may be provided. By providing the LDD region, an off current can be reduced, reliability can be enhanced by improving a withstand pressure of the transistor, and flat characteristics can be obtained, in which a drain-source current is not changed so much even if a drain-source voltage is changed when the transistor is operated in a saturation region.

The wiring and the electrode are formed to have one or more elements of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); a compound or an alloy material including one or more of the elements (for example, indium tin oxide (ITO), indium zinc oxide (IZO), indium tin oxide to which silicon oxide is added (ITSO), zinc oxide (ZnO), aluminum neodymium (Al—Nd), magnesium silver (Mg—Ag), or the like); a substance in which these compounds are combined; or the like. Alternatively, the wiring and the electrode are formed to have a compound (silicide) of silicon and the above material (for example, aluminum silicon, molybdenum silicon, nickel silicide, or the like) or a compound of nitrogen and the above material (for example, titanium nitride, tantalum nitride, molybdenum nitride, or the like). Note that a number of n-type impurities (phosphorus or the like) or p-type impurities (boron or the like) may be included in silicon (Si). By including these impurities, conductivity is improved and behavior similar to a general conductor is shown, and accordingly, the wiring and the electrode can be easily utilized as a wiring and an electrode. Note that silicon may be single crystal silicon, polycrystalline silicon (polysilicon), or amorphous silicon. By using single crystal silicon or polycrystalline silicon, resistance can be reduced. By using amorphous silicon, a display device can be formed with a simple manufacturing process. Aluminum and silver has high conductivity; therefore, signal delay can be reduced. In addition, aluminum and silver is easily etched and patterned; therefore, minute processing can be performed. Copper has high conductivity; therefore, signal delay can be reduced. Molybdenum is desirable because the display device can be manufactured without a problem of failure in a material even when molybdenum is in contact with a semiconductor oxide such as ITO or IZO or silicon, patterning and etching are easily performed, and heat resistance is high. Titanium is desirable because the display device can be manufactured without a problem of failure in a material even when titanium is in contact with a semiconductor oxide such as ITO or IZO or silicon, and heat resistance is high. Tungsten is desirable because heat resistance is high. Neodymium is desirable because heat resistance is high. In particular, alloy of neodymium and aluminum is desirable because heat resistance is improved and hillock does not occur in aluminum. Silicon is desirable because silicon can be formed concurrently with a semiconductor layer included in a transistor and heat resistance is high. Indium tin oxide (ITO), indium zinc oxide (IZO), indium tin oxide to which silicon oxide is added (ITSO), zinc oxide (ZnO), and silicon (Si) are desirable because these materials can be used for a portion, through which light is transmitted, owing to a light transmitting property. For example, these materials can be used as a pixel electrode or a common electrode.

The wiring and the electrode may be formed of the above material to have a single layer structure or a multilayer structure. By forming the wiring and the electrode to have a single layer structure, a manufacturing process can be simplified, the number of days for a process can be reduced, and cost can be lowered. Alternatively, the multilayer structure enables formation of a wiring and an electrode with high performance by taking advantage of each material and reducing disadvantage thereof. For example, by including a material with low resistance (such as aluminum) in a multilayer structure, resistance of a wiring can be lowered. By including a material with high resistance therein, heat resistance of the wiring and the electrode can be heightened as a whole, for example, by employing a stacked structure where a material with low heat resistance but with an advantage other than heat resistance is interposed between materials with high heat resistance. For example, a stacked structure is desirable, where a layer including aluminum is interposed between layers each including molybdenum or titanium. Further, in a case of including a portion to be directly in contact with a wiring or an electrode formed of another material, the materials are mutually affected in some cases. For example, one material enters another material and a property thereof is changed, and accordingly, an intended purpose cannot be achieved or a problem occurs in manufacturing a display device; therefore, a display device cannot be manufactured normally in some cases. In such a case, the problem can be solved by interposing one layer between other layers or covering one layer with another layer. For example, in a case where it is desired to have indium tin oxide (ITO) and aluminum in contact with each other, titanium or molybdenum is desirably interposed therebetween. In a case where it is desired to have silicon and aluminum in electrical contact to each other, titanium or molybdenum is desirably interposed therebetween.

The content described in this embodiment mode can be implemented by being arbitrarily combined with the content described in Embodiment Modes 1 to 8.

This application is based on Japanese Patent Application serial No. 2005-269654 filed in Japan Patent Office on Sep. 16, 2005, the entire contents of which are hereby incorporated by reference.

What is claimed is:
1. A display device comprising:
a pixel portion formed over a face of a substrate, the pixel portion comprising:
a first transistor;
a second transistor;
a third transistor;
a fourth transistor;
a fifth transistor;
a first capacitor;
a second capacitor;
a light-emitting element electrically connected to the fifth transistor, the light-emitting element being configured to emit white light; and
a color filter over the light-emitting element;
a first FPC connected to a first side of the face of the substrate;
a first IC chip over the face of the substrate, the whole of the first IC chip overlapping with the first FPC;
a second FPC connected to a second side of the face of the substrate, the second side being opposite to the first side and the pixel portion being positioned between the first side and the second side; and
a second IC chip over the face of the substrate, the whole of the second IC chip overlapping with the second FPC,
wherein a gate of the first transistor is directly connected to one of a source and a drain of the third transistor,
wherein the gate of the first transistor is directly connected to one of a source and a drain of the fourth transistor,
wherein the gate of the first transistor is directly connected to one of a source and a drain of the second transistor,
wherein the gate of the first transistor is directly connected to a first electrode of the second capacitor,
wherein one of a source and a drain of the first transistor is directly connected to the other one of the source and the drain of the fourth transistor,
wherein the one of the source and the drain of the first transistor is directly connected to one of a source and a drain of the fifth transistor,
wherein the other one of the source and the drain of the second transistor is directly connected to a signal line,
wherein the other one of the source and the drain of the third transistor is directly connected to a first electrode of the first capacitor,
wherein the other one of the source and the drain of the fifth transistor is directly connected to a first electrode of the light-emitting element, and wherein a second electrode of the first capacitor is electrically connected to a second electrode of the second capacitor.

2. The display device according to claim 1, wherein the first IC chip comprises at least a part of a signal line driver circuit.

3. The display device according to claim 1, wherein the first IC chip comprises at least a part of a scanning line driver circuit.

4. The display device according to claim 1, wherein the first transistor comprises In and Zn.

5. A display device comprising:
a pixel portion formed over a face of a substrate, the pixel portion comprising:
a first transistor;
a second transistor;
a third transistor;
a fourth transistor;
a fifth transistor;
a first capacitor;
a second capacitor;
a light-emitting element electrically connected to the fifth transistor, the light-emitting element being configured to emit white light; and
a color filter over the light-emitting element;
a first FPC connected to a first side of the face of the substrate;
a first IC chip over the face of the substrate, the whole of the first IC chip overlapping with the first FPC;
a second FPC connected to a second side of the face of the substrate, the second side being opposite to the first side and the pixel portion being positioned between the first side and the second side; and
a second IC chip over the face of the substrate, the whole of the second IC chip overlapping with the second FPC;
wherein a gate of the first transistor is directly connected to one of a source and a drain of the second transistor,
wherein the gate of the first transistor is directly connected to one of a source and a drain of the fourth transistor,
wherein the gate of the first transistor is directly connected to a first electrode of the first capacitor,
wherein one of a source and a drain of the first transistor is directly connected to the other one of the source and the drain of the fourth transistor,
wherein the one of the source and the drain of the first transistor is directly connected to one of a source and a drain of the fifth transistor,
wherein the other one of the source and the drain of the second transistor is directly connected to a signal line,
wherein one of a source and a drain of the third transistor is directly connected to a second electrode of the first capacitor,
wherein the one of the source and the drain of the third transistor is directly connected to a first electrode of the second capacitor,
wherein the other one of the source and the drain of the fifth transistor is directly connected to a first electrode of the light-emitting element, and
wherein the other one of the source and the drain of the third transistor is directly connected to a second electrode of the second capacitor.

6. The display device according to claim 5, wherein the first IC chip comprises at least a part of a signal line driver circuit.

7. The display device according to claim 5, wherein the first IC chip comprises at least a part of a scanning line driver circuit.

8. The display device according to claim 5, wherein the first transistor comprises In and Zn.

9. A display device comprising:
a first transistor;
a second transistor;
a third transistor;
a fourth transistor;
a fifth transistor;
a first capacitor;
a second capacitor; and
a light-emitting element,
wherein a gate of the first transistor is directly connected to one of a source and a drain of the third transistor,
wherein the gate of the first transistor is directly connected to one of a source and a drain of the fourth transistor,
wherein the gate of the first transistor is directly connected to one of a source and a drain of the second transistor,
wherein the gate of the first transistor is directly connected to a first electrode of the second capacitor,
wherein one of a source and a drain of the first transistor is directly connected to the other one of the source and the drain of the fourth transistor,
wherein the one of the source and the drain of the first transistor is directly connected to one of a source and a drain of the fifth transistor,
wherein the other one of the source and the drain of the second transistor is directly connected to a signal line,
wherein the other one of the source and the drain of the third transistor is directly connected to a first electrode of the first capacitor,
wherein the other one of the source and the drain of the fifth transistor is directly connected to a first electrode of the light-emitting element, and
wherein a second electrode of the first capacitor is electrically connected to a second electrode of the second capacitor.

10. The display device according to claim 9, wherein the first transistor comprises In and Zn.

11. A display device comprising:
a first transistor;
a second transistor;
a third transistor;
a fourth transistor;
a fifth transistor;
a first capacitor;
a second capacitor; and
a light-emitting element,
wherein a gate of the first transistor is directly connected to one of a source and a drain of the second transistor,
wherein the gate of the first transistor is directly connected to one of a source and a drain of the fourth transistor,
wherein the gate of the first transistor is directly connected to a first electrode of the first capacitor,
wherein one of a source and a drain of the first transistor is directly connected to the other one of the source and the drain of the fourth transistor,
wherein the one of the source and the drain of the first transistor is directly connected to one of a source and a drain of the fifth transistor,
wherein the other one of the source and the drain of the second transistor is directly connected to a signal line,
wherein one of a source and a drain of the third transistor is directly connected to a second electrode of the first capacitor,
wherein the one of the source and the drain of the third transistor is directly connected to a first electrode of the second capacitor, wherein the other one of the source and the drain of the fifth transistor is directly connected to a first electrode of the light-emitting element, and wherein the other one of the source and the drain of the third transistor is directly connected to a second electrode of the second capacitor.

12. The display device according to claim 11, wherein the first transistor comprises In and Zn.

* * * * *

UNITED STATES PATENT AND TRADEMARK OFFICE
CERTIFICATE OF CORRECTION

PATENT NO. : 8,743,030 B2
APPLICATION NO. : 12/813885
DATED : June 3, 2014
INVENTOR(S) : Hideaki Shishido It is certified that error appears in the above-identified patent and that said Letters Patent is hereby corrected as shown below:

In the Specification

Column 9, line 16 – after "R, G" insert --,--;

Column 10, line 58 – after "transistor" insert --.--;

Column 20, line 58 – replace "VDD-$V_{th}$|" with --VDD-|$V_{th}$|--;

Column 27, line 61 – replace "VDD-|$V_{th}$." with --VDD-|$V_{th}$|.--;

Column 44, line 8 – replace "A1$g_3$," with --Al$q_3$,--;

Column 45, line 46 – replace "CaF," with --CAF$_2$,--;

Column 48, line 18 – replace "(MN)," with --(AlN),--;

Column 48, line 49 – after "layer" insert --.--;

Column 51, line 16 – replace "(MN)," with --(AlN),--;

Column 54, line 10 – replace "cm$^3$" with --cm$^{-3}$--;

Column 58, line 52 – replace "36036" with --3603b--; and

In the Claims

Column 67, line 34, claim 5 – after "FPC" replace ";" with --,--.

Signed and Sealed this
Eighteenth Day of August, 2015

Michelle K. Lee
*Director of the United States Patent and Trademark Office*